US010575417B2

(12) United States Patent
Sabbag et al.

(10) Patent No.: US 10,575,417 B2
(45) Date of Patent: Feb. 25, 2020

(54) JOBSITE COMMUNICATIONS CENTER

(71) Applicant: The Stanley Works Israel Ltd., Rosh Ha'Ayin (IL)

(72) Inventors: Yosi Sabbag, Holon (IL); Elad Shitrit, Tel Aviv (IL); Eran Schul, Hod Ha'Sharon (IL)

(73) Assignee: The Stanley Works Israel Ltd., Rosh Ha'Ayin (IL)

( * ) Notice: Subject to any disclaimer, the term of this patent is extended or adjusted under 35 U.S.C. 154(b) by 168 days.

(21) Appl. No.: 15/509,267

(22) PCT Filed: Jun. 30, 2015

(86) PCT No.: PCT/IL2015/050679
§ 371 (c)(1),
(2) Date: Mar. 7, 2017

(87) PCT Pub. No.: WO2016/038597
PCT Pub. Date: Mar. 17, 2016

(65) Prior Publication Data
US 2017/0257958 A1  Sep. 7, 2017

Related U.S. Application Data

(63) Continuation-in-part of application No. 14/480,113, filed on Sep. 8, 2014, now Pat. No. 9,132,543.

(51) Int. Cl.
*H05K 5/00* (2006.01)
*B25H 3/02* (2006.01)
(Continued)

(52) U.S. Cl.
CPC ............ *H05K 5/0021* (2013.01); *B25H 3/022* (2013.01); *B25H 3/028* (2013.01); *B65D 21/023* (2013.01);
(Continued)

(58) Field of Classification Search
CPC ...... H05K 5/0021; B25H 3/022; B25H 3/028; H04R 1/025; H04R 1/026; H04R 1/028
(Continued)

(56) References Cited

U.S. PATENT DOCUMENTS 344,661 A   6/1886 Kistler
687,619 A   11/1901 Couse
(Continued)

FOREIGN PATENT DOCUMENTS

DE   4201264   7/1993
EP   1424170   6/2004
(Continued)

OTHER PUBLICATIONS

An International Search Report and a Written Opinion both dated Oct. 28, 2015, which issued during the prosecution of Applicant's PCT/IL2015/050679.
(Continued)

*Primary Examiner* — Jeremy A Luks
(74) *Attorney, Agent, or Firm* — Sughrue Mion, PLLC

(57) ABSTRACT

A jobsite communications center including a communications module including an electrical power source, at least one speaker and at least one antenna and a toolbox-like housing for enclosing the communications module and having a handle and first and second connection assemblies, the first connection assembly enabling readily-disconnectable and reconnectable stacking interconnection of the communications center with tool boxes, the second connection assembly enabling readily-disconnectable and reconnectable mounting of the communication center on a toolbox-carrying cart in a manner similar to connection of toolboxes thereto.

24 Claims, 160 Drawing Sheets

(51) Int. Cl.
| | |
|---|---|
| *H04R 1/02* | (2006.01) |
| *G10K 9/22* | (2006.01) |
| *H05K 5/02* | (2006.01) |
| *H05K 5/06* | (2006.01) |
| *B65D 21/02* | (2006.01) |
| *B65D 25/22* | (2006.01) |
| *B65D 43/22* | (2006.01) |
| *B65D 25/28* | (2006.01) |
| *H04R 1/24* | (2006.01) |
| *B65D 43/16* | (2006.01) |

(52) U.S. Cl.
CPC ......... *B65D 21/0217* (2013.01); *B65D 25/22* (2013.01); *B65D 25/28* (2013.01); *B65D 43/16* (2013.01); *B65D 43/22* (2013.01); *G10K 9/22* (2013.01); *H04R 1/025* (2013.01); *H04R 1/026* (2013.01); *H04R 1/028* (2013.01); *H04R 1/24* (2013.01); *H05K 5/0004* (2013.01); *H05K 5/0017* (2013.01); *H05K 5/0086* (2013.01); *H05K 5/0204* (2013.01); *H05K 5/0208* (2013.01); *H05K 5/0221* (2013.01); *H05K 5/0234* (2013.01); *H05K 5/0239* (2013.01); *H05K 5/061* (2013.01); *B65D 2525/283* (2013.01)

(58) Field of Classification Search
USPC .................. 206/349, 372; 181/198, 199
See application file for complete search history.

(56) References Cited

U.S. PATENT DOCUMENTS

| | | | |
|---|---|---|---|
| 1,424,819 A | 8/1922 | Hayes et al. | |
| 2,554,091 A | 5/1951 | Davis | |
| 2,588,830 A | 3/1952 | Haanstad | |
| 2,901,262 A | 12/1956 | Berlin | |
| 2,964,328 A | 12/1960 | Muir | |
| 3,168,329 A | 2/1965 | Goldschmidt | |
| 3,393,951 A | 7/1968 | Sulentic | |
| 3,734,526 A | 5/1973 | Propst et al. | |
| 3,804,432 A | 4/1974 | Lehrman | |
| 3,990,653 A | 11/1976 | Marcell | |
| 4,363,496 A | 12/1982 | Schreiner | |
| 4,448,434 A | 5/1984 | Anderson | |
| 4,619,363 A | 10/1986 | Wolfseder | |
| 4,984,704 A | 1/1991 | O'Malley | |
| 5,104,135 A | 4/1992 | Sheets | |
| 5,123,666 A | 6/1992 | Moore | |
| 5,207,723 A | 5/1993 | Newby, Sr. | |
| 5,235,822 A | 8/1993 | Leonovich, Jr. | |
| 5,362,078 A | 11/1994 | Paton | |
| 5,378,005 A | 1/1995 | Norton | |
| 5,464,104 A | 11/1995 | McArthur | |
| 5,474,312 A | 12/1995 | Starita et al. | |
| 5,547,080 A | 8/1996 | Klimas | |
| 5,595,395 A | 1/1997 | Wilson | |
| 5,626,352 A | 5/1997 | Grace | |
| 5,634,649 A | 6/1997 | Breining et al. | |
| 5,720,535 A | 2/1998 | Mehman | |
| 5,810,168 A * | 9/1998 | Eggering ............... | A45C 15/00 206/372 |
| 5,845,915 A | 12/1998 | Wilson | |
| 5,906,381 A | 5/1999 | Hovatter | |
| 5,913,527 A | 6/1999 | Hailston | |
| 5,931,483 A | 8/1999 | Haynes | |
| 5,934,466 A | 8/1999 | Loeffler | |
| 5,938,396 A | 8/1999 | Audet | |
| 6,000,713 A | 12/1999 | Lin | |
| 6,050,660 A | 4/2000 | Gurley | |
| 6,079,719 A | 6/2000 | Tisbo et al. | |
| 6,109,627 A | 8/2000 | Be | |
| 6,113,129 A | 9/2000 | Marques et al. | |
| 6,131,926 A | 10/2000 | Harlan | |
| 6,135,466 A | 10/2000 | Irwin | |
| 6,176,559 B1 | 1/2001 | Tiramani et al. | |
| D437,484 S | 2/2001 | Tiramani et al. | |
| 6,254,112 B1 | 7/2001 | Clegg | |
| 6,347,847 B1 | 2/2002 | Tiramani et al. | |
| 6,357,063 B1 | 3/2002 | Selby | |
| 6,371,320 B2 | 4/2002 | Sagol | |
| 6,394,471 B1 | 5/2002 | Watson | |
| 6,398,235 B1 | 6/2002 | Cary | |
| 6,423,344 B1 | 7/2002 | Platz et al. | |
| 6,474,930 B1 | 11/2002 | Simpson | |
| 6,561,528 B2 | 5/2003 | Bootsman | |
| 6,601,930 B2 | 8/2003 | Tiramani et al. | |
| 6,616,152 B2 | 9/2003 | Oliver | |
| 6,659,476 B2 | 12/2003 | Weida | |
| 6,662,945 B1 * | 12/2003 | Chang ................... | B25H 3/006 206/372 |
| 6,666,465 B2 | 12/2003 | Chan | |
| 6,874,634 B2 | 4/2005 | Riley | |
| 6,889,838 B2 | 5/2005 | Meier et al. | |
| 6,945,546 B2 | 9/2005 | Guirlinger | |
| 7,063,339 B2 | 6/2006 | Jarko et al. | |
| 7,066,475 B2 | 6/2006 | Barnes | |
| 7,168,715 B1 | 1/2007 | Friedman | |
| 7,188,847 B1 | 3/2007 | Friedman | |
| D542,496 S | 5/2007 | Sabbag | |
| 7,210,689 B2 | 5/2007 | Guirlinger | |
| 7,328,905 B2 | 2/2008 | Guirlinger | |
| 7,367,571 B1 | 5/2008 | Nichols | |
| 7,500,681 B2 | 3/2009 | Steadman | |
| 7,503,569 B2 | 3/2009 | Duvigneau | |
| 7,686,260 B1 | 3/2010 | Tetradis | |
| 7,703,776 B1 | 4/2010 | Nugent | |
| 7,819,407 B1 | 10/2010 | Charitun | |
| 7,823,893 B2 | 11/2010 | Meyers et al. | |
| 7,845,653 B2 | 12/2010 | Katz | |
| 7,883,096 B2 | 2/2011 | Katz et al. | |
| 7,905,502 B2 | 3/2011 | Oliver | |
| 7,938,412 B2 | 5/2011 | Katz | |
| D640,869 S | 7/2011 | Katz et al. | |
| D653,832 S | 2/2012 | Vilkomirski et al. | |
| D654,241 S | 2/2012 | Vilkomirski et al. | |
| 8,132,819 B2 | 3/2012 | Landau et al. | |
| 8,226,092 B2 | 7/2012 | Oliver | |
| 8,567,796 B2 | 10/2013 | Bar-Erez et al. | |
| 8,657,307 B2 | 2/2014 | Lifshitz et al. | |
| 8,907,623 B2 * | 12/2014 | Saur ....................... | H02J 50/10 320/114 |
| 8,917,497 B2 * | 12/2014 | Bergum ................ | H04Q 1/025 174/51 |
| 8,936,258 B2 | 1/2015 | Bar-Erez et al. | |
| 9,132,543 B2 | 9/2015 | Bar-Erez et al. | |
| 2002/0014488 A1 | 2/2002 | Schermel | |
| 2002/0067027 A1 | 6/2002 | Anderson | |
| 2002/0074905 A1 | 6/2002 | Tiramani et al. | |
| 2002/0113386 A1 | 8/2002 | Be | |
| 2002/0185831 A1 | 12/2002 | Chan | |
| 2003/0001348 A1 | 1/2003 | Weida | |
| 2003/0146589 A1 | 8/2003 | Jarko et al. | |
| 2004/0265104 A1 | 12/2004 | Davis, Jr. | |
| 2005/0062244 A1 | 3/2005 | Guirlinger | |
| 2005/0104308 A1 | 5/2005 | Barnes | |
| 2005/0258610 A1 | 11/2005 | Stone et al. | |
| 2005/0275178 A1 | 12/2005 | Huesdash et al. | |
| 2006/0006619 A1 | 1/2006 | Guirlinger | |
| 2006/0012139 A1 | 1/2006 | Guirlinger | |
| 2006/0038367 A9 | 2/2006 | Ferraro et al. | |
| 2006/0170395 A1 * | 8/2006 | Yoshimizu ............ | B25H 3/006 320/114 |
| 2007/0080512 A1 | 4/2007 | Bartholmey et al. | |
| 2007/0138041 A1 | 6/2007 | Welsh | |
| 2007/0194543 A1 | 8/2007 | Duvigneau | |
| 2007/0273114 A1 | 11/2007 | Katz | |
| 2008/0067091 A1 * | 3/2008 | Chang ..................... | A45C 5/00 206/349 |
| 2008/0084036 A1 | 4/2008 | Keeler | |
| 2008/0121547 A1 | 5/2008 | Dur et al. | |
| 2008/0128305 A1 | 6/2008 | Guirlinger | |
| 2008/0143069 A1 | 6/2008 | Richards et al. | |

(56) References Cited

U.S. PATENT DOCUMENTS

| | | |
|---|---|---|
| 2009/0020528 A1 | 1/2009 | Chang |
| 2009/0026901 A1 | 1/2009 | Nies, III et al. |
| 2009/0250364 A1* | 10/2009 | Gerold .................... B25C 1/08 |
| | | 206/349 |
| 2009/0309323 A1 | 12/2009 | Oliver |
| 2010/0026151 A1 | 2/2010 | Melkumyan et al. |
| 2010/0033325 A1* | 2/2010 | Vilkomirski ............. B25H 3/02 |
| | | 340/540 |
| 2010/0052276 A1 | 3/2010 | Brunner |
| 2010/0290877 A1 | 11/2010 | Landau et al. |
| 2010/0327562 A1 | 12/2010 | Kasuya et al. |
| 2011/0049824 A1 | 3/2011 | Bar-Erez et al. |
| 2011/0181008 A1 | 7/2011 | Bensman et al. |
| 2012/0160886 A1 | 6/2012 | Henny et al. |
| 2012/0326406 A1 | 12/2012 | Lifshitz et al. |
| 2013/0155657 A1* | 6/2013 | Werner .................. B25H 3/023 |
| | | 362/154 |
| 2013/0248390 A1 | 9/2013 | Roehm et al. |
| 2014/0001719 A1 | 1/2014 | Bar-Erez et al. |
| 2014/0069832 A1* | 3/2014 | Roehm .................... B25H 3/02 |
| | | 206/349 |
| 2014/0375181 A1 | 12/2014 | Bar-Erez et al. |

FOREIGN PATENT DOCUMENTS

| | | |
|---|---|---|
| EP | 1859908 | 11/2007 |
| EP | 2537641 | 12/2012 |
| GB | 2235165 | 2/1991 |
| WO | 2013/026084 | 2/2013 |
| WO | 2016/038597 | 3/2016 |

OTHER PUBLICATIONS

An International Preliminary Report on Patentability dated Mar. 14, 2017, which issued during the prosecution of Applicant's PCT/IL2015/050679.

European Search Report dated Feb. 23, 2018 which issued during the prosecution of Applicant's European App No. 15840412.9.

U.S. Appl. No. 61/238,937, filed Sep. 1, 2009.

Stanley 20602Z Metal Rolling Workshop [online]. Retrieved from the Internet: <URL: http://www.amazon.com/Stanley-20602ZMetal-Rolling-Workshop/dp/B00005QVQT>.

Stanley Rolling Workshop [online]. Retrieved from the Internet: <URL: https://www.stanleytools.com/products/storage/tool-boxes/mobile/essential-rolling-workshop/stst18631 >.

Stanley FatMax® 4-in-1 Mobile Work Station (020800R) [online], Retrieved from the Internet: <URL:https://www.stanleytools.com/products/fatmax-tools/fatmax-storage/fatmax-4in1-mobile-work-station/020800r>.

Duratool Rolling Tool Organizer and Rolling Workshop [online], Retrieved from the Internet: <URL: https://www.amazon.com/Duratool-D00407-Plastic-Rolling-Workshop/dp/B008BW9ZSW >.

European Search Report dated May 27, 2011 which issued during the prosecution of Applicant's European App No. 10174339.1.

* cited by examiner

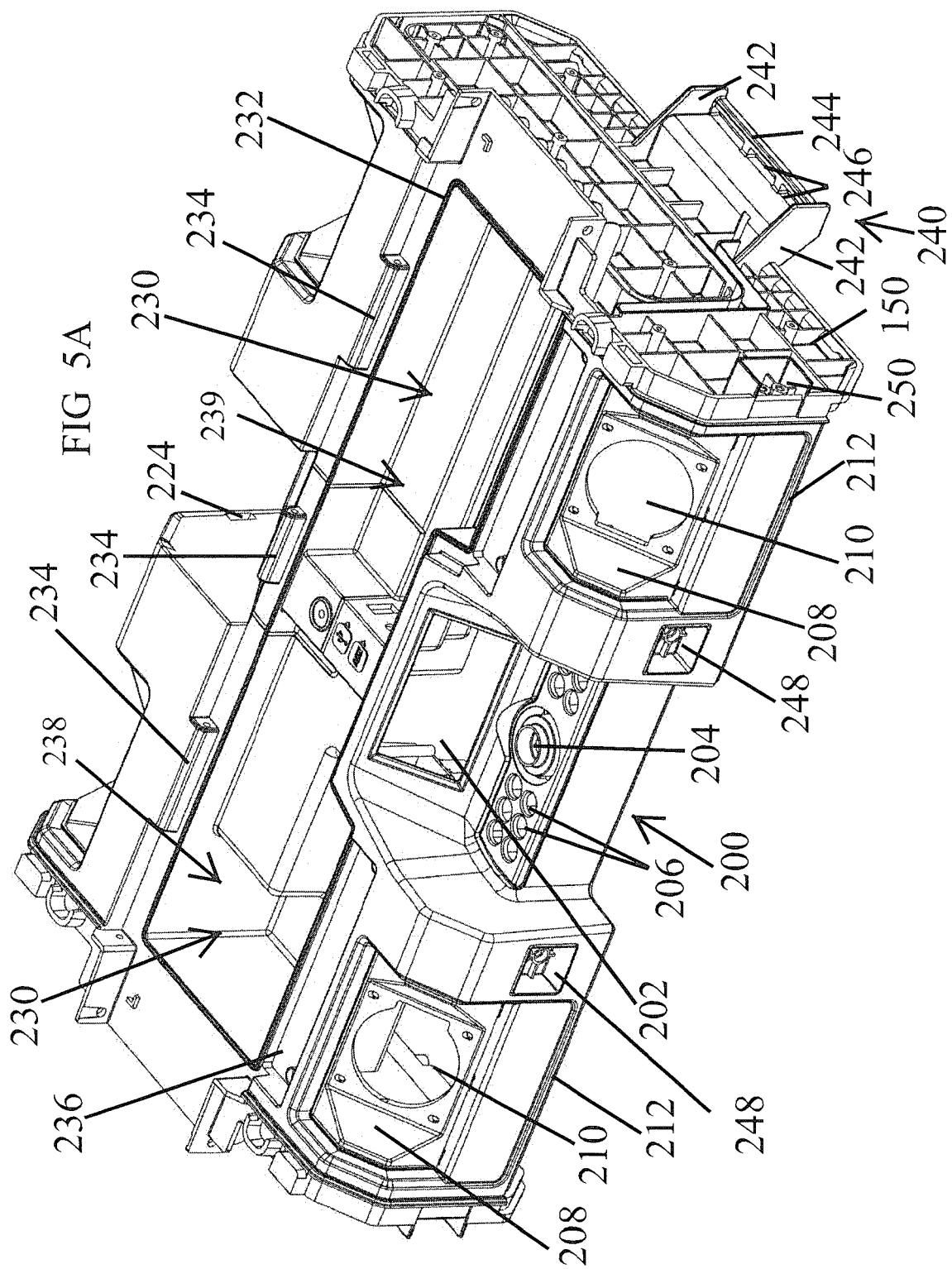

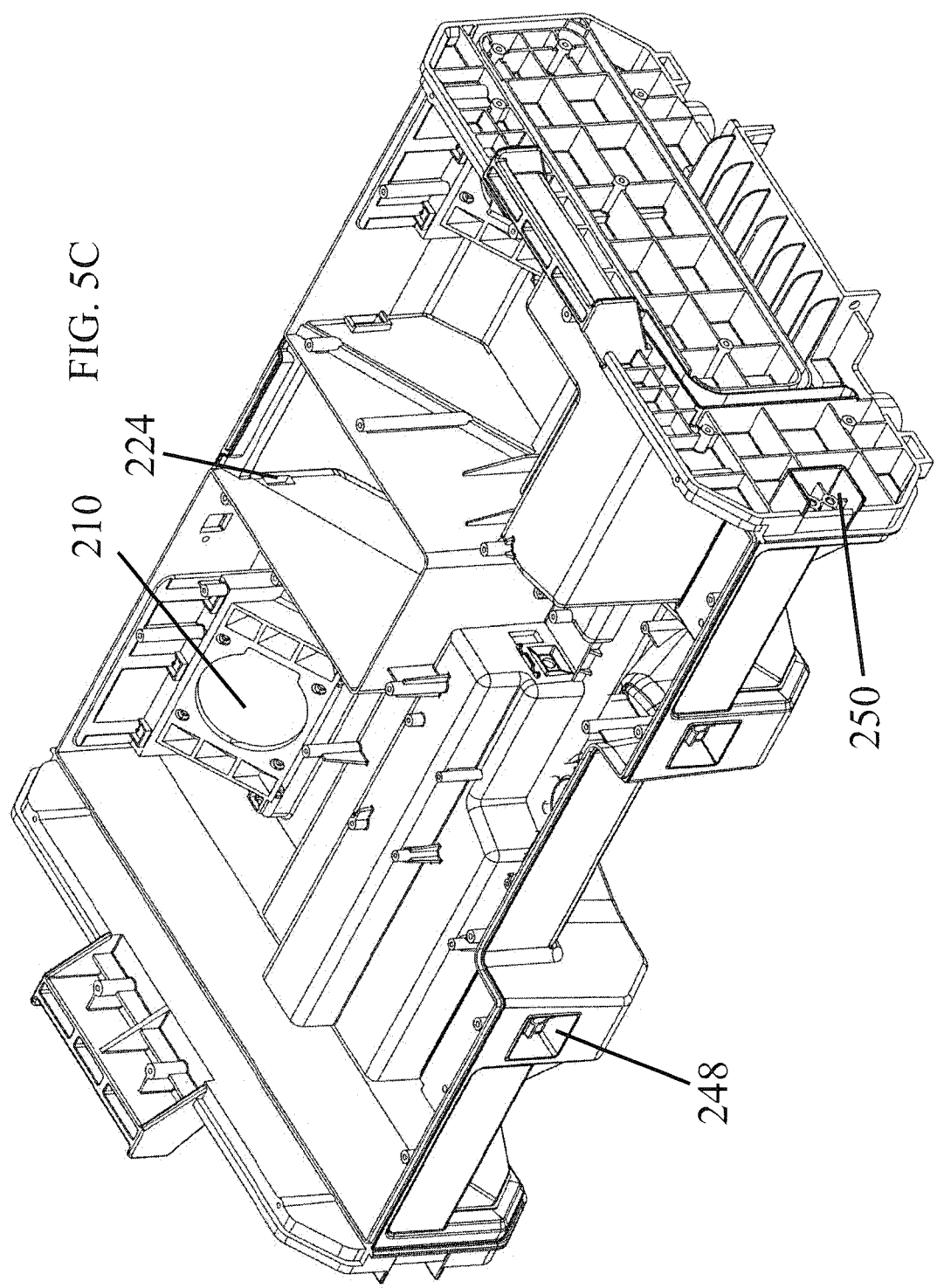

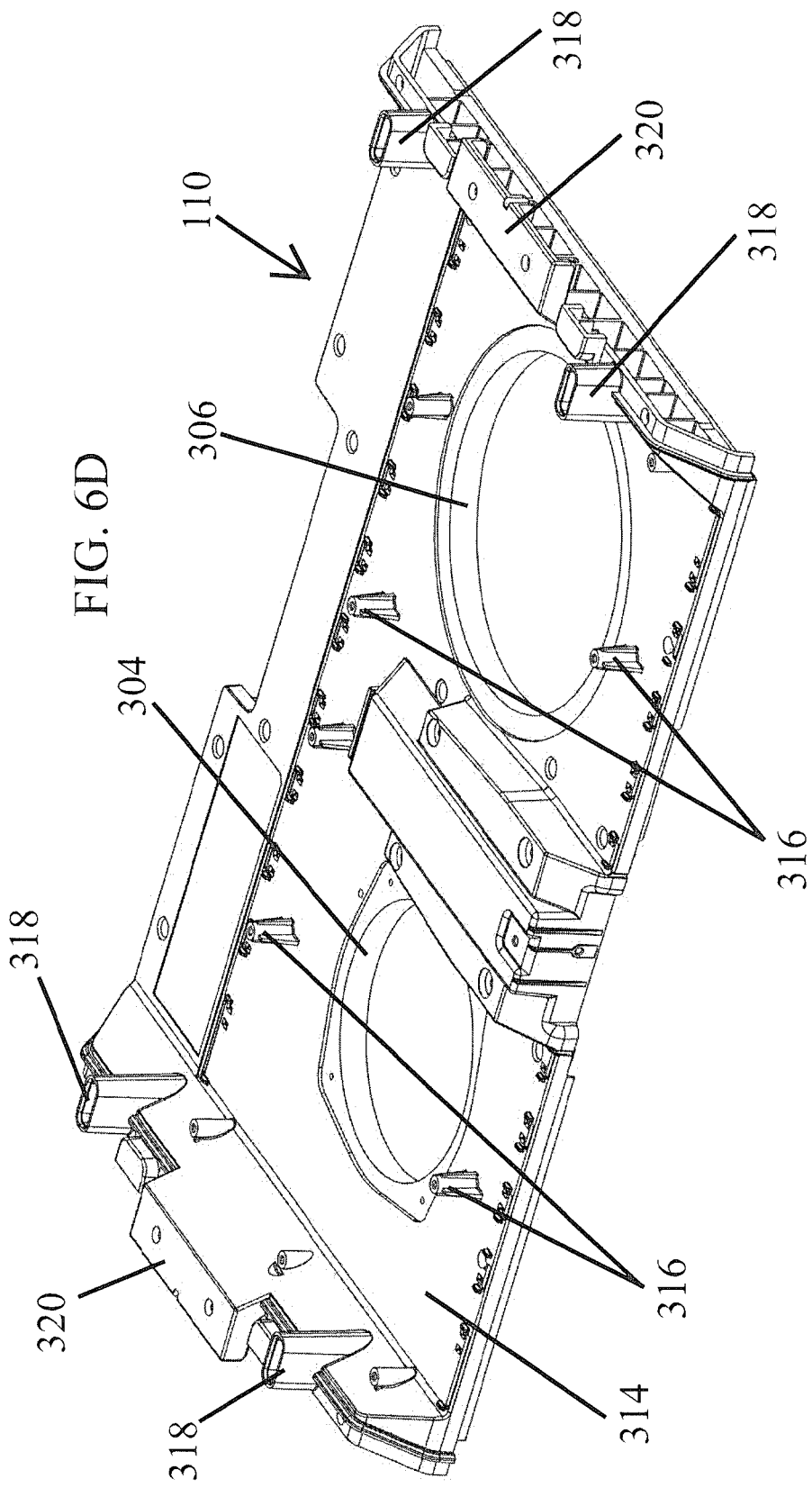

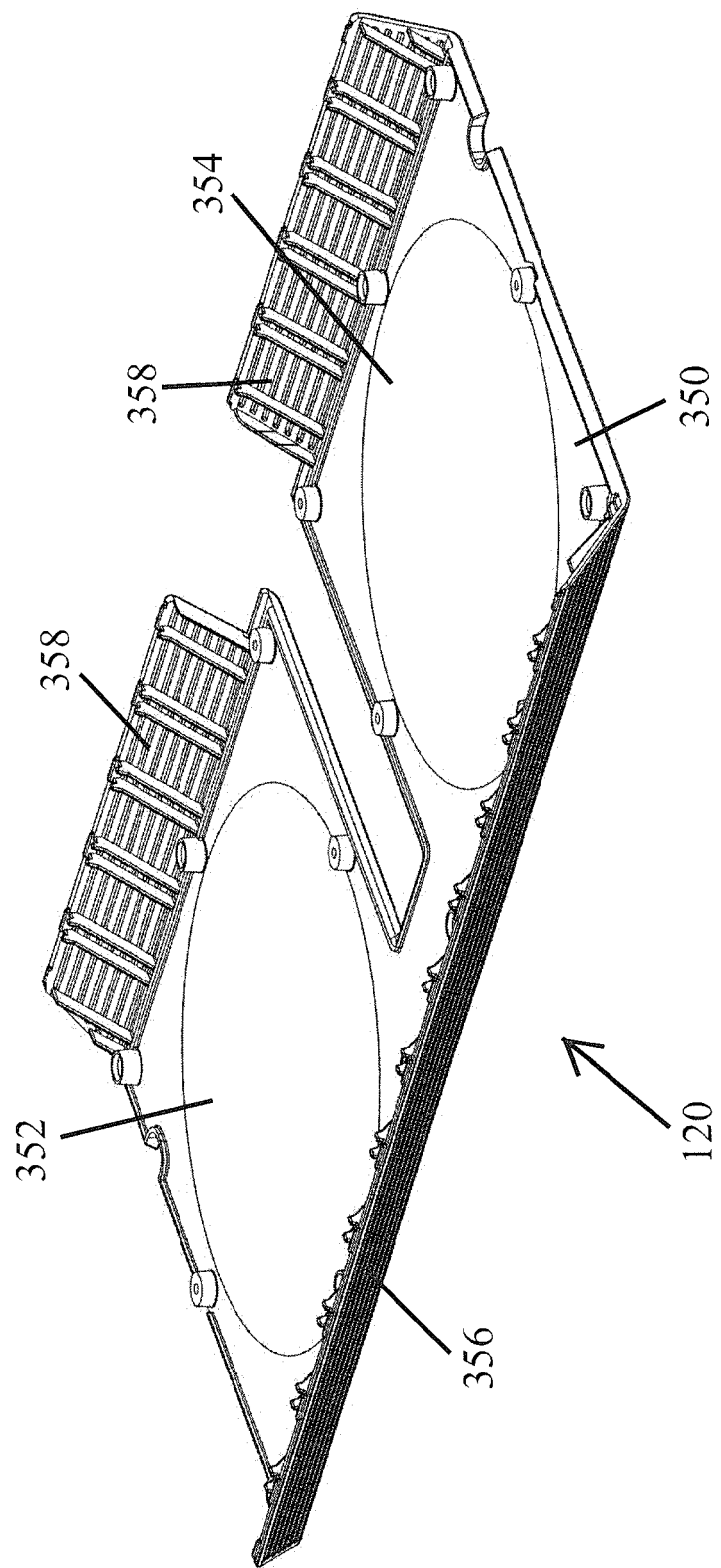

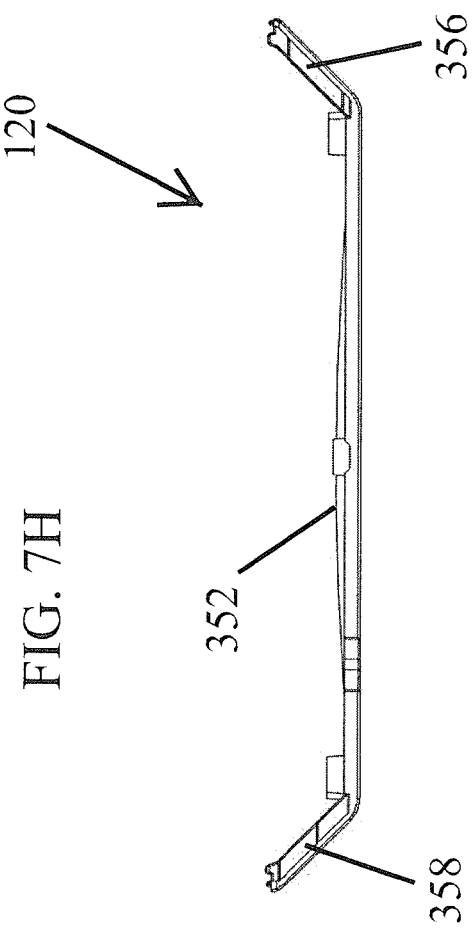

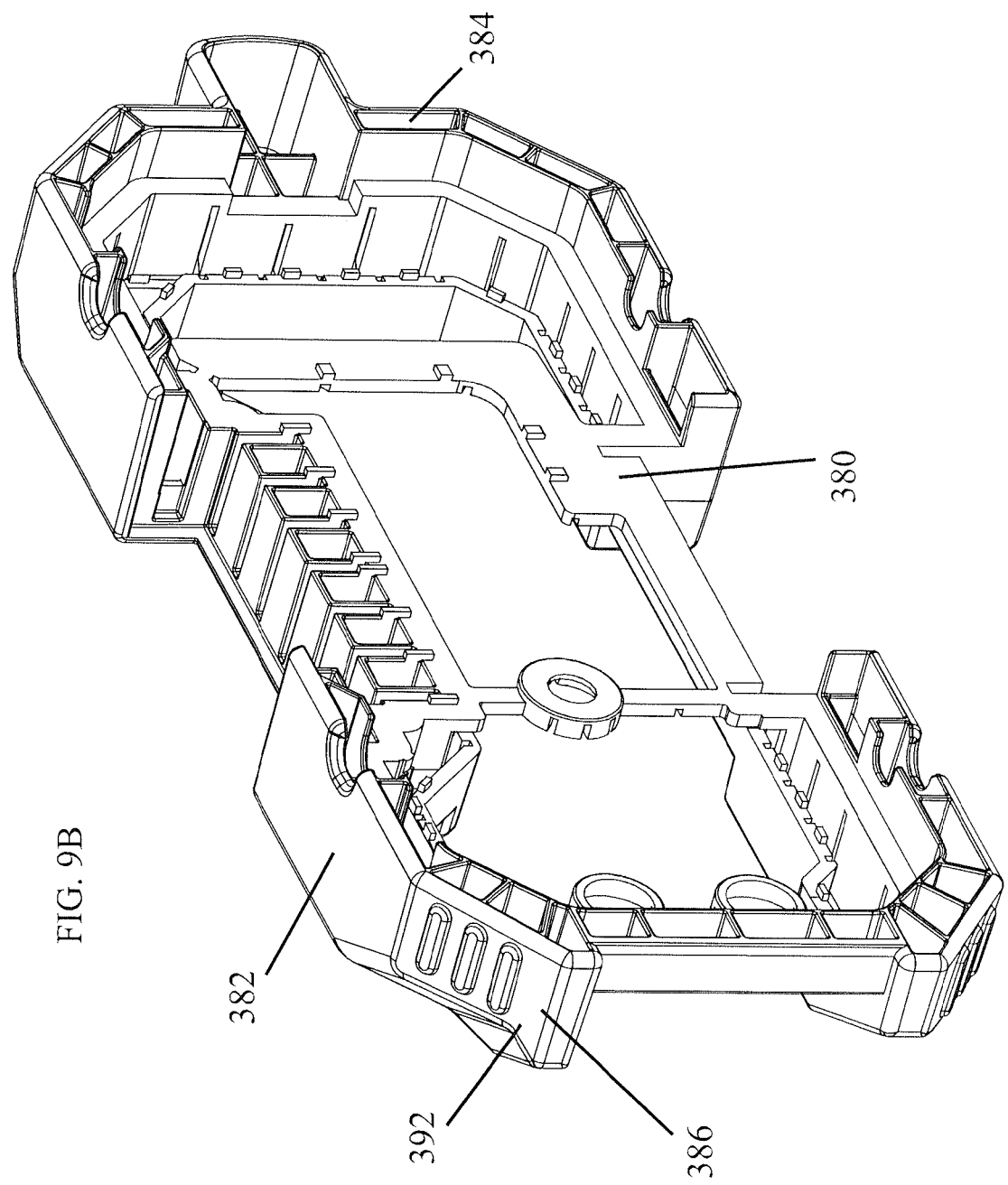

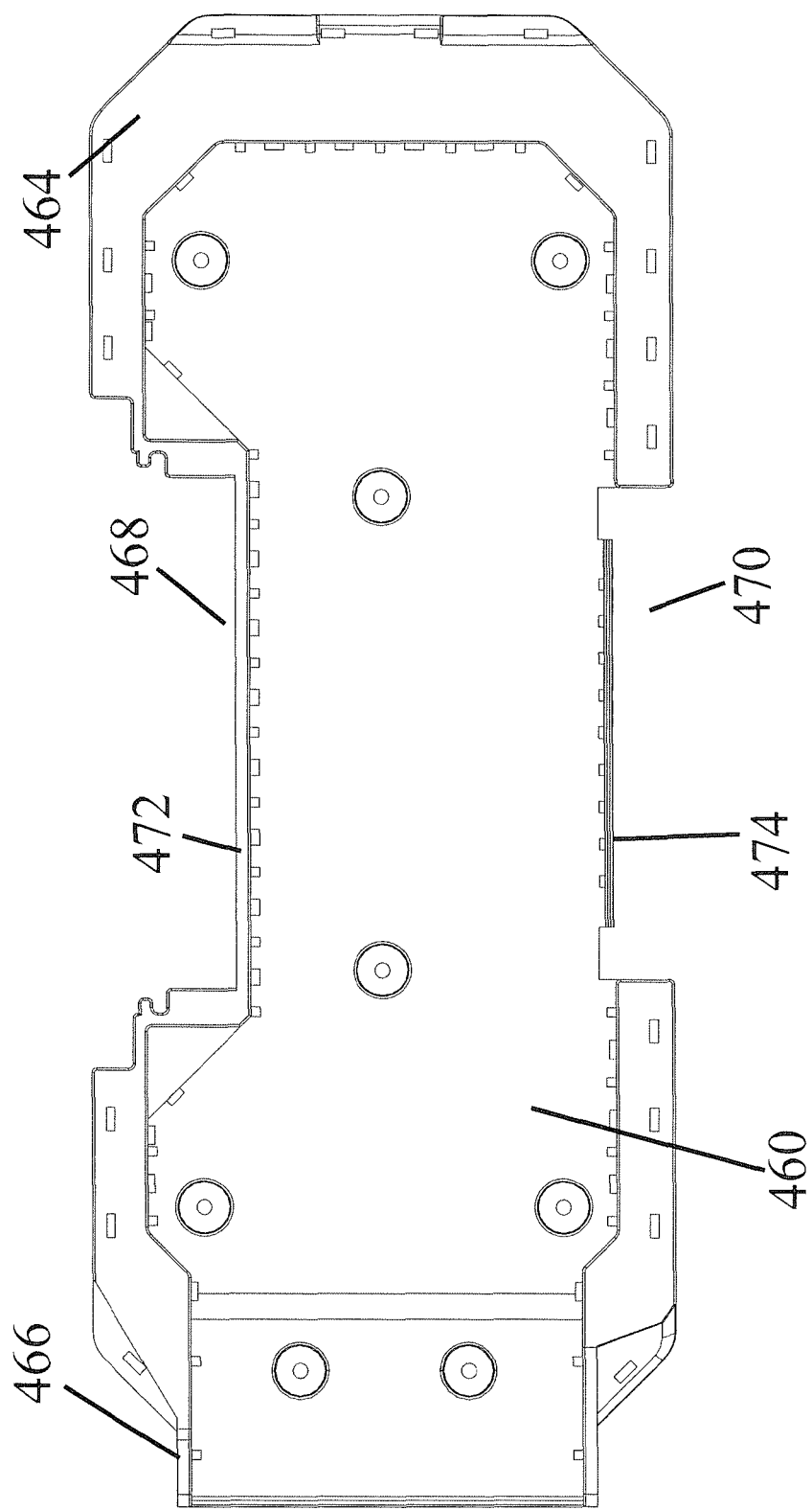

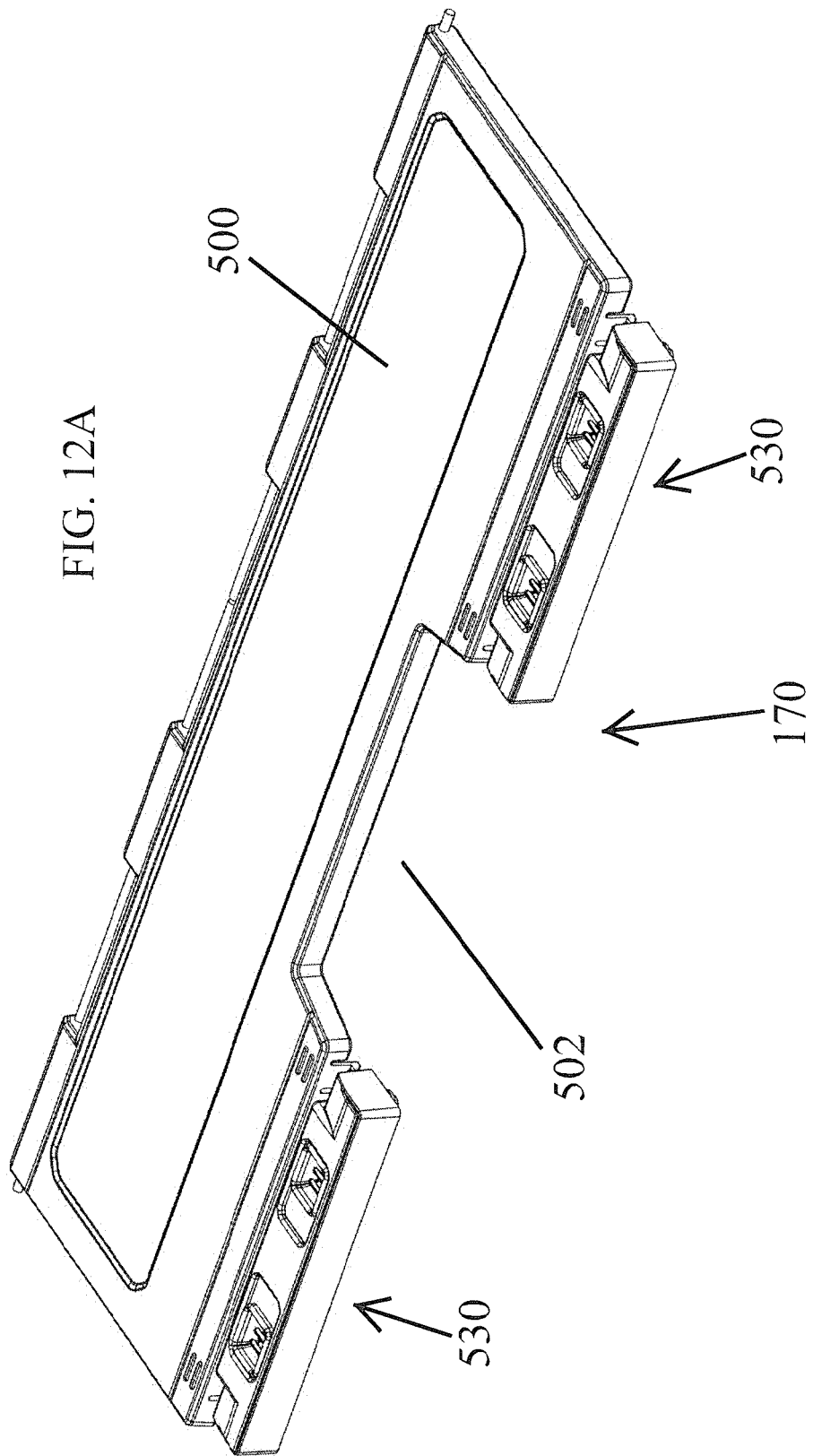

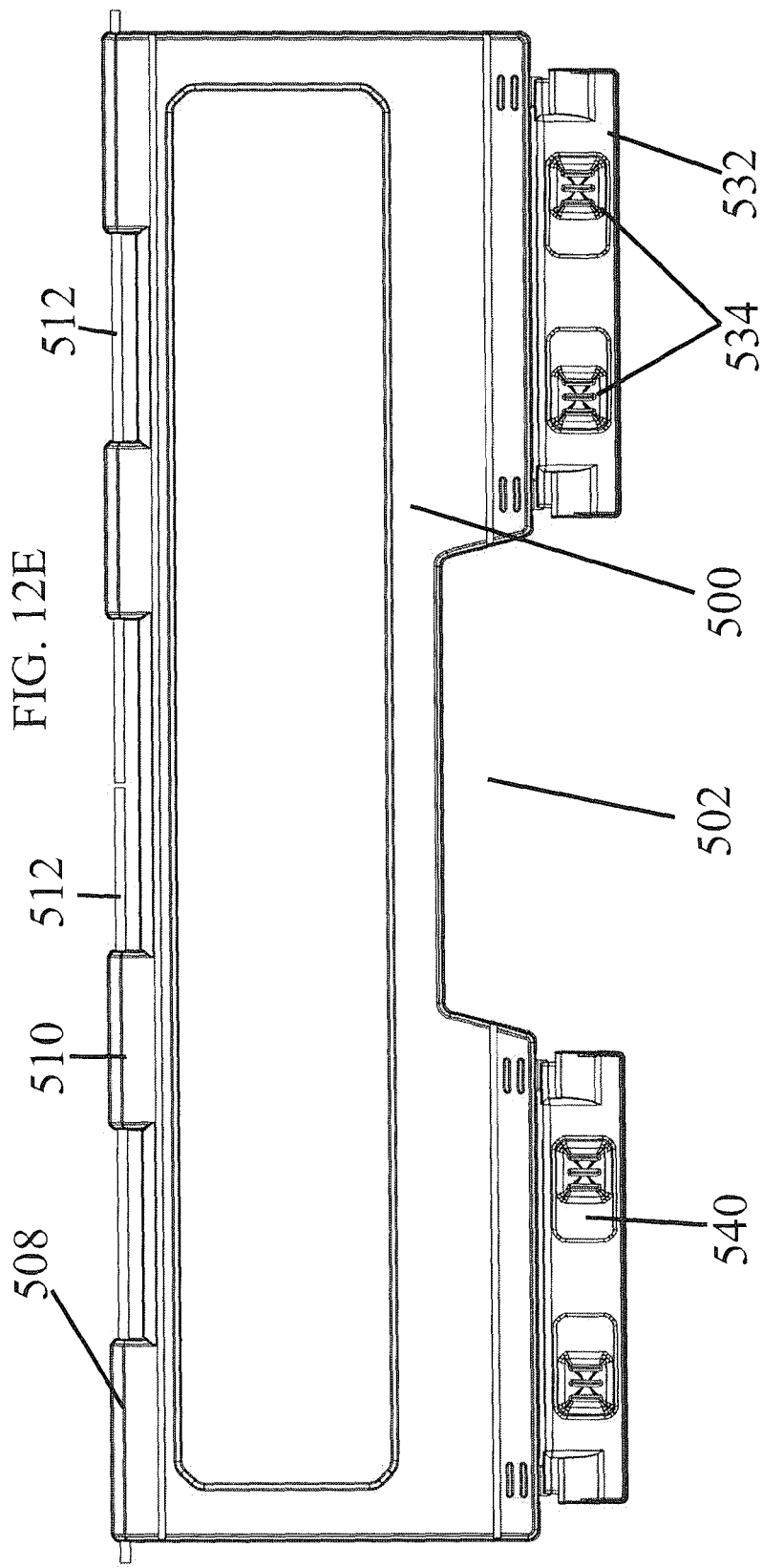

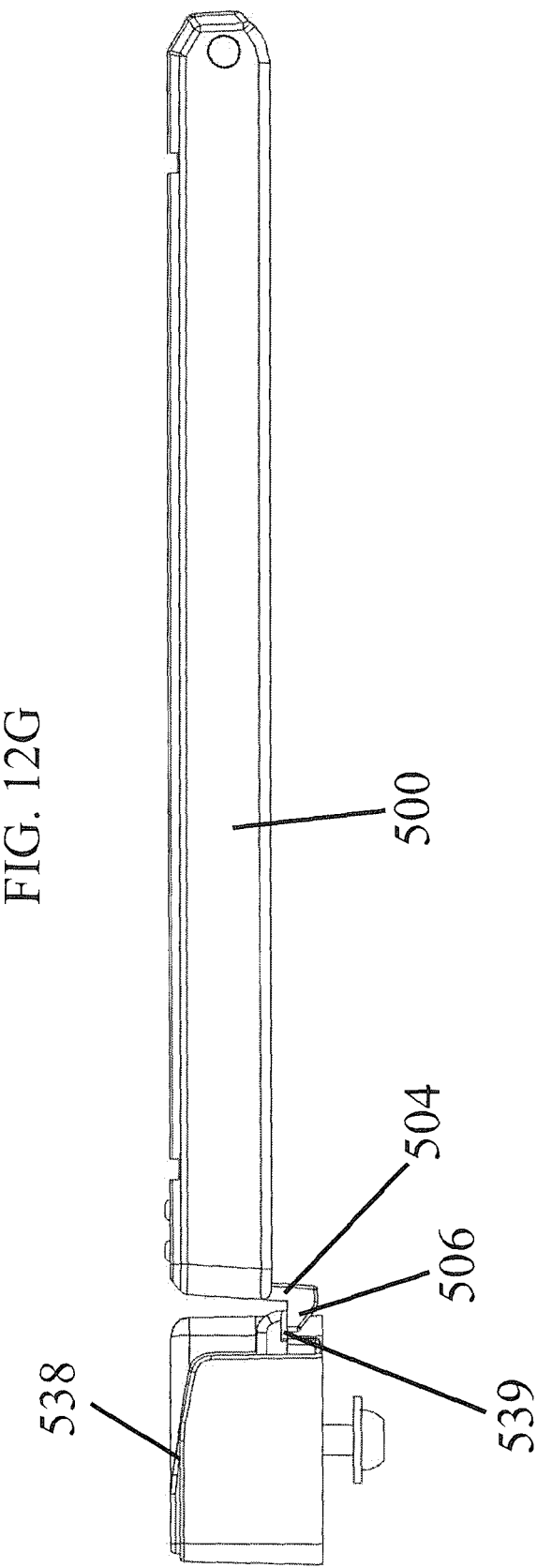

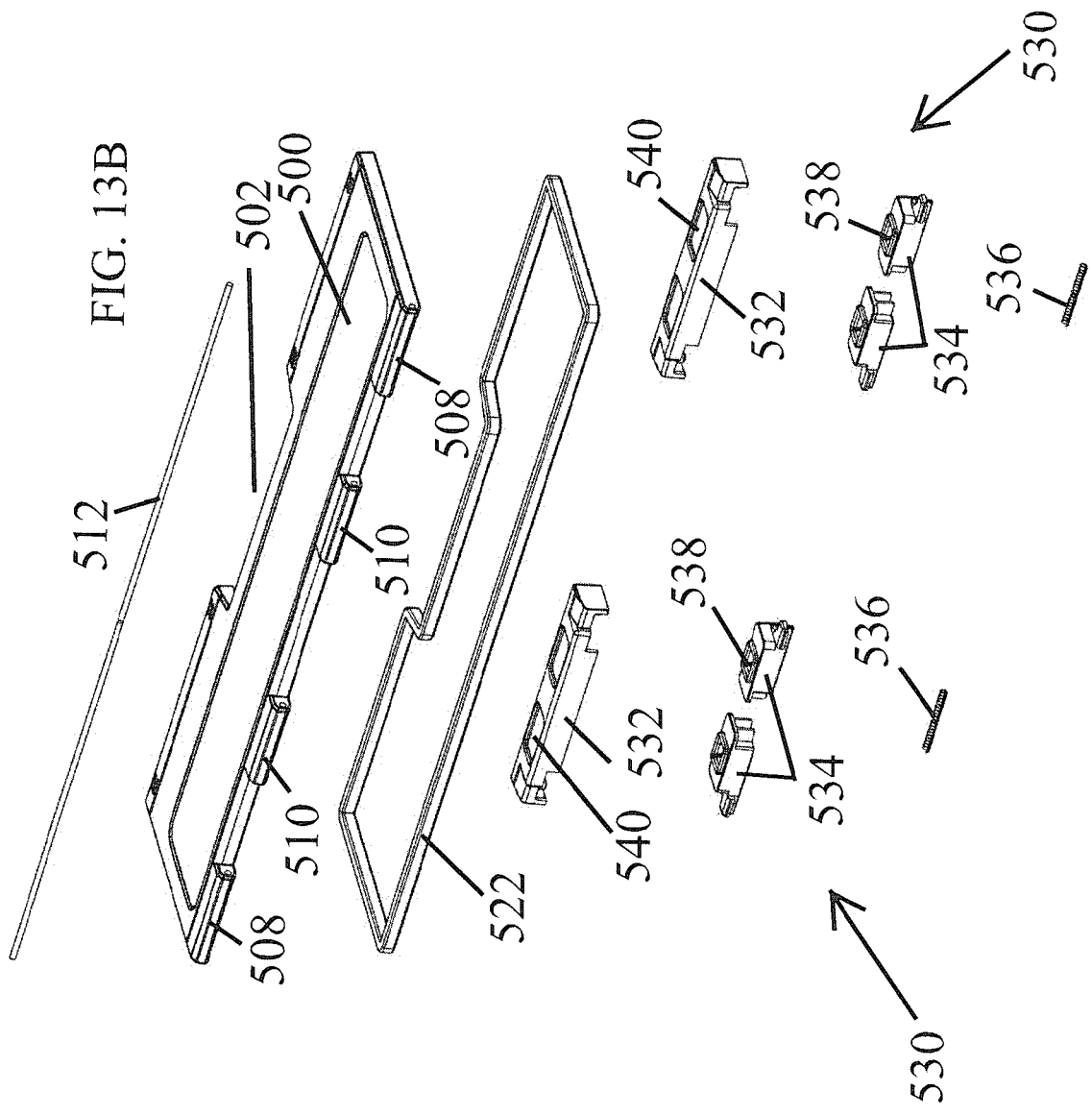

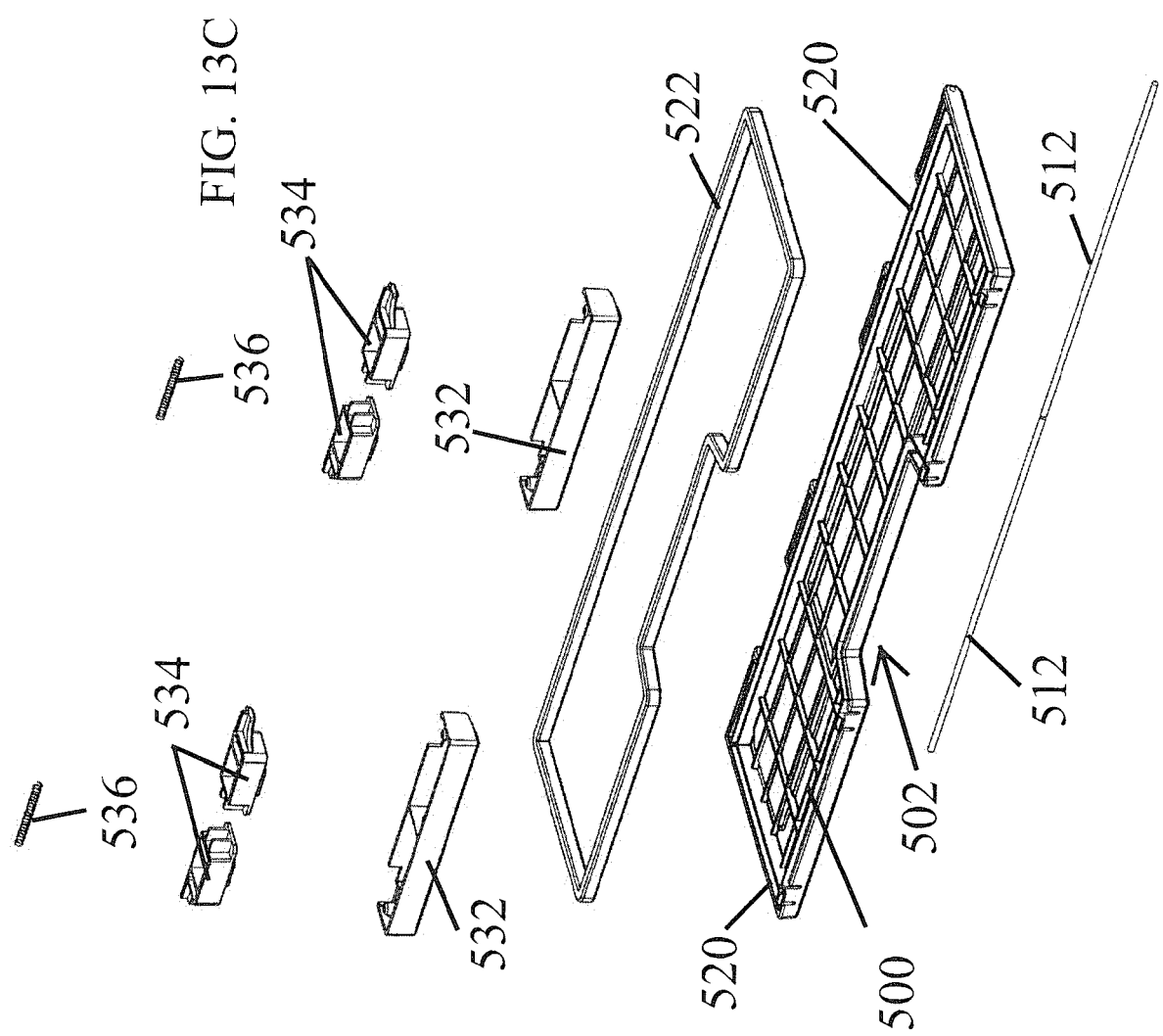

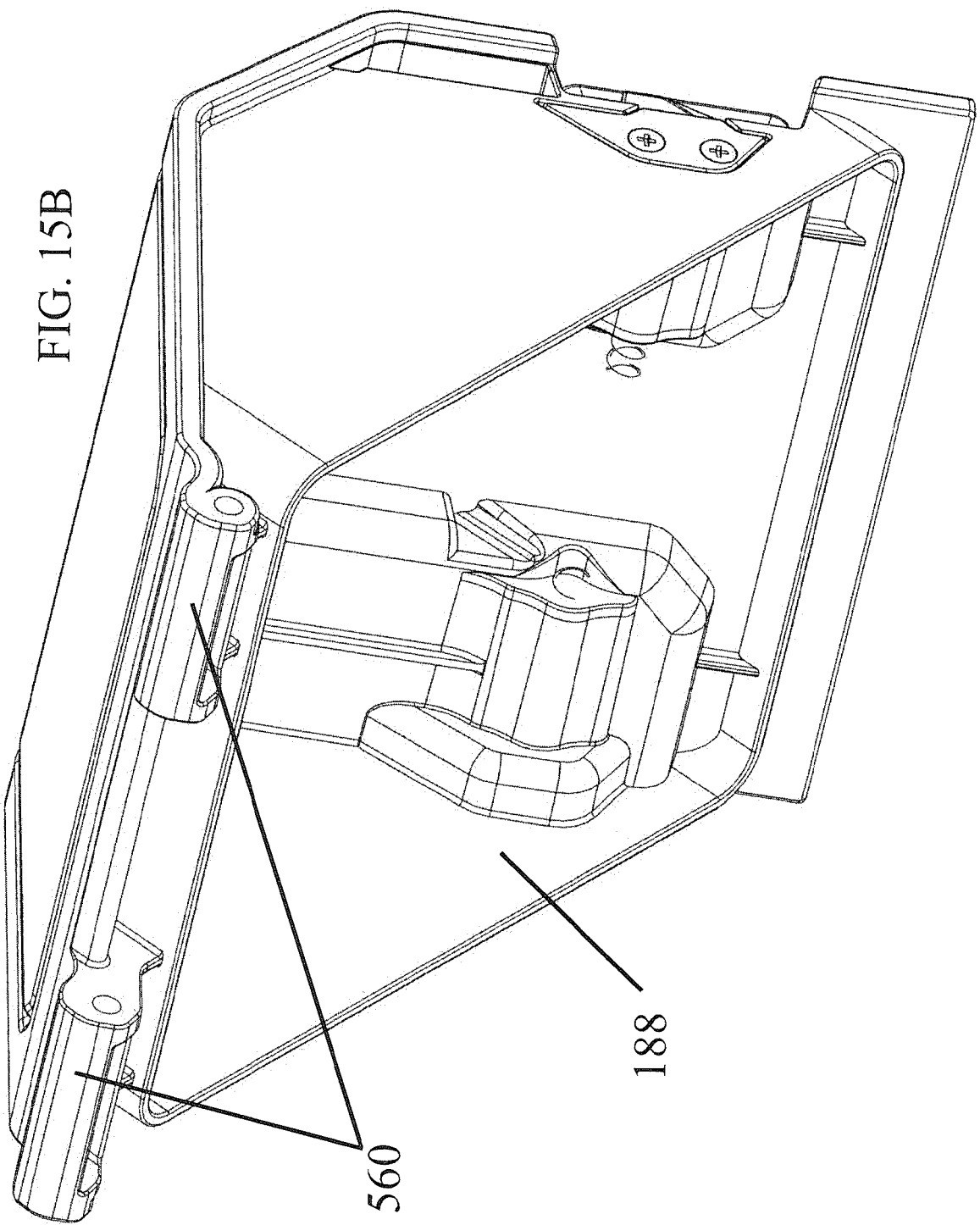

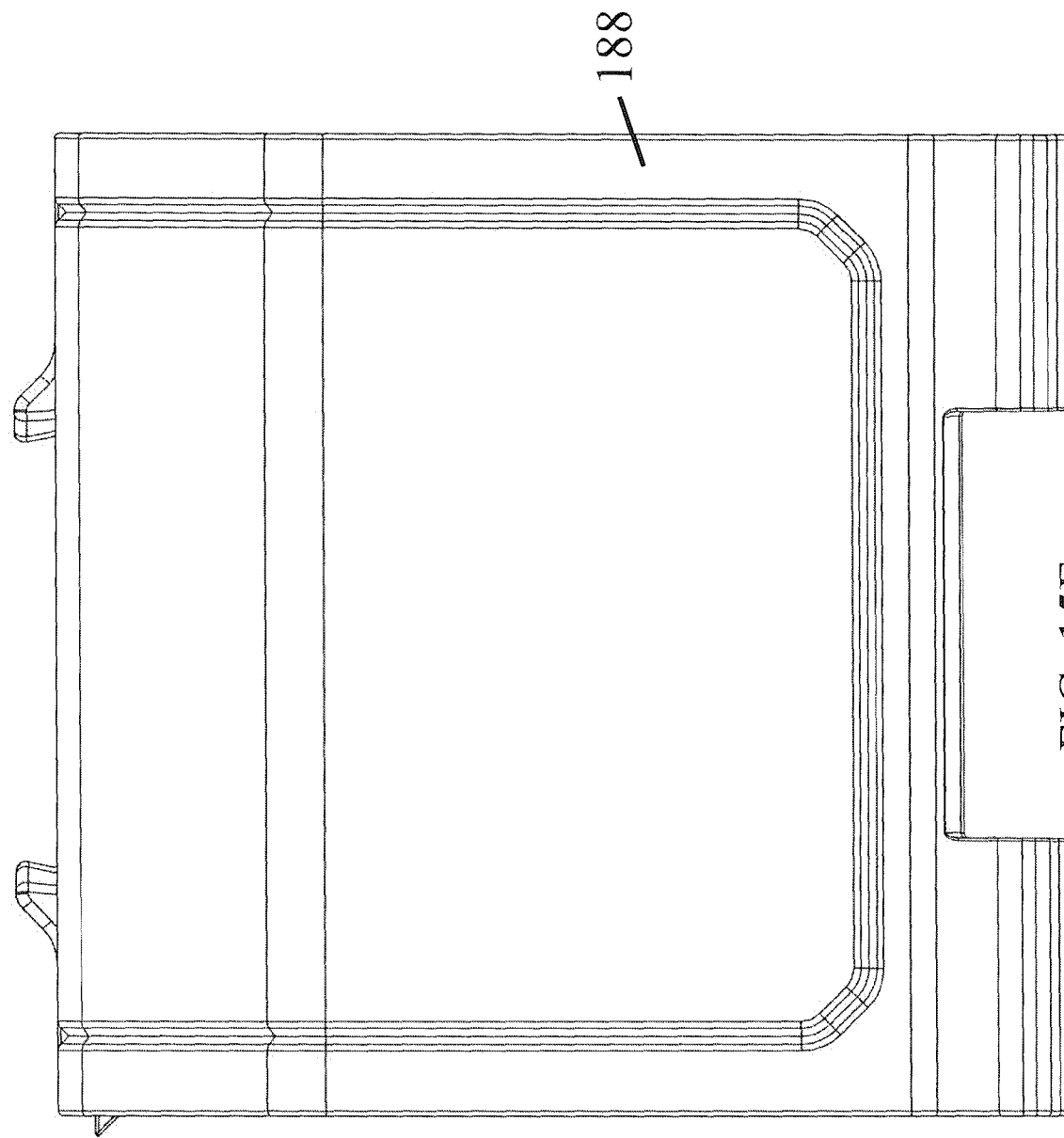

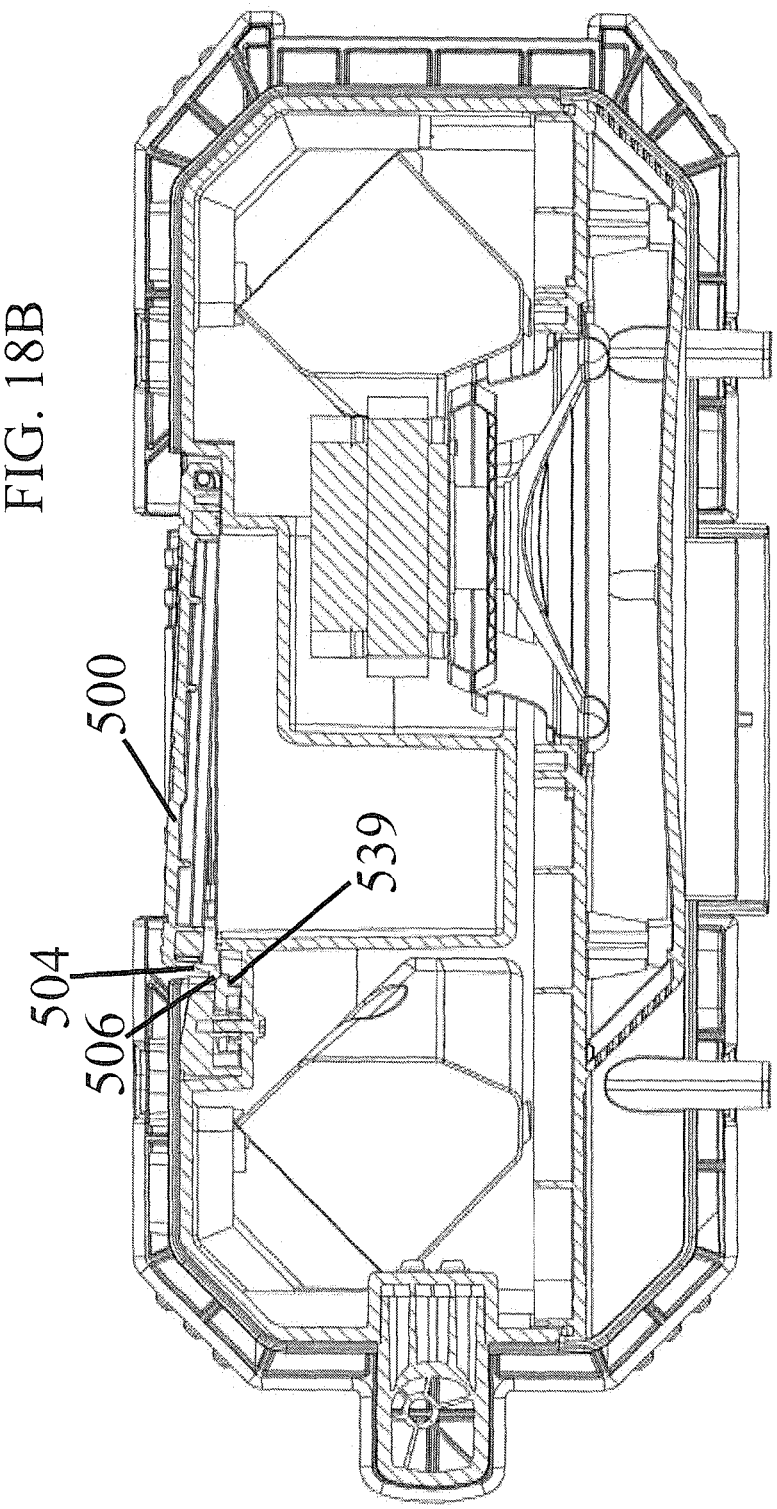

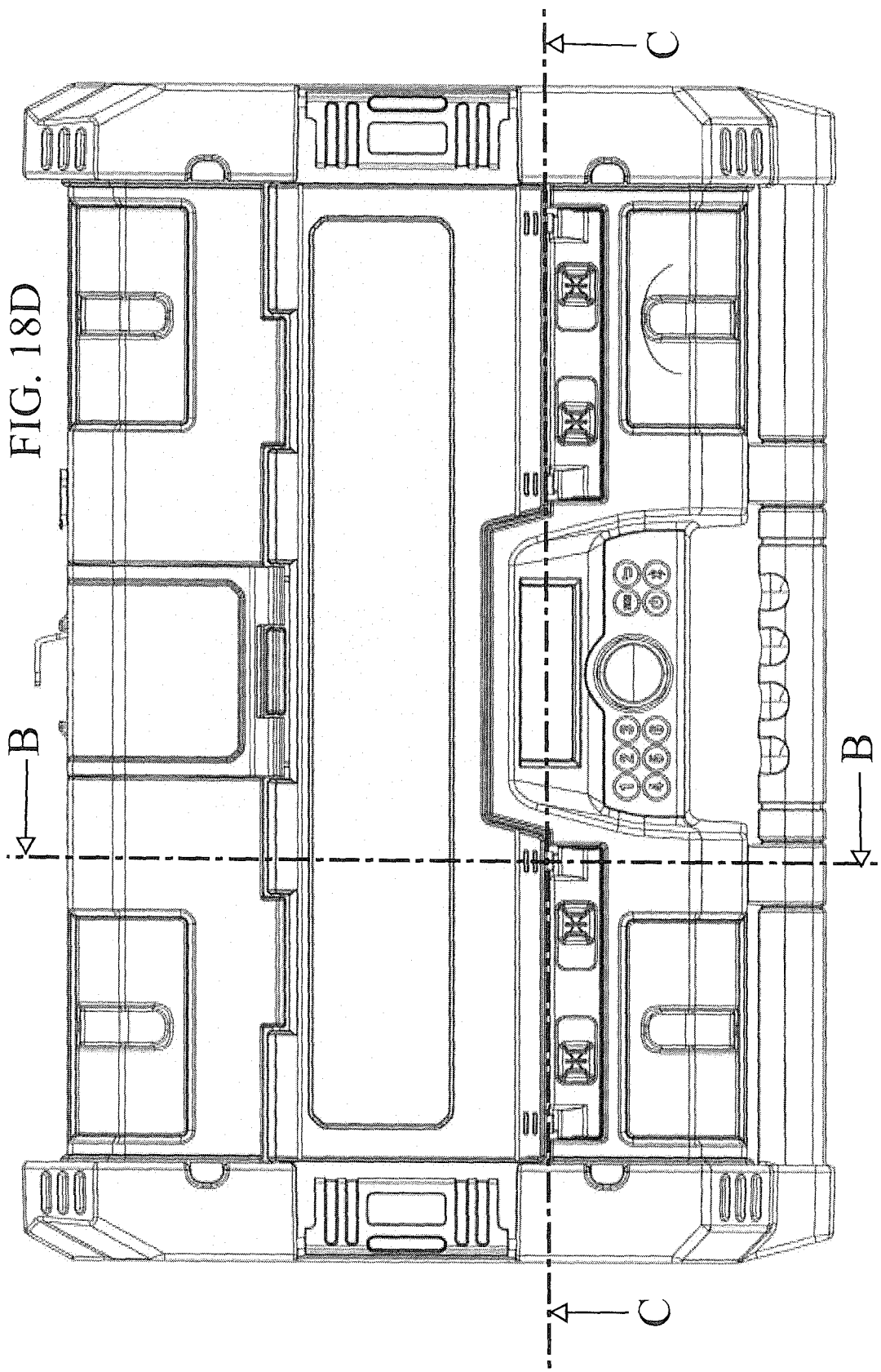

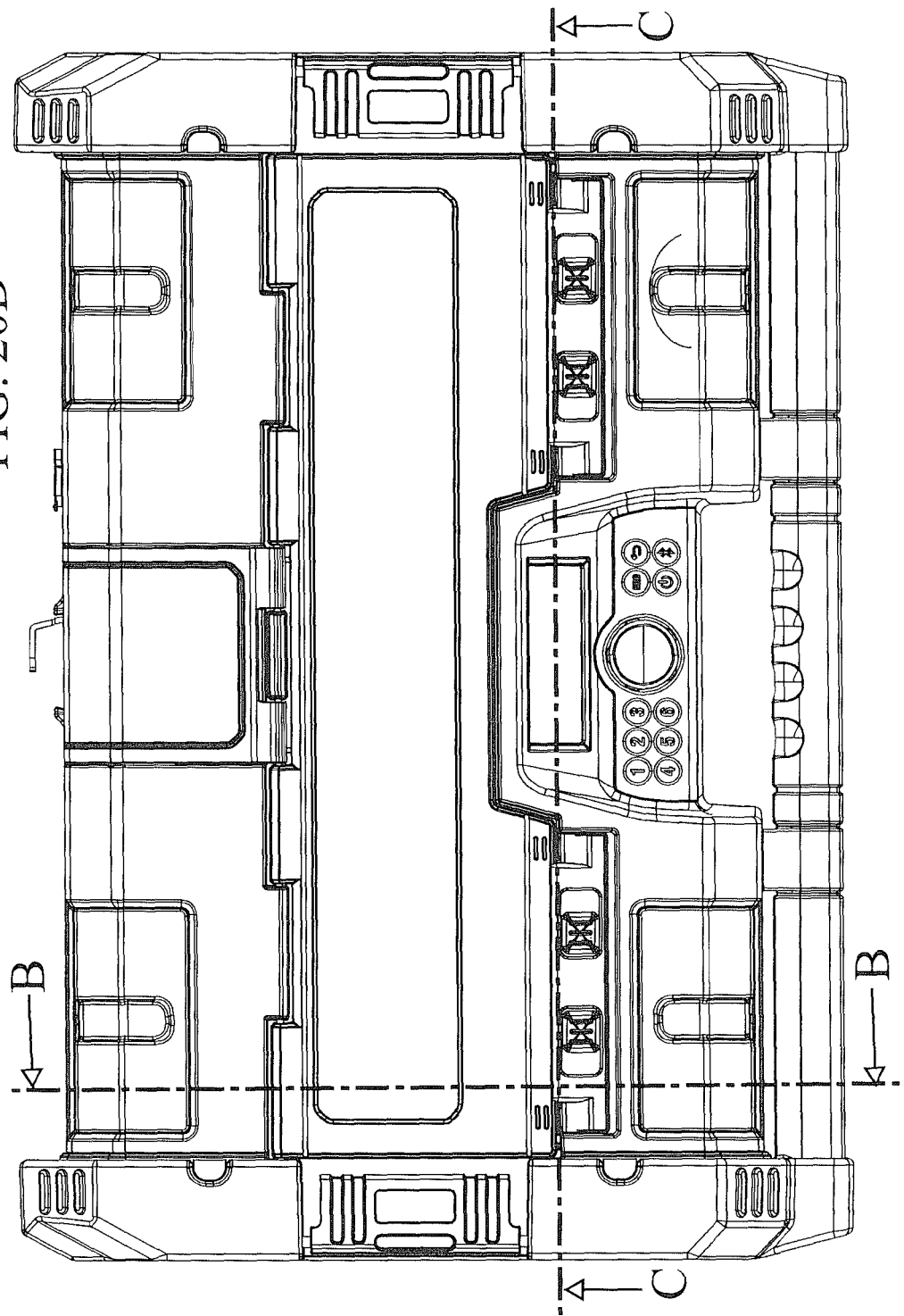

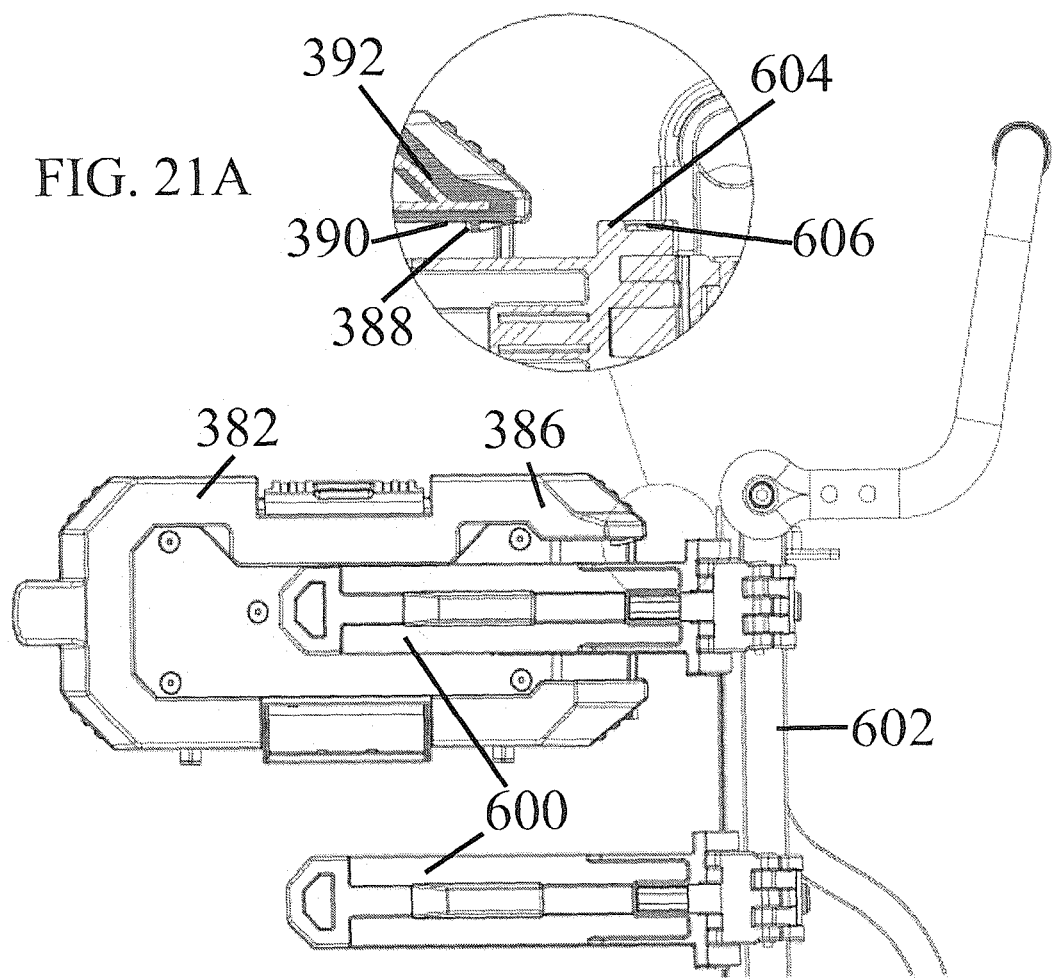

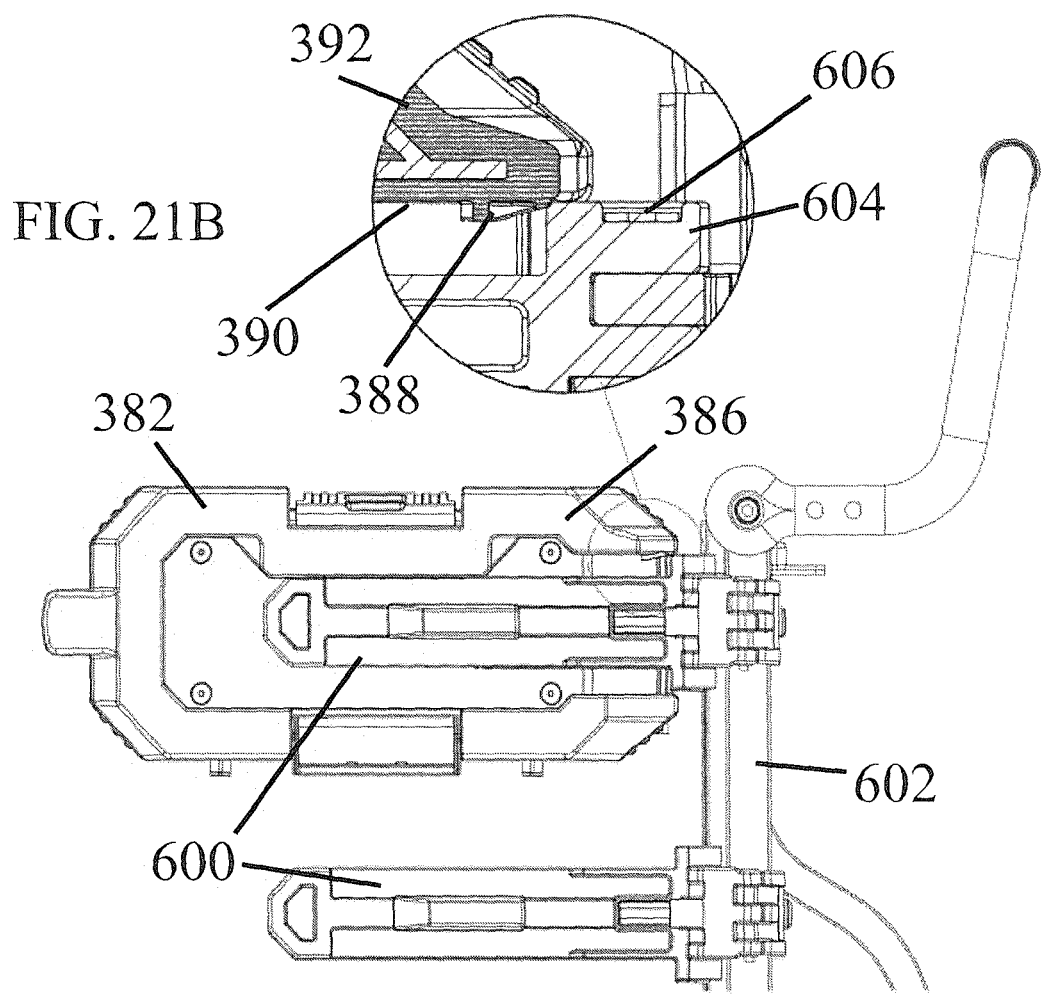

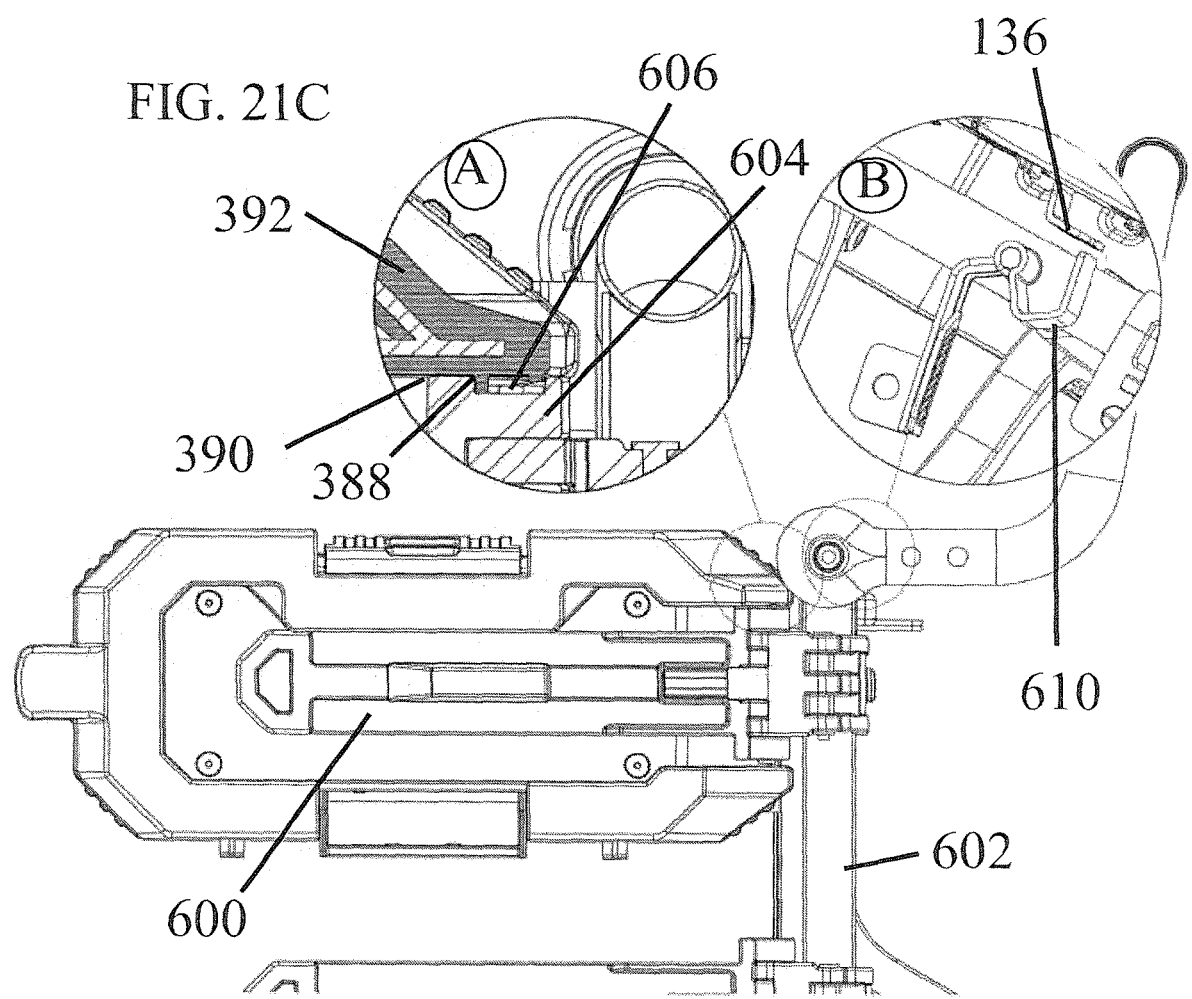

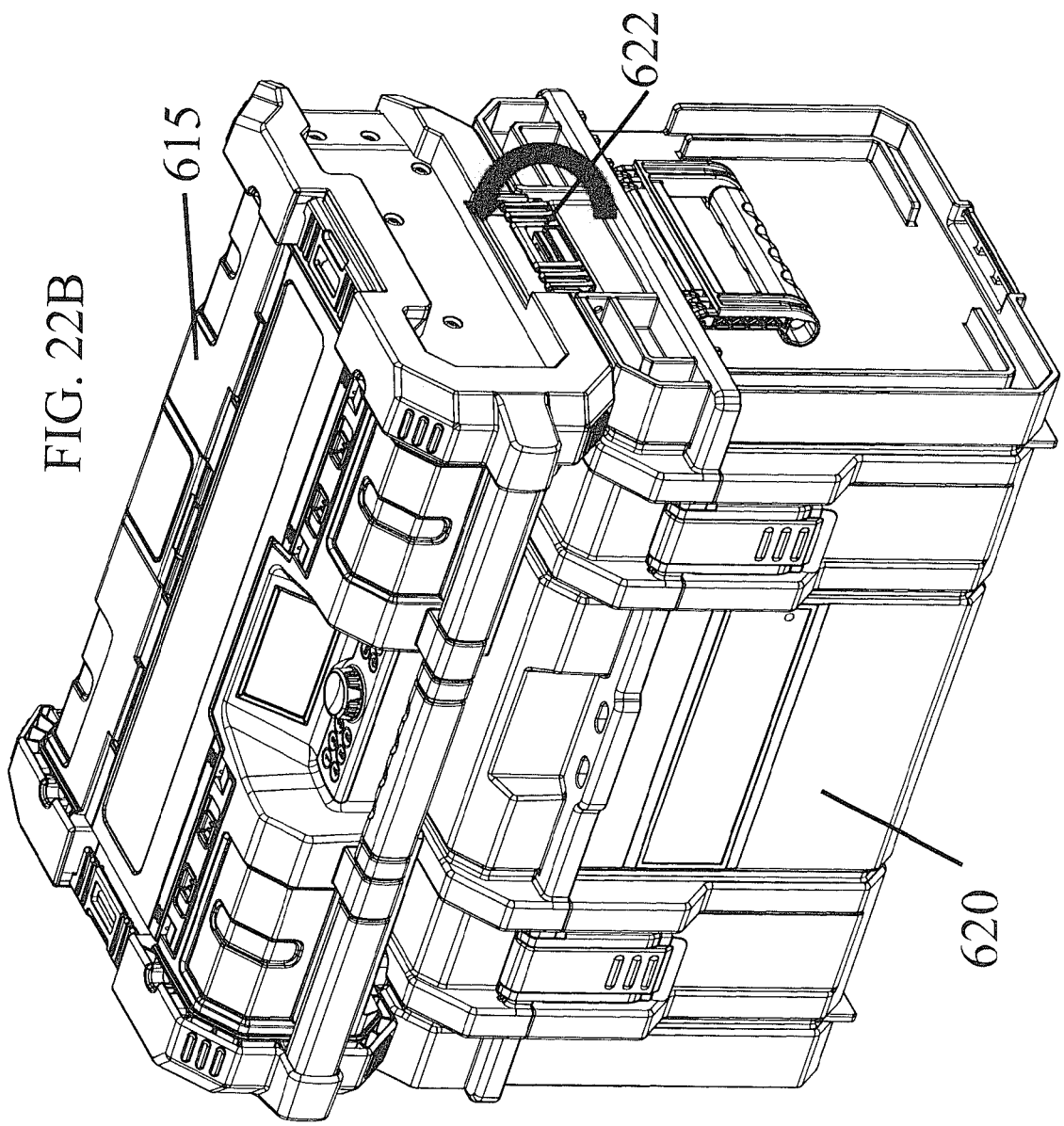

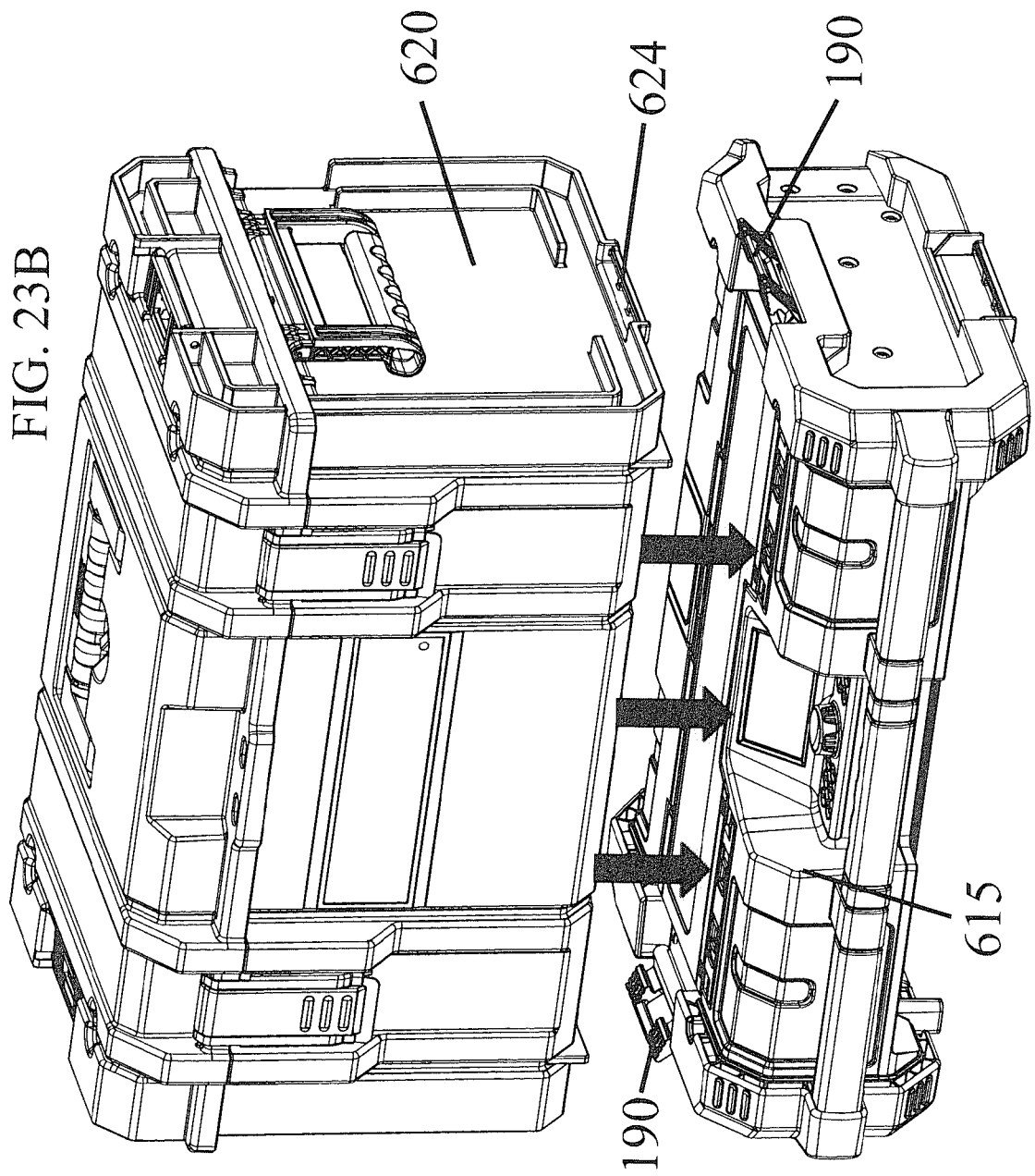

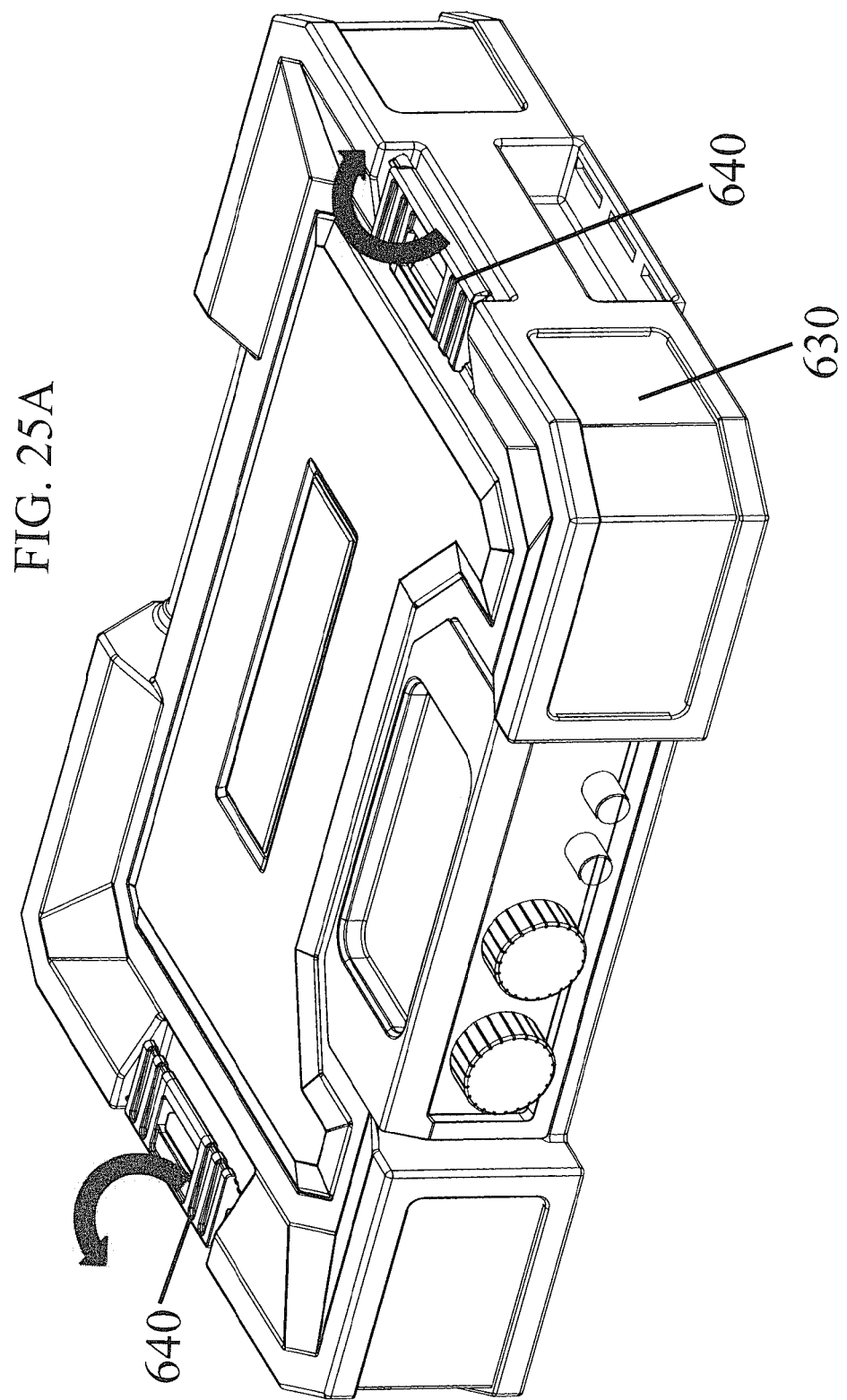

JOBSITE COMMUNICATIONS CENTER

REFERENCE TO RELATED PATENTS

Reference is hereby made to U.S. Pat. No. 8,567,796, entitled Rolling Container Assembly with Adjustable Storage Units, the description of which is hereby incorporated by reference.

This application is a continuation-in-part of U.S. patent application Ser. No. 14/480,113, entitled "ROLLING CONTAINER ASSEMBLY WITH ADJUSTABLE STORAGE UNITS" and filed Sep. 8, 2014, the contents of which are hereby incorporated by reference herein and priority of which is hereby claimed.

FIELD OF THE INVENTION

The present invention relates generally to stackable and/or rollable storage and toolbox systems and to a job site communications center which is stackable and/or otherwise usable therewith.

BACKGROUND OF THE INVENTION

Various types of stackable and rollable storage and toolbox systems are known. Audio play systems, commonly known as "boom boxes" are also known.

SUMMARY OF THE INVENTION

The present invention seeks to provide an improved job site communications center which is suitable for use with stackable and/or rollable storage and/or toolbox systems and to stackable and/or rollable storage and/or toolbox systems including a job site communication center which is stackable or rollable therewith.

The present invention also relates to a rugged sound system and a housing for a sound system, which are adapted for use in demanding environments, such as, for example, jobsites or building sites. Jobsite sound systems or radios are at high risk of being dropped, or of having heavy items such as tools or workpieces dropped onto them. Additionally, jobsite sound systems have to perform well in the open air and in large interior spaces.

One aim of the present invention is to provide high quality sound performance in a jobsite communication center. Another aim of the present invention is to improve the overall impact resistance of a housing for a jobsite communication center while also providing high quality sound performance. It should be understood that although the invention will be described with reference to a jobsite communication center and a housing for a jobsite communication center, the sound system of the present invention and the sound system housing of the present invention may be suitable for use with or to house other devices, for example a sound system which does not include a radio receiver, or a computer system with or without speakers, or another device which it is desirable to take to a jobsite but which requires rugged protection.

Another aim of an embodiment of the present invention is to integrate the jobsite sound system as an element of an integrated tool storage and transport system, such as the TSTAK® and Tough System™ tool storage and transport systems, which are currently manufactured and sold by assignee and/or its affiliates.

A further aim of an embodiment of the present invention is to integrate into the jobsite sound system, which may include the features described hereinabove, a WIFI system which enables communication, via the sound system, with and between workers at various locations, who may not be in a line of sight or shouting distance of each other. Mobile devices of workers may communicate with the WIFI system among themselves as well as with entities remote from the jobsite. A foreman or team leader may employ the WIFI system to manage the work of members of a work team.

An additional aim of an embodiment of the present invention is to integrate into a jobsite sound system, which may include the features described hereinabove, an Internet of Things (TOT) module, which enables remote monitoring of functioning of tools and activity of workers. Such monitoring may include, for example, proper functioning of tools, duty cycle of tool usage, tool wear and charge status.

There is thus provided in accordance with a preferred embodiment of the present invention a jobsite communications center including a communications module including an electrical power source, at least one speaker and at least one antenna and a toolbox-like housing for enclosing the communications module and having a handle and first and second connection functionalities, the first connection functionality enabling readily-disconnectable and reconnectable stacking interconnection of the communications center with tool boxes, the second connection functionality enabling readily-disconnectable and reconnectable mounting of the communication center on a toolbox-carrying cart in a manner similar to connection of toolboxes thereto.

There is also provided in accordance with another preferred embodiment of the present invention a jobsite communications center including a communications module including an electrical power source, at least one speaker and at least one antenna, the communications module including two-way wireless communication functionality and a housing enclosing the communications module and having a handle, the antenna being embedded in the handle.

There is further provided in accordance with yet another preferred embodiment of the present invention a jobsite communications center including a communications module including an electrical power source, at least one speaker and at least one antenna, the communications module including two-way wireless communication functionality and a toolbox-like housing for enclosing the communications module and having a handle, the antenna being embedded in the housing.

There is even further provided in accordance with still another preferred embodiment of the present invention a jobsite communications center including a communications module including an electrical power source, at least one speaker and at least one antenna and a housing for enclosing the communications module and having a handle, and connection elements enabling the housing to be removably attached to and transported together with toolboxes.

Preferably, the housing includes a toolbox-like housing.

In accordance with a preferred embodiment of the present invention the at least one antenna is located in a portion of the housing. Preferably, at least one of the at least one antenna is located in the handle.

In accordance with a preferred embodiment of the present invention the first connection functionality includes a pair of manually actuable clamps for selectable attachment of the housing to a toolbox stacked thereabove. Additionally or alternatively, the second connection functionality includes a pair of bracket receiving side portions for selectable attachment of the housing to the toolbox-carrying cart. Additionally, the second connection functionality also includes a pair of resilient engagement elements operative to engage a corresponding pair of brackets forming part of the housing to the toolbox-carrying cart.

In accordance with a preferred embodiment of the present invention the second connection functionality enables the jobsite communications center to be mounted onto the toolbox-carrying cart interchangeably with a toolbox. Additionally or alternatively, the second connection functionality enables the jobsite communications center to be mounted onto the toolbox-carrying cart in additional to at least one toolbox.

Preferably, the first connection functionality includes a pair of connection elements for selectable attachment of the housing to a toolbox stacked therebelow, which toolbox has a pair of manually actuable latches for connecting to the connection elements.

In accordance with a preferred embodiment of the present invention the communications module includes a radio receiver. Additionally or alternatively, the communications module includes a WI-FI hotspot module. Additionally or alternatively, the communications module includes a wireless router.

Preferably, the communications module includes a BLUETOOTH® module. Additionally or alternatively, the communications module includes a video communication module. Additionally, the video communication module provides video communication both to and from a jobsite to a remote location. Additionally or alternatively, the video communication module provides audio-video communication both to and from a jobsite via at least one smartphone.

In accordance with a preferred embodiment of the present invention the communications module includes a projector operative to project an image onto a region of a jobsite. Additionally or alternatively, the communications module includes a camera for imaging a region of a jobsite and a wireless communication module for transmitting an image from the camera to a remote location.

Preferably, the communications module includes an image overlay module for overlaying an image taken at a jobsite with another image and an image comparison module for indicating differences between the image taken at a jobsite and the another image.

In accordance with a preferred embodiment of the present invention the communications module includes a holographic lens module. Additionally or alternatively, the communications module includes a lighting module. Additionally, the lighting module includes at least one of ambient light and directable lighting.

Preferably, the jobsite communications center also includes at least one of an oxygen source, a compressor, a welder and a dust extractor. Additionally or alternatively, the jobsite communications center also includes at least one of a refrigerated compartment and a microwave oven.

In accordance with a preferred embodiment of the present invention the jobsite communications center also includes at least one of an intrusion alarm module and a tampering alarm module. Additionally, the at least one of an intrusion alarm module and a tampering alarm module has at least one of a wireless remote reporting module and a management module.

Preferably, the communications module includes a visually sensible display. Additionally or alternatively, the communications module interfaces with a smart phone.

In accordance with a preferred embodiment of the present invention the communications module includes a remotely controllable 360 degree camera. Preferably, the communications module includes a printer. Additionally or alternatively, the communications module includes an augmented-reality module.

In accordance with a preferred embodiment of the present invention the communications module includes an intercom module. Additionally, the intercom module is operative to enable intercom communications among multiple smartphones via the communications module.

Preferably, the communications module includes a 3D printer to enable on-site fabrication of elements based on data received via the communications module. Additionally or alternatively, the communications module includes a 3D scanner.

In accordance with a preferred embodiment of the present invention the communications module includes a tool tracking module. Additionally or alternatively, the communications module includes a tool use monitoring module.

Preferably, the communications module includes a tool wear monitoring module. Additionally or alternatively, the communications module includes a tool battery charge state tracking module.

In accordance with a preferred embodiment of the present invention the communications module includes an environmental hazard sensing module. Additionally, the environmental hazard sensing module includes sensors for at least one of fire, smoke, dangerous chemicals, biohazards, weather hazards and earthquakes.

Preferably, the communication module includes at least one sensor interface.

In accordance with a preferred embodiment of the present invention the jobsite communications center also including a wireless battery charging module. Preferably, the communication module includes a calendar module including an active reminder module.

In accordance with a preferred embodiment of the present invention the at least one speaker is wirelessly connected to the jobsite communication center. Additionally or alternatively, the communication module includes a message transmission module.

Preferably, the communication module includes a wireless remote communicator enabling it to communicate with a wireless remote communicator in another jobsite communication center located remotely therefrom. Additionally or alternatively, the communication module includes a communicator enabling it to communicate with and via the cloud.

In accordance with a preferred embodiment of the present invention the housing includes a main shell and at least one side panel, and the at least one side panel partially overlaps an area of the main shell and each of the at least one side panel includes a plate and at least one bumper, the plate being relatively rigid and the bumper being relatively resilient, and the plate is connected to the main shell in the area of overlap and the bumper protrudes beyond one or more planar surfaces of the housing. Additionally, the main shell includes a top shell and a bottom shell. Preferably, at least one of the bumpers is overmolded onto the corresponding plate.

In accordance with a preferred embodiment of the present invention the overmolding process is carried out as a two step process after the molding of the plate in the same injection molding machine. Alternatively, the overmolding process is carried out as a separate process on a batch of pre-made plates in a different machine.

In accordance with a preferred embodiment of the present invention the housing has six main faces in a substantially cuboid arrangement. Additionally, the at least one side panel includes two side panels, the two side panels partially overlapping areas of the main shell which are located on opposite main faces of the housing. Alternatively, the at least one side panel includes more than two side panels.

In accordance with a preferred embodiment of the present invention the at least one side panel is connected to the main shell via the plate.

In accordance with a preferred embodiment of the present invention the plate is connected to the main shell in the area of overlap by one or more screws, each screw passing through a screw hole in the plate. Preferably, the screw holes in the plate are each provided with a resilient gasket. Additionally, the resilient gaskets are overmolded onto the corresponding plate. Preferably, the resilient gaskets are overmolded in the same molding shot as the resilient bumper on the same plate.

In accordance with a preferred embodiment of the present invention each side panel includes one bumper. Alternatively, at least one of the at least one side panels includes two or more separate bumpers. Additionally, the two or more separate bumpers may be provided at different positions.

Preferably, the handle is attached to the main shell, and the handle includes a recess adapted to contain the at least one antenna.

In accordance with a preferred embodiment of the present invention the housing includes an enclosure adapted to contain the at least one antenna, the enclosure being located between one of the one or more plates and the main shell in the area of overlap.

In accordance with a preferred embodiment of the present invention the housing provides accommodation for a sound system including at least one sound input means, up to six speakers and means for powering the speakers and the housing also includes cover means for each speaker located therein. Additionally or alternatively, the housing is integratable into a storage system by means of adaptation to be stackable or adaptation to be supported on a storage rack. Additionally, the sound input means is a radio receiver.

Preferably, the housing includes one or more latches, one or more latch receiving structures, and one or more rack attachment structures. In accordance with a preferred embodiment of the present invention the jobsite communications center includes a rear attachment point for securing to a rack.

In accordance with a preferred embodiment of the present invention the jobsite communications center also includes sound system electronics located within the housing and WIFI electronics coupled to the sound system electronics and located within the housing. Additionally, the jobsite communications center also includes Internet of Things (JOT) electronics for communication with IOT components of tools via the WIFI electronics. Additionally or alternatively, the WIFI electronics enables communication with a monitoring site remote from the sound system.

In accordance with a preferred embodiment of the present invention the housing includes a sound system including at least six speakers housed therein, at least one of the at least six speakers is an active subwoofer and at least one of the at least six speakers is a passive subwoofer.

Preferably, the housing includes a top face, a bottom face opposite to the top face and at least one side face, the housing having a central axis passing through the centre point of the top face and the centre point of the bottom face. Additionally, a central axis of the active subwoofer and a central axis of the passive subwoofer are parallel to each other. Additionally, both the active subwoofer and the passive subwoofer face the bottom surface of the housing and the central axis of the active subwoofer and the passive subwoofer are parallel to the central axis of the housing.

In accordance with a preferred embodiment of the present invention the subwoofers face downwards.

Preferably, the jobsite communications center is supported on a surface. Additionally, the surface is a floor surface. Alternatively, the jobsite communications center is suspended above a floor surface by support means.

In accordance with a preferred embodiment of the present invention a speaker cover is attached to the outside of the housing, the speaker cover including a first convex region facing the housing, the first convex region having a central axis collinear with the central axis of the active subwoofer, and a second convex region facing the housing, the second convex region having a central axis collinear with the central axis of the passive subwoofer, the speaker cover further including at least one grill region.

In accordance with a preferred embodiment of the present invention at least four of the at least six speakers include tweeter units. Preferably, four of the at least six speakers are tweeter units. Additionally or alternatively, each of the tweeter units are located near the top face of the housing. Additionally or alternatively, each of the tweeter units are adjacent to the top face of the housing.

Preferably, the central axis of each tweeter unit is at a diverging angle to the central axis of the housing. It is appreciated that this arrangement may help to project sound from the speaker units evenly over a wide area, to improve overall sound distribution.

In accordance with a preferred embodiment of the present invention the housing includes at least one external handle suitable for carrying the sound system, the at least one external handle being located on one of the at least one side faces of the housing. Additionally or alternatively, the housing includes connection means to permit the housing to be mounted onto a rack or dolly.

Preferably, the housing includes a range of attachment points for support means. Additionally, the support means are wall-mounted. Alternatively, the support means are portable.

In accordance with a preferred embodiment of the present invention the housing includes a portable housing.

In accordance with a preferred embodiment of the present invention the jobsite communications center also includes a cover assembly including a pair of latch assemblies. Additionally, each of the latch assemblies includes two slidable latch elements and a spring urging the latch elements towards a locked orientation. Additionally or alternatively, the cover assembly includes a water-resistant seal, the water-resistant seal acting as a spring to urge the cover assembly into an open orientation when it is unlatched.

There is also provided in accordance with another preferred embodiment of the present invention a toolbox system including at least one toolbox having a footprint and a jobsite communications center having a footprint at least similar to the footprint of the at least one toolbox, the at least one toolbox and the jobsite communication center having mutual attachment elements enabling the jobsite communications center and the at least one toolbox to be removably attached to each other and transported together.

There is yet further provided in accordance with still another preferred embodiment of the present invention a toolbox system including a toolbox cart, at least one toolbox having a footprint and a jobsite communications center having a footprint at least similar to the footprint of the at least one toolbox, the toolbox cart, the at least one toolbox and the jobsite communication center having mutual attachment elements enabling the jobsite communications center and the at least one toolbox to be removably attached to the cart and transported together.

Preferably, the jobsite communications center includes a housing, the housing including a main shell and at least one side panel, the at least one side panel partially overlapping an area of the main shell, each of the at least one side panels including a plate and at least one bumper, the plate being relatively rigid and the bumper being relatively resilient and the plate is connected to the main shell in the area of overlap and the bumper protrudes beyond one or more planar surfaces of the housing. Preferably, at least one of the bumpers is overmolded onto the corresponding plate.

In accordance with a preferred embodiment of the present invention the housing has six main faces in a substantially cuboid arrangement. Additionally, the at least one side panel includes two side panels, the two side panels partially overlapping areas of the main shell which are located on opposite main faces of the housing. Alternatively, the at least one side panel includes more than two side panels.

In accordance with a preferred embodiment of the present invention the plate is connected to the main shell in the area of overlap by one or more screws, each screw passing through a screw hole in the plate. Preferably, the screw holes in the plate are each provided with a resilient gasket. Additionally, the resilient gaskets are overmolded onto the corresponding plate.

In accordance with a preferred embodiment of the present invention each side panel includes one bumper. Alternatively, at least one of the at least one side panels includes two or more separate bumpers.

Preferably, the housing includes a handle attached to the main shell; and the handle includes a hollow adapted to contain at least one antenna. Additionally or alternatively, the housing includes an enclosure for at least one antenna, the enclosure being located in-between one of the one or more plates and the main shell in the area of overlap.

In accordance with a preferred embodiment of the present invention the housing provides accommodation for a sound system including at least one sound input means, up to six speakers and means for powering the speakers and the housing also includes cover means for each speaker located therein. Additionally or alternatively, the housing is integratable into a storage system by means of adaptation to be stackable or adaptation to be supported on a storage rack.

Preferably, the housing includes one or more latches, one or more latch receiving structures, and one or more rack attachment structures. In accordance with a preferred embodiment of the present invention the jobsite communications center includes a rear attachment point for securing to a rack.

In accordance with a preferred embodiment of the present invention the toolbox system also includes sound system electronics located within the housing and WIFI electronics coupled to the sound system electronics and located within the housing. Additionally, the toolbox system also includes Internet Of Things (IOT) electronics for communication with IOT components of tools via the WIFI electronics. Additionally or alternatively, the WIFI electronics enables communication with a monitoring site remote from the sound system.

In accordance with a preferred embodiment of the present invention the housing includes a sound system including at least six speakers housed therein, at least one of the at least six speakers is an active subwoofer and at least one of the at least six speakers is a passive subwoofer.

Preferably, the housing includes a top face, a bottom face opposite to the top face and at least one side face, the housing having a central axis passing through the centre point of the top face and the centre point of the bottom face. Additionally, a central axis of the active subwoofer and a central axis of the passive subwoofer are parallel to each other. Additionally, both the active subwoofer and the passive subwoofer face the bottom surface of the housing and the central axis of the active subwoofer and the passive subwoofer are parallel to the central axis of the housing.

In accordance with a preferred embodiment of the present invention a speaker cover is attached to the outside of the housing, the speaker cover including a first convex region facing the housing, the first convex region having a central axis collinear with the central axis of the active subwoofer, and a second convex region facing the housing, the second convex region having a central axis collinear with the central axis of the passive subwoofer, the speaker cover further including at least one grill region.

In accordance with a preferred embodiment of the present invention at least four of the at least six speakers include tweeter units. Preferably, four of the at least six speakers are tweeter units. Additionally or alternatively, each of the tweeter units are located near the top face of the housing. Additionally or alternatively, each of the tweeter units are adjacent to the top face of the housing.

Preferably, the central axis of each tweeter unit is at a diverging angle to the central axis of the housing.

In accordance with a preferred embodiment of the present invention the housing includes at least one external handle suitable for carrying the sound system, the at least one external handle being located on one of the at least one side faces of the housing. Additionally or alternatively, the housing includes connection means to permit the housing to be mounted onto a rack.

In accordance with a preferred embodiment of the present invention the housing includes a portable housing.

In accordance with a preferred embodiment of the present invention the jobsite communications center includes a cover assembly including a pair of latch assemblies. Additionally, each of the latch assemblies includes two slidable latch elements and a spring urging the latch elements towards a locked orientation. Additionally or alternatively, the cover assembly includes a water-resistant seal, the water-resistant seal acting as a spring to urge the cover assembly into an open orientation when it is unlatched.

BRIEF DESCRIPTION OF THE DRAWINGS

The present invention will be understood and appreciated more fully from the following detailed description, taken in conjunction with the drawings in which:

FIGS. 5A, 5B, 5C, 5D, 5E, 5F, 5G and 5H are respective simplified front/top view pictorial; back/top view pictorial, front/bottom view pictorial, back/bottom view pictorial, top planar view, bottom planar view, right side planar view and left side planar view illustrations of a main assembly housing element, forming part of the main assembly of FIGS. 3A-4;

FIGS. 6A, 6B, 6C, 6D, 6E, 6F, 6G and 6H are respective simplified front/top view pictorial; back/top view pictorial, front/bottom view pictorial, back/bottom view pictorial, top planar view, bottom planar view, right side planar view and left side planar view illustrations of a base element, forming part of the job site communications center of FIGS. 1A-2;

FIGS. 7A, 7B, 7C, 7D, 7E, 7F, 7G and 7H are respective simplified front/top view pictorial; back/top view pictorial, front/bottom view pictorial, back/bottom view pictorial, top planar view, bottom planar view, right side planar view and left side planar view illustrations of a bottom element, forming part of the job site communications center of FIGS. 1A-2;

FIGS. 9A, 9B, 9C, 9D, 9E, 9F, 9G and 9H are respective simplified front/top view pictorial; back/top view pictorial, front/bottom view pictorial, back/bottom view pictorial, top planar view, bottom planar view, right side planar view and left side planar view illustrations of a right side bumper, forming part of the job site communications center of FIGS. 1A-2;

FIGS. 10A, 10B, 10C, 10D, 10E, 10F, 10G and 10H are respective simplified front/top view pictorial; back/top view pictorial, front/bottom view pictorial, back/bottom view pictorial, top planar view, bottom planar view, right side planar view and left side planar view illustrations of a left side bracket engaging element, forming part of the job site communications center of FIGS. 1A-2;

FIGS. 12A, 12B, 12C, 12D, 12E, 12F, 12G and 12H are respective simplified front/top view pictorial; back/top view pictorial, front/bottom view pictorial, back/bottom view pictorial, top planar view, bottom planar view, right side planar view and left side planar view illustrations of a latchable pivotable top cover assembly, forming part of the job site communications center of FIGS. 1A-2;

FIGS. 13A, 13B, 13C, 13D, 13E, 13F, 13G and 13H are respective simplified front/top view pictorial; back/top view pictorial, front/bottom view pictorial, back/bottom view pictorial, top planar view, bottom planar view, right side planar view and left side planar view exploded view illustrations of the latchable pivotable top cover assembly of FIGS. 12A-12H;

FIGS. 15A, 15B, 15C, 15D, 15E, 15F, 15G and 15H are respective simplified front/top view pictorial; back/top view pictorial, front/bottom view pictorial, back/bottom view pictorial, top planar view, bottom planar view, right side planar view and left side planar view illustrations of a latchable, pivotable battery charging receptacle cover, forming part of the job site communications center of FIGS. 1A-2;

FIGS. 18A, 18B, 18C and 18D are respective simplified front/top view pictorial; side-facing sectional, rearward-facing sectional and top planar view illustrations of the latchable pivotable top cover assembly of FIGS. 12A-12H in a cover partially-lowered, unlatched operative orientation, FIGS. 18B and 18C being taken along lines B-B and C-C in FIG. 18D;

FIGS. 20A, 20B, 20C and 20D are respective simplified front/top view pictorial; side-facing sectional, rearward-facing sectional and top planar view illustrations of the latchable pivotable top cover assembly of FIGS. 12A-12H in a cover-lowered, unlatched operative orientation, FIGS. 20B and 20C being taken along lines B-B and C-C in FIG. 20D;

FIGS. 21A, 21B, 21C and 21D are simplified pictorial illustrations illustrating stages in mounting of the job site communications center of FIGS. 1A-20D onto a rollable container carrier;

FIGS. 22A and 22B are simplified pictorial illustrations illustrating stages in stackable and lockable mounting of the job site communications center of FIGS. 1A-20D onto a tool box in accordance with one embodiment of the present invention;

FIGS. 23A, 23B and 23C are simplified pictorial illustrations illustrating stages in stackable and lockable mounting of a tool box onto the job site communications center of FIGS. 1A-20D in accordance with one embodiment of the present invention;

FIGS. 25A, 25B and 25C are simplified pictorial illustrations illustrating stages in stackable and lockable mounting of a tool box onto a job site communications center in accordance with another embodiment of the present invention;

DETAILED DESCRIPTION OF PREFERRED EMBODIMENTS

Figure 1A:
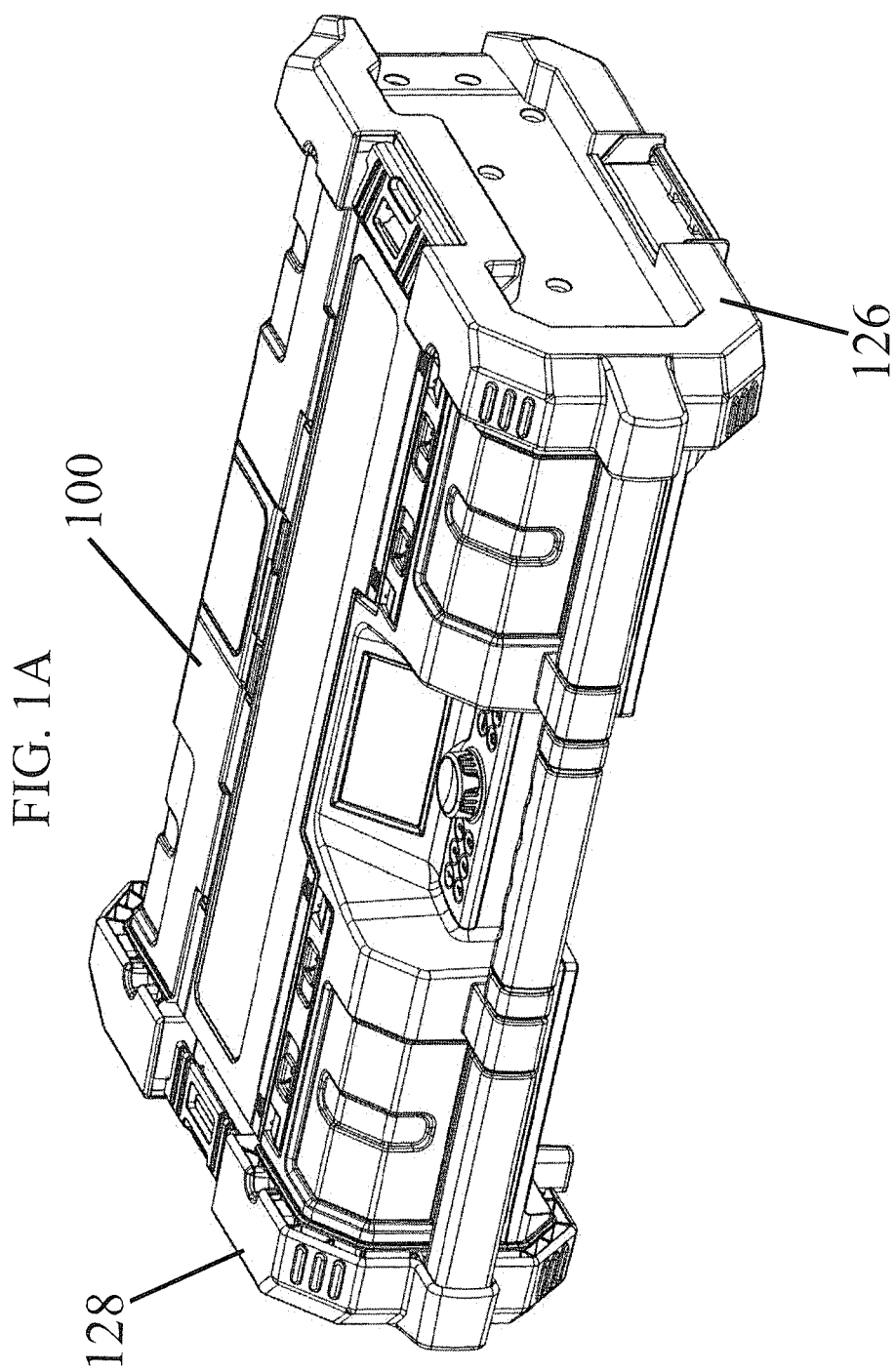
FIGS. 1A, 1B, 1C, 1D, 1E, 1F, 1G and 1H are respective simplified front/top view pictorial; back/top view pictorial, front/bottom view pictorial, back/bottom view pictorial, top planar view, bottom planar view, right side planar view and left side planar view illustrations of a job site communications center constructed and operative in accordance with a preferred embodiment of the present invention.
Figure 1B:
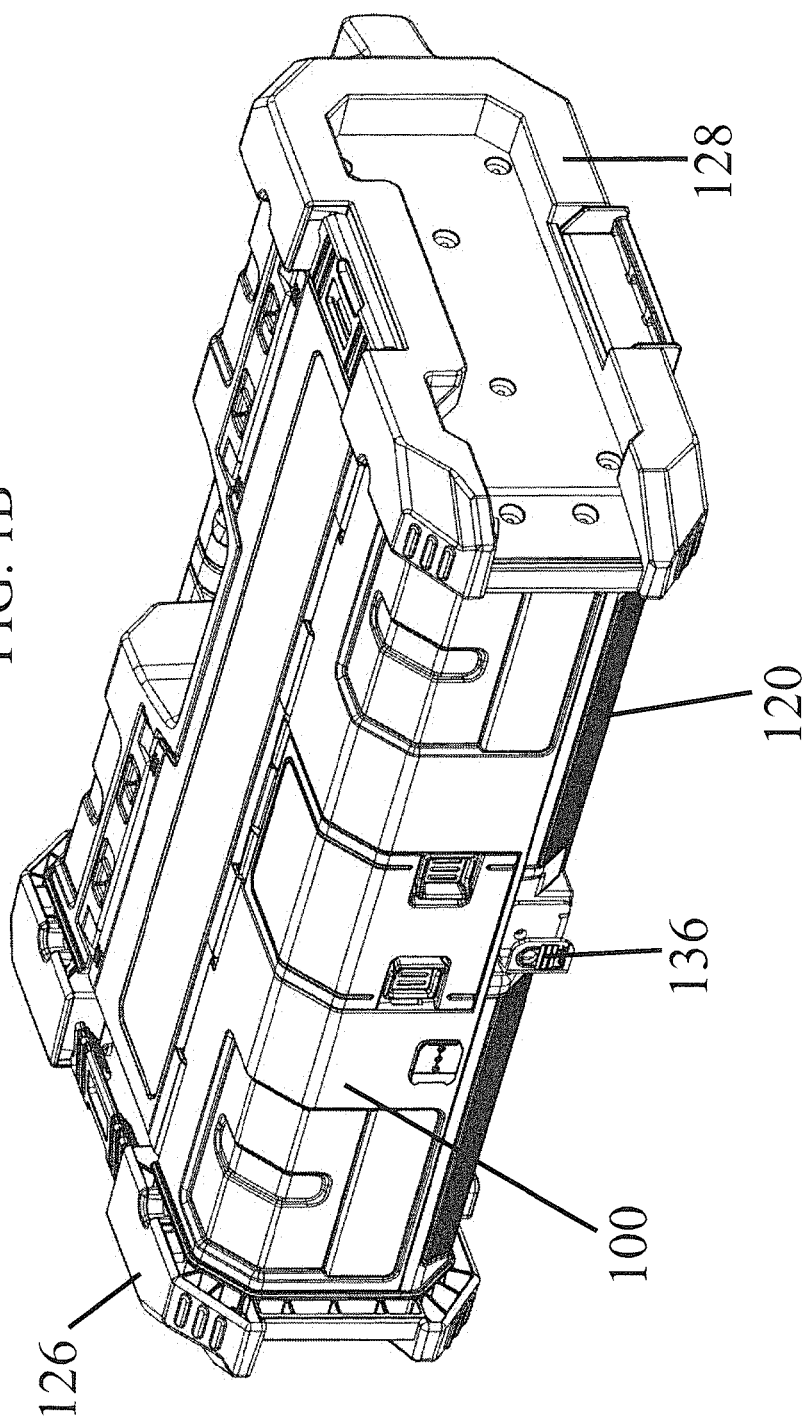
Figure 1C:
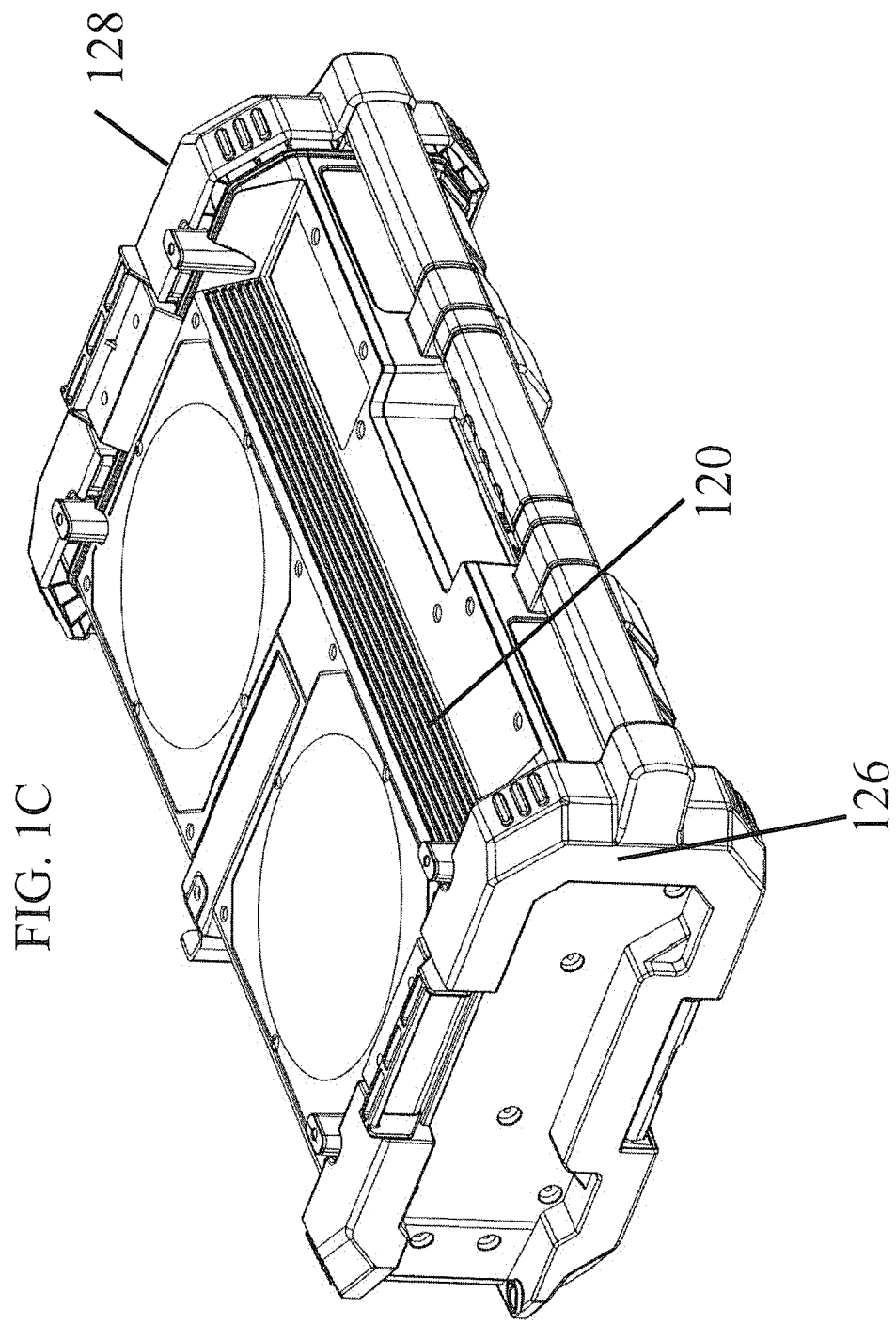
Figure 1D:
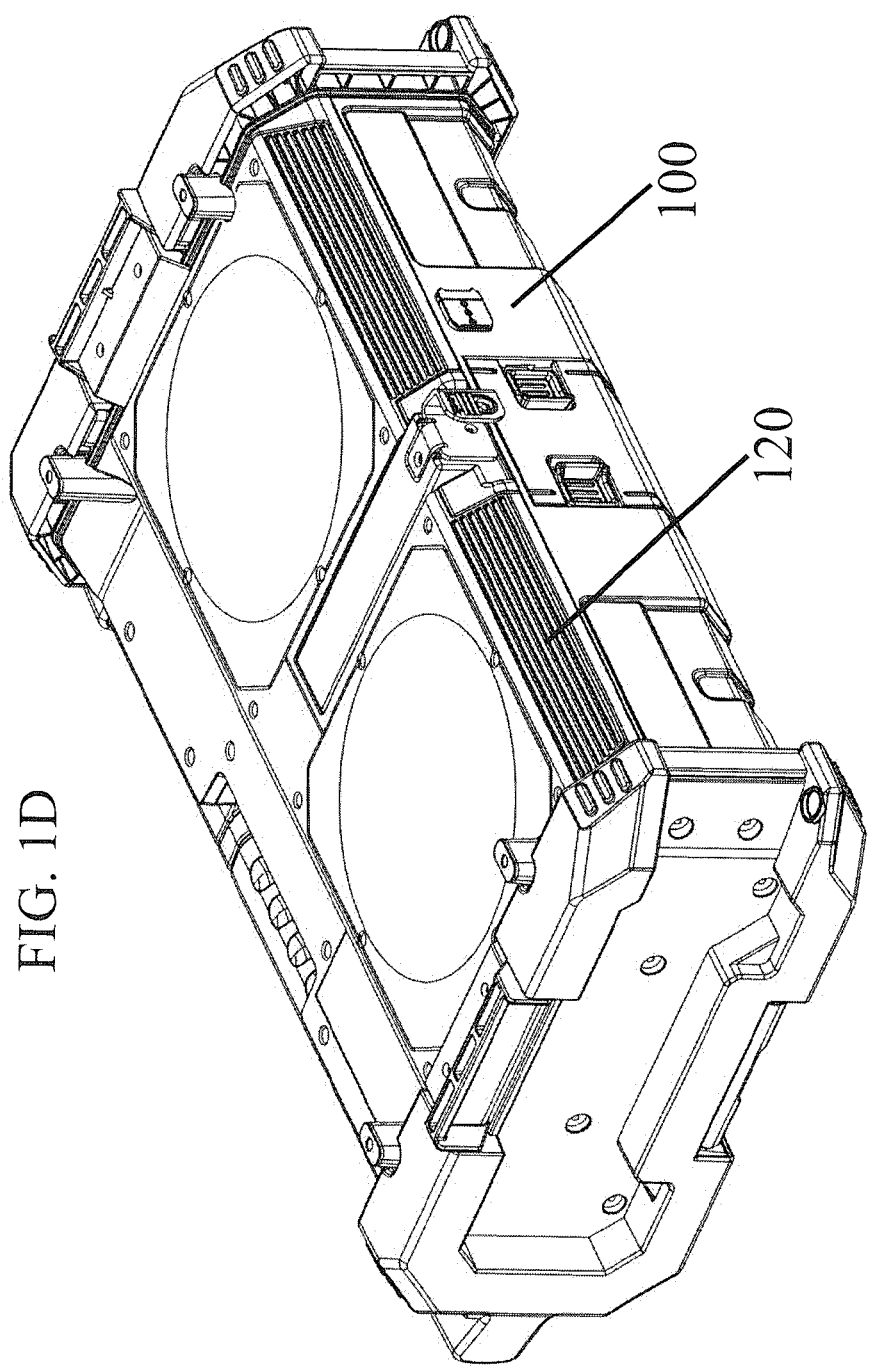
Figure 1E:
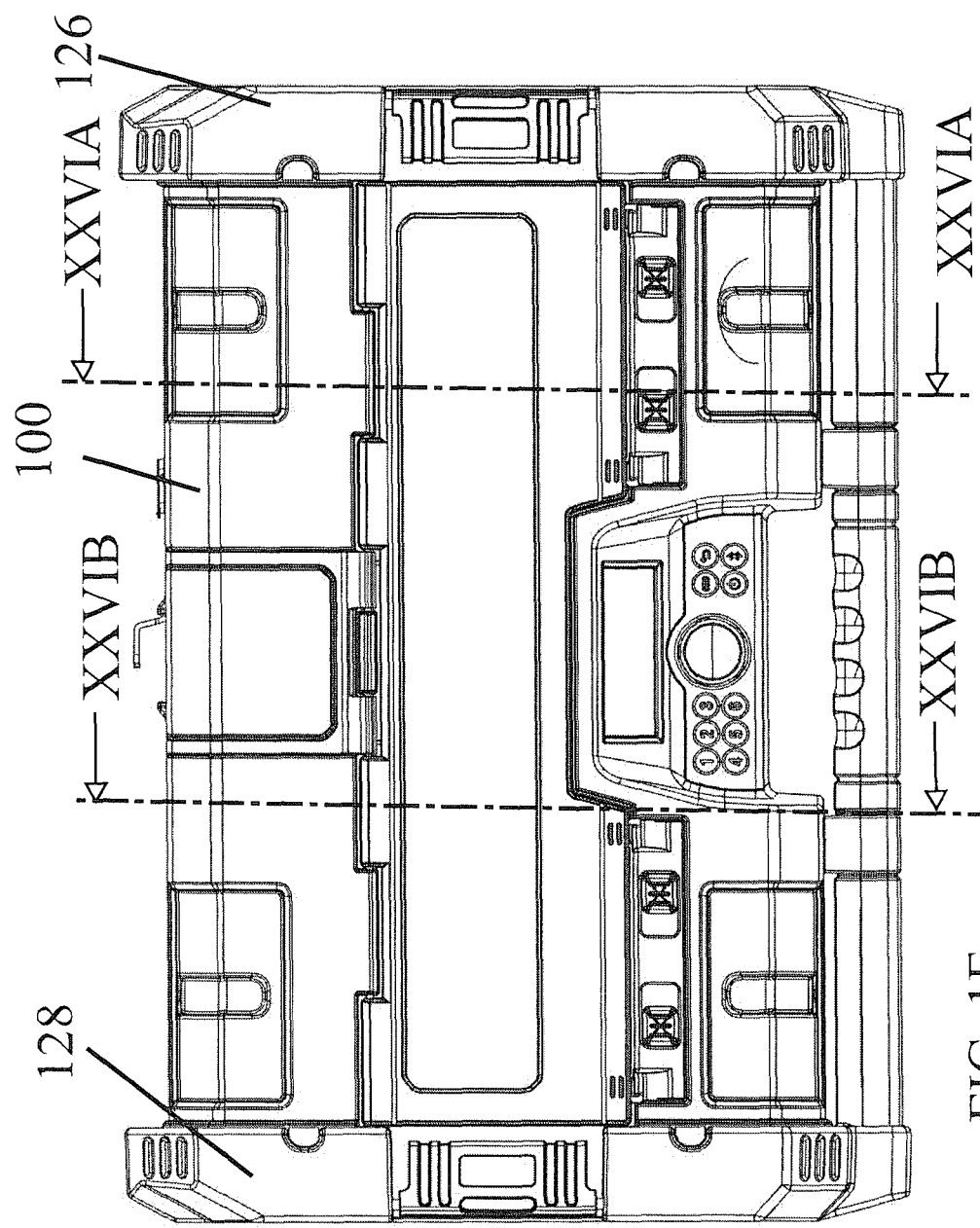
Figure 1F:
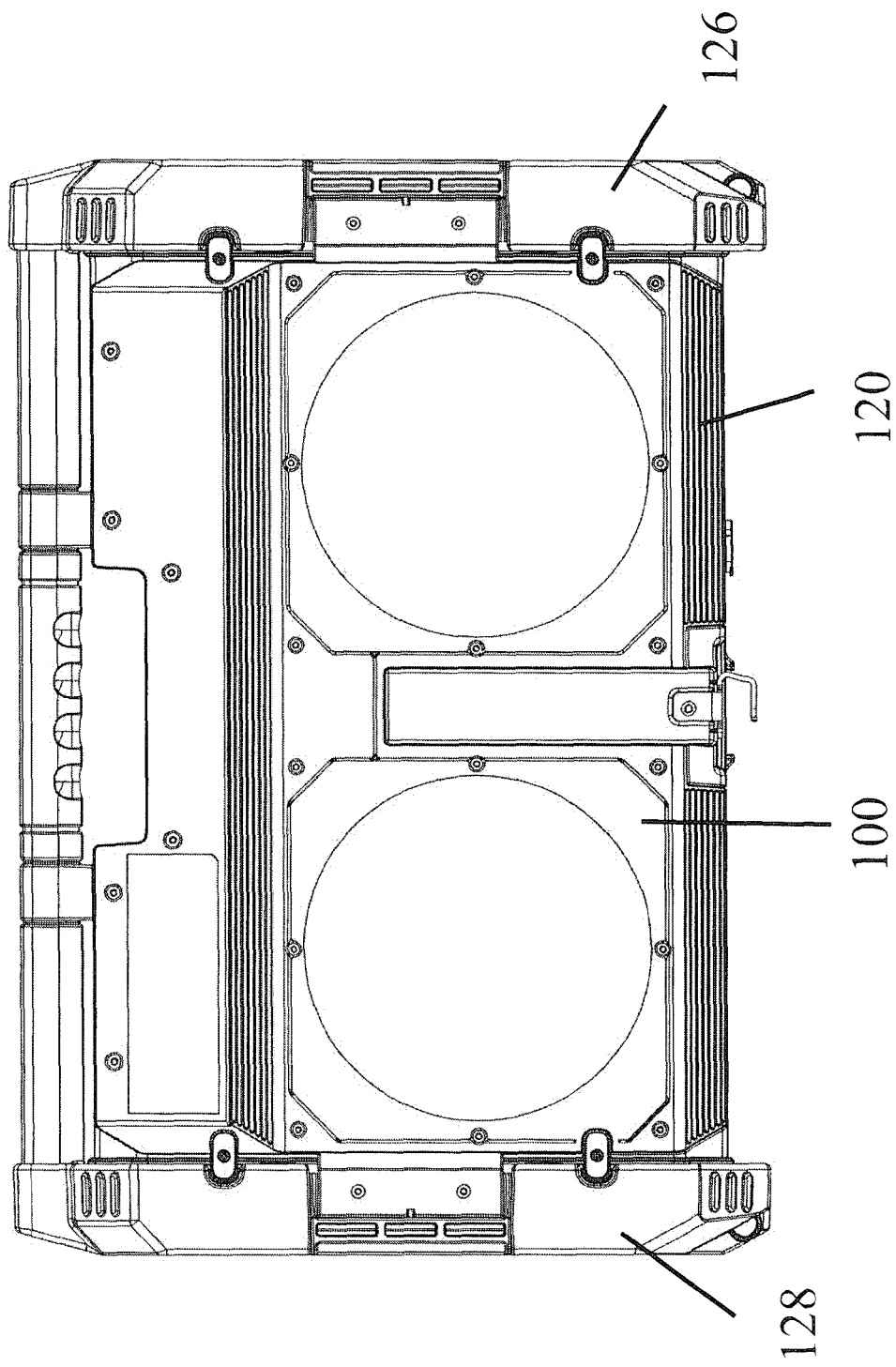
Figure 1G:
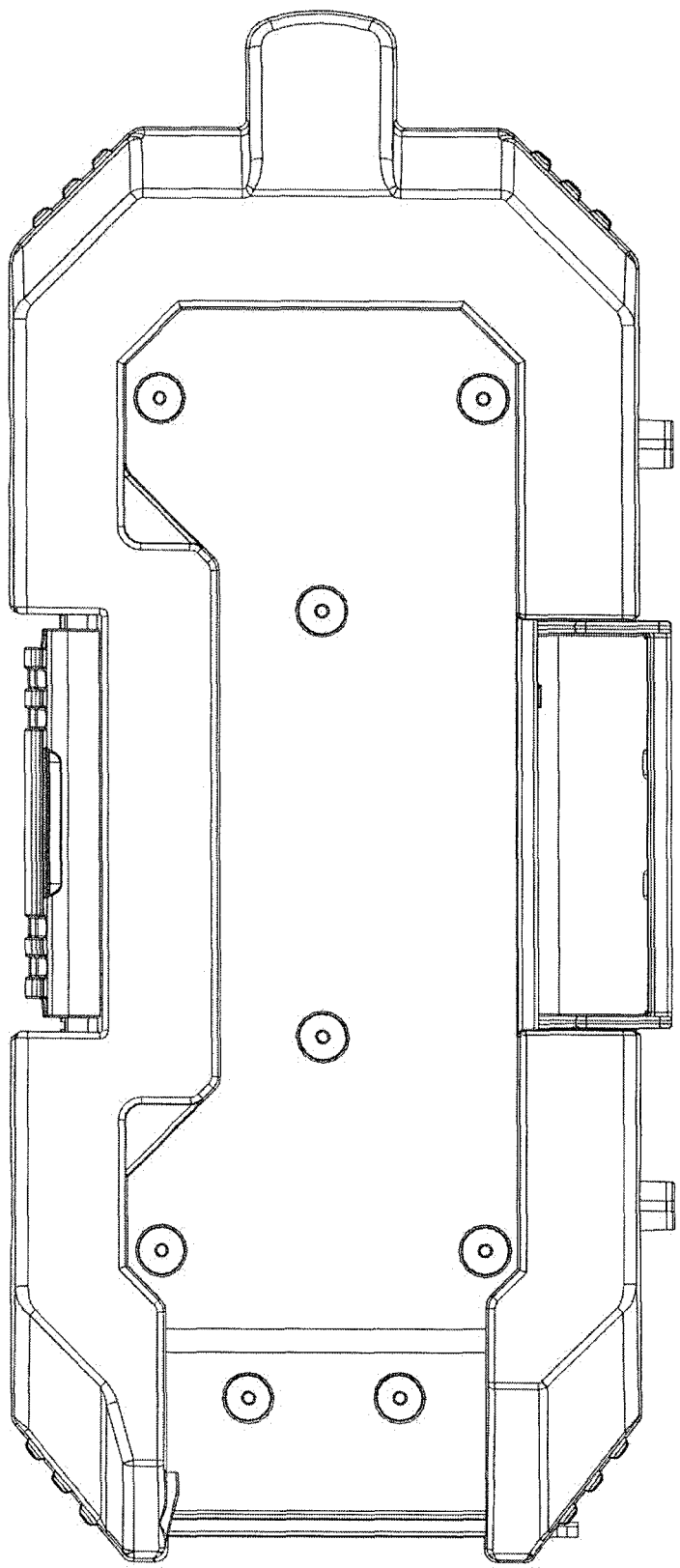
Figure 1H:
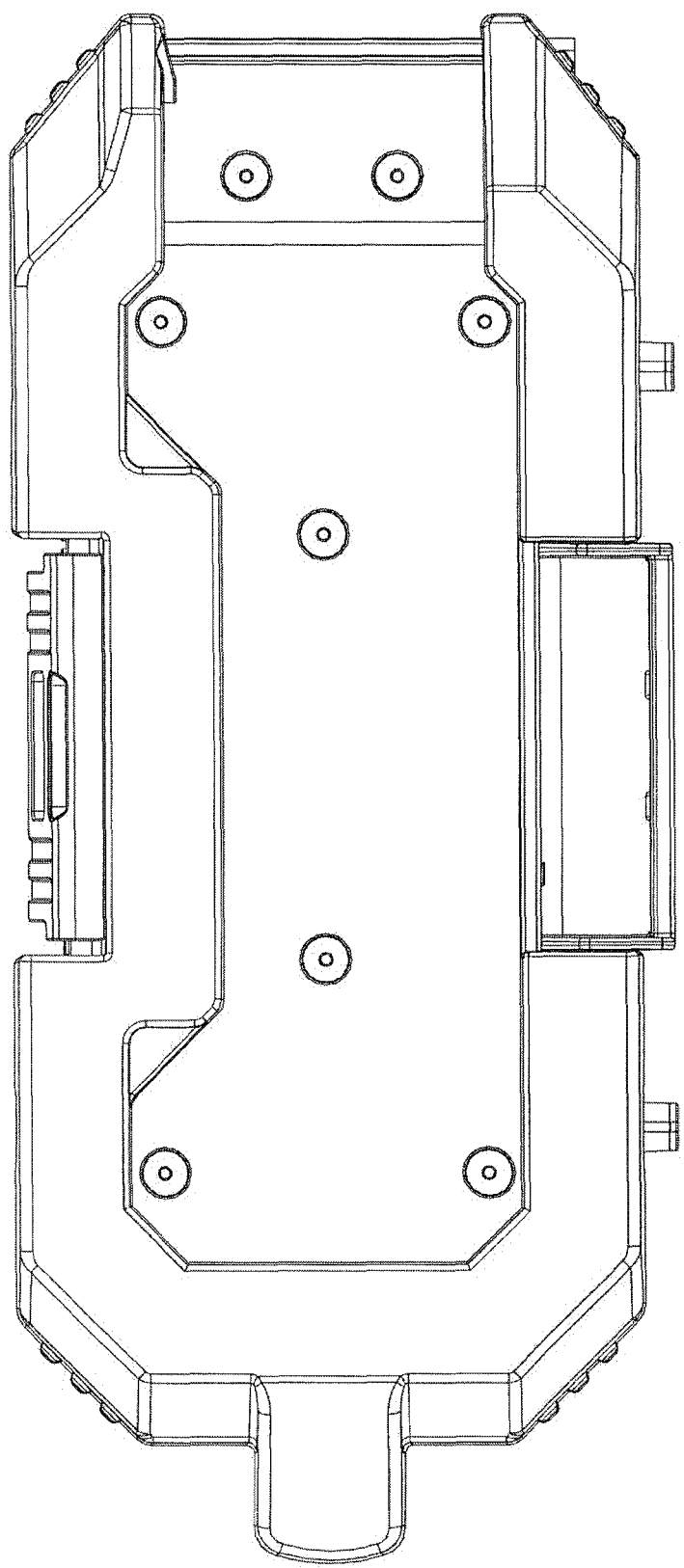
Figure 2:
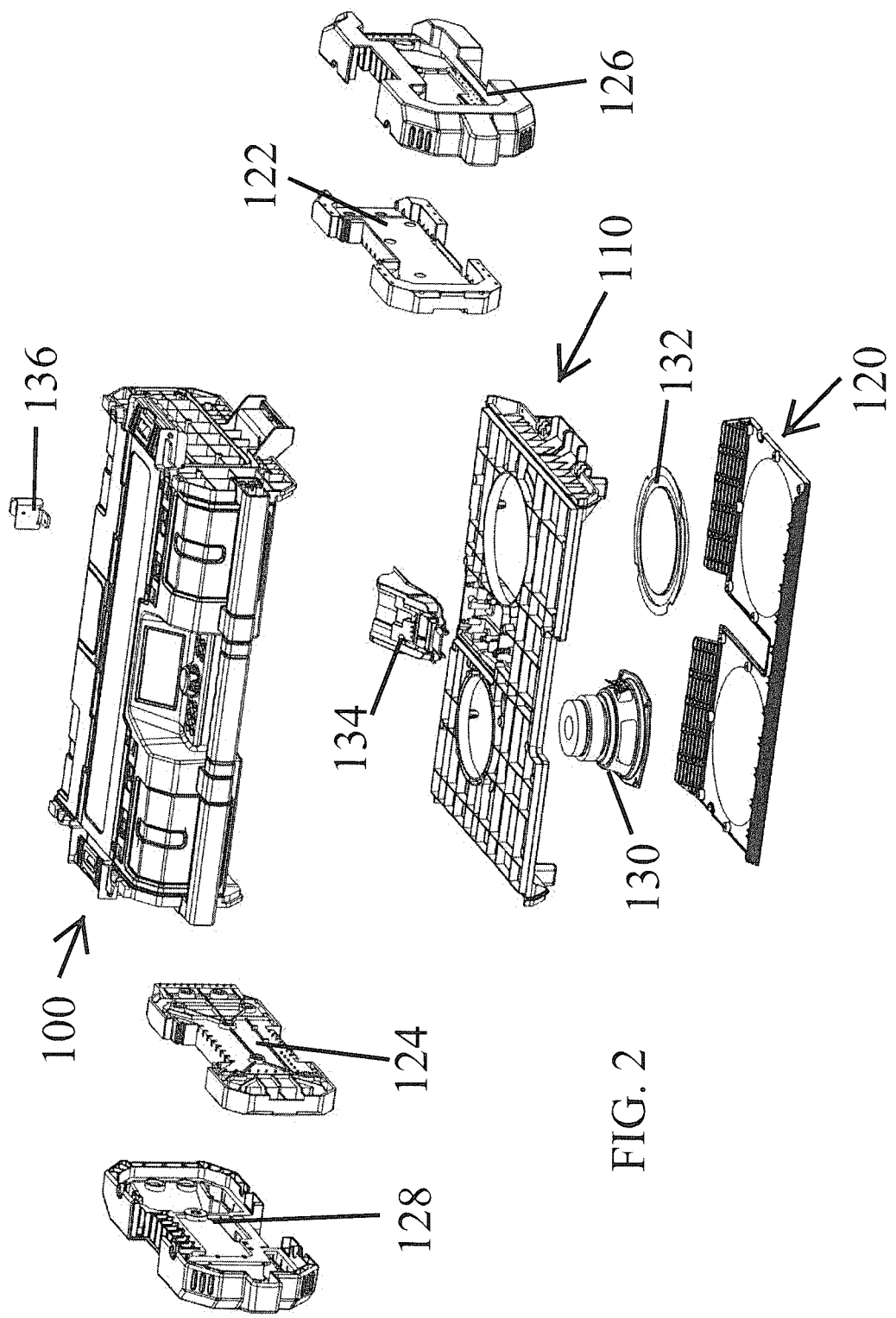
FIG. 2 is a simplified exploded view illustration of the job site communications center of FIGS. 1A-1H.

Reference is now made to FIGS. 1A, 1B, 1C, 1D, 1E, 1F, 1G and 1H, which are respective simplified front/top view pictorial; back/top view pictorial, front/bottom view pictorial, back/bottom view pictorial, top planar view, bottom planar view, right side planar view and left side planar view illustrations of a job site communications center constructed and operative in accordance with a preferred embodiment of the present invention, and to FIG. 2, which is a simplified exploded view illustration of the job site communications center of FIGS. 1A-1H.

As seen in FIGS. 1A-2, the job site communications center of a preferred embodiment of the present invention includes a top shell, such as a main assembly 100, a bottom shell, such as a base element 110, and a bottom cover, such as a bottom element 120. The job site communications center also preferably includes respective right and left side panels, each side panel including a plate, such as right and left side bracket engaging elements 122 and 124, which are mounted onto respective right and left sides of the main assembly 100, in the sense of FIG. 1A, and a bumper, such as a right side bumper 126 and a left side bumper 128, which are mounted over the peripheral edges of respective right side bracket engaging element 122 and left side bracket engaging element 124.

The right and left side panels are preferably attached to main assembly 100 with multiple screws onto side sections thereof. The side sections of the main assembly 100 may be reinforced compared to the other regions thereof, for example, by one or more ribs perpendicular to the external surface. Main assembly 100 preferably includes a grid of ribs perpendicular to the external surface, to provide a region which is resistant to deformation or crushing if the region is subjected to sudden impacts or heavy loading.

The top shell, bottom shell and bottom cover are made from any suitable rigid material, preferably plastic, such as ABS. Right side bumper 126 and left side bumper 128 are preferably formed of a resilient, impact-absorbing, material, such as an elastomer or rubber. The top shell, bottom shell and bottom cover are preferably formed by injection molding, and right side bumper 126 and left side bumper 128 are preferably formed of a thermoplastic elastomer to allow them to be formed on and attached to right and left side bracket engaging elements 122 and 124 in an overmolding process. It is appreciated that fire resistant materials may be used for some or all parts of the job site communications center.

A sound system of the job site communication center preferably includes an active sub-woofer 130 and a passive sub-woofer 132, which are preferably mounted onto base element 110 and are protected from below by bottom element 120. A battery charging assembly 134 is also preferably mounted onto base element 110. A back mounting bracket 136 is mounted onto main assembly 100.

Figure 3A:
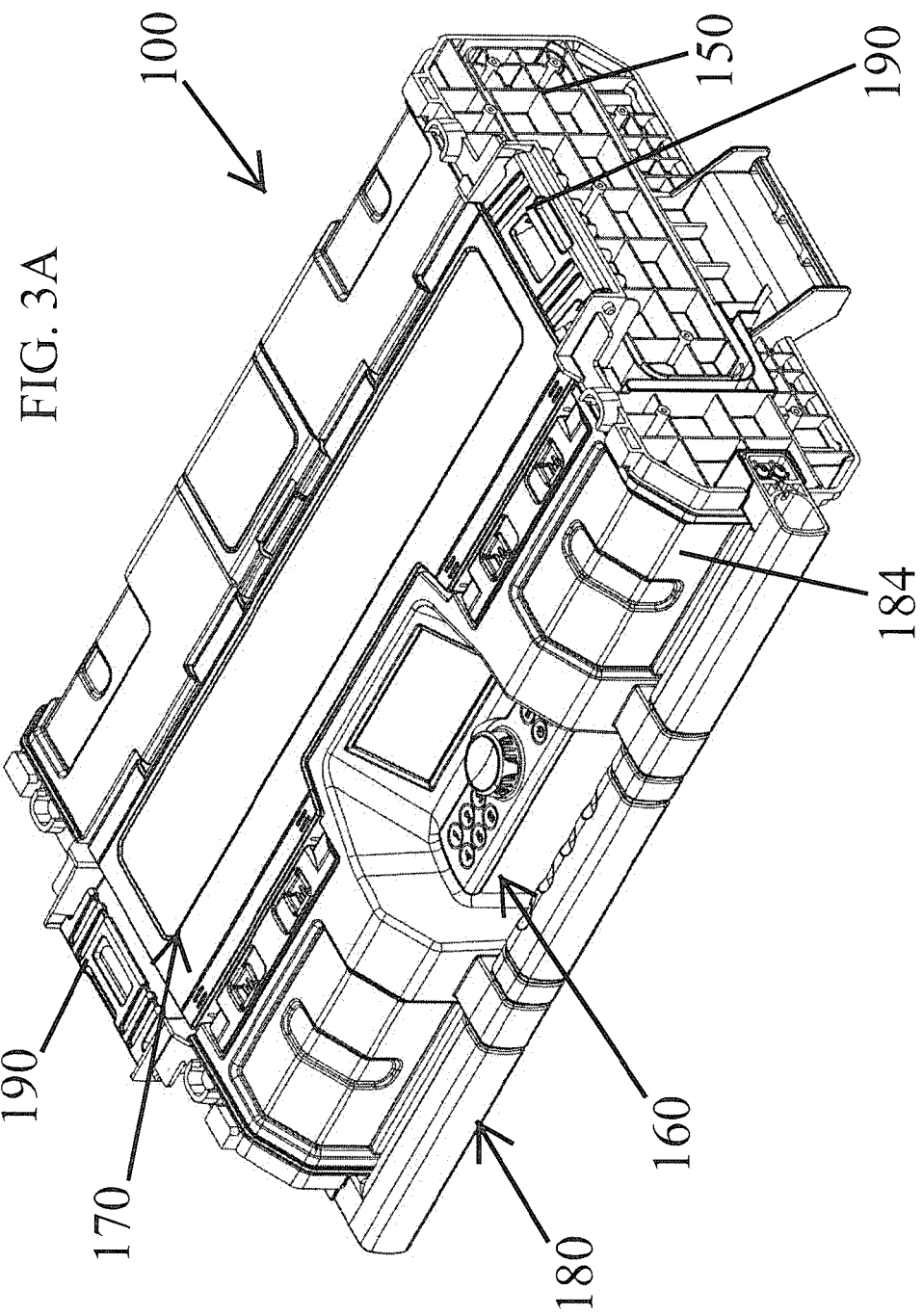
FIGS. 3A, 3B, 3C, 3D, 3E, 3F, 3G and 3H are respective simplified front/top view pictorial; back/top view pictorial, front/bottom view pictorial, back/bottom view pictorial, top planar view, bottom planar view, right side planar view and left side planar view illustrations of a main assembly, forming part of the communications center of FIGS. 1A-2.
Figure 3B:
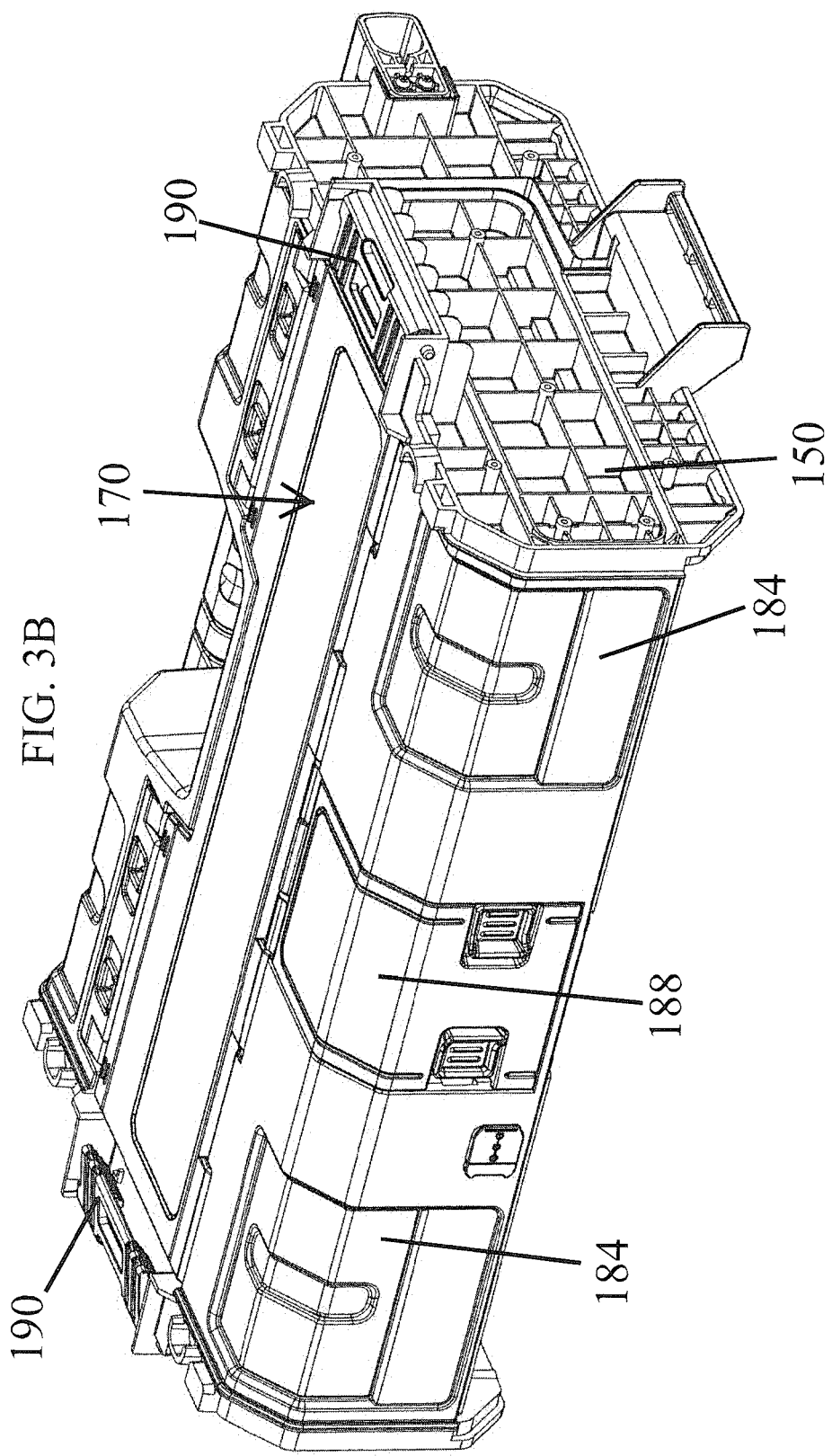
Figure 3C:
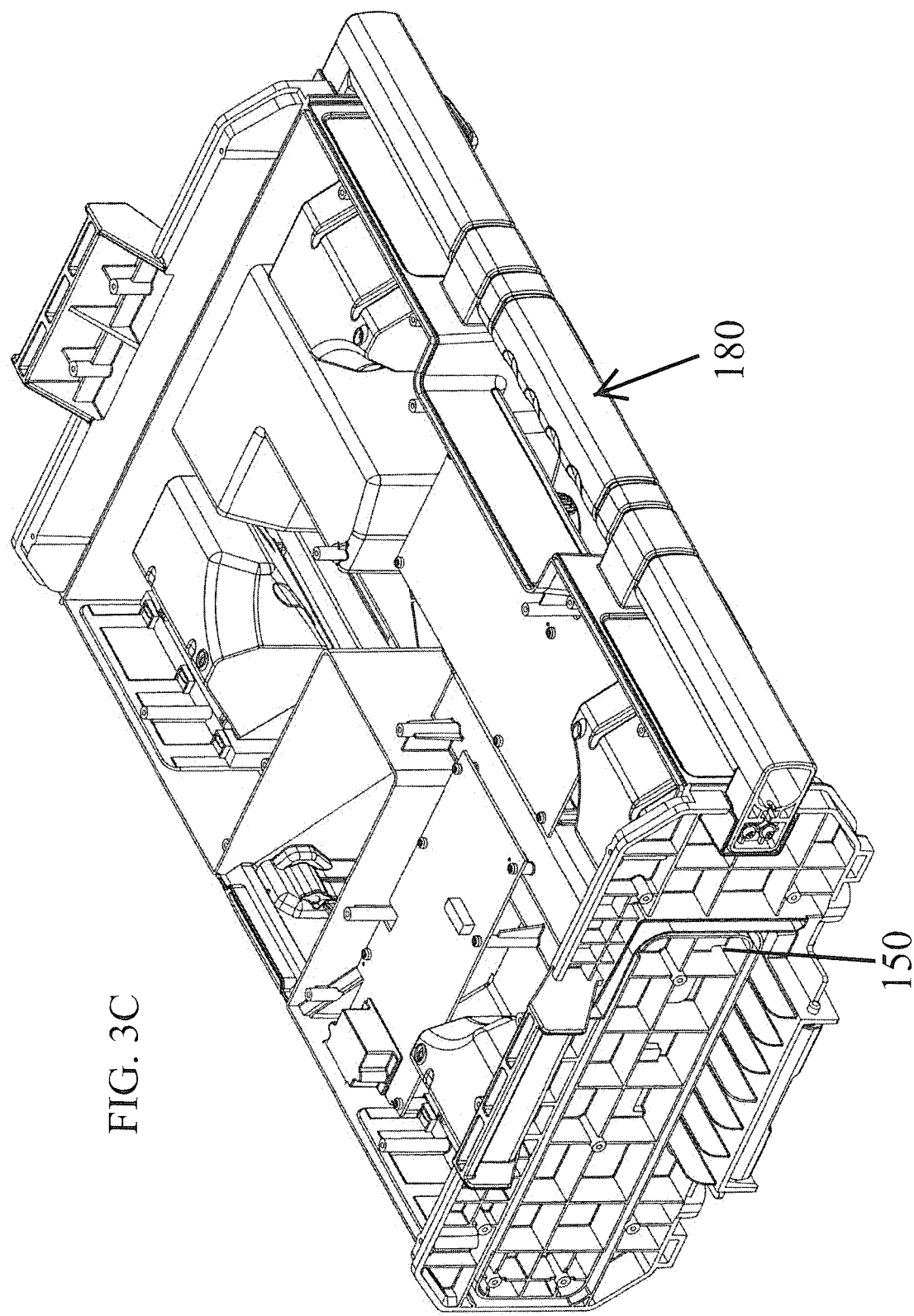
Figure 3D:
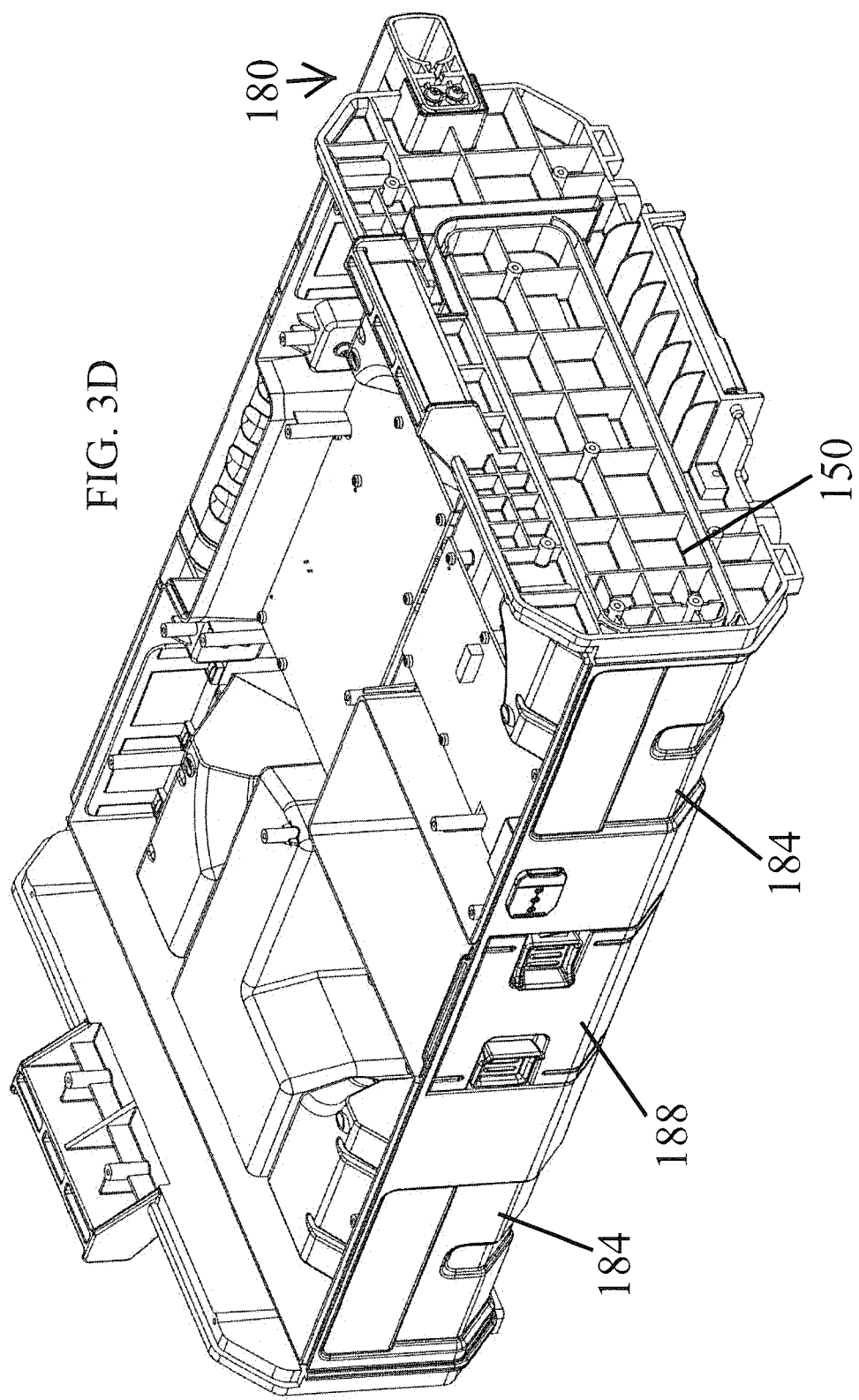
Figure 3E:
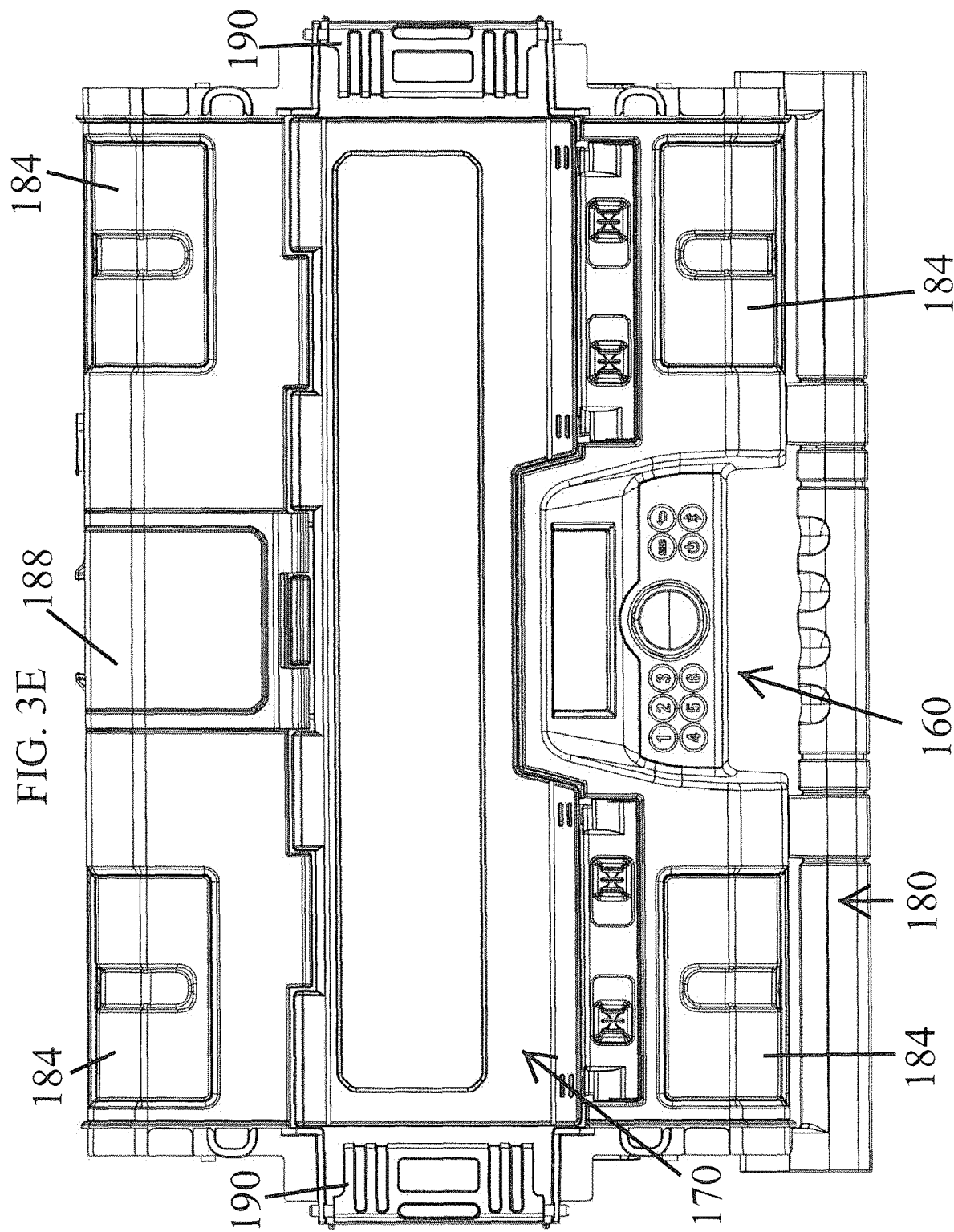
Figure 3F:
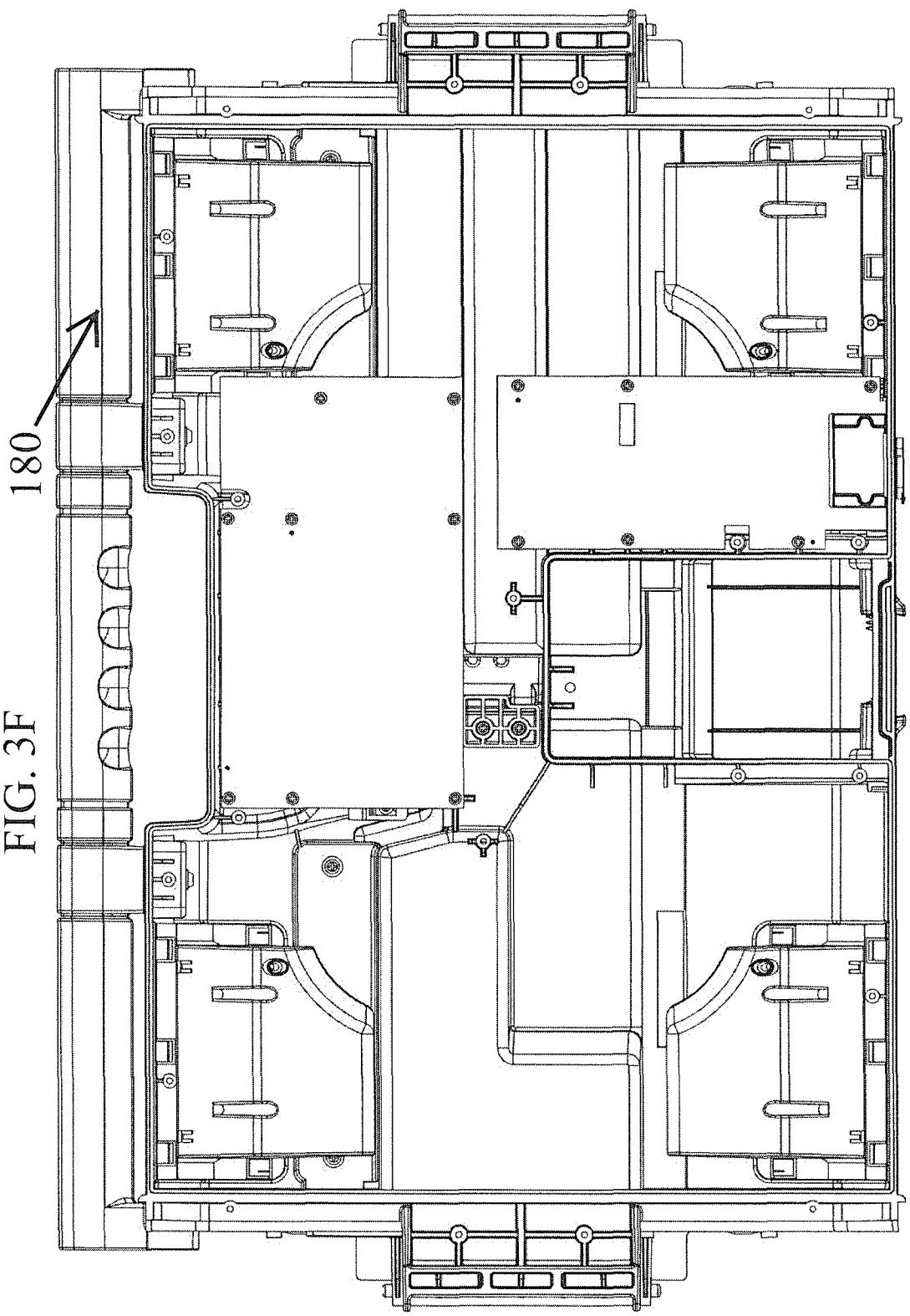
Figure 3G:
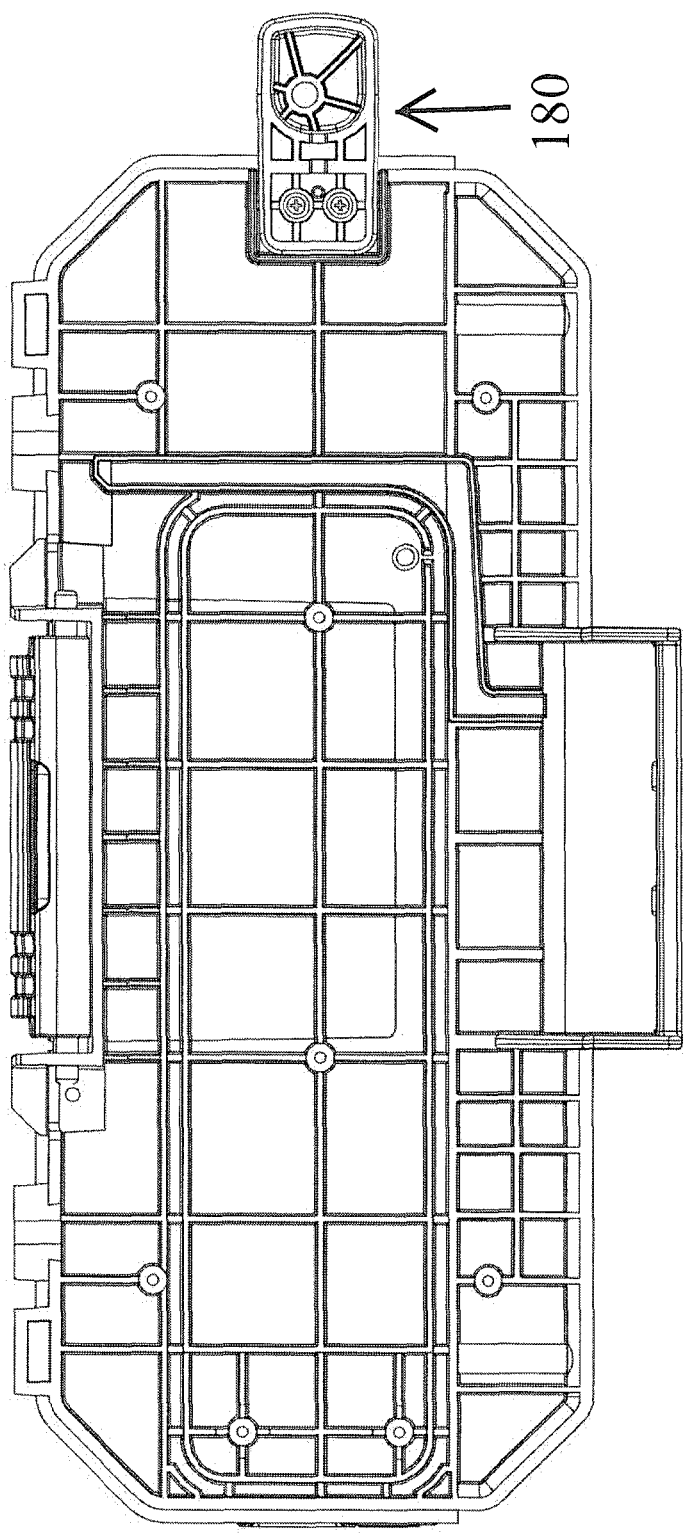
Figure 3H:
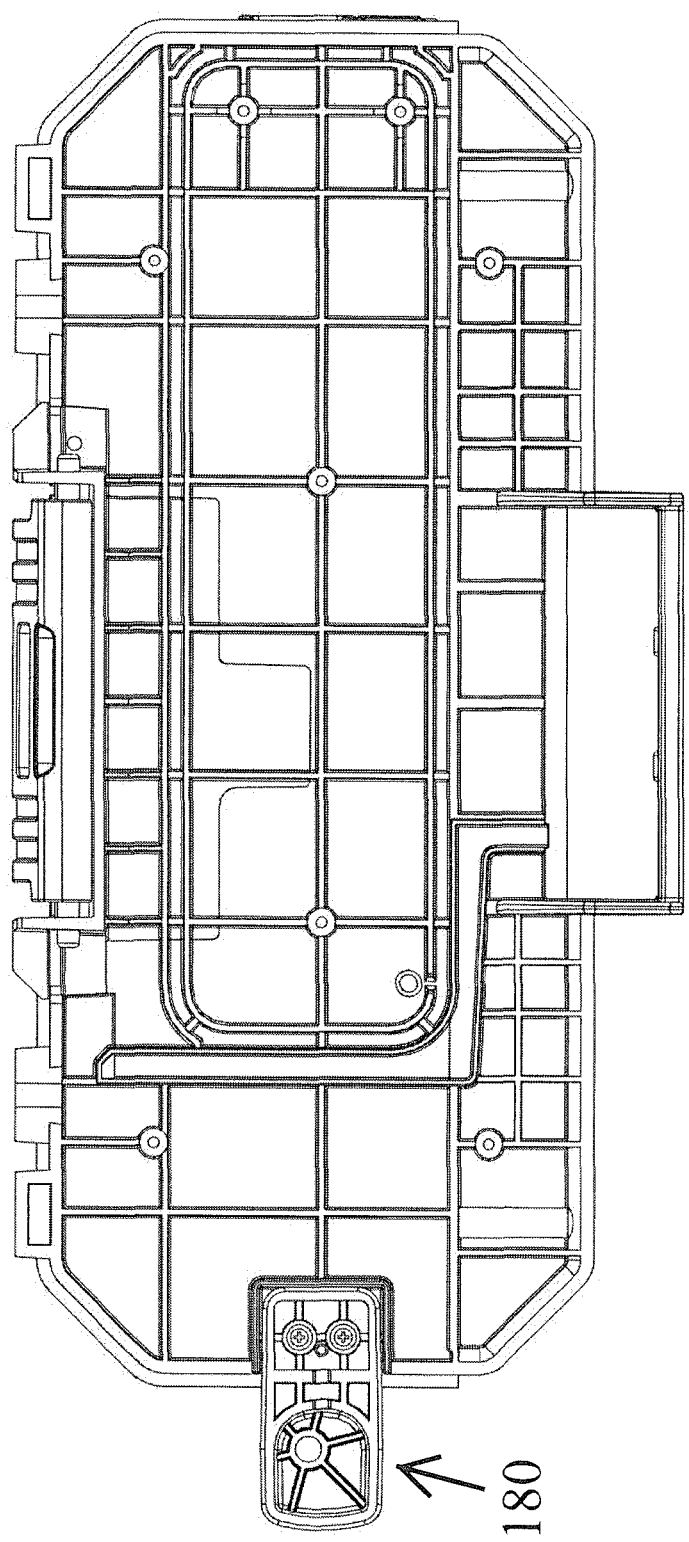
Figure 4:
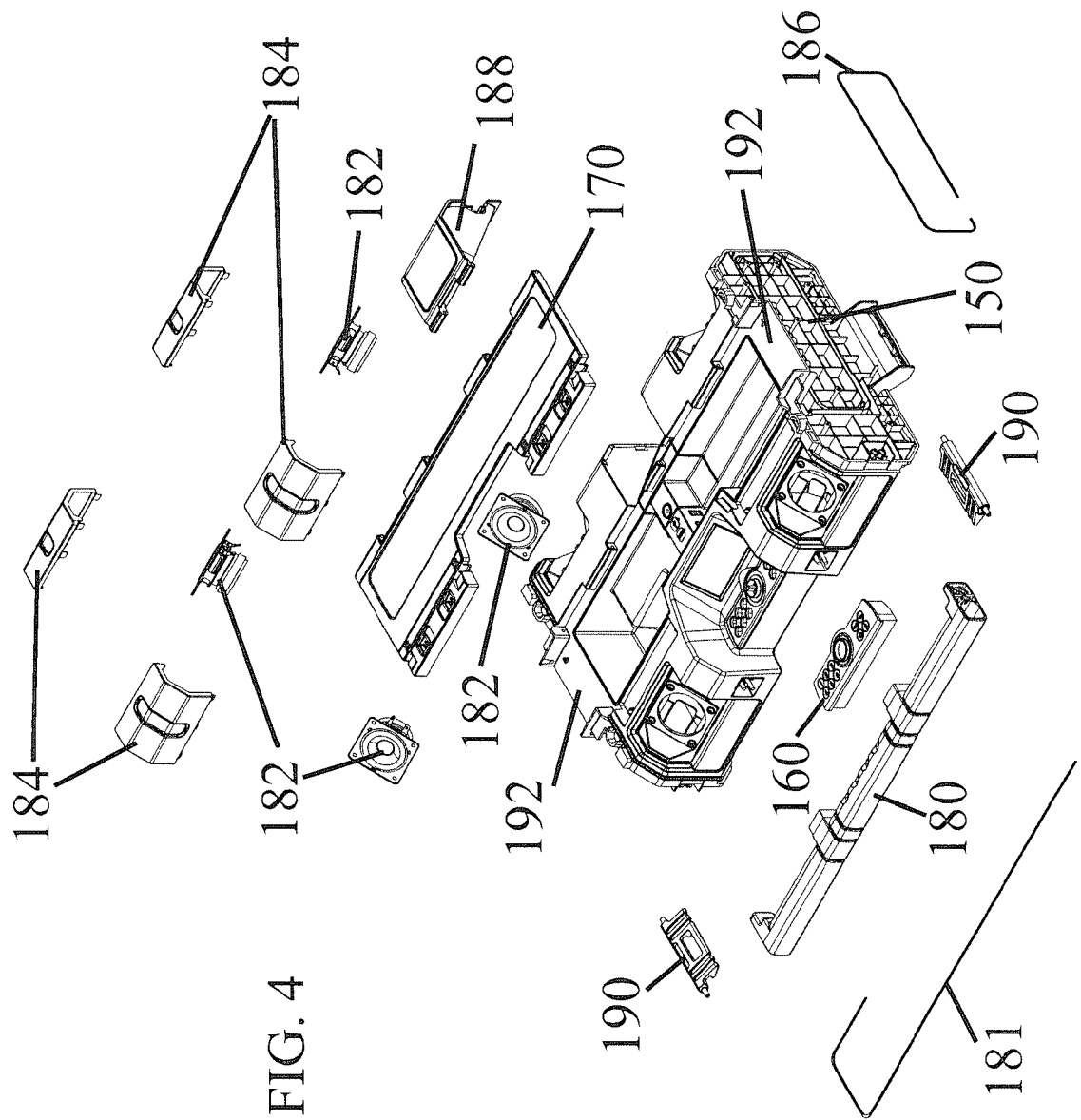
FIG. 4 is a simplified exploded view illustration of the main assembly of FIGS. 3A-3H.
Figure 5B:
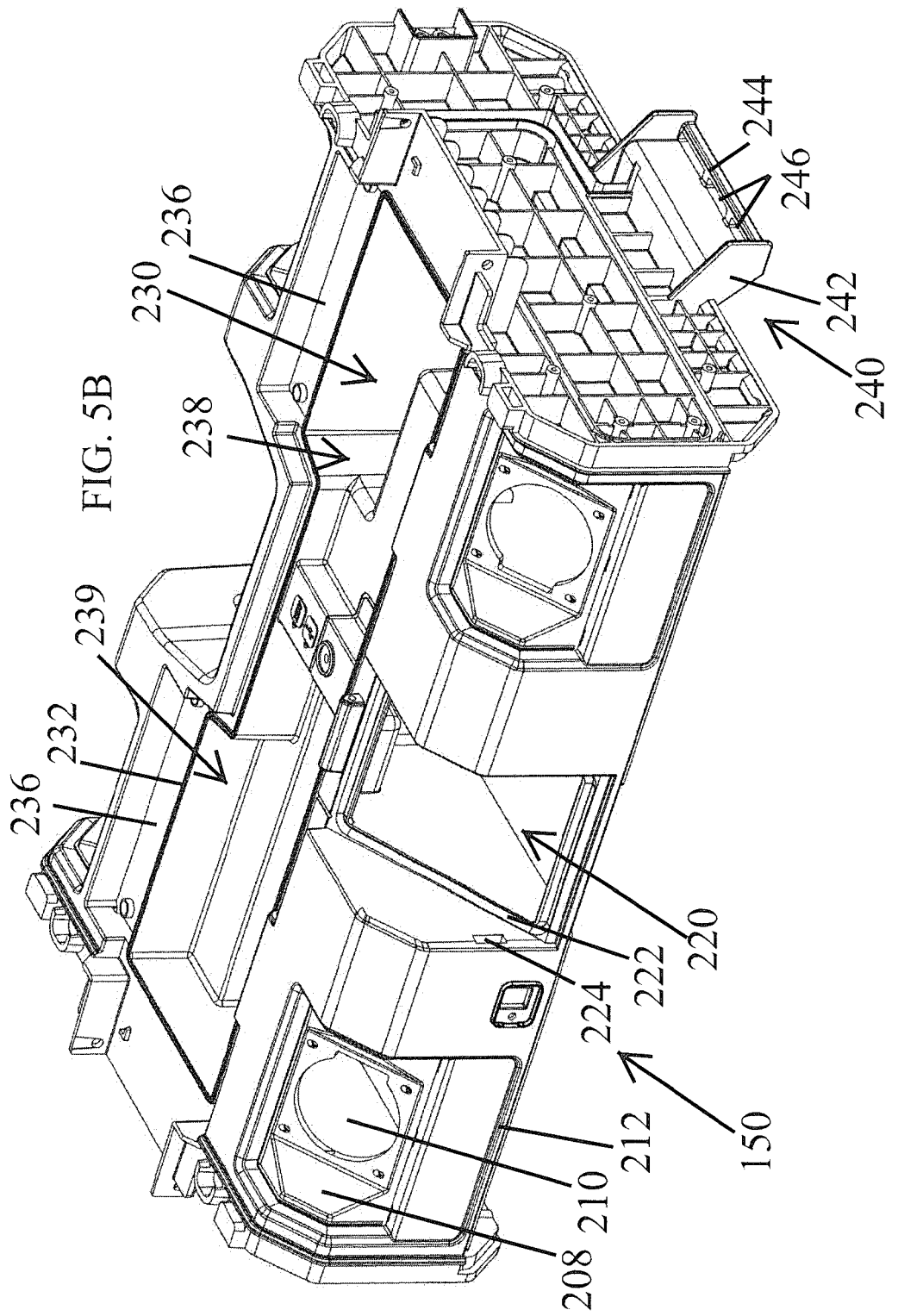
Figure 5D:
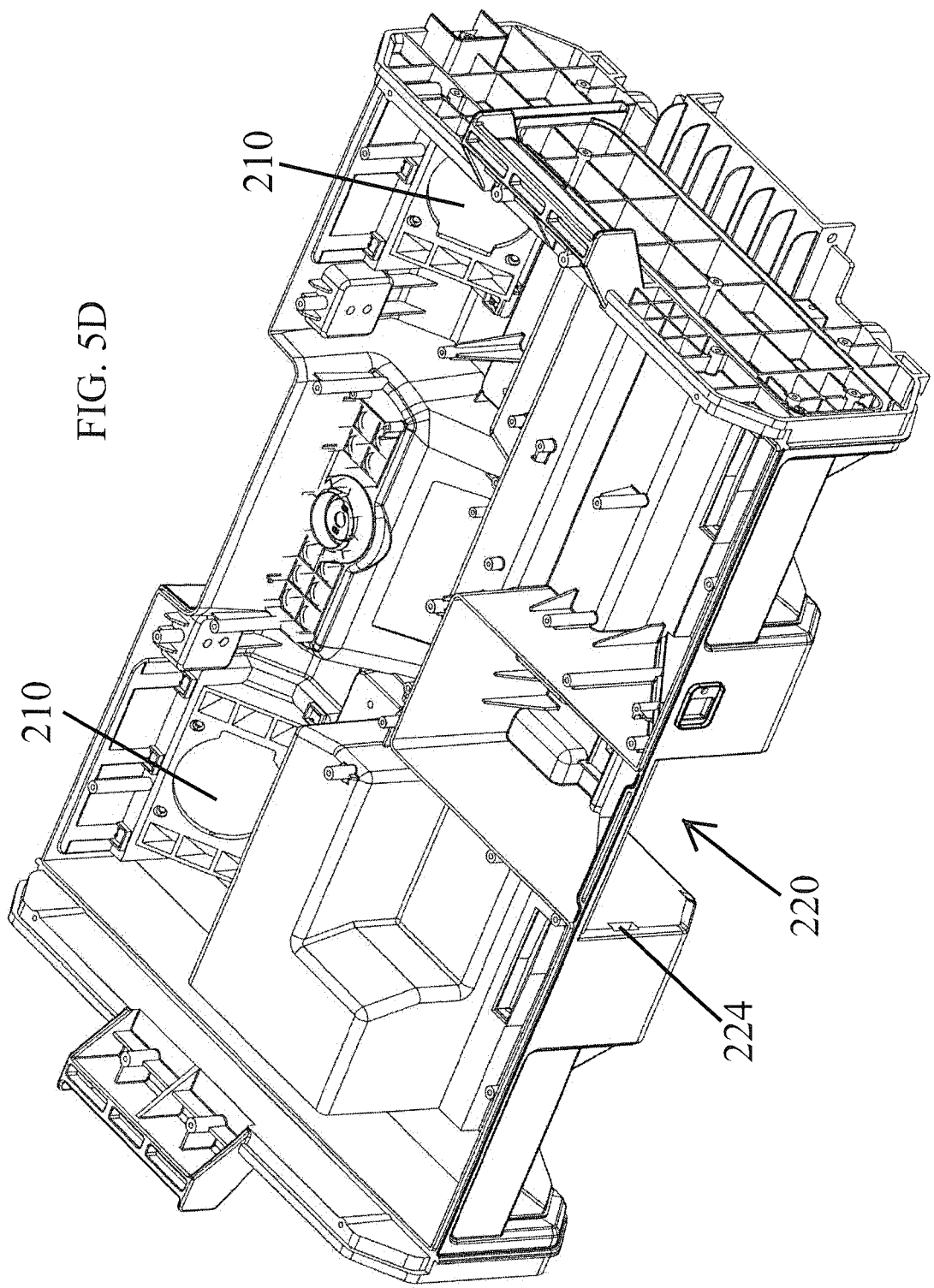
Figure 5E:
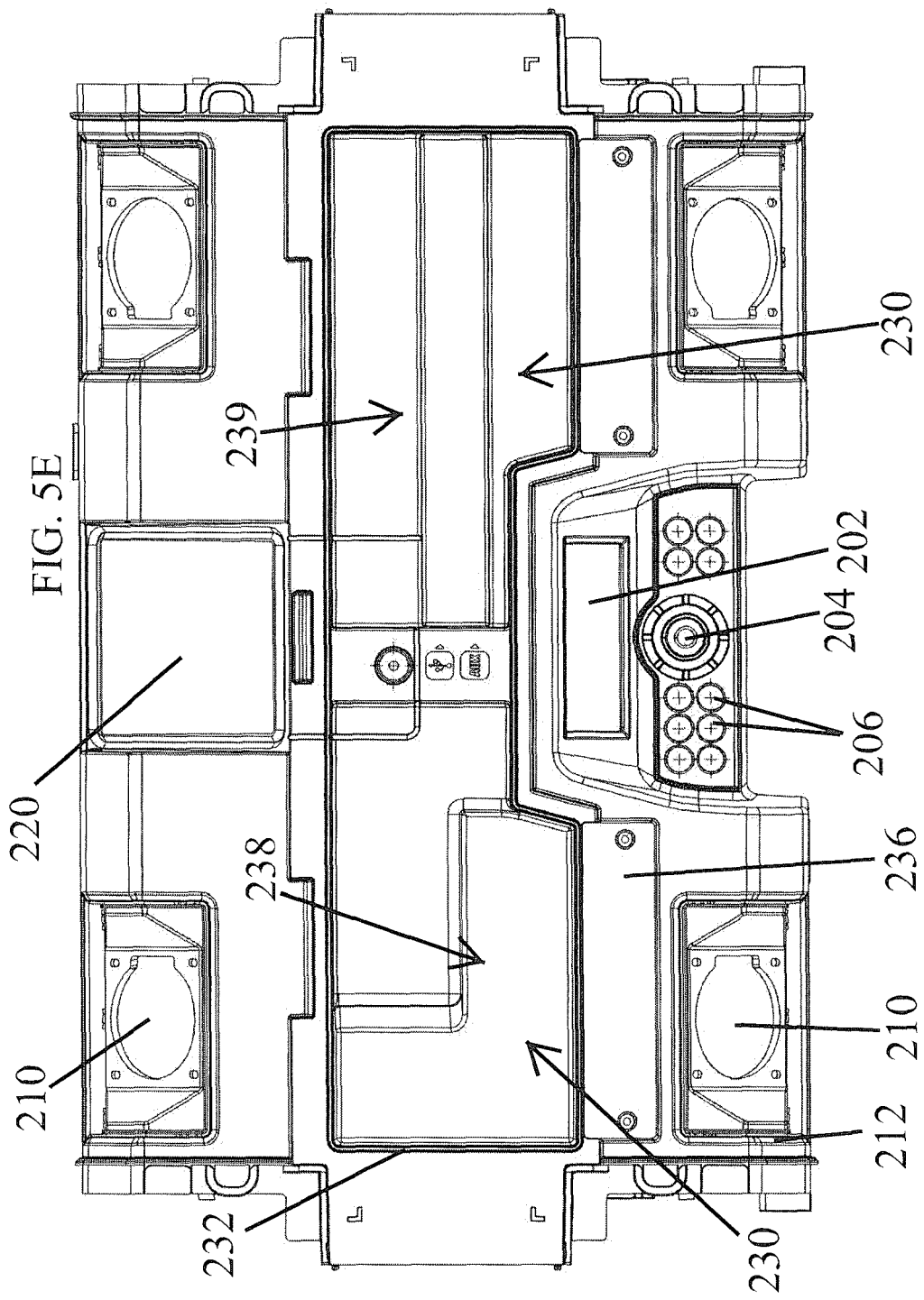
Figure 5F:
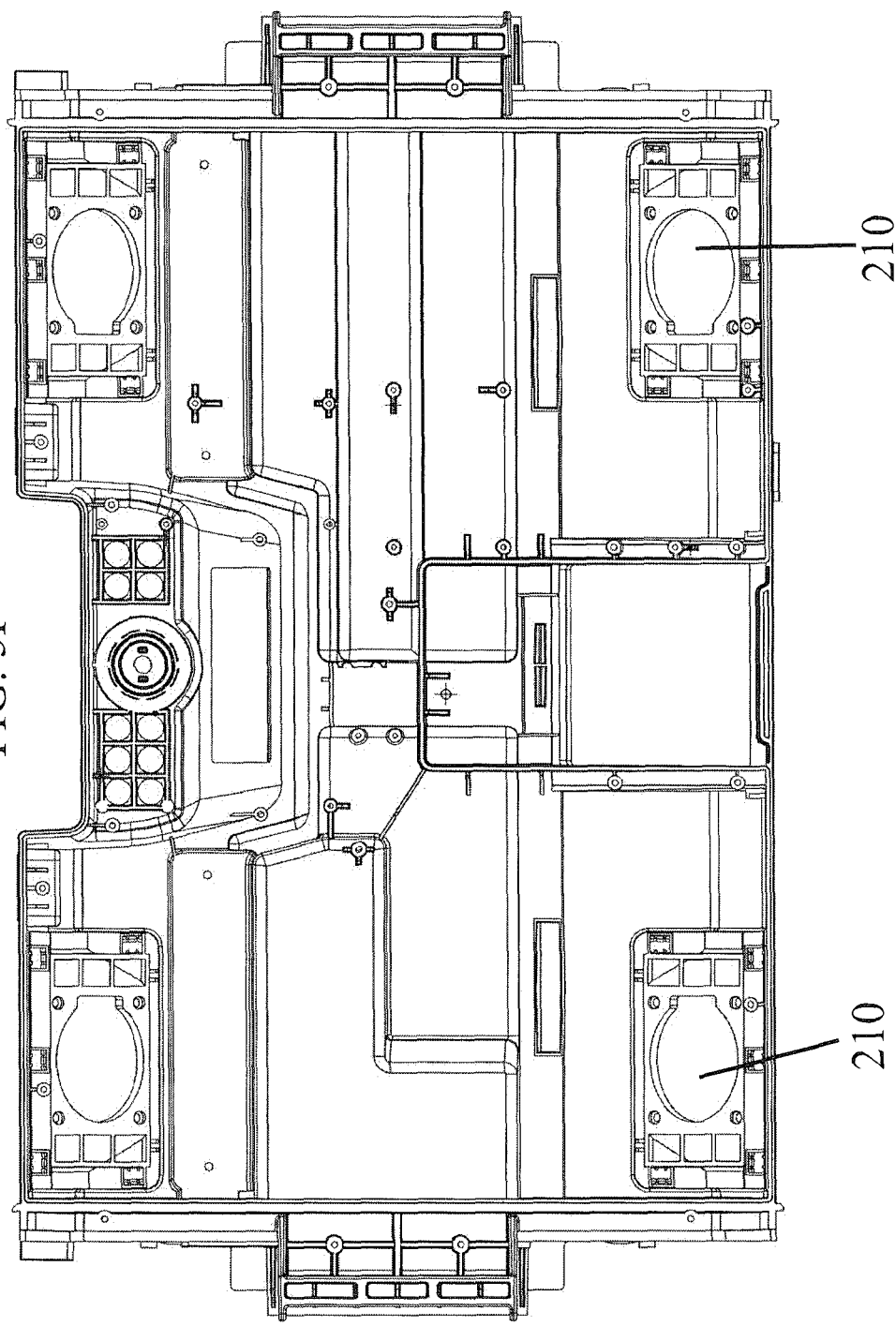
Figure 5G:
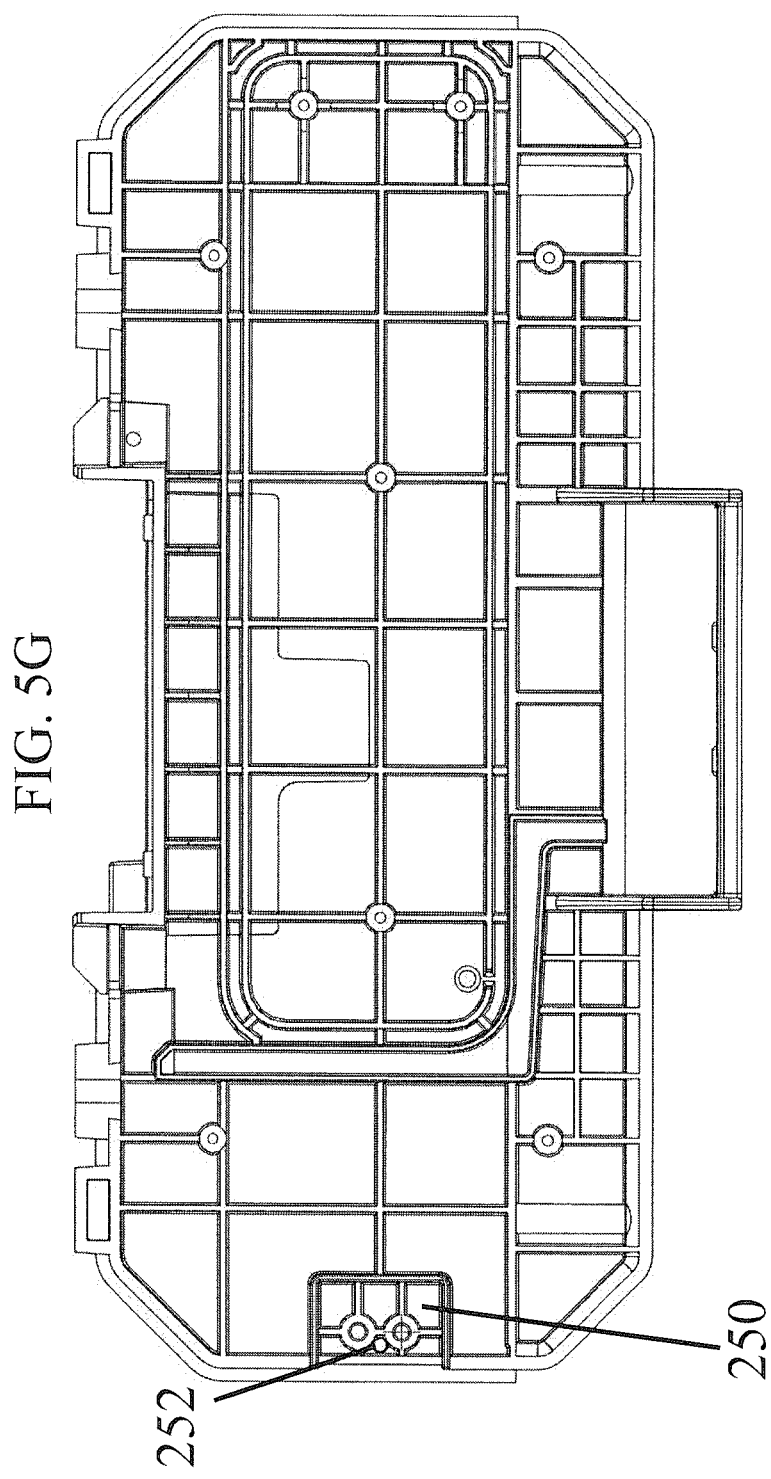
Figure 5H:
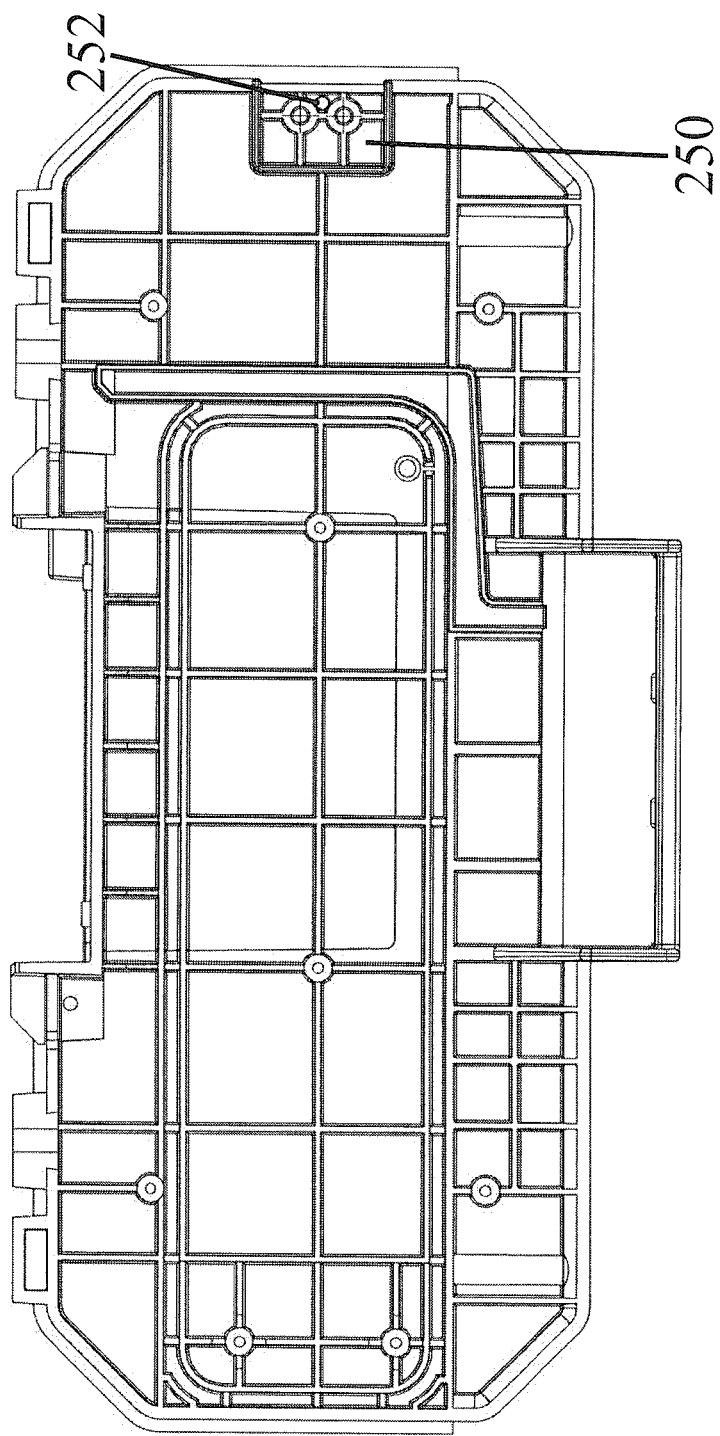
Figure 6A:
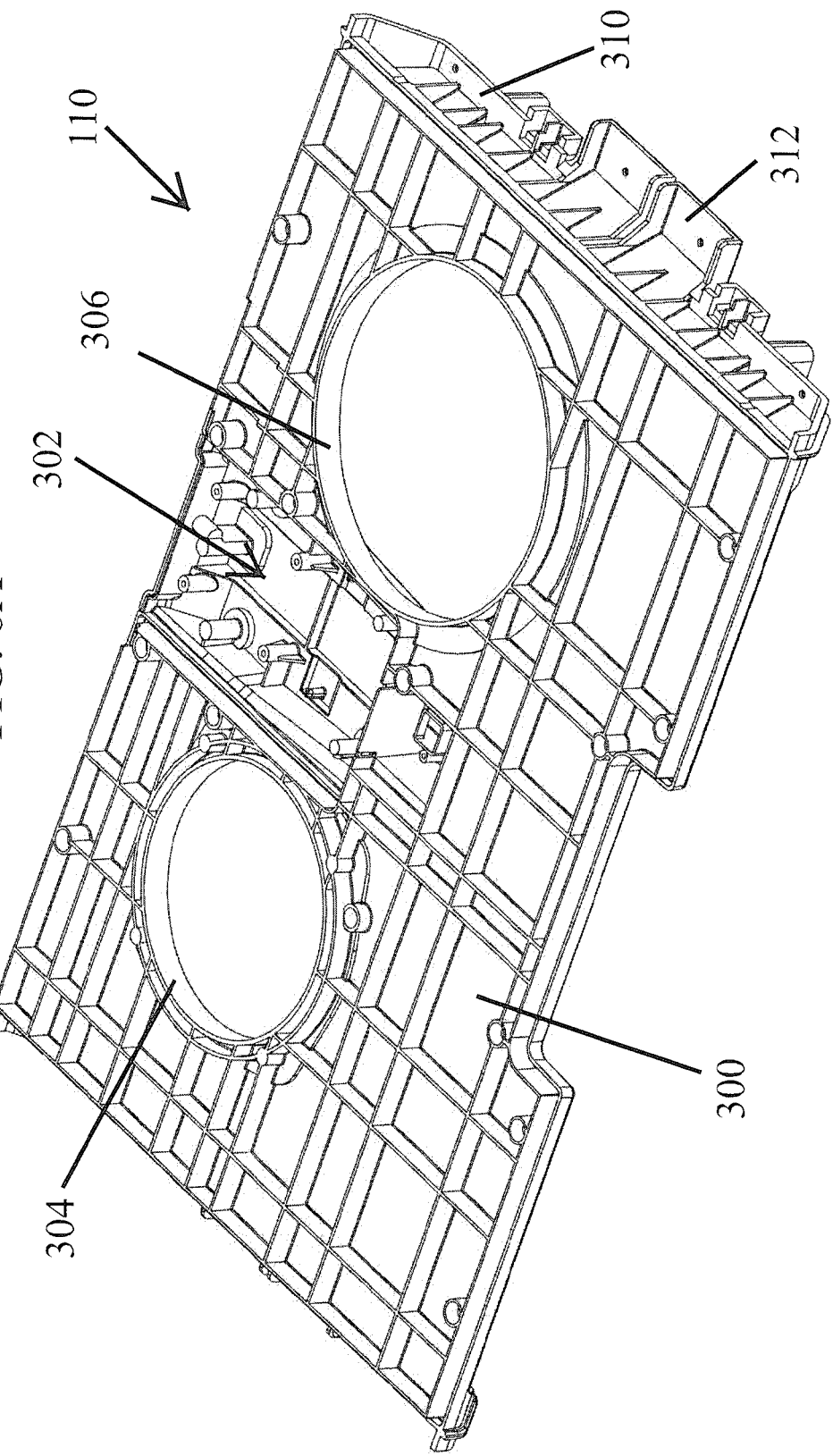
Figure 6B:
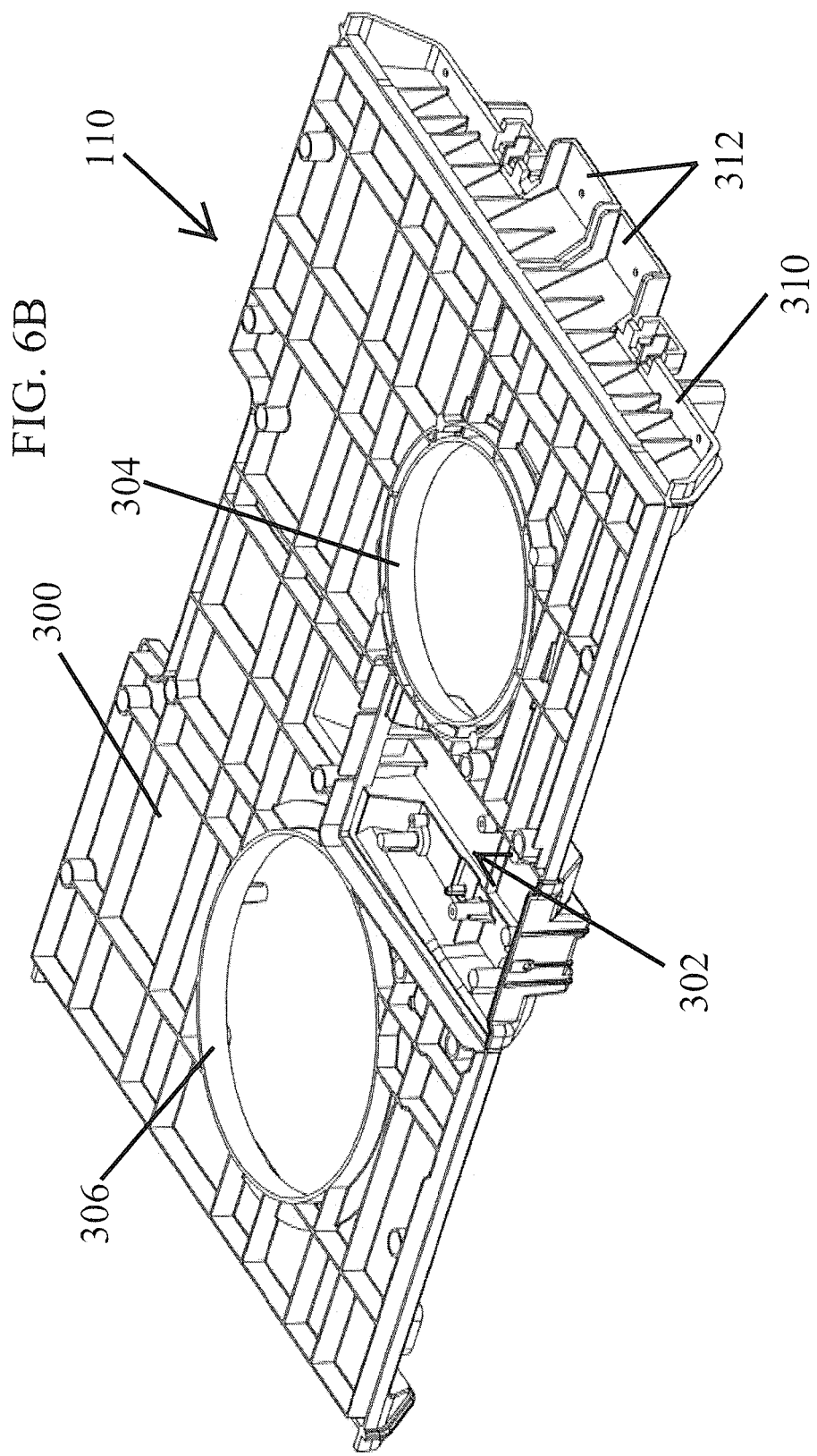
Figure 6C:
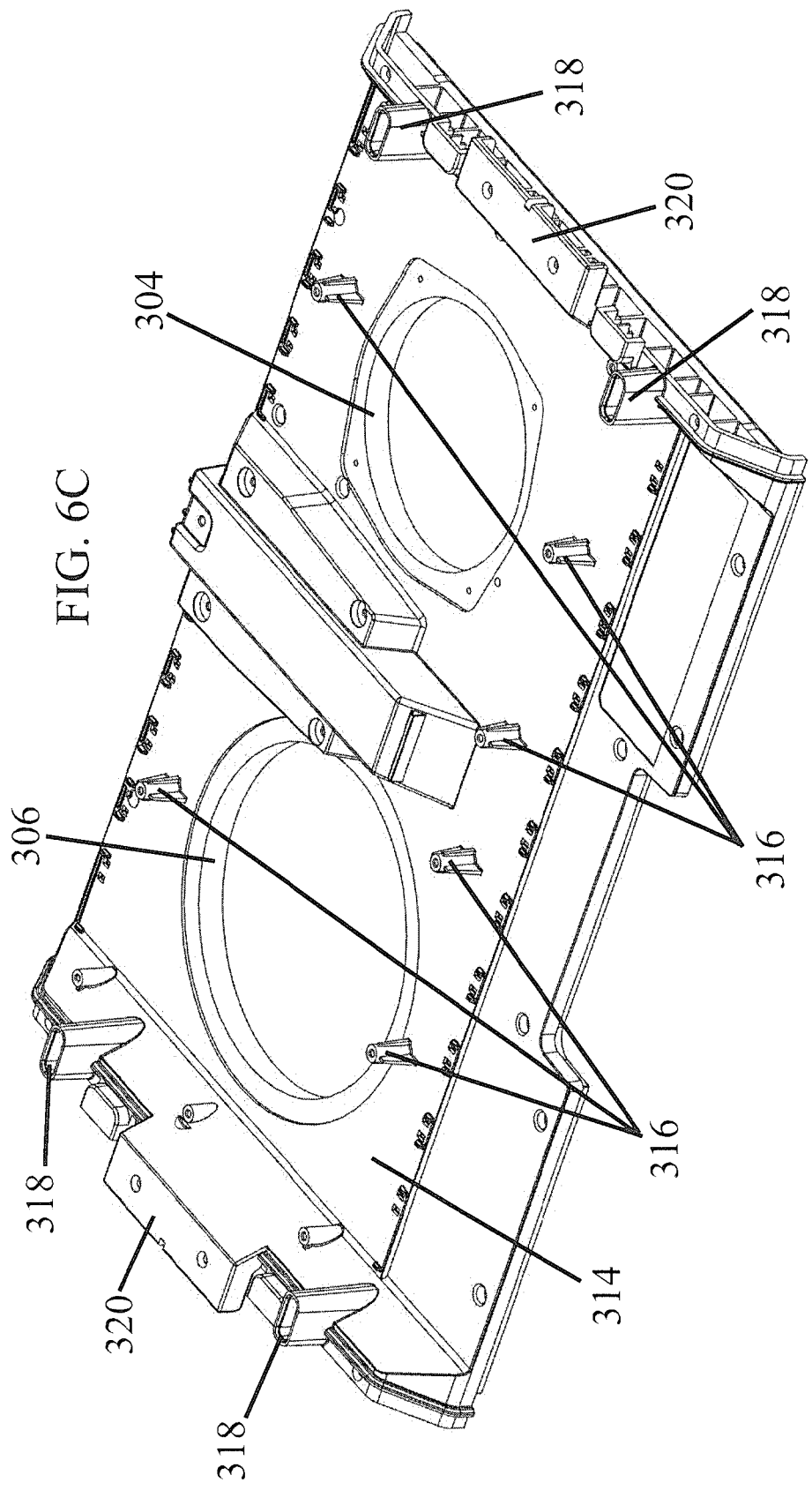
Figure 6E:
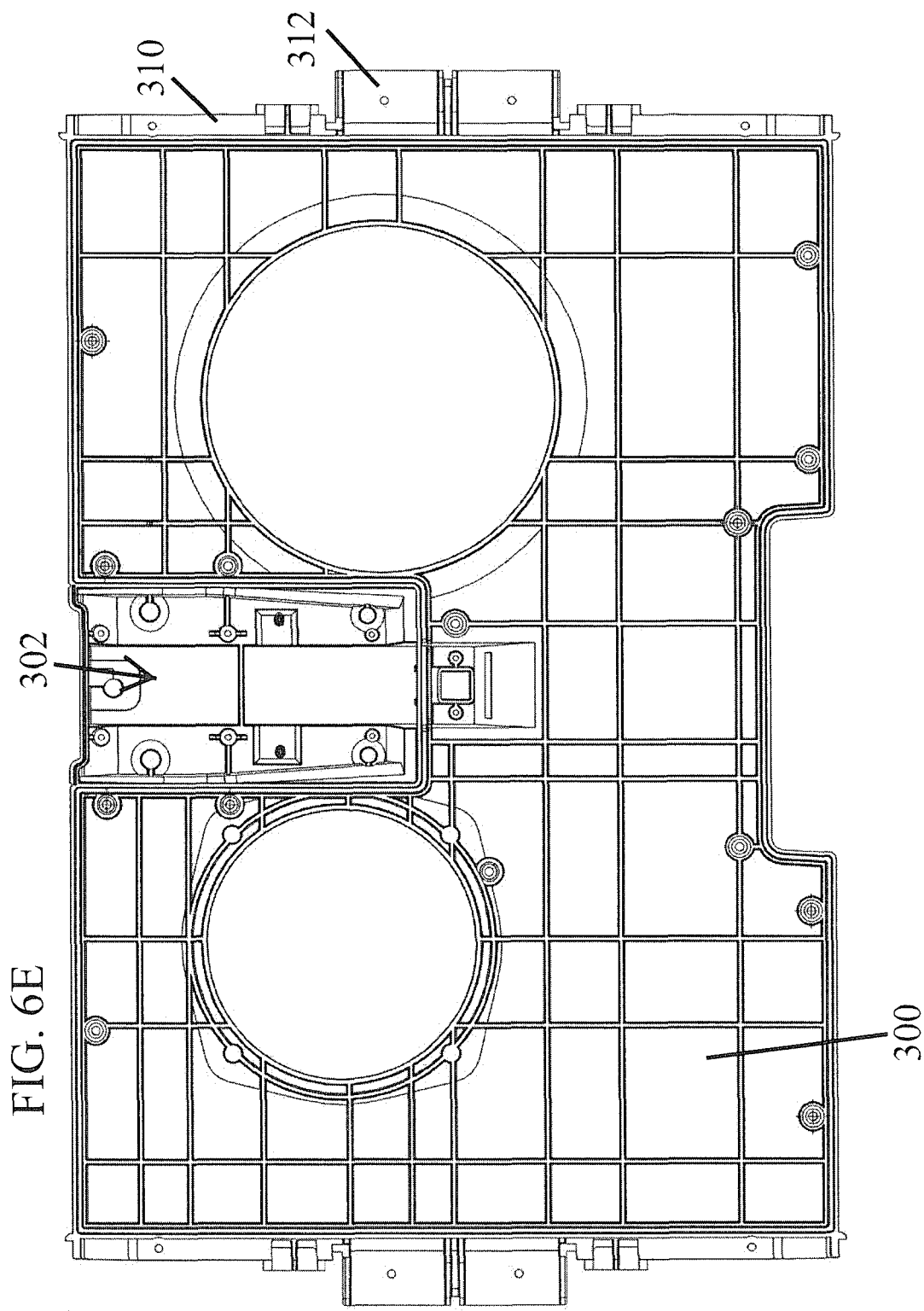
Figure 6F:
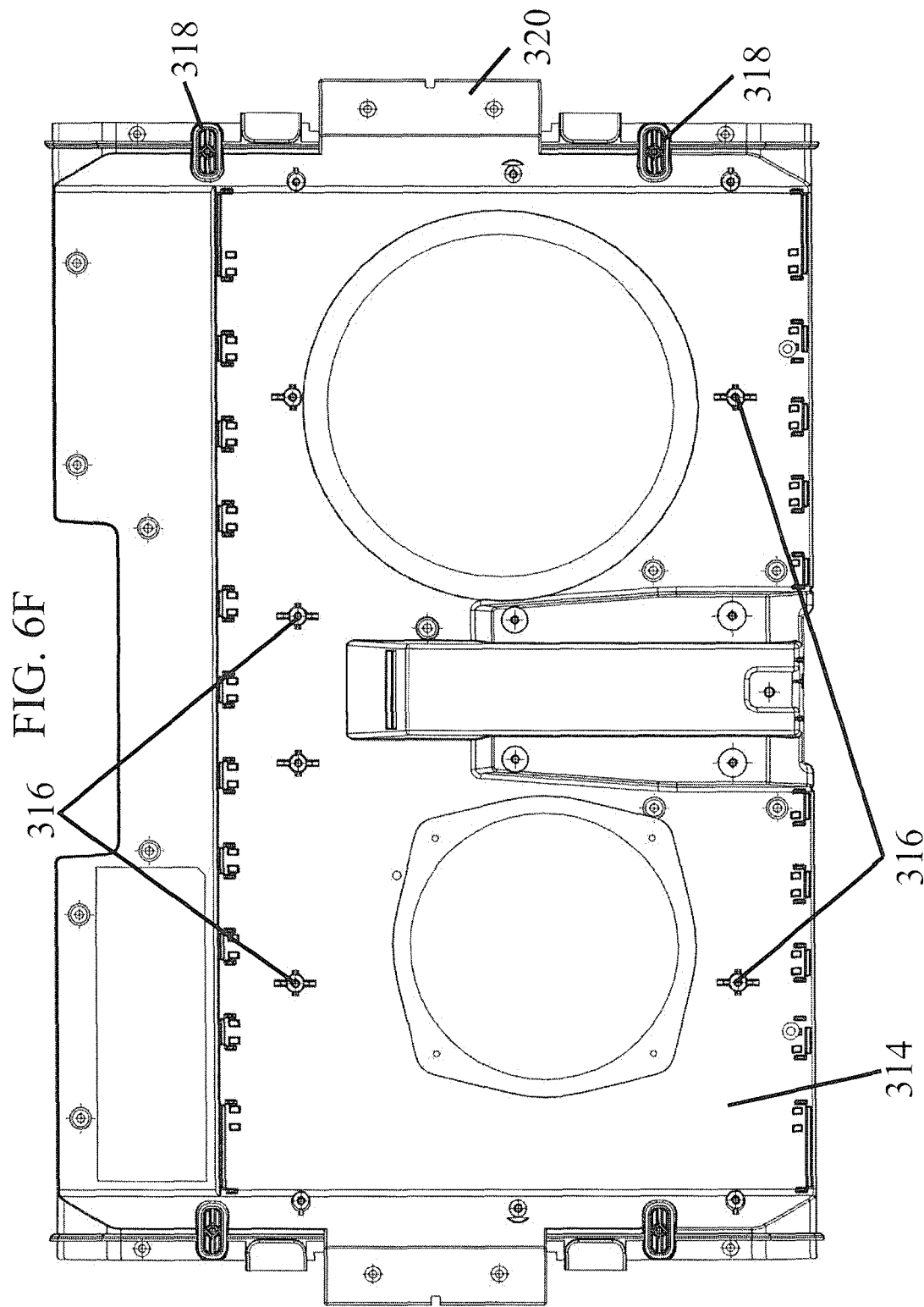
Figure 6G:
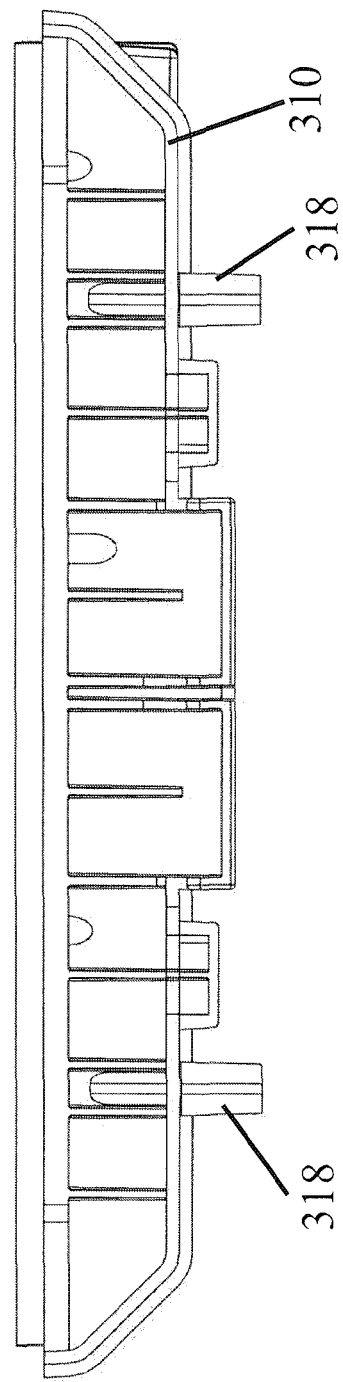
Figure 6H:
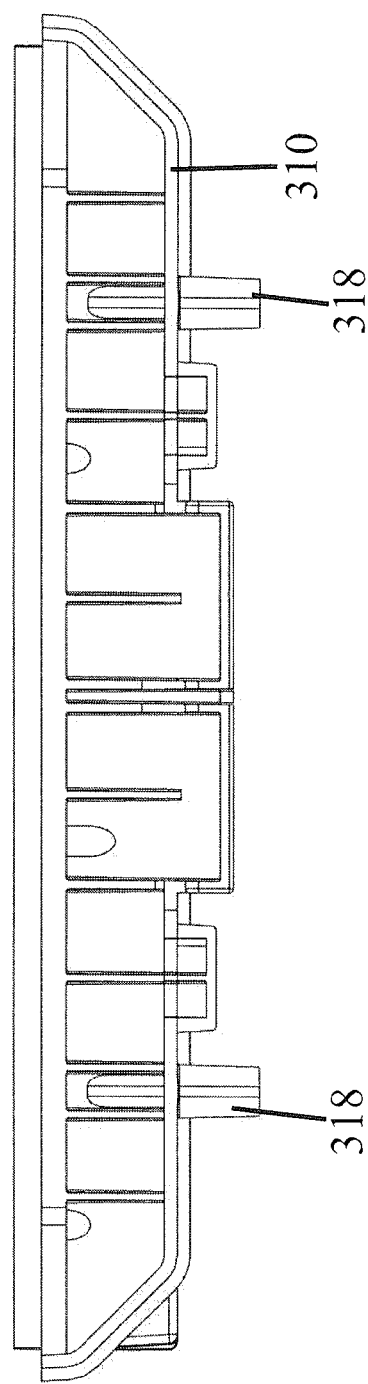
Figure 7B:
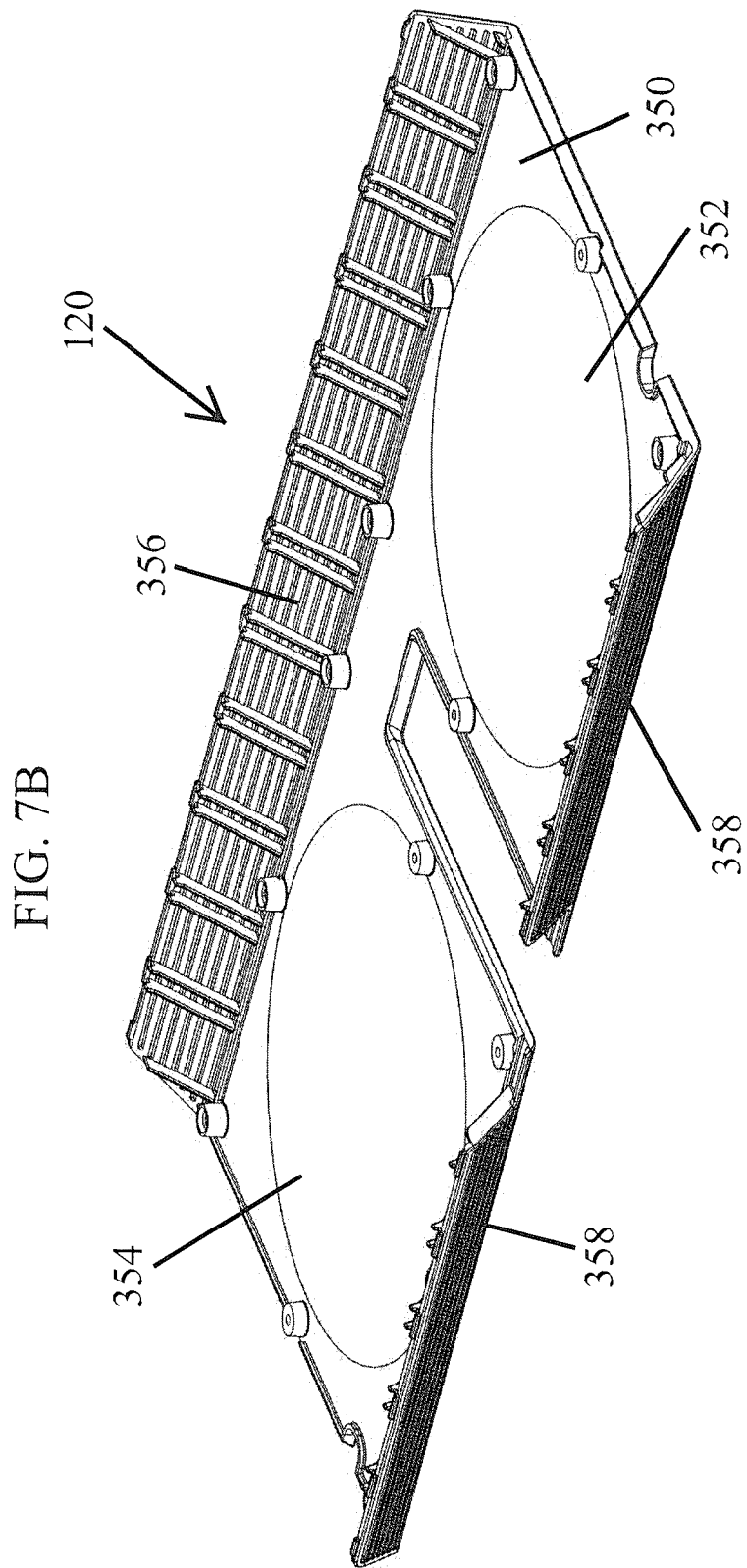
Figure 7C:
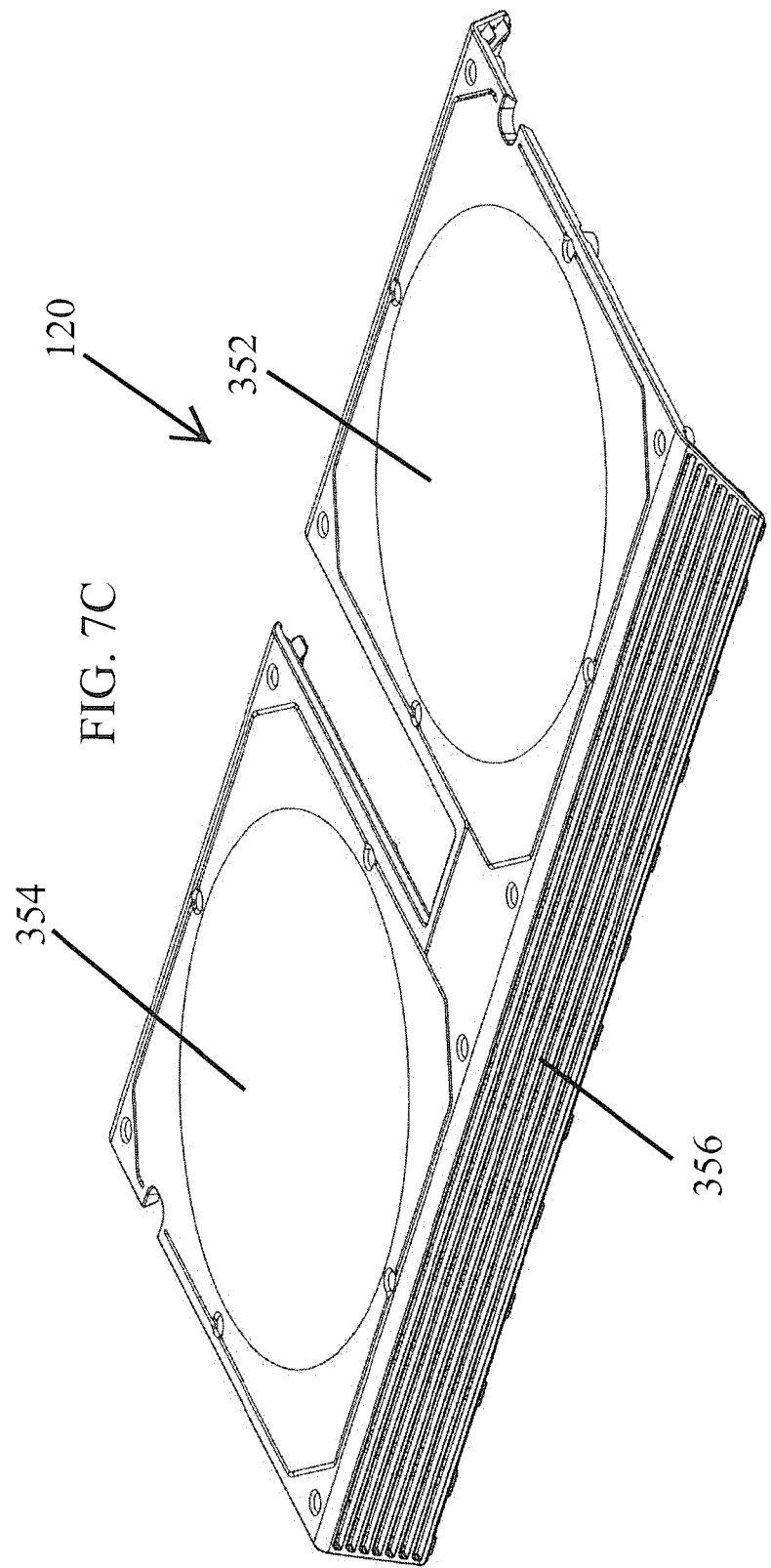
Figure 7D:
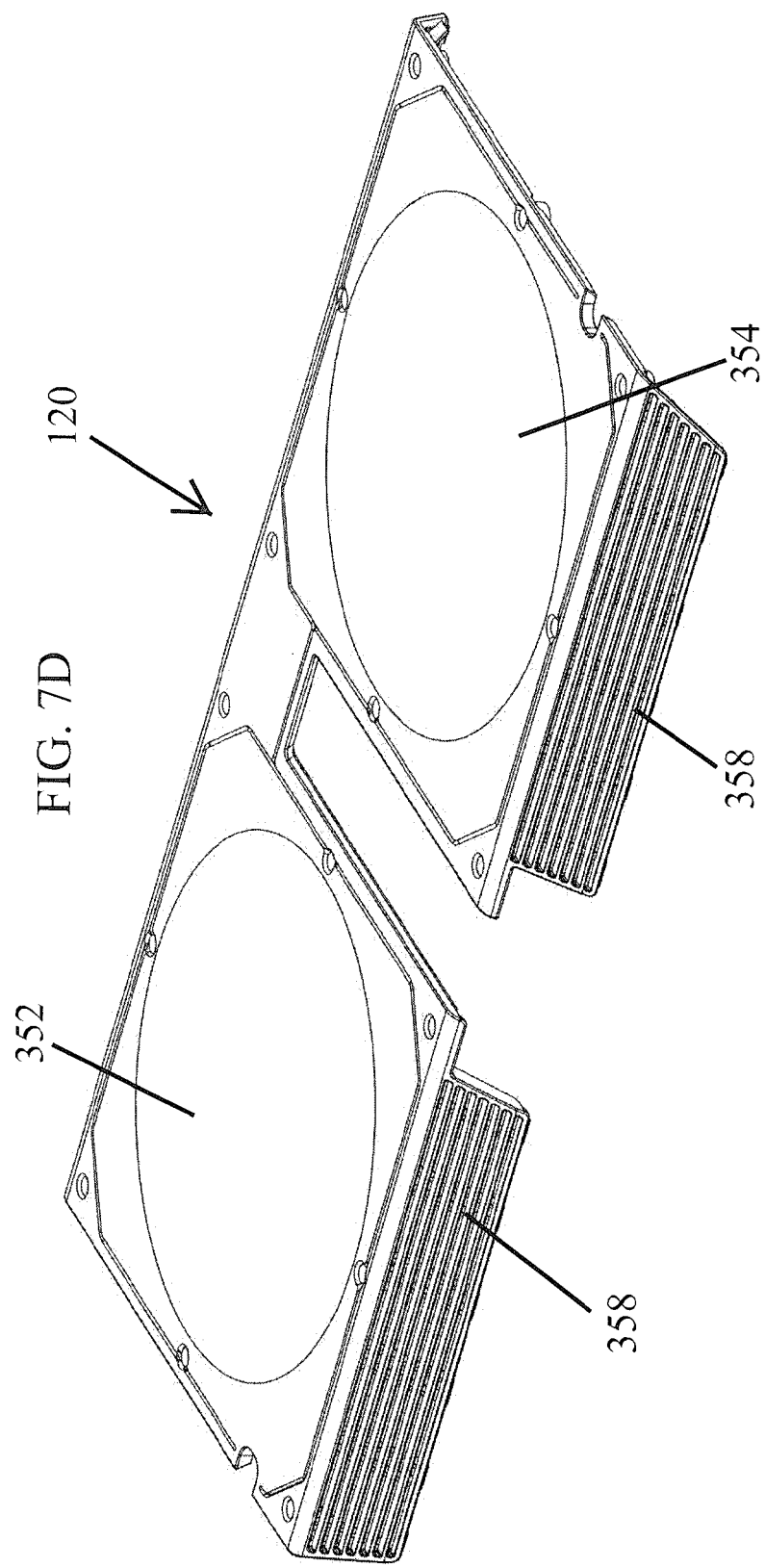
Figure 7E:
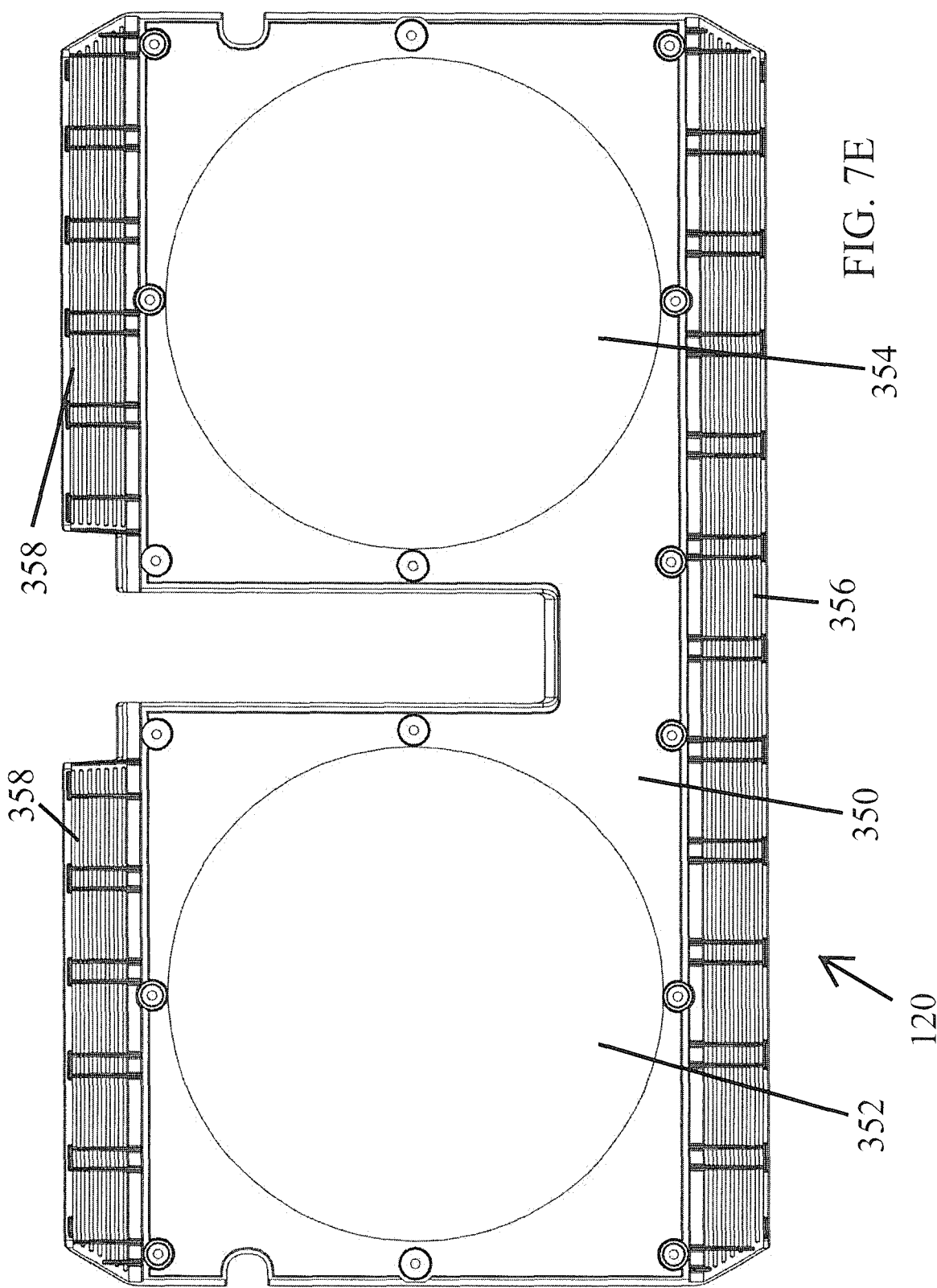
Figure 7F:
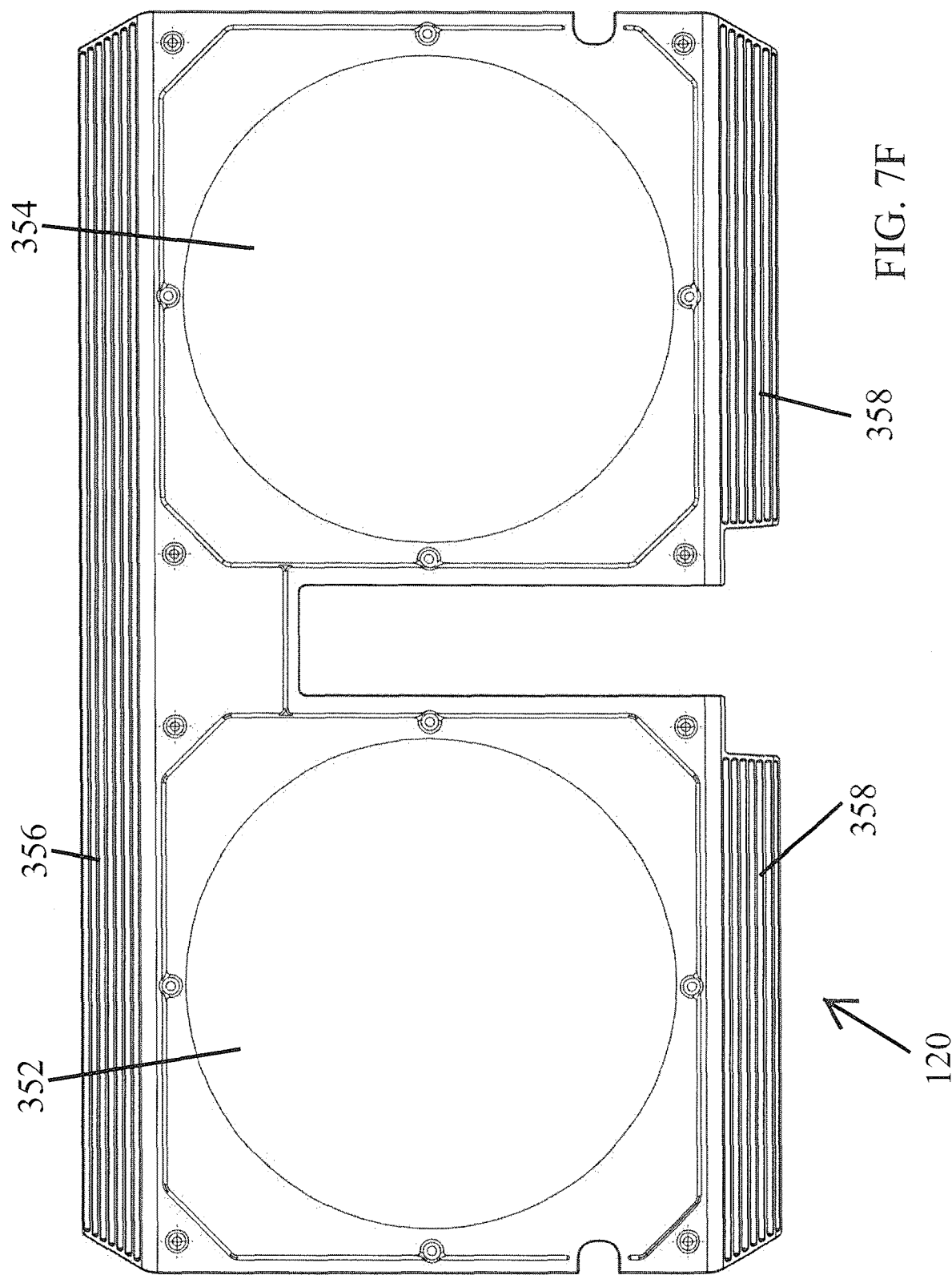
Figure 7G:
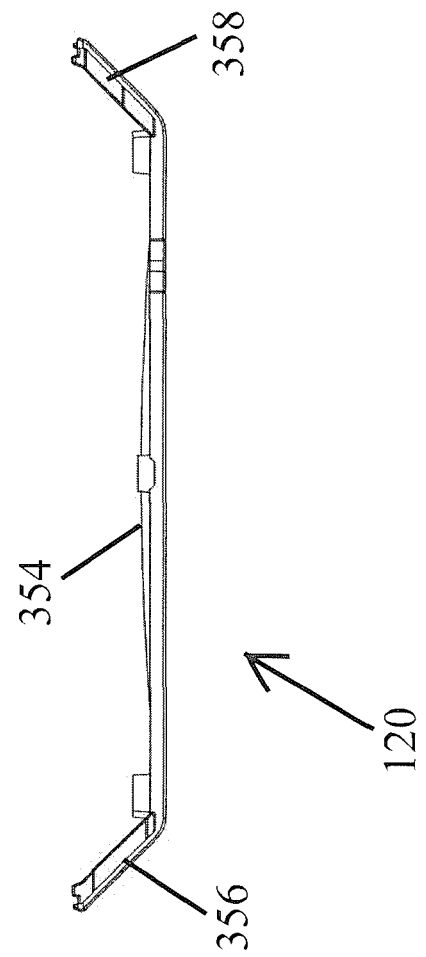
Figure 8A:
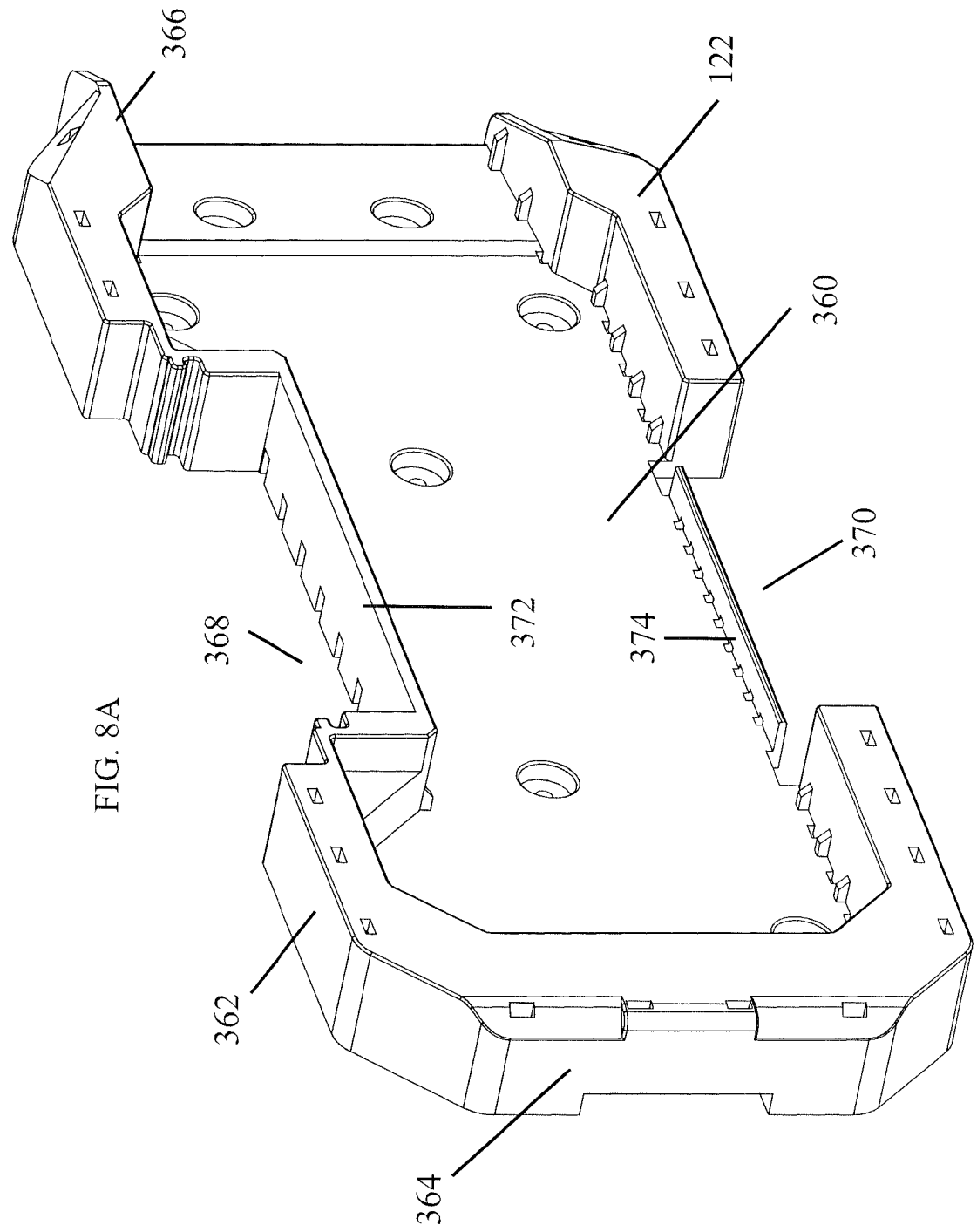
FIGS. 8A, 8B, 8C, 8D, 8E, 8F, 8G and 8H are respective simplified front/top view pictorial; back/top view pictorial, front/bottom view pictorial, back/bottom view pictorial, top planar view, bottom planar view, right side planar view and left side planar view illustrations of a right side bracket engaging element, forming part of the job site communications center of FIGS. 1A-2.
Figure 8B:
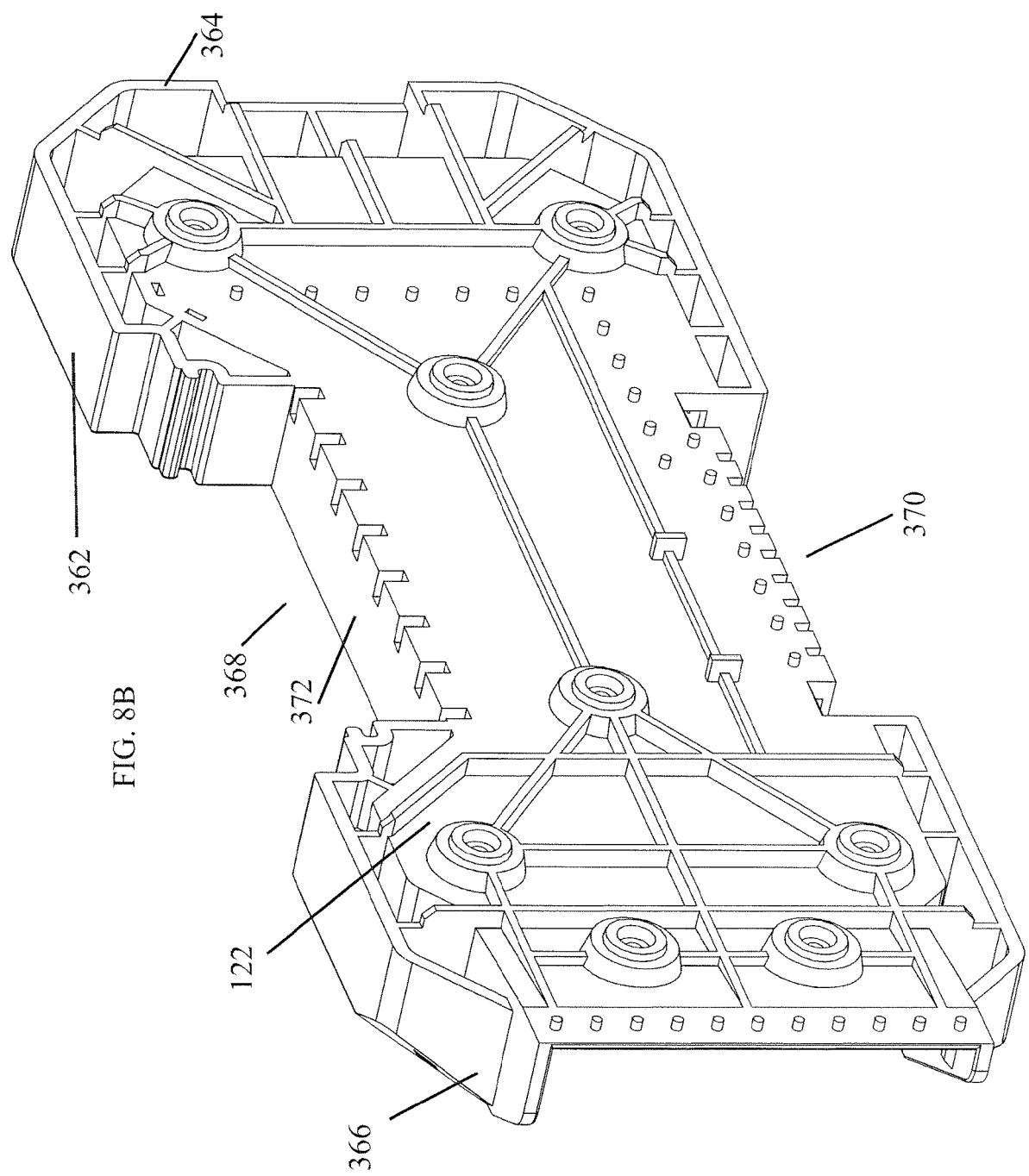
Figure 8C:
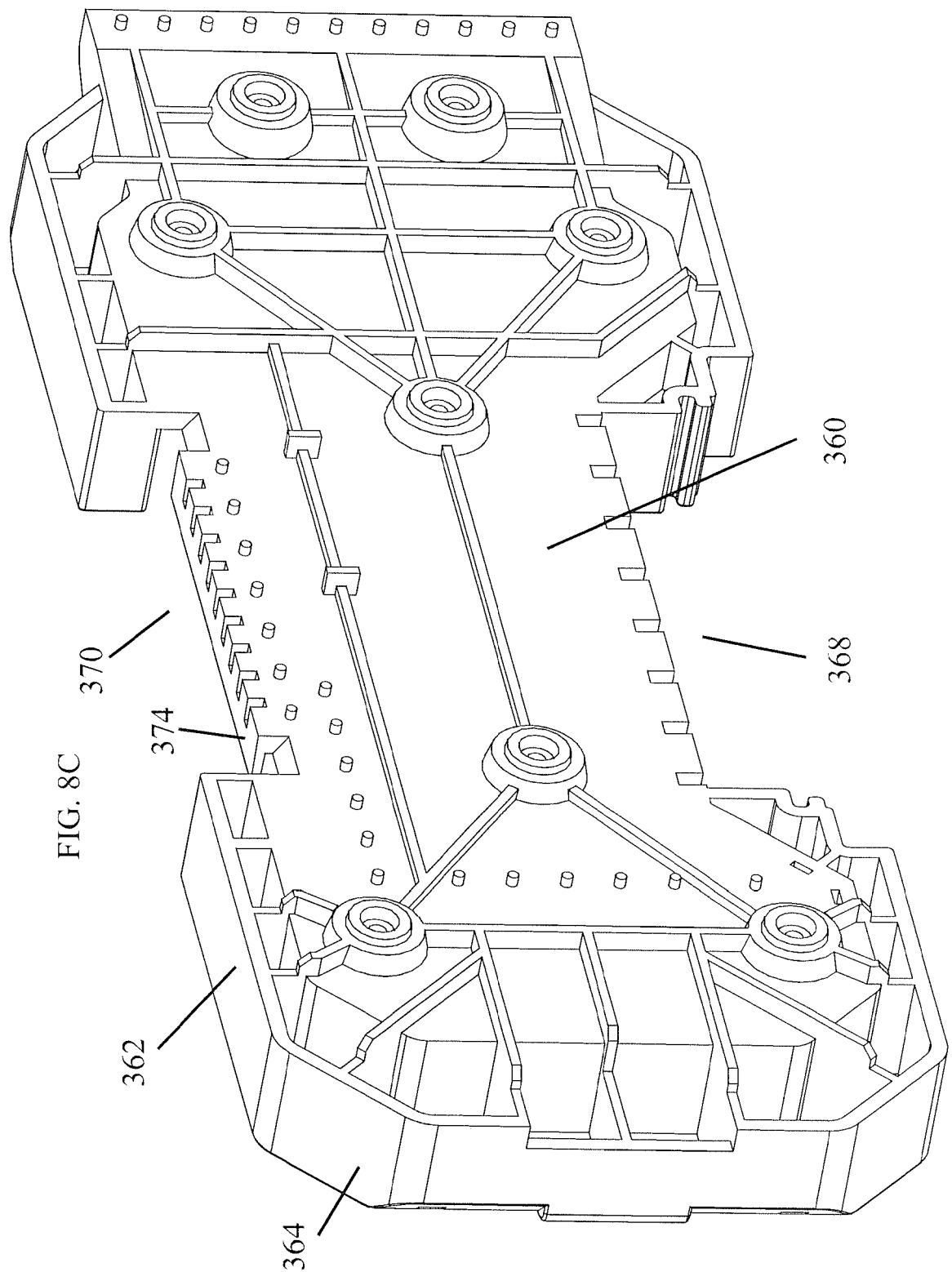
Figure 8D:
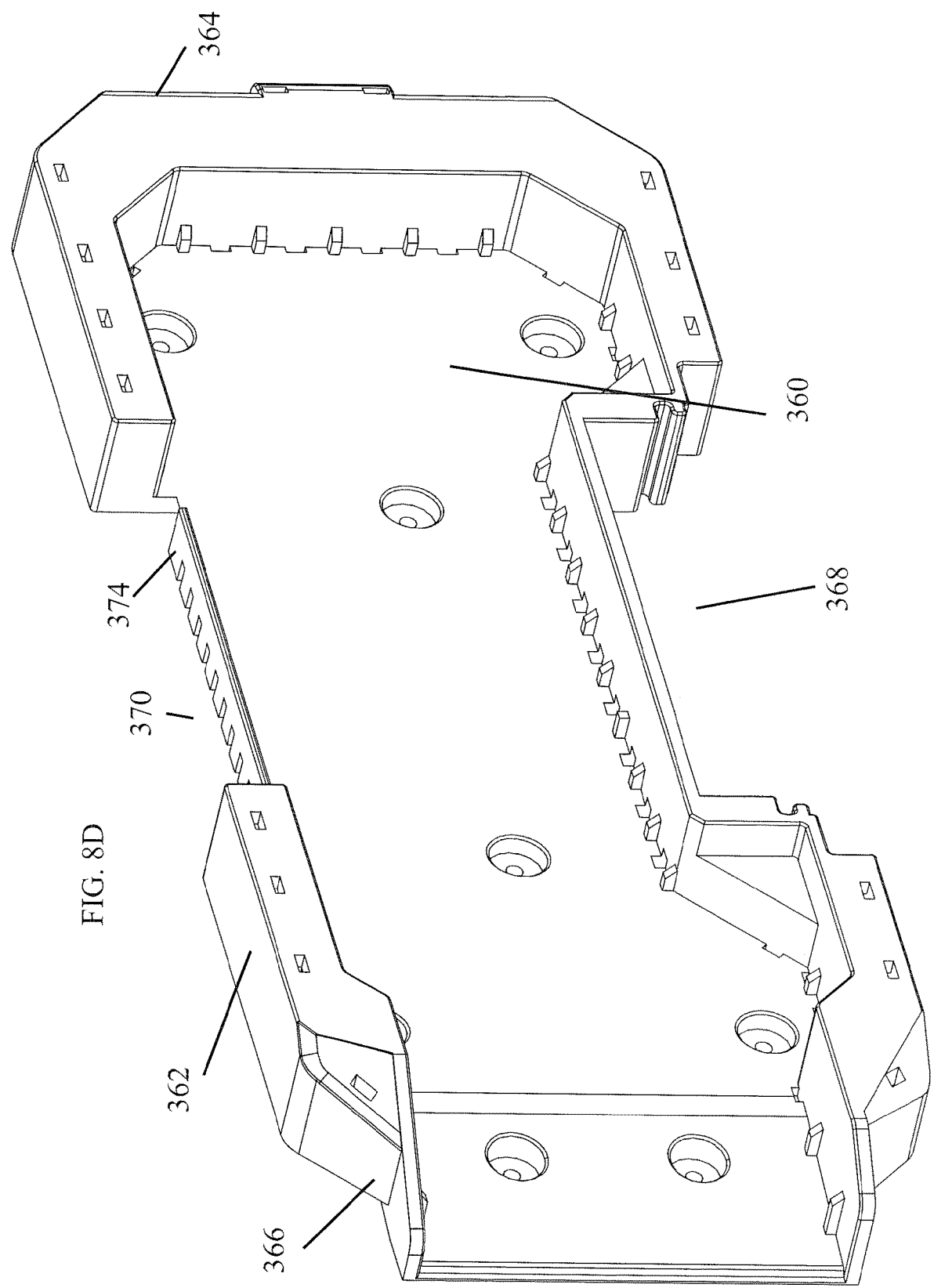
Figure 8E:
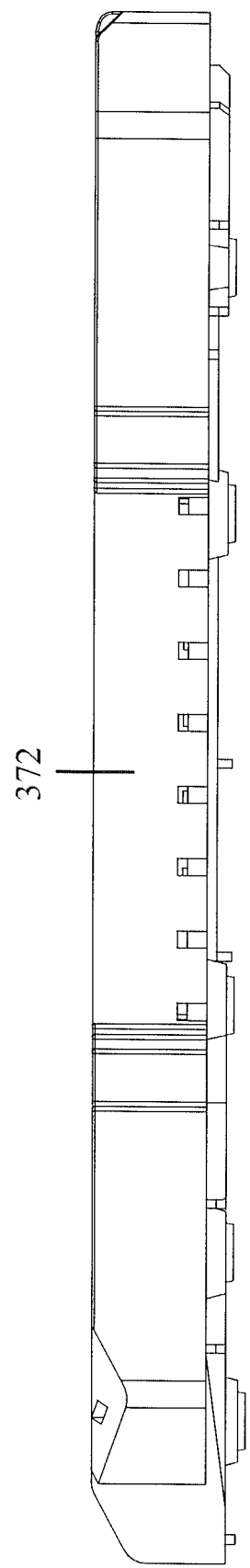
Figure 8F:
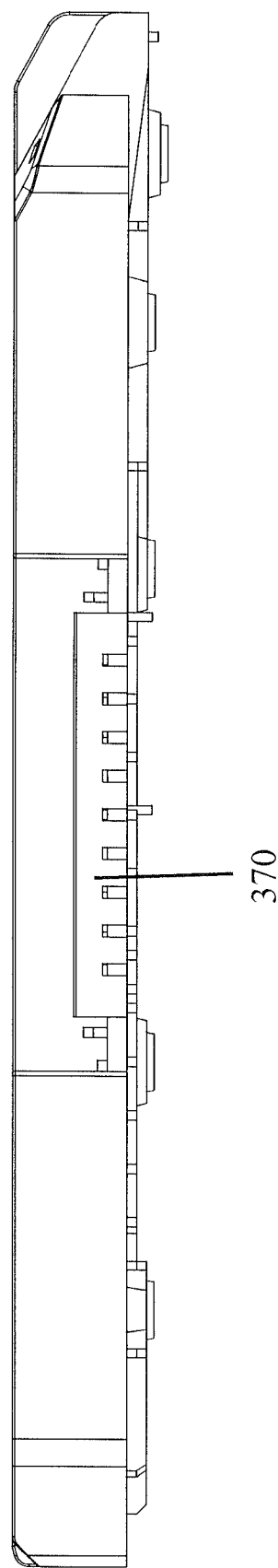
Figure 8G:
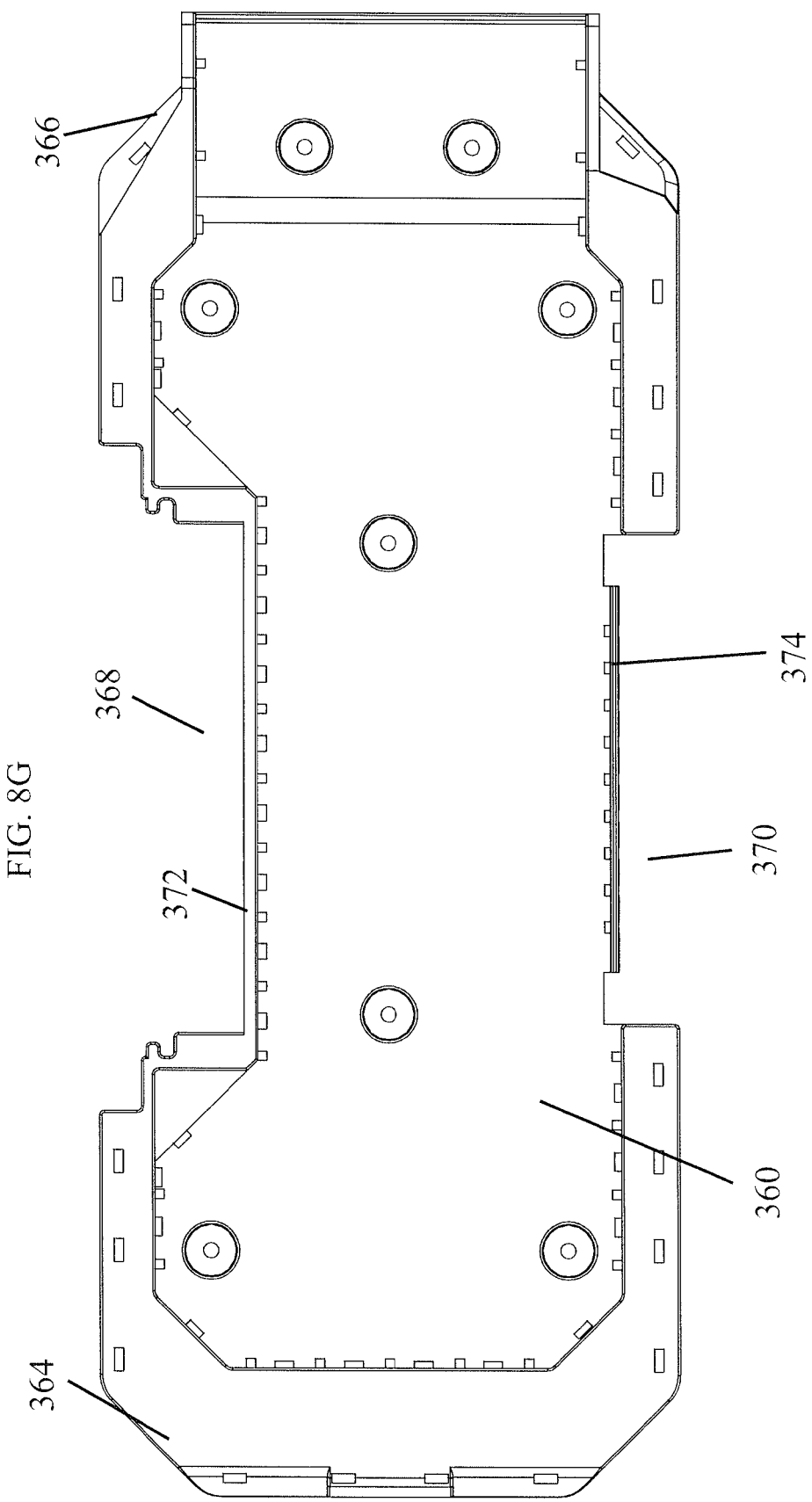
Figure 8H:
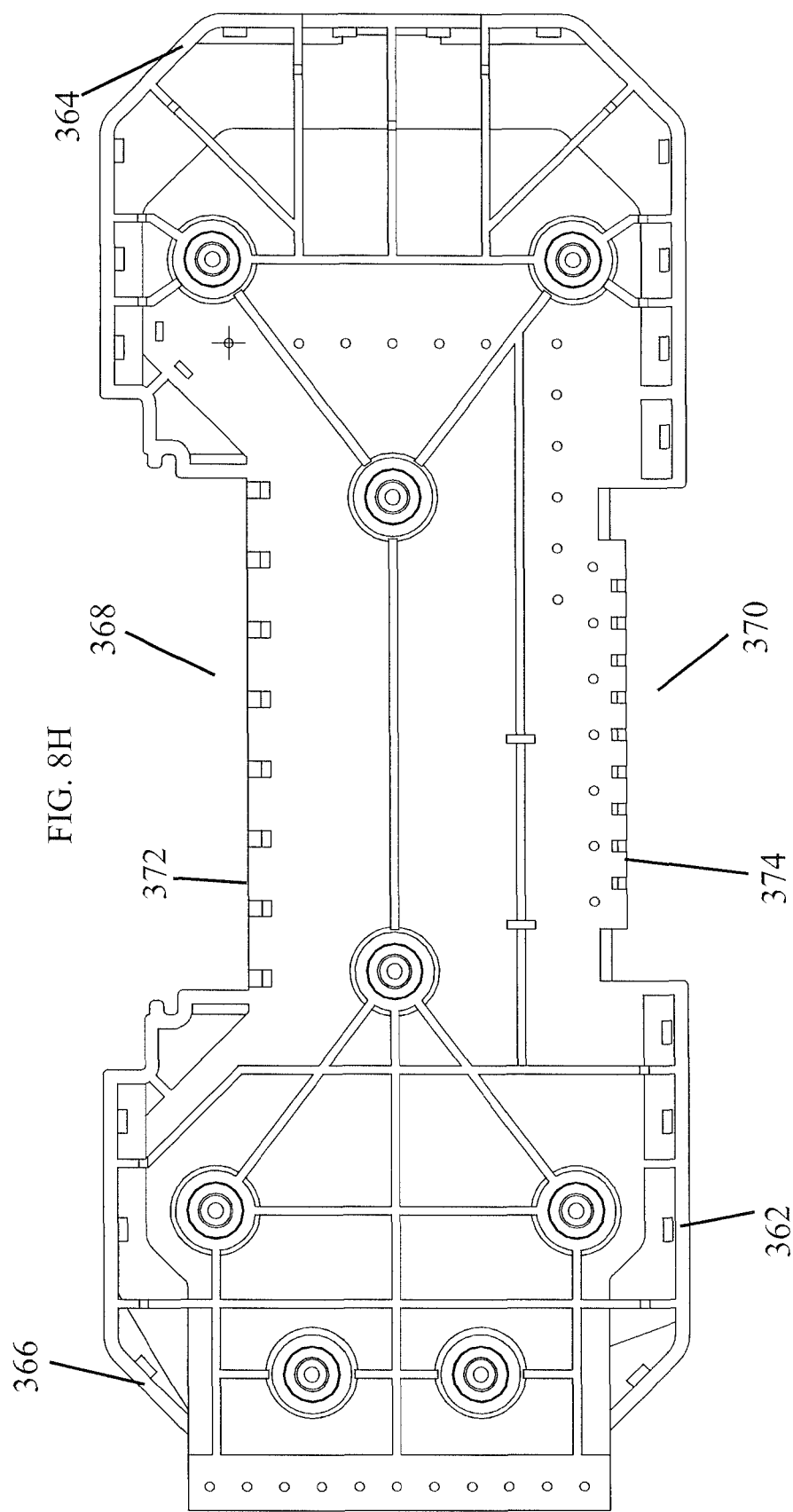
Figure 9A:
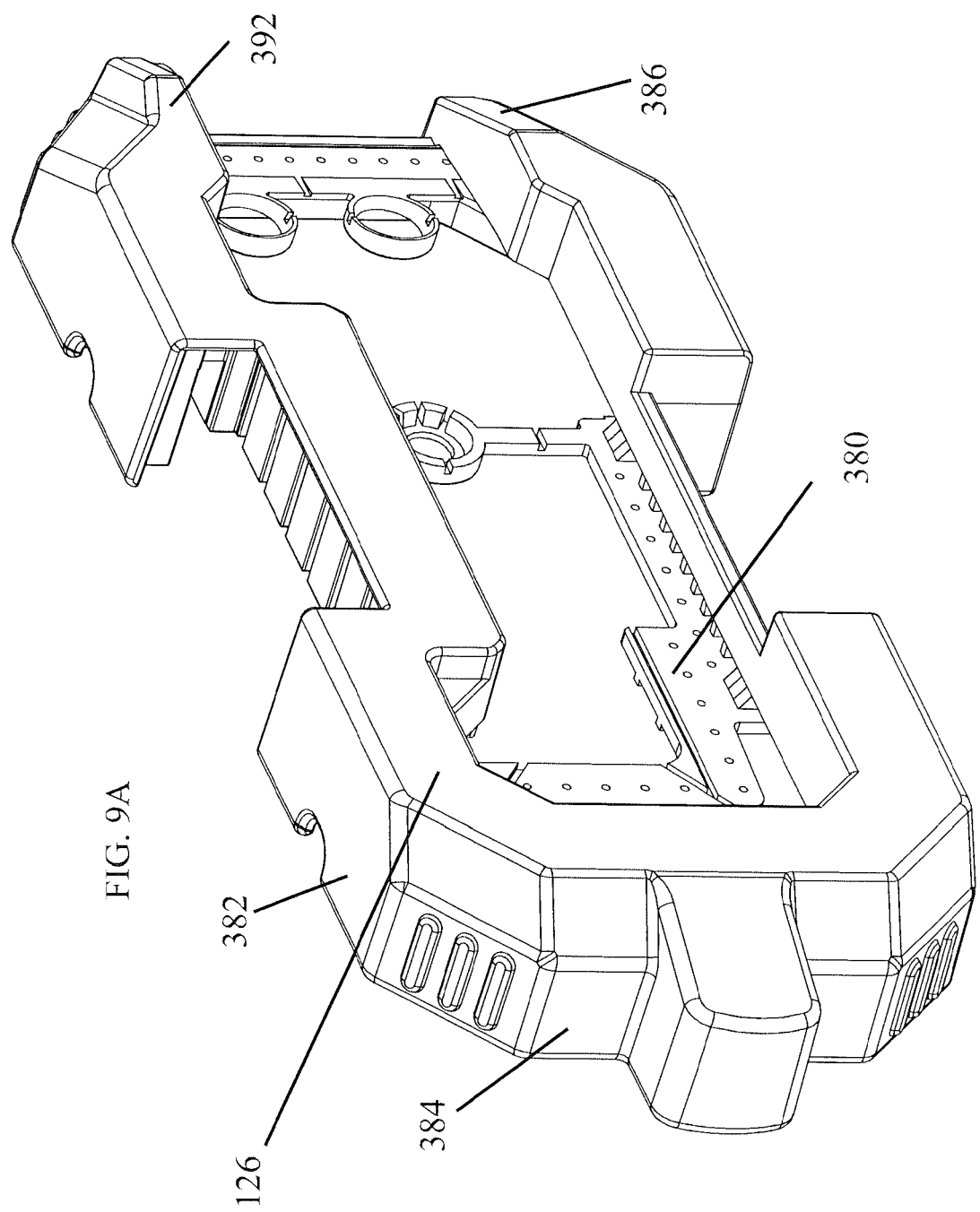
Figure 9C:
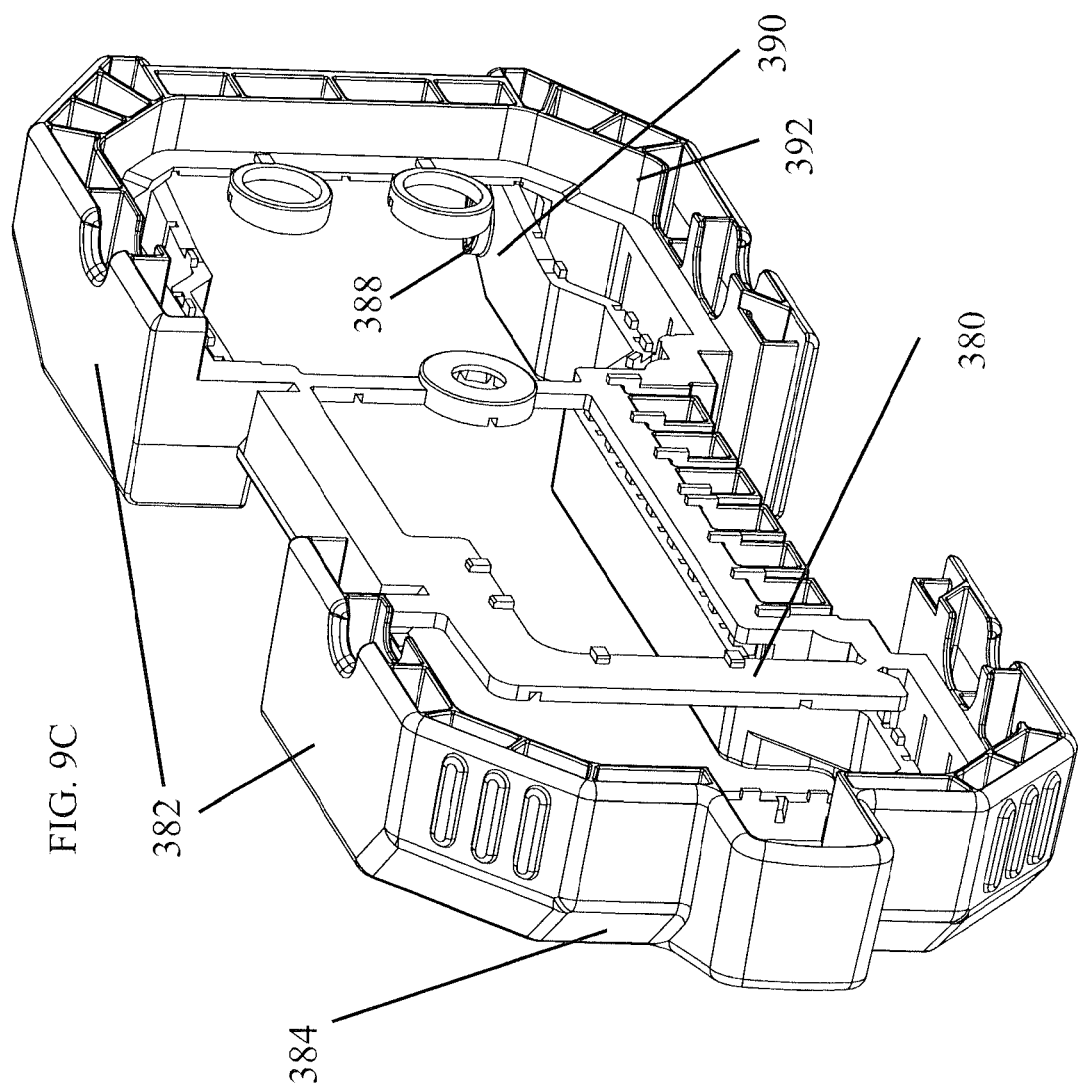
Figure 9D:
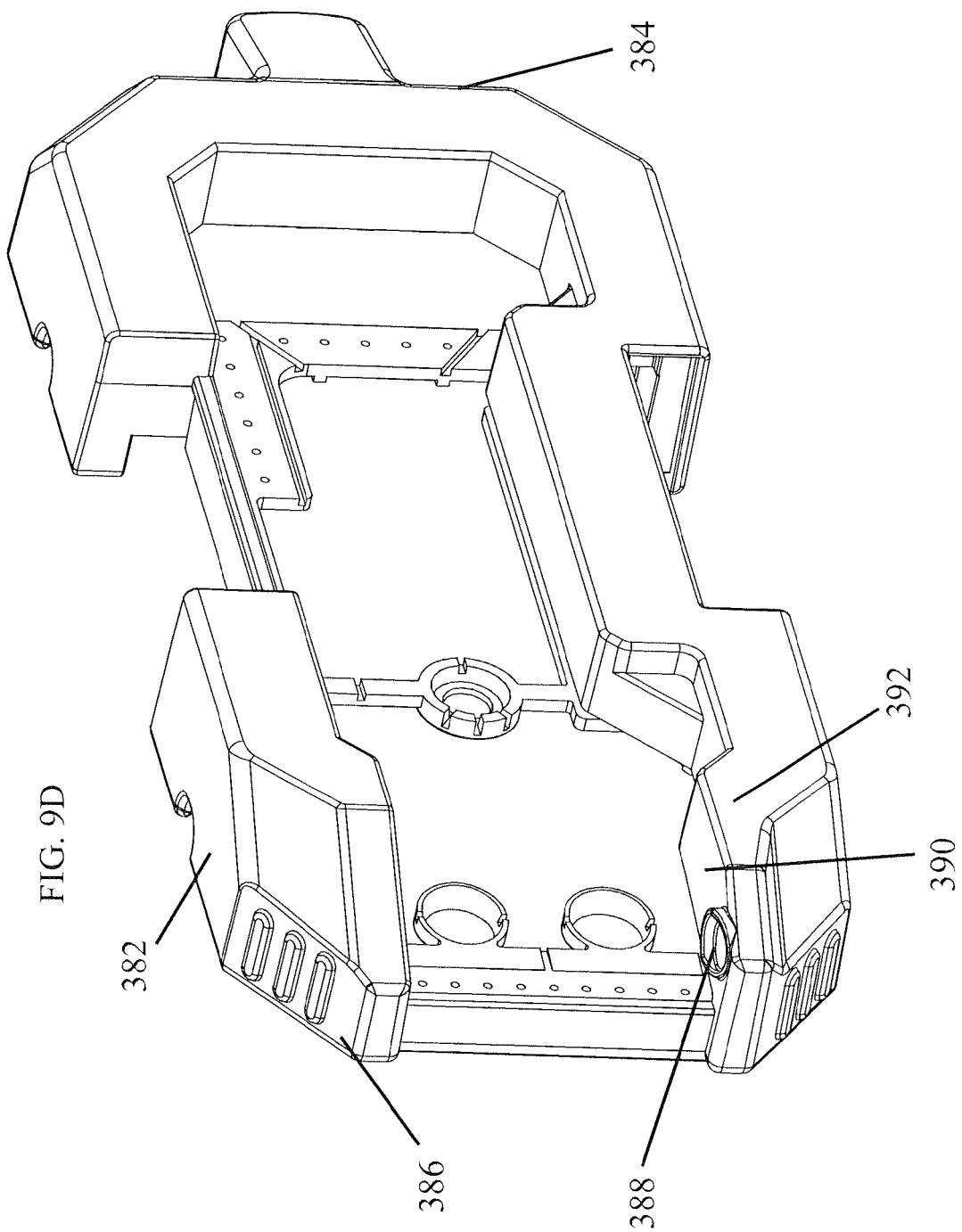
Figure 9E:
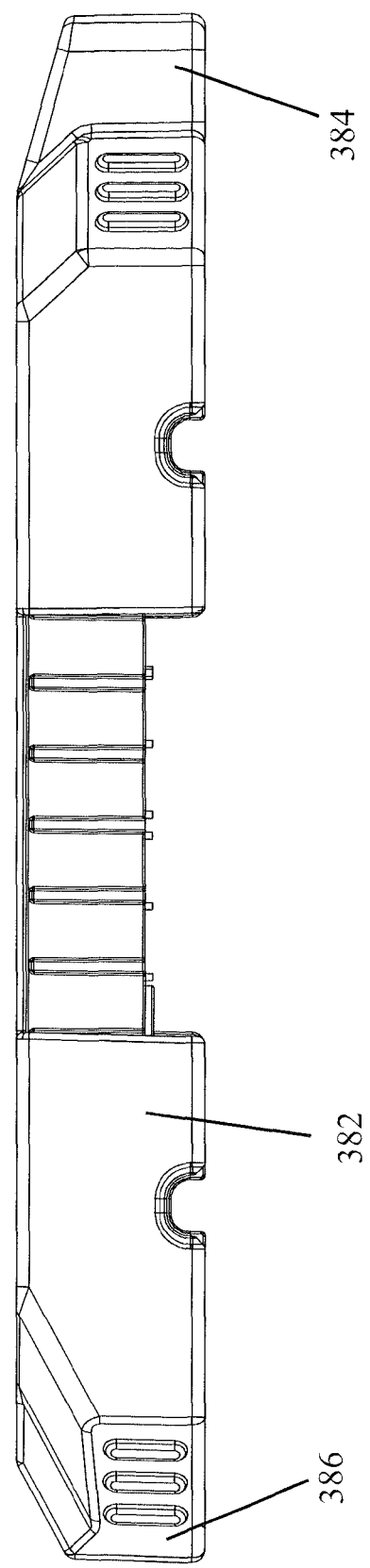
Figure 9F:
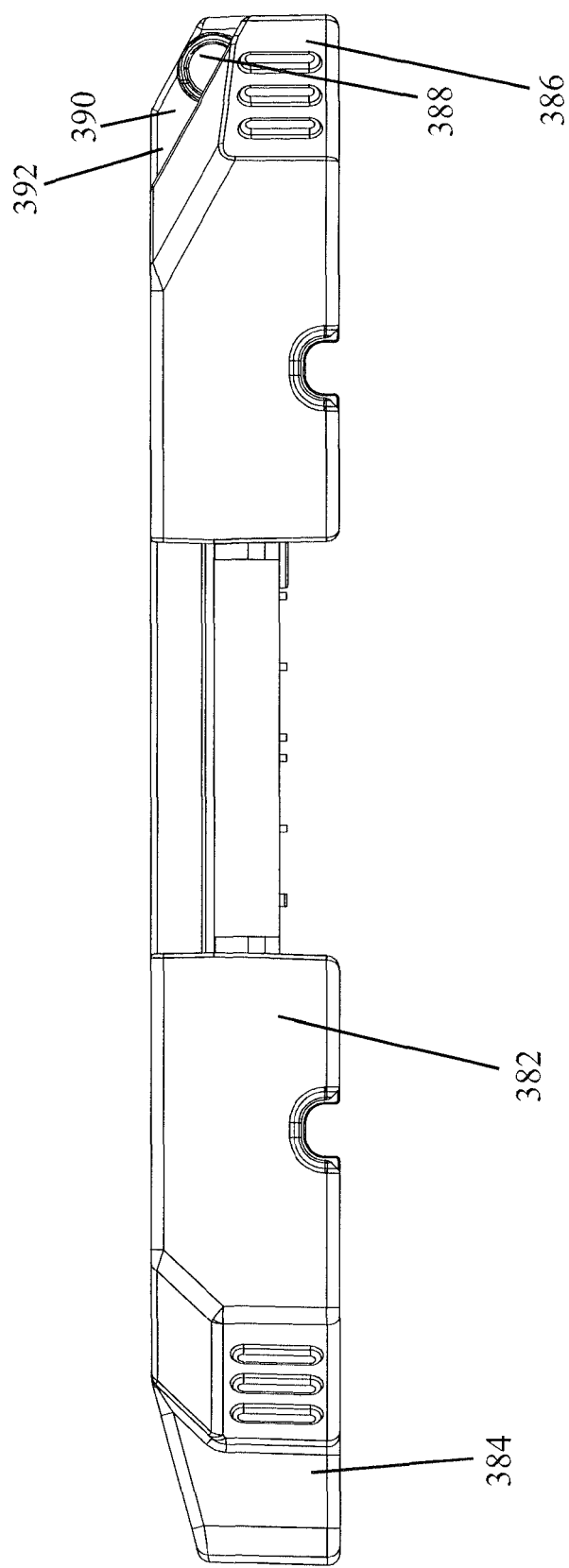
Figure 9G:
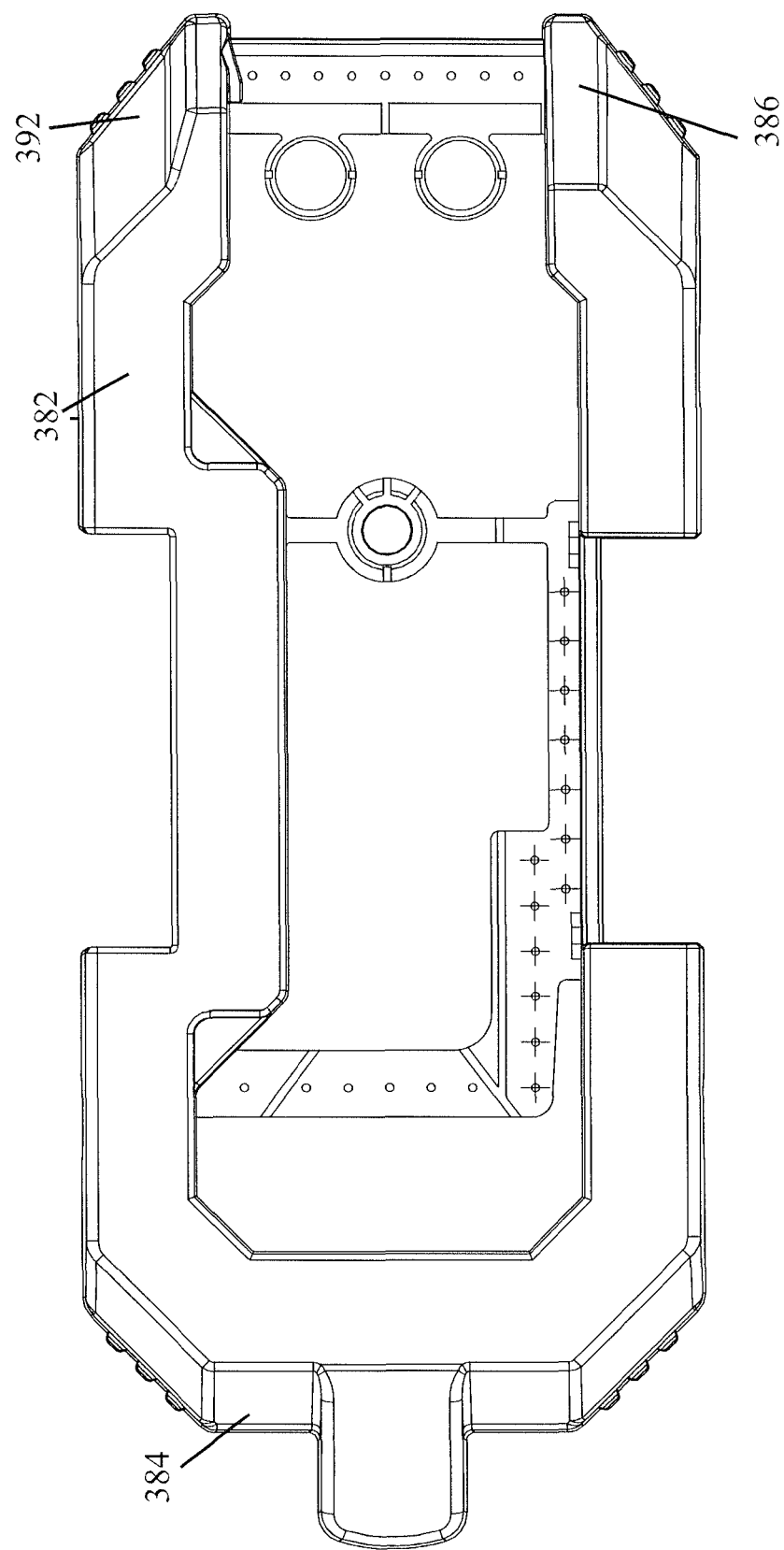
Figure 9H:
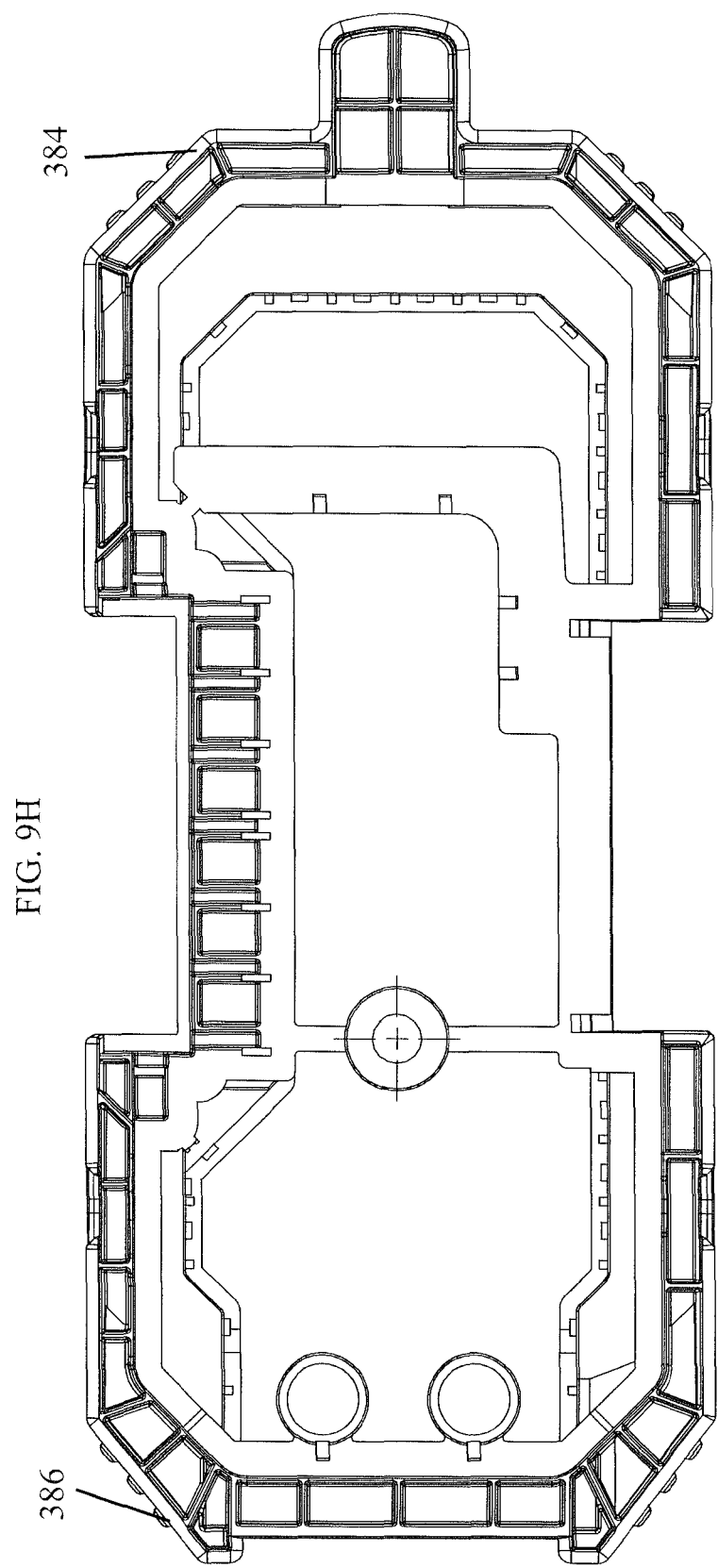
Figure 10A:
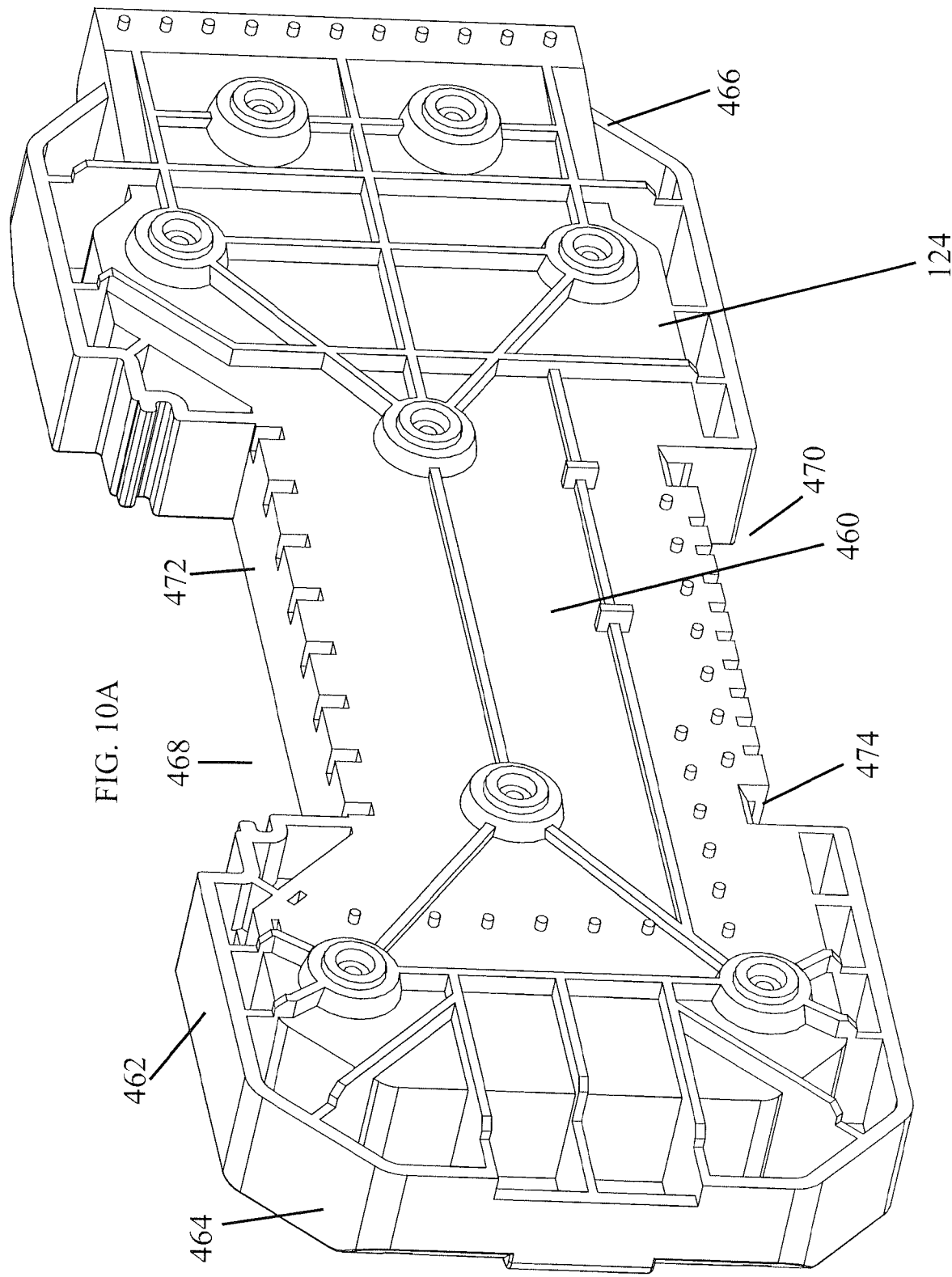
Figure 10B:
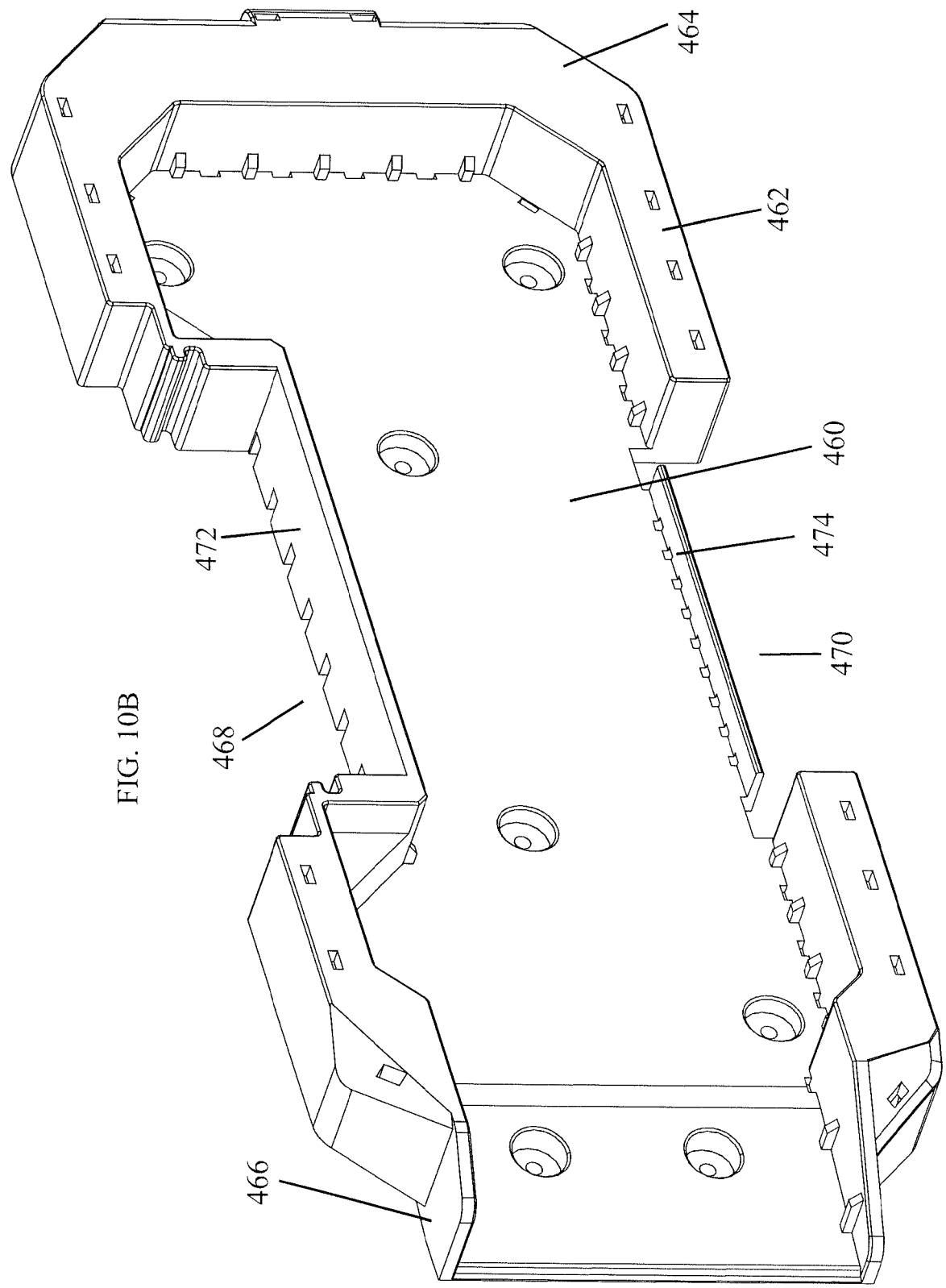
Figure 10C:
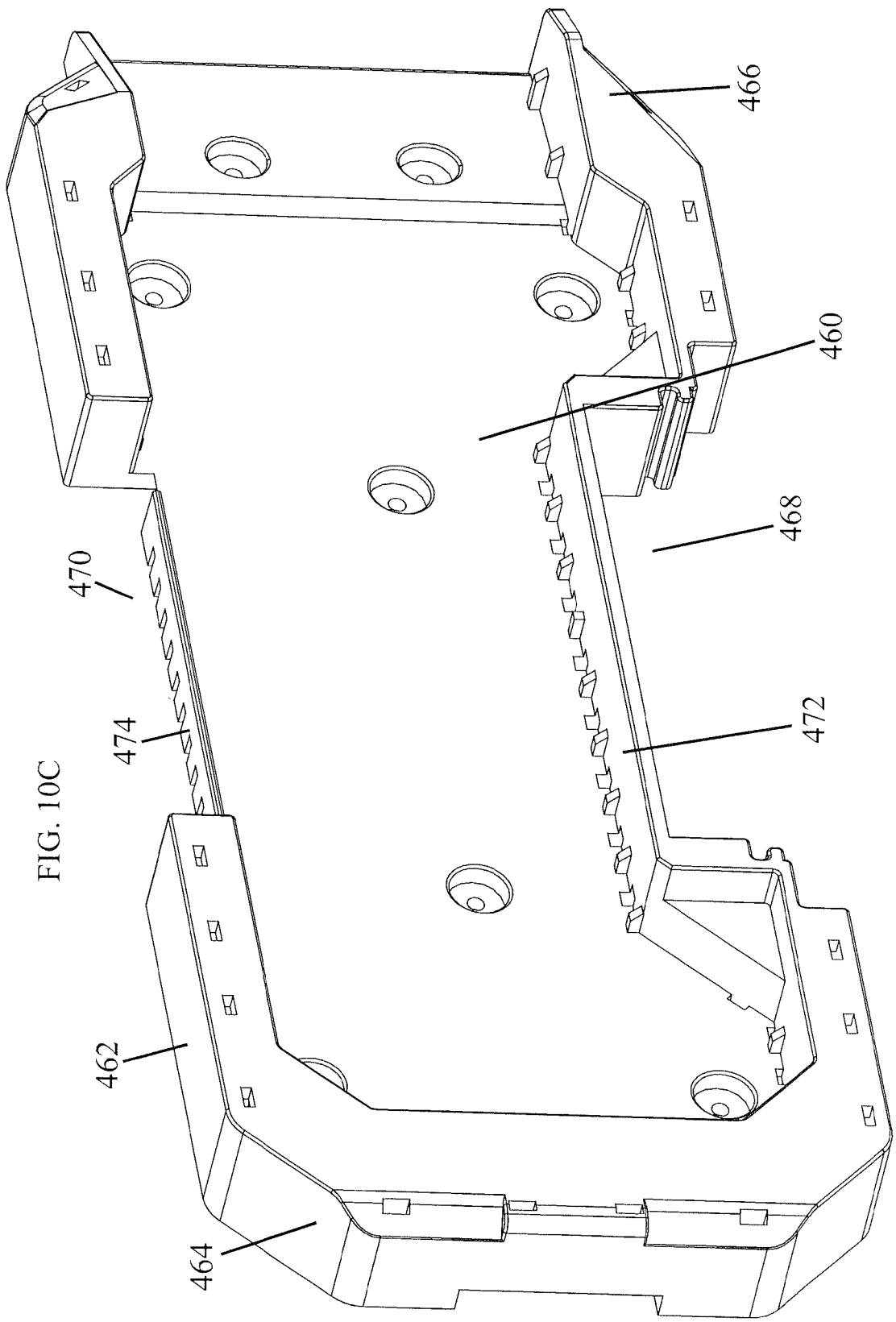
Figure 10D:
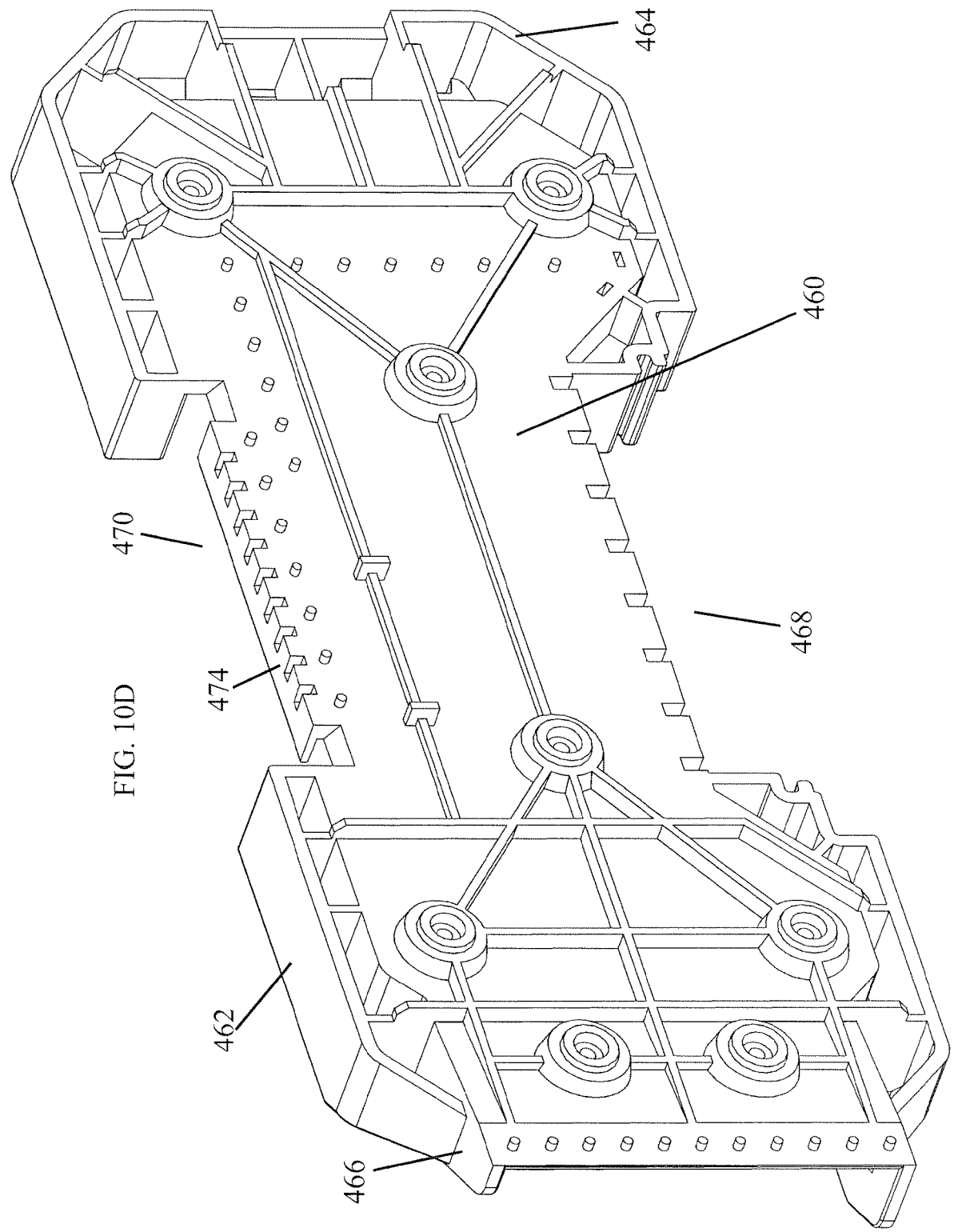
Figure 10E:
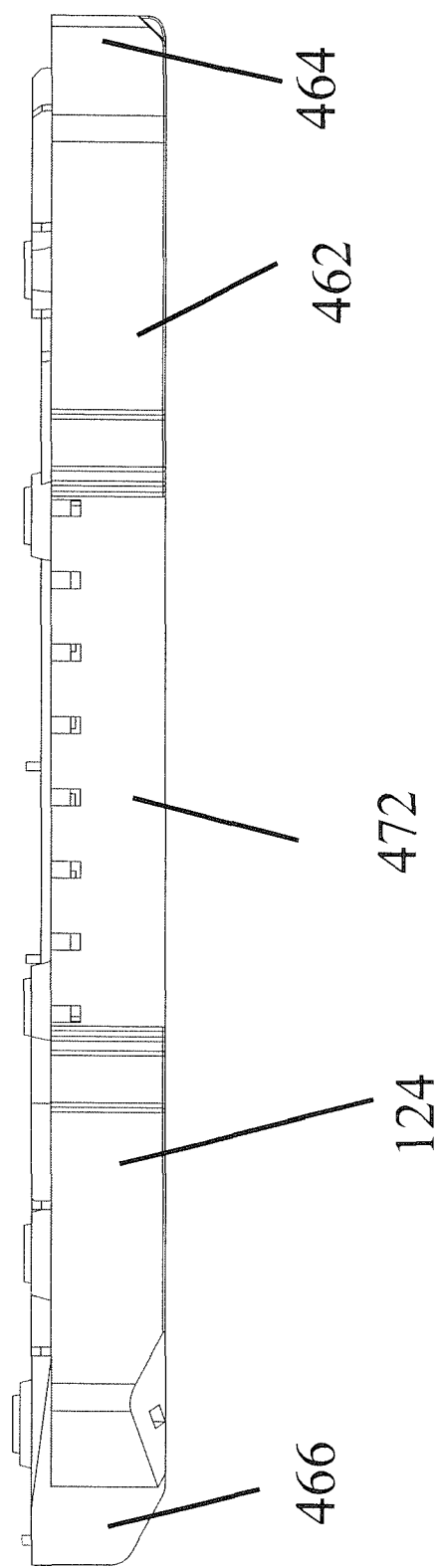
Figure 10F:
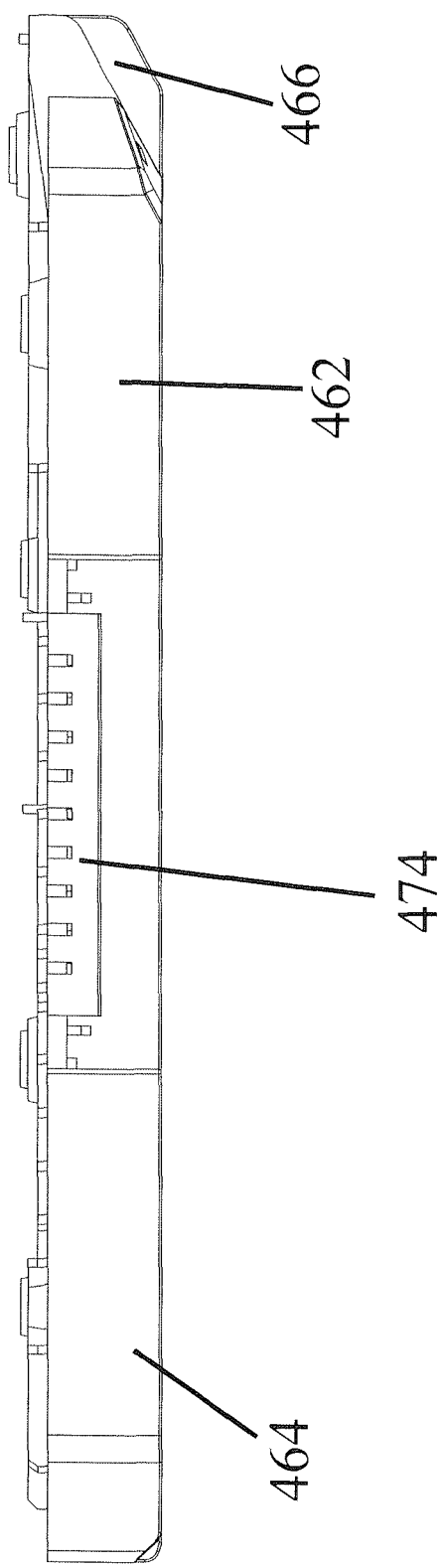
Figure 10G:
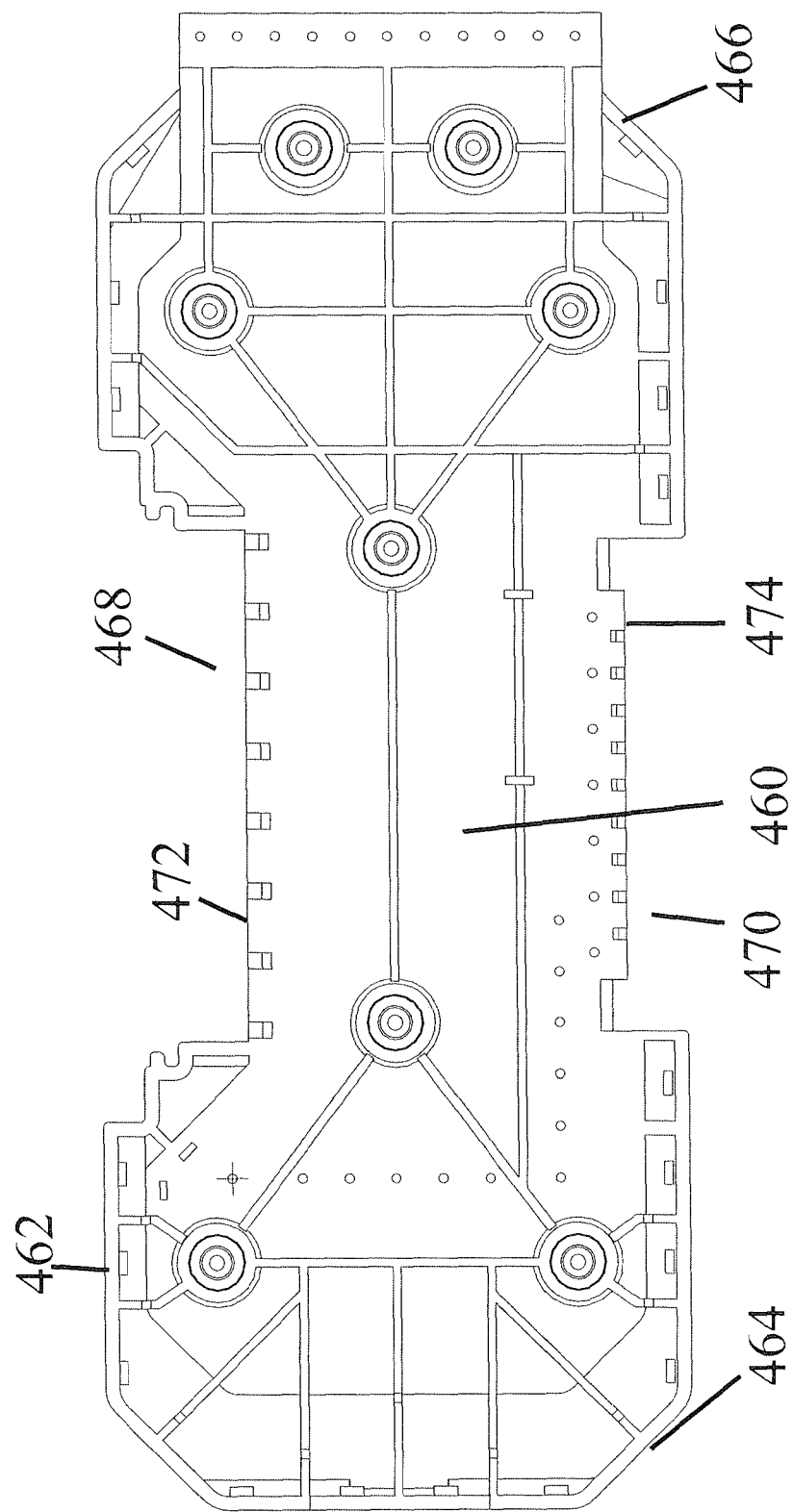
Figure 11A:
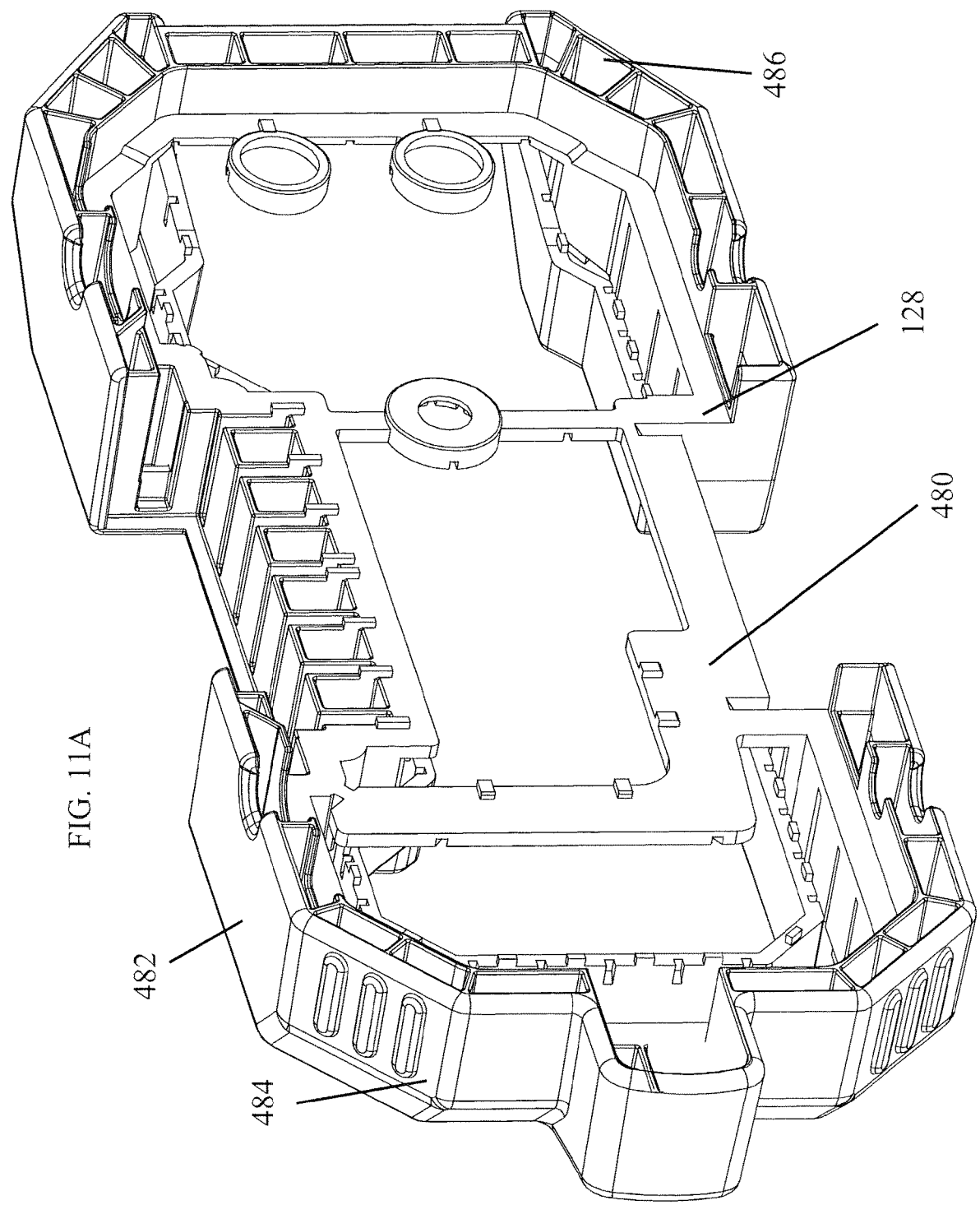
FIGS. 11A, 11B, 11C, 11D, 11E, 11F, 11G and 11H are respective simplified front/top view pictorial; back/top view pictorial, front/bottom view pictorial, back/bottom view pictorial, top planar view, bottom planar view, right side planar view and left side planar view illustrations of a left side bumper, forming part of the job site communications center of FIGS. 1A-2.
Figure 11B:
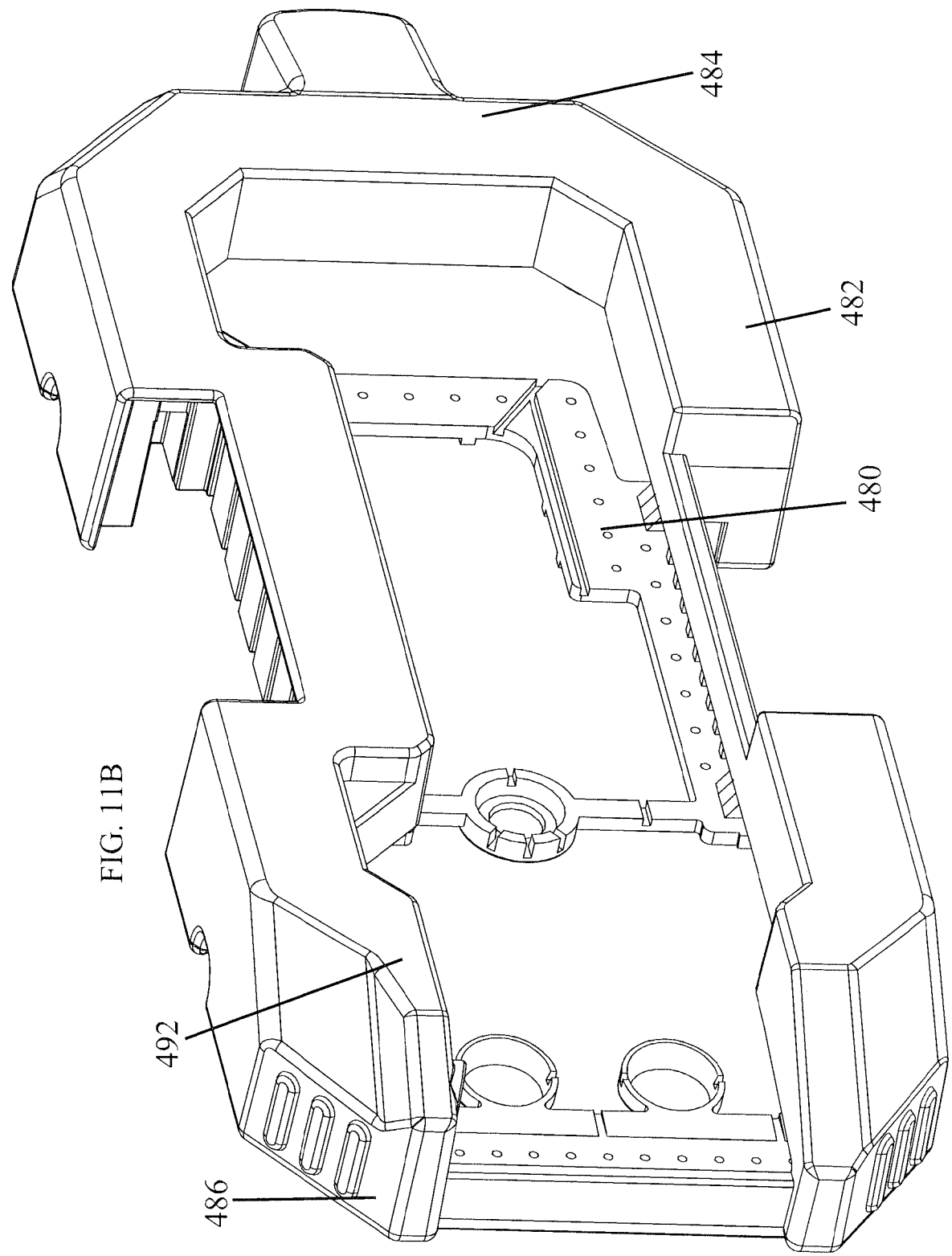
Figure 11C:
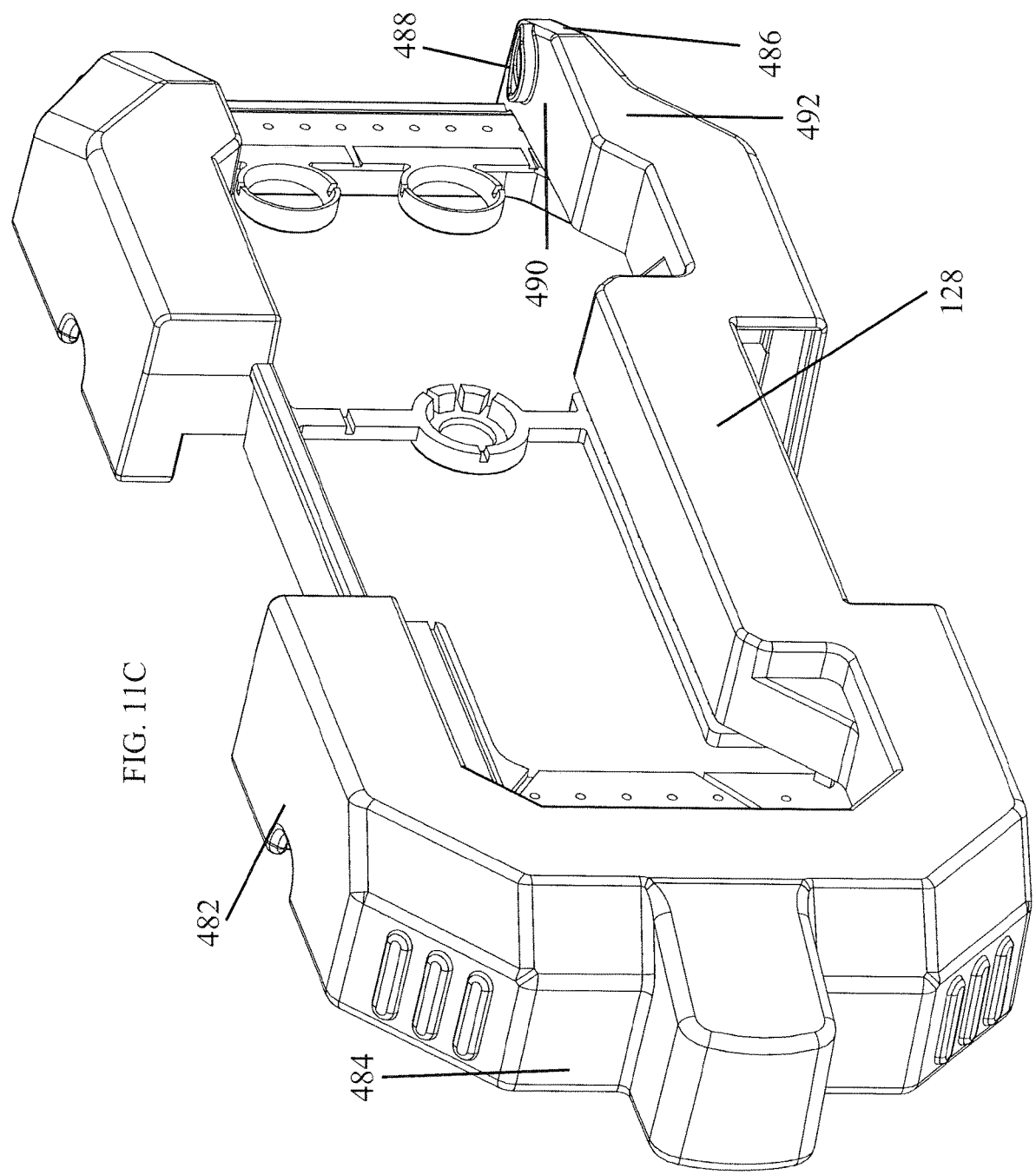
Figure 11D:
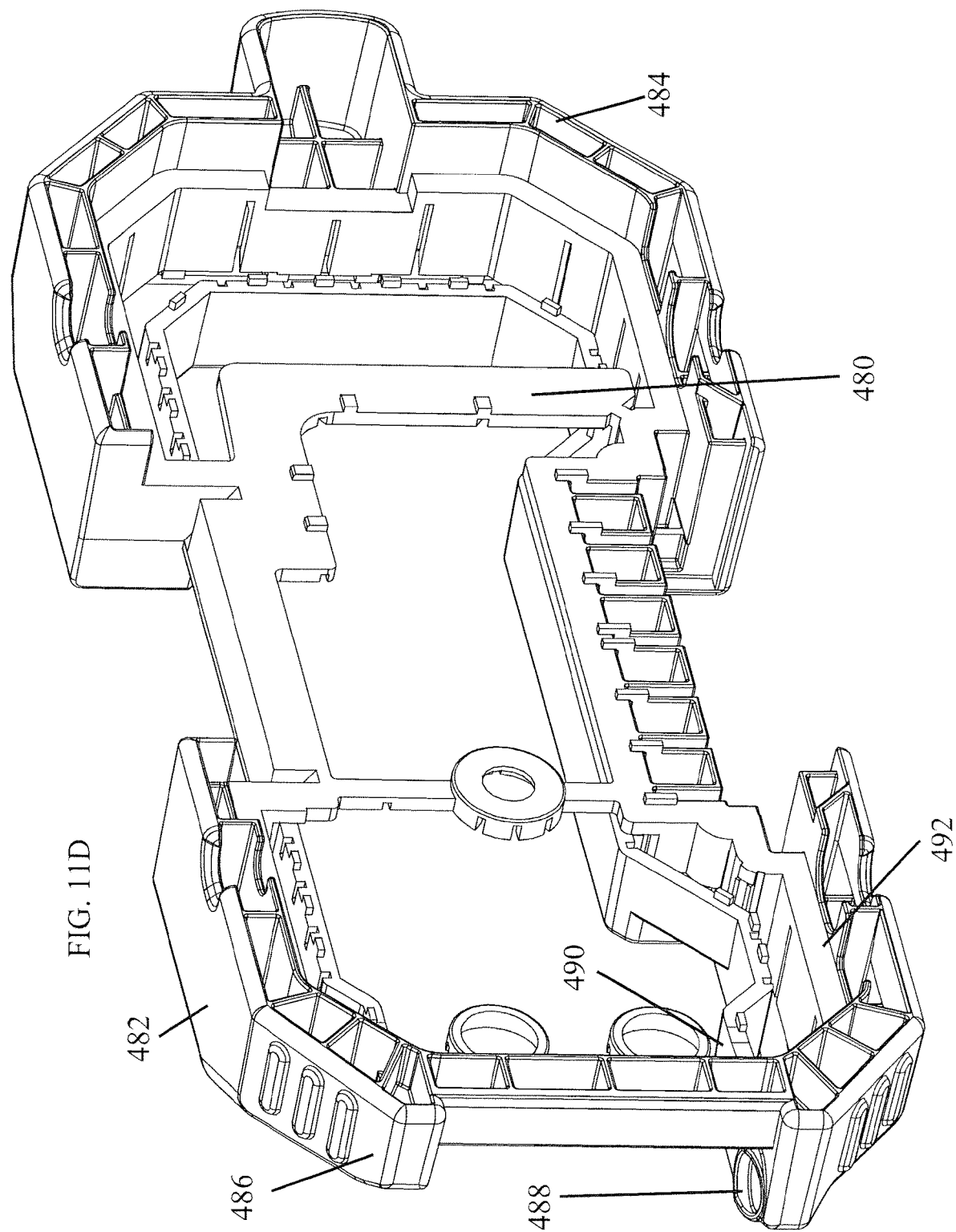
Figure 11E:
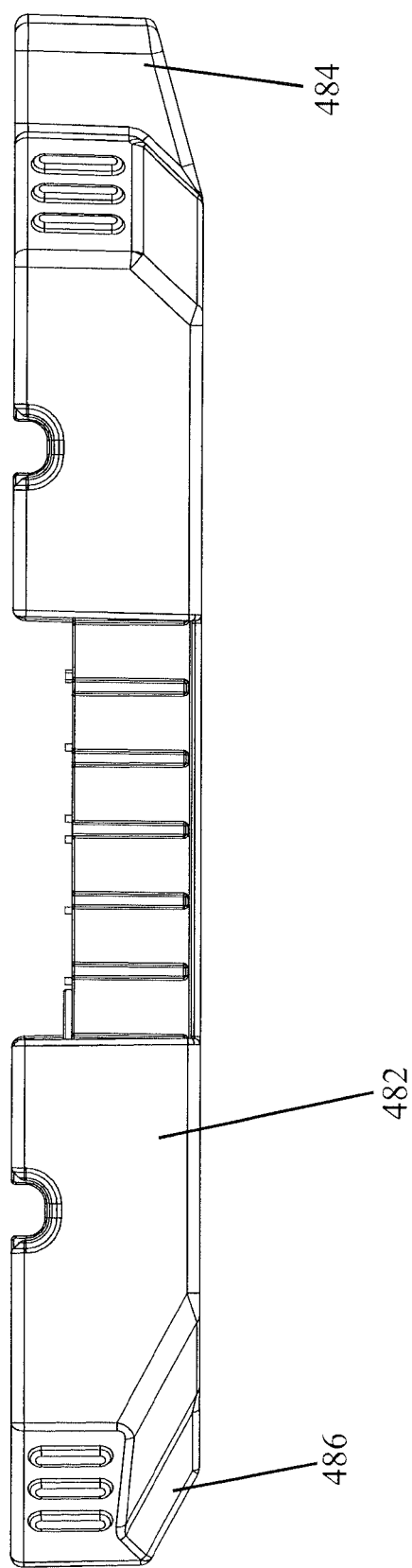
Figure 11F:
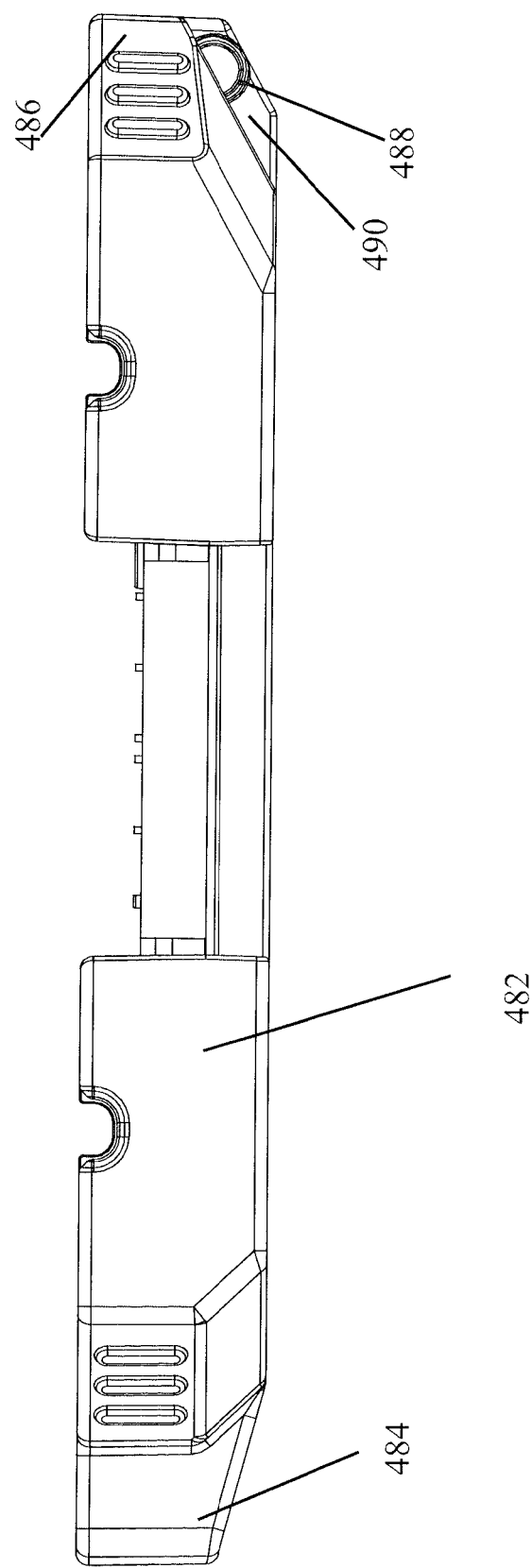
Figure 11G:
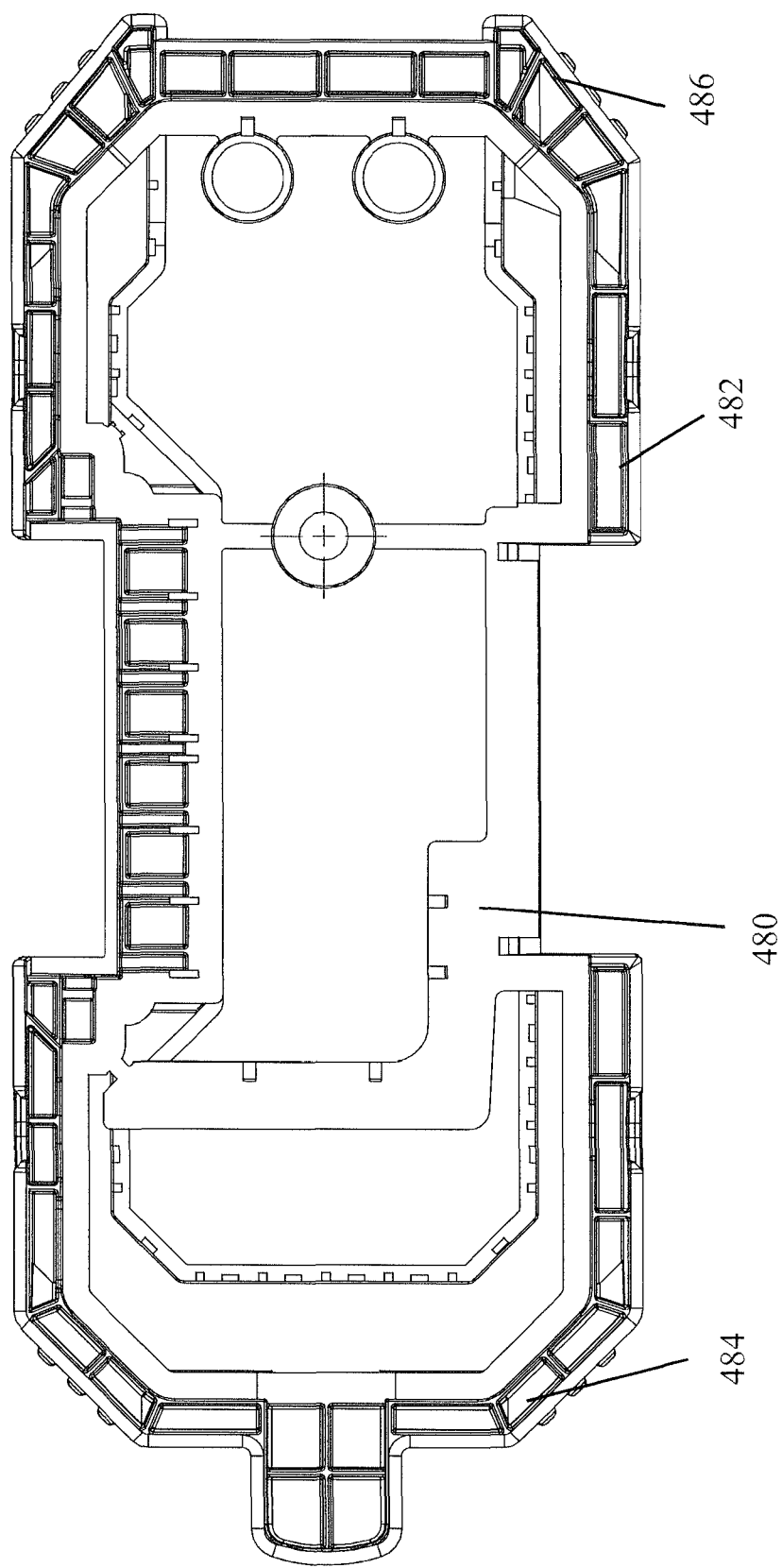
Figure 11H:
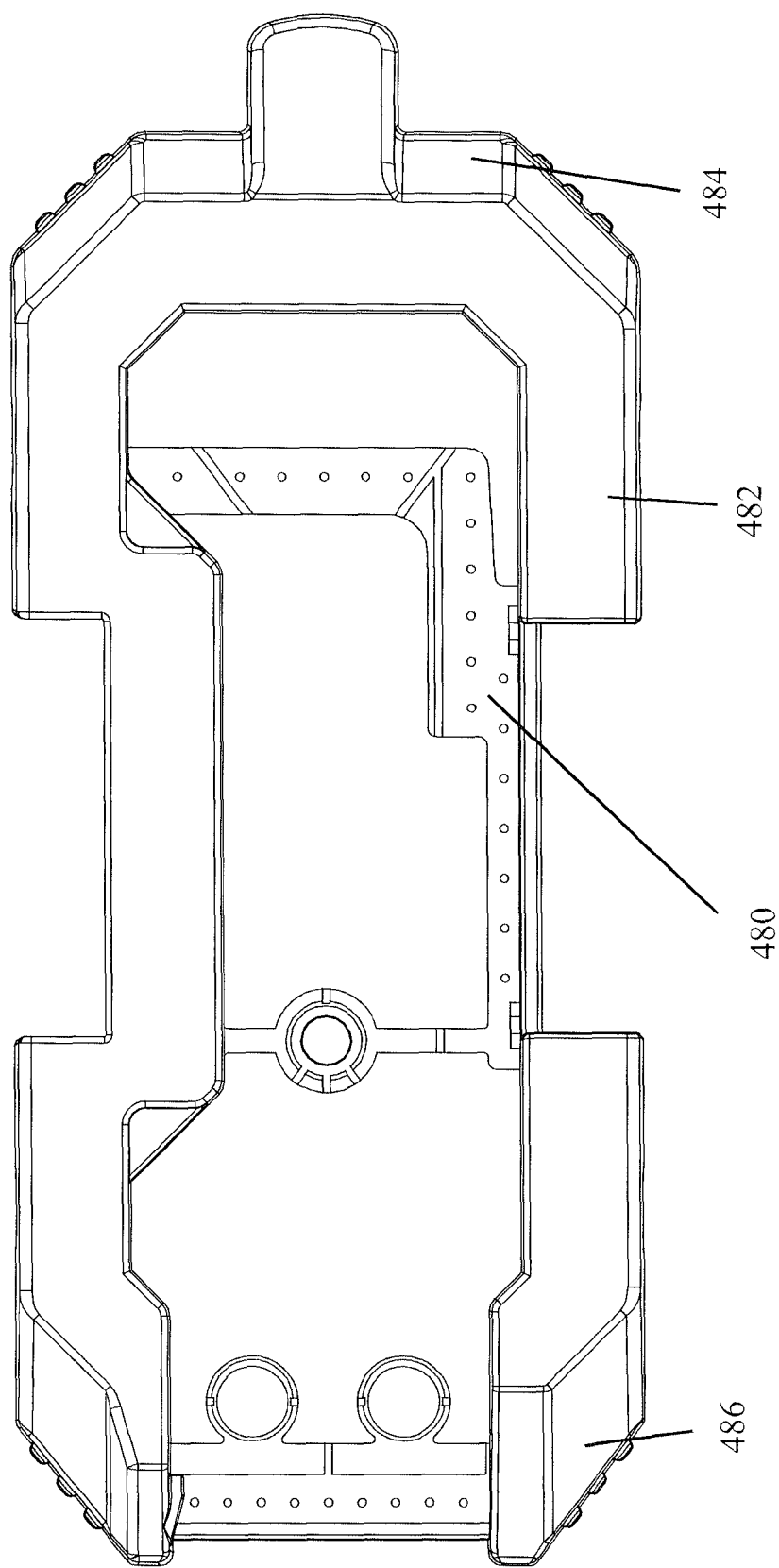
Figure 12B:
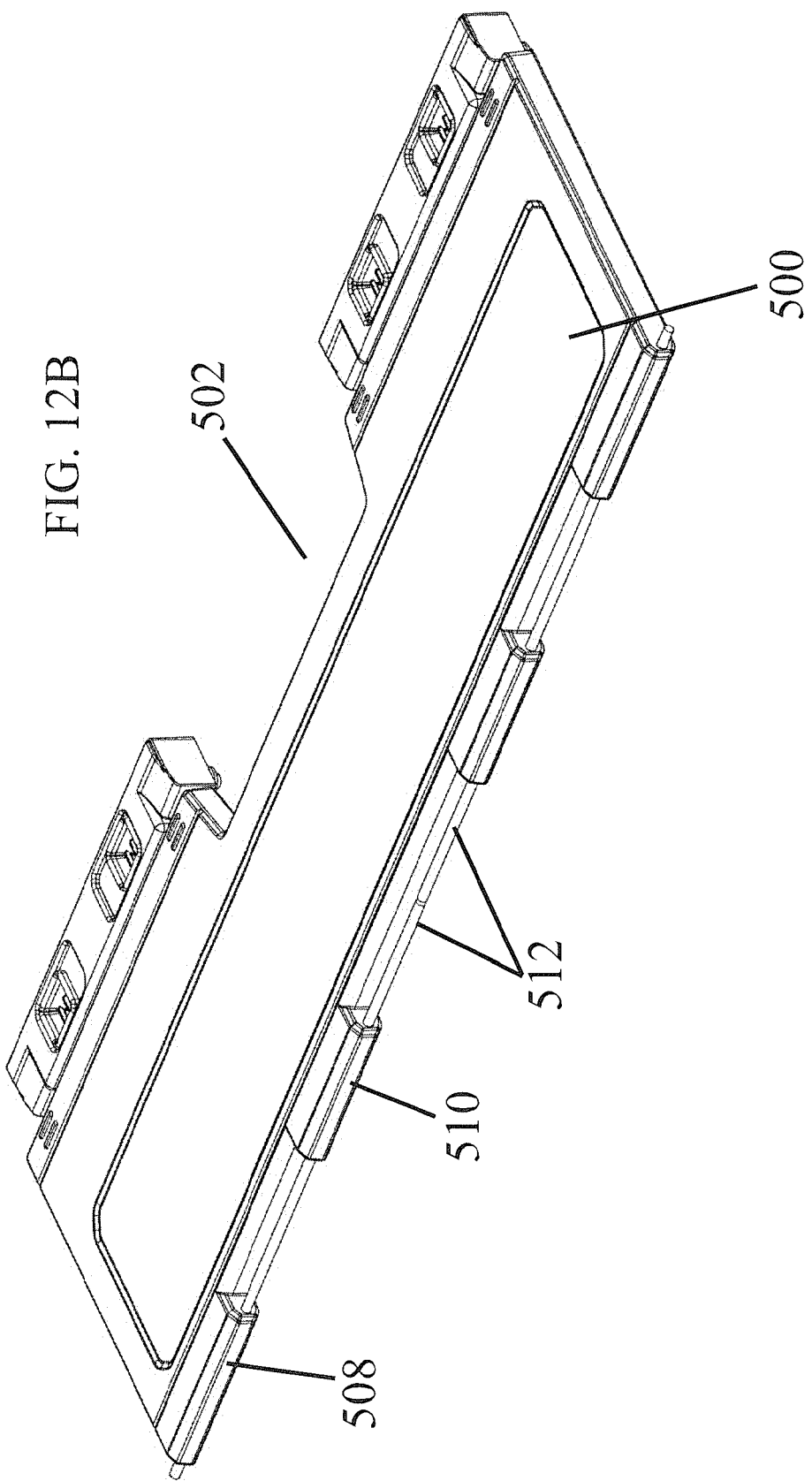
Figure 12C:
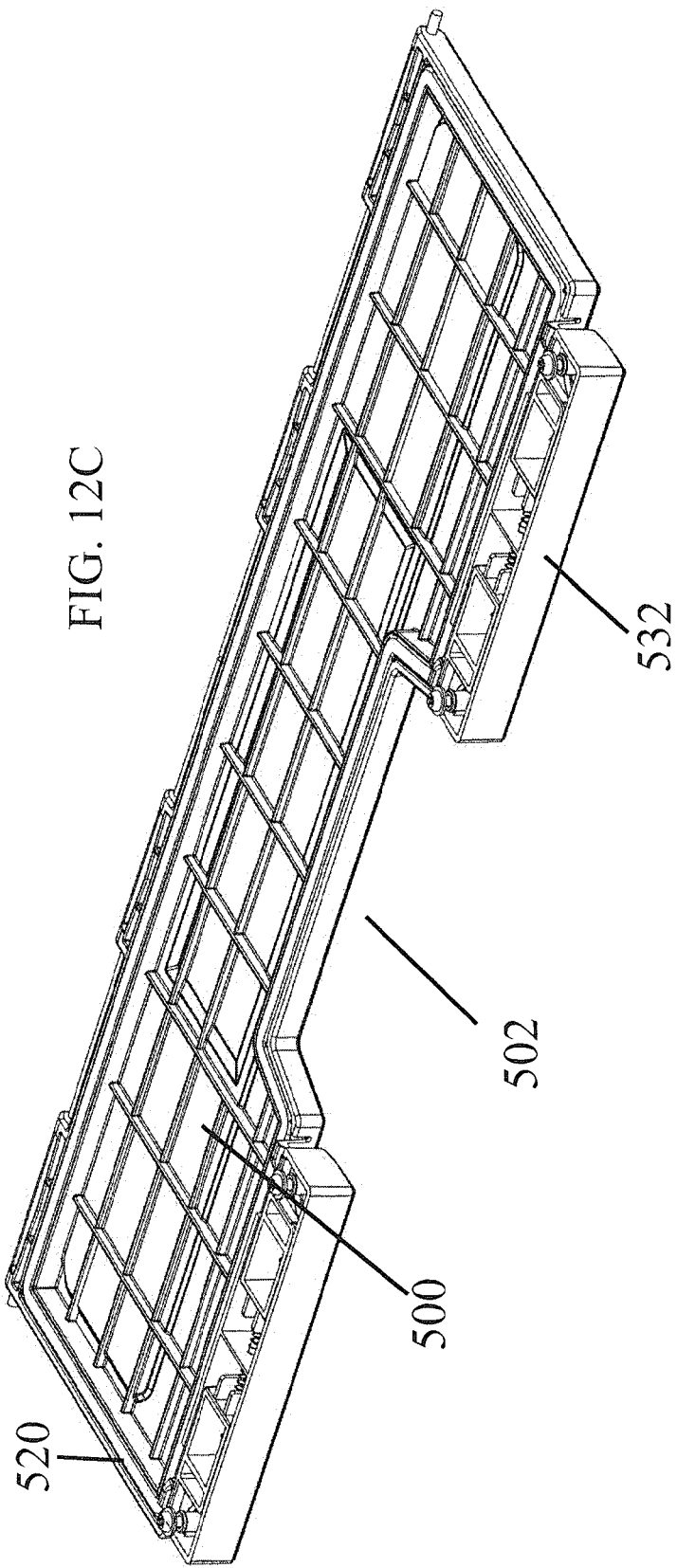
Figure 12D:
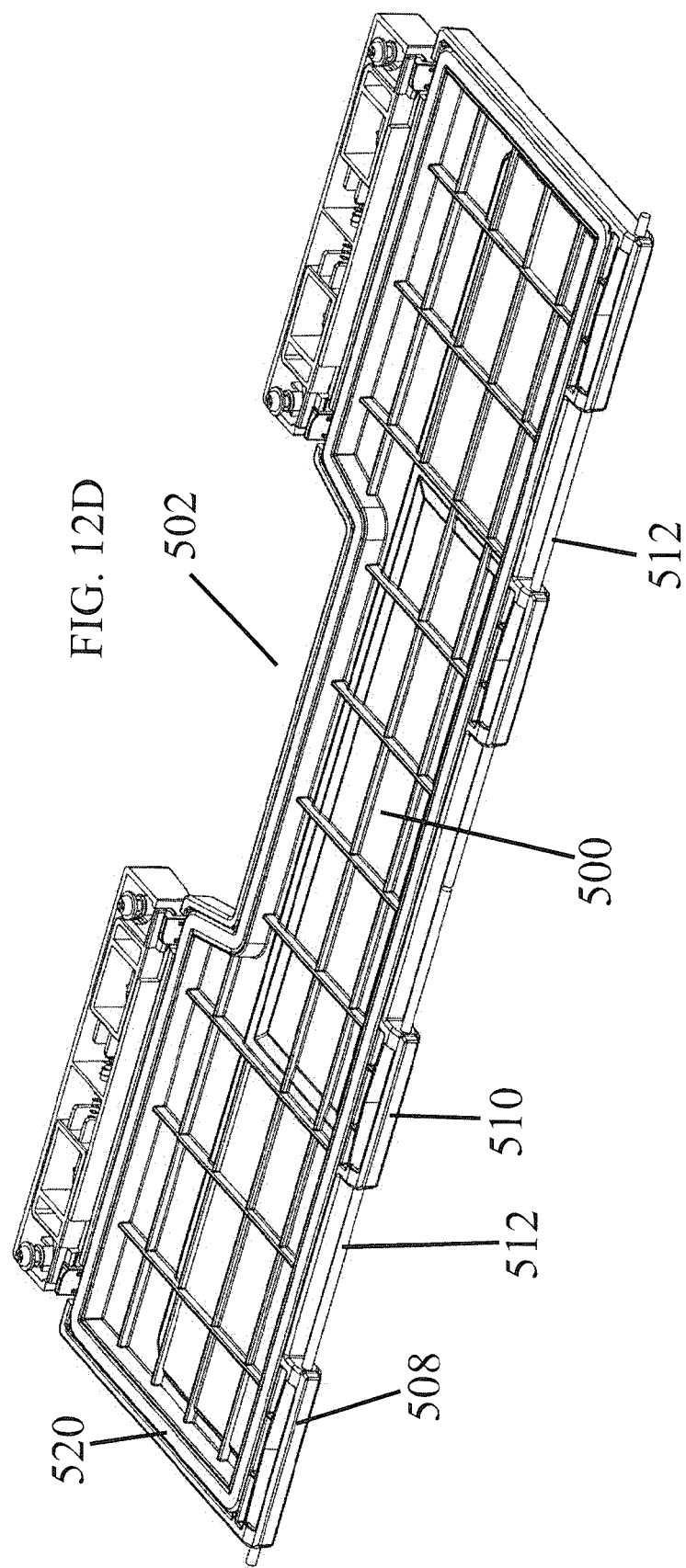
Figure 12F:
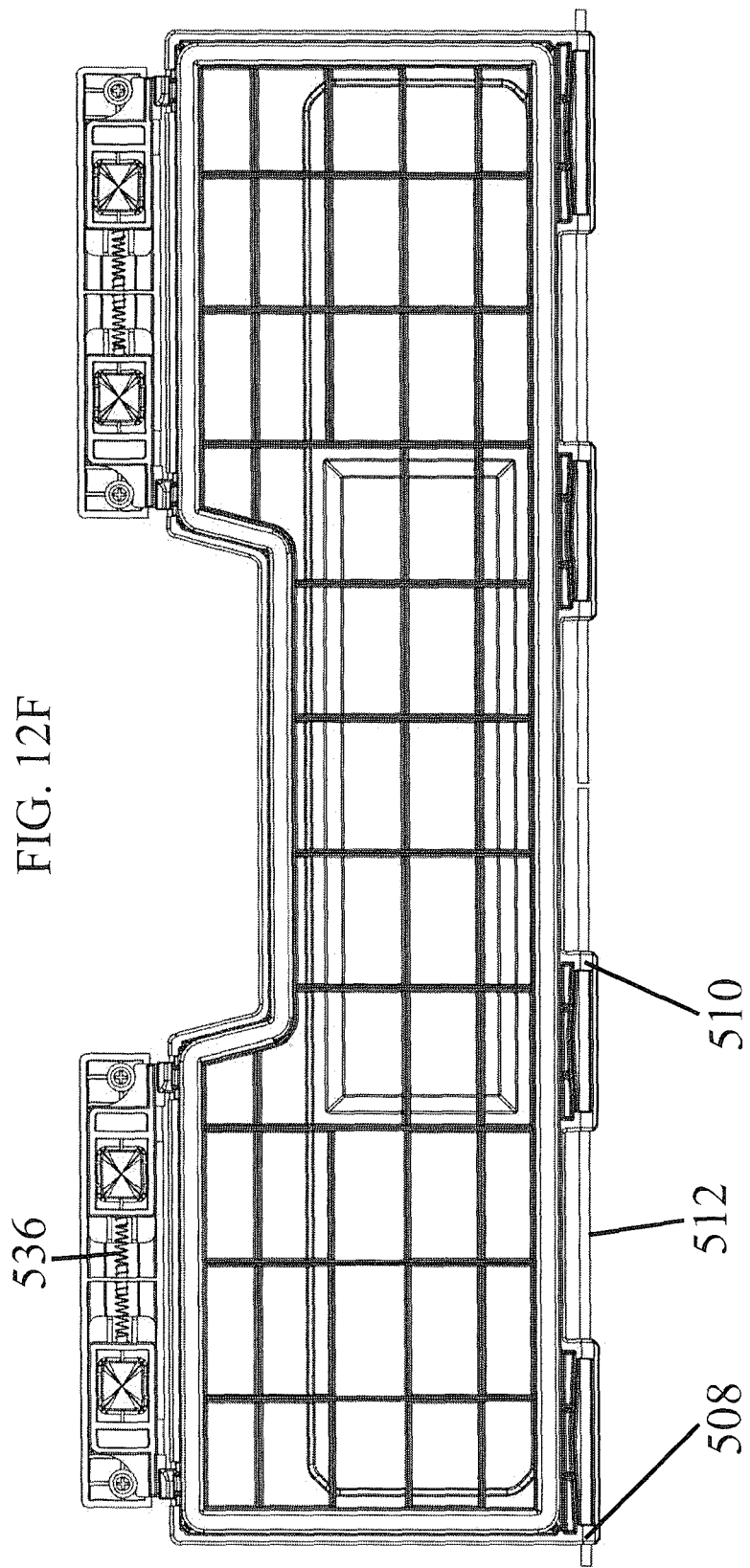
Figure 12H:
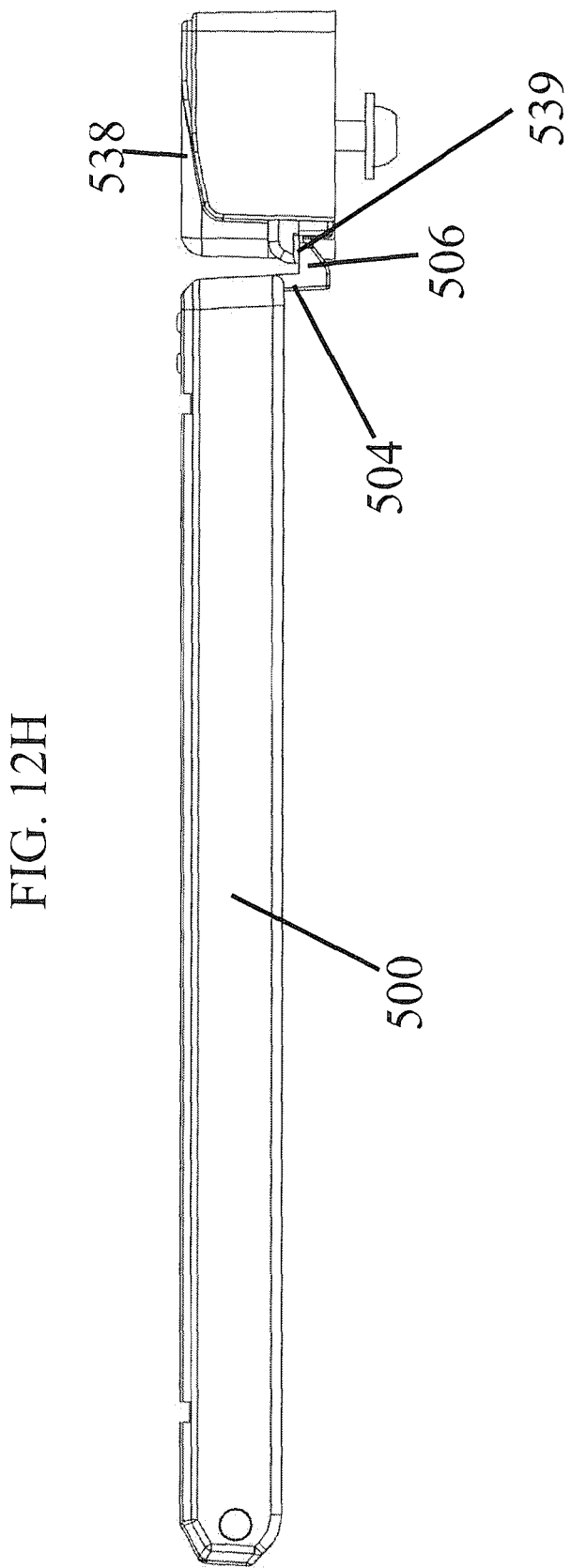

Reference is now made to FIGS. 3A, 3B, 3C, 3D, 3E, 3F, 3G and 3H, which are respective simplified front/top view pictorial; back/top view pictorial, front/bottom view pictorial, back/bottom view pictorial, top planar view, bottom planar view, right side planar view and left side planar view illustrations of main assembly 100, forming part of the communications center of FIGS. 1A-2, and to FIG. 4, which is a simplified exploded view illustration of the main assembly 100 of FIGS. 3A-3H.

As seen in FIGS. 3A-4, the main assembly 100 preferably comprises a main assembly housing element 150, a user interface and electronics subassembly 160, a latchable pivotable top cover assembly 170 and an antenna and handle assembly 180 including an antenna 181. The sound system of the job site communication center preferably also includes four speakers, preferably waterproof, such as tweeters 182, which are mounted onto main assembly housing element 150 and are protected by corresponding tweeter covers 184, which are also mounted onto main assembly housing element 150. A side antenna 186 is preferably mounted onto a side of main assembly housing element 150. Main assembly 100 also preferably includes a pivotably mounted battery charging assembly cover element 188.

It is appreciated that the number of speakers and placement thereof may differ from that shown, for example, there may be a larger or smaller number of small speakers near the top, and there may be only one sub-woofer cone. For example, there may be two, three, five or six small speakers, or there may be a total of two small, two medium-sized and one or two large speakers.

It is further appreciated that main assembly housing element 150 is preferably waterproofed to avoid damage to the job site communication center due to rain or other fluid contacting the housing element 150. The speakers may have waterproof cones and all of the housing compartments, including each speaker compartment, may be individually sealed with rubber seals. User interface and electronics subassembly 160 provides a user interface for operation of the sound system. Preferably, user interface and electronics subassembly 160 is waterproofed to prevent water damage.

A pair of latch assemblies 190 are mounted on latch assembly mounting surfaces 192 on right and left sides of main assembly housing element 150. Latch assemblies 190 are preferably known latch assemblies employed in the known TOUGH SYSTEM™ tool box carrier, commercially available under the DEWALT® brand from the Stanley Black & Decker.

Reference is now made to FIGS. 5A, 5B, 5C, 5D, 5E, 5F, 5G and 5H, which are respective simplified front/top view pictorial; back/top view pictorial, front/bottom view pictorial, back/bottom view pictorial, top planar view, bottom planar view, right side planar view and left side planar view illustrations of main assembly housing element 150, forming part of the main assembly 100 of FIGS. 3A-4.

As seen in FIGS. 5A-5H, main assembly housing element 150 preferably comprises an integral element preferably formed of plastic by injection molding. The main assembly housing element 150 is generally rectangular and preferably includes at a front and top facing portion thereof, in the sense of FIG. 5A, a control panel portion 200 for receiving user interface and electronics subassembly 160 (FIG. 4) and including a socket 202 for a flat panel display (not shown), a main button socket 204 and various push button sockets 206 on both sides thereof. Disposed on opposite sides of the control panel portion 200 are tweeter housing portions 208, each having a socket 210 for receiving and mounting of a tweeter 182 and a frame 212 for receiving and mounting of a tweeter cover 184.

The main assembly housing element 150 also preferably includes at a top and rear facing portion thereof, in the sense of FIG. 5A, a battery charger assembly receiving portion 220 for receiving and mounting of battery charging assembly 134 (FIGS. 1A-2H) and a frame 222 for receiving battery charger assembly cover portion 188 (FIG. 4). Battery charging assembly cover element 188 (FIG. 4) is pivotably and sealably mounted over battery charger assembly receiving portion 220. Preferably, two latch recesses 224 are provided in main housing element 150 for engagement with battery charging assembly cover element 188.

The main assembly housing element 150 also preferably includes, at a top facing portion thereof, in the sense of FIG. 5A, a pair of side-by-side enclosures 230, which are both selectably accessible via latchable pivotable top cover assembly 170 (FIG. 4), which preferably provides a watertight seal for enclosures 230 via a peripheral sealing rib 232 formed on main assembly housing element 150. Rearwardly of enclosures 230 there are provided a plurality of mutually axially spaced intermediate hinge elements 234. Forwardly of enclosures 230, there are preferably provided recesses 236 for retaining latch assemblies.

Enclosures 230 preferably include a storage cavity 238, which can be used to store an AC power adaptor, provided with the job site communication center, when the adaptor is not in use, and a media compartment 239, including one or more of a media device charging socket and an auxiliary input socket for the media device to interface with the sound system. Storage cavity 238 may also store various other elements useful in embodiments of the invention described hereinbelow with reference to FIGS. 27-39.

Extending outwardly and downwardly from each of side portions of main assembly housing element 150, in the sense of FIG. 5A, is a latch engagement portion 240, which preferably comprises a pair of side supports 242, each extending outwardly from a lower side portion of main assembly housing element 150, which are joined by an elongate portion 244 having formed therein a plurality of side by side separated latch engagement apertures 246.

Formed on a forward-facing surface of main assembly housing element 150 are a pair of mutually spaced intermediate handle attachment sockets 248 and formed on respective side-facing surfaces of main assembly housing element 150 are a pair of end handle attachment sockets 250, at least one of which includes an antenna connection socket 252.

Reference is now made to FIGS. 6A, 6B, 6C, 6D, 6E, 6F, 6G and 6H, which are respective simplified front/top view pictorial; back/top view pictorial, front/bottom view pictorial, back/bottom view pictorial, top planar view, bottom planar view, right side planar view and left side planar view illustrations of base element 110, forming part of the job site communications center of FIGS. 1A-2.

As seen in FIGS. 6A-6H, the base element 110 comprises a generally planar top surface 300, preferably having a grid of reinforcing elements and a centrally disposed, rearward recess 302 for accommodating battery charging assembly 134 (FIG. 2). Disposed on opposite sides of recess 302 are a socket 304 for accommodating active sub-woofer 130 (FIG. 2) and a socket 306 for accommodating passive sub-woofer 132 (FIG. 2).

Depending from generally planar top surface 300 at the sides of base element 110, there are provided depending side portions 310, each of which is preferably provided with a bifurcated latch mounting portion 312.

On the underside of base element 110 at a forward facing portion thereof there is provided a generally planar bottom surface 314 having a plurality of screw attachment protrusions 316. Underlying each of side portions 310 there are provided a pair of leg portions 318 and a generally planar screw attachment portion 320.

Reference is now made to FIGS. 7A, 7B, 7C, 7D, 7E, 7F, 7G and 7H, which are respective simplified front/top view pictorial; back/top view pictorial, front/bottom view pictorial, back/bottom view pictorial, top planar view, bottom planar view, right side planar view and left side planar view illustrations of bottom element 120, forming part of the job site communications center of FIGS. 1A-2.

As seen in FIGS. 7A-7H, bottom element 120 includes a generally planar top facing surface 350, having formed therein a pair of slightly convex (in the sense of FIG. 2) round domes 352 and 354, arranged to generally underlie sub-woofers 130 and 132, respectively. Bottom element 120 also includes an upwardly-inclined, forward facing grill 356 and a bifurcated upwardly-inclined rearward facing grill 358.

It is appreciated that domes 352 and 354 redirect the sound output from sub-woofers 130 and 132 through forward facing grill 356 and rearward facing grill 358.

During use, the job site communications center may be supported on a surface, and the redirection of the sub-woofer output towards the front and back thereof prevents the sound quality being impaired or affected by the surface onto which the job site communications center is supported.

Reference is now made to FIGS. 8A, 8B, 8C, 8D, 8E, 8F, 8G and 8H, which are respective simplified front/top view pictorial; back/top view pictorial, front/bottom view pictorial, back/bottom view pictorial, top planar view, bottom planar view, right side planar view and left side planar view illustrations of right side bracket engaging element 122, forming part of the job site communications center of FIGS. 1A-2.

As seen in FIGS. 8A-8H, right side bracket engaging element 122 preferably comprises a unitary element, preferably formed of plastic, and includes a generally flat surface 360 for receiving a mounting bracket of a rollable container carrier, preferably a wheeled tool box carrier, such as a TOUGH SYSTEM™ tool box carrier, commercially available under the DEWALT® brand from Stanley Black & Decker. Surrounding surface 360 is a partially peripheral bumper mounting protrusion 362 having a closed forward-facing end 364 and an open rearward-facing end 366. Protrusion 362 includes a top central recess 368 and a bottom central recess 370. Respective inner facing walls 372 and 374 of recesses 368 and 370 help define, together with generally flat surface 360, a bracket insertion guide path for enabling ready mounting and dismounting of the job site communications center of FIGS. 1A-2 onto mounting brackets of the wheeled tool box carrier, as is described hereinbelow with reference to FIGS. 21A-21D.

Reference is now made to FIGS. 9A, 9B, 9C, 9D, 9E, 9F, 9G and 9H, which are respective simplified front/top view pictorial; back/top view pictorial, front/bottom view pictorial, back/bottom view pictorial, top planar view, bottom planar view, right side planar view and left side planar view illustrations of right side bumper 126, forming part of the job site communications center of FIGS. 1A-2.

As seen in FIGS. 9A-9H, right side bumper 126 preferably comprises a unitary element, preferably formed of a resilient, impact-absorbing, material, such as an elastomer or rubber, and includes a cut-out generally flat mounting surface 380 which serves for mounting the bumper 126 onto the right side of the main assembly housing element 150 and in protective relationship on the outside of right side bracket engaging element 122.

In the illustrated embodiment, mounting surface 380 is preferably retained between a right end of the main assembly housing element 150 and an inner facing surface of right side bracket engaging element 122, while a resilient, shock absorbing, partial peripheral bumper protrusion 382, integrally formed with mounting surface 380, is mounted onto partially peripheral bumper mounting protrusion 362 of right side bracket engaging element 122 and protrudes outwardly to the right, as well as to the top, bottom, front and rear thereof, thereby providing impact protection for the job site communications center of FIGS. 1A-2 at the right end thereof. It is seen that partially peripheral bumper protrusion 382 has a closed forward-facing end 384 mounted over closed forward-facing end 364 of partially peripheral bumper mounting protrusion 362 of right side bracket engaging element 122 and an open rearward-facing end 386, mounted over open rearward-facing end 366 of partially peripheral bumper mounting protrusion 362 of right side bracket engaging element 122.

It is a particular feature of bumper 126 that there is provided a resilient downwardly extending curved engagement lip 388 at a lower surface 390 of an upper portion 392 of partially peripheral bumper protrusion 382 adjacent open rearward facing end 386.

Reference is now made to FIGS. 10A, 10B, 10C, 10D, 10E, 10F, 10G and 10H, which are respective simplified front/top view pictorial; back/top view pictorial, front/bottom view pictorial, back/bottom view pictorial, top planar view, bottom planar view, right side planar view and left side planar view illustrations of left side bracket engaging element 124, forming part of the job site communications center of FIGS. 1A-2. Left side bracket engaging element 124 is preferably a mirror image of right side bracket engaging element 122 and is otherwise identical thereto.

Accordingly, as seen in FIGS. 10A-10H, left side bracket engaging element 124 preferably comprises a unitary element, preferably formed of plastic, and includes a generally flat surface 460 for receiving a mounting bracket of a rollable container carrier, preferably a wheeled tool box carrier, such as a TOUGH SYSTEM™ tool box carrier, commercially available under the DEWALT® brand from Stanley Black & Decker. Surrounding surface 460 is a partially peripheral bumper mounting protrusion 462 having a closed forward-facing end 464 and an open rearward-facing end 466. Protrusion 462 includes a top central recess 468 and a bottom central recess 470. Respective inner facing walls 472 and 474 of recesses 468 and 470 help define, together with generally flat surface 460, a bracket insertion guide path for enabling ready mounting and dismounting of the job site communications center of FIGS. 1A-2 onto mounting brackets of the wheeled tool box carrier, as is described hereinbelow with reference to FIGS. 21A-21D.

Reference is now made to FIGS. 11A, 11B, 11C, 11D, 11E, 11F, 11G and 11H, which are respective simplified front/top view pictorial; back/top view pictorial, front/bottom view pictorial, back/bottom view pictorial, top planar view, bottom planar view, right side planar view and left side planar view illustrations of left side bumper 128, forming part of the job site communications center of FIGS. 1A-2. Left side bumper 128 is preferably a mirror image of right side bumper 126 and is otherwise identical thereto.

Accordingly, as seen in FIGS. 11A-11H, left side bumper 128 preferably comprises a unitary element, preferably formed of a resilient, impact-absorbing, material, such as an elastomer or rubber, and includes a cut-out generally flat mounting surface 480 which serves for mounting the bumper 128 onto the left side of the main assembly housing element 150 and in protective relationship on the outside of left side bracket engaging element 124.

In the illustrated embodiment, mounting surface 480 is preferably retained between a left end of the main assembly housing element 150 and an inner facing surface of left side bracket engaging element 124, while a resilient, shock absorbing, partial peripheral bumper protrusion 482, integrally formed with mounting surface 480, is mounted onto partially peripheral bumper mounting protrusion 462 of left side bracket engaging element 124 and protrudes outwardly to the left, as well as to the top, bottom front and rear thereof, thereby providing impact protection for the job site communications center of FIGS. 1A-2 at the left end thereof. It is seen that partially peripheral bumper protrusion 482 has a closed forward-facing end 484 mounted over closed forward-facing end 464 of partially peripheral bumper mounting protrusion 462 of left side bracket engaging element 124 and an open rearward-facing end 486, mounted over open rearward-facing end 466 of partially peripheral bumper mounting protrusion 462 of left side bracket engaging element 124.

It is a particular feature of bumper 128 that there is provided a resilient downwardly extending curved engagement lip 488 at a lower surface 490 of an upper portion 492 of partially peripheral bumper protrusion 482 adjacent open rearward facing end 486.

It is appreciated that right side bumper 126 and left side bumper 128 protrude from the edges of the right side bracket engaging element 122 and left side bracket engaging element 124, respectively, and when the right and left side panels are attached to the main assembly 100, bumpers 126 and 128 protrude beyond the main surfaces of main assembly 100. Bumpers 126 and 128 may have cavities defined by partially peripheral bumper protrusion 382 as shown in FIGS. 9A-9H and 11A-11H, or alternatively the bumper may be partially hollow or may be a solid piece of resilient material. If the jobsite communications center is dropped or heavy equipment is dropped onto it, bumpers 126 and 128 act to absorb shocks and prevent the main structure from being damaged or crushed.

A corner impact will deform bumper 126 or 128 extending therefrom. Some of the force from the impact will be dissipated by deformation of the resilient bumper 126 or 128 and some will be transferred to the bracket engaging element 122 or 124 to which bumper 126 or 128 is attached. As shown in FIGS. 8A-8H and 10A-10H, bracket engaging elements 122 and 124 each have a number of screw holes with which bracket engaging elements 122 and 124 can be attached to main assembly 100. These screw holes can be provided with resilient gaskets. Such gaskets can allow any impact forces to be dissipated without damaging main assembly 100 and bracket engaging elements 122 and 124 where they are in contact with the screws.

In the embodiment shown in the figures, bracket engaging elements 122 and 124 hold the job site communications center together. Base element 110 is preferably connected to main assembly 100 using screws. A left and a right side panel are then attached to the left and right sides of the main assembly 100, respectively. Bracket engaging elements 122 and 124 are not attached to base element 110 by screws, but an edge of the bracket engaging elements 122 and 124 overlaps base element 110, which ensures that base element 110 is held tightly in position by even if the screws connecting base element 110 to main assembly 100 were removed or any connecting parts were snapped.

Alternatively, bracket engaging elements 122 and 124 may be attached to base element 110 as well as to main assembly 100 using screws, or the job site communications center may have a different arrangement. Preferably, all of the screw connections between bracket engaging elements 122 and 124 and the job site communications center are provided with resilient gaskets.

The edges of the job site communications center which are not directly protected by bumpers 126 and 128 are chamfered, in order to reduce the likelihood of an impact crushing part of an edge, since the chamfered edges do not protrude as far as the edges would otherwise. The tweeter covers 184 also have a central molded divot to improve crush-resistance. Tweeter covers 184 may also be slightly set back from the main surfaces of the job site communications center, as shown in FIGS. 1A-1H and 3A-3H, which may make them less vulnerable to impacts and main assembly 100 may also be slightly shaped to provide extra acoustic amplification and direction.

Reference is now made to FIGS. 12A, 12B, 12C, 12D, 12E, 12F, 12G and 12H, which are respective simplified front/top view pictorial; back/top view pictorial, front/bottom view pictorial, back/bottom view pictorial, top planar view, bottom planar view, right side planar view and left side planar view illustrations of latchable pivotable top cover assembly 170, forming part of the job site communications center of FIGS. 1A-2, and to FIGS. 13A, 13B, 13C, 13D, 13E, 13F, 13G and 13H, which are respective simplified front/top view pictorial; back/top view pictorial, front/bottom view pictorial, back/bottom view pictorial, top planar view, bottom planar view, right side planar view and left side planar view simplified exploded view illustrations of the latchable pivotable top cover assembly of FIGS. 12A-12H. Reference is also made to FIGS. 17A-20D, which illustrate various stages in the closing, latching and unlatching of the top cover.

As seen in FIGS. 12A-13H, the latchable pivotable top cover assembly 170 preferably comprises a generally planar cover portion 500 having a generally rectangular shape, defining a central forward facing cut out 502. At a forward-facing edge of cover portion 500, in the sense of FIG. 12A, there are preferably provided two pairs of mutually spaced, depending latch fingers 504, each having a forward facing tooth 506.

At a rearward-facing edge of cover portion 500, in the sense of FIG. 12A, there are preferably provided a pair of corner hinge elements 508 and a pair of mutually spaced intermediate hinge elements 510, all mutually axially spaced from each other and receiving a pair of coaxial pivot axles 512, which also extend through corresponding mutually axially spaced hinge elements 234, formed on main assembly housing element 150 (FIGS. 5A-5H).

As seen particularly in FIG. 13C, an underside surface of cover portion 500 is formed with a peripheral recess 520, which accommodates a water-resistant seal 522. Water-resistant seal 522 cooperates with peripheral sealing rib 232 (FIGS. 5A-5H) to provide a water-tight seal for containers 230 (FIGS. 5A-5H). Water-resistant seal 522 also serves as a spring, which urges the latchable pivotable top cover assembly 170 into an open orientation when it is unlatched.

The latchable pivotable top cover assembly 170 preferably also comprises a pair of identical latch assemblies 530, which are fixed to recesses 236 in main assembly housing element 150, each of which includes a latch assembly housing 532, a pair of finger engageable slidable latch elements 534 and a compression spring 536, which urges the latch elements 534 towards a mutually axially separated operative orientation, as seen in FIGS. 12A-12H.

Figure 13A:
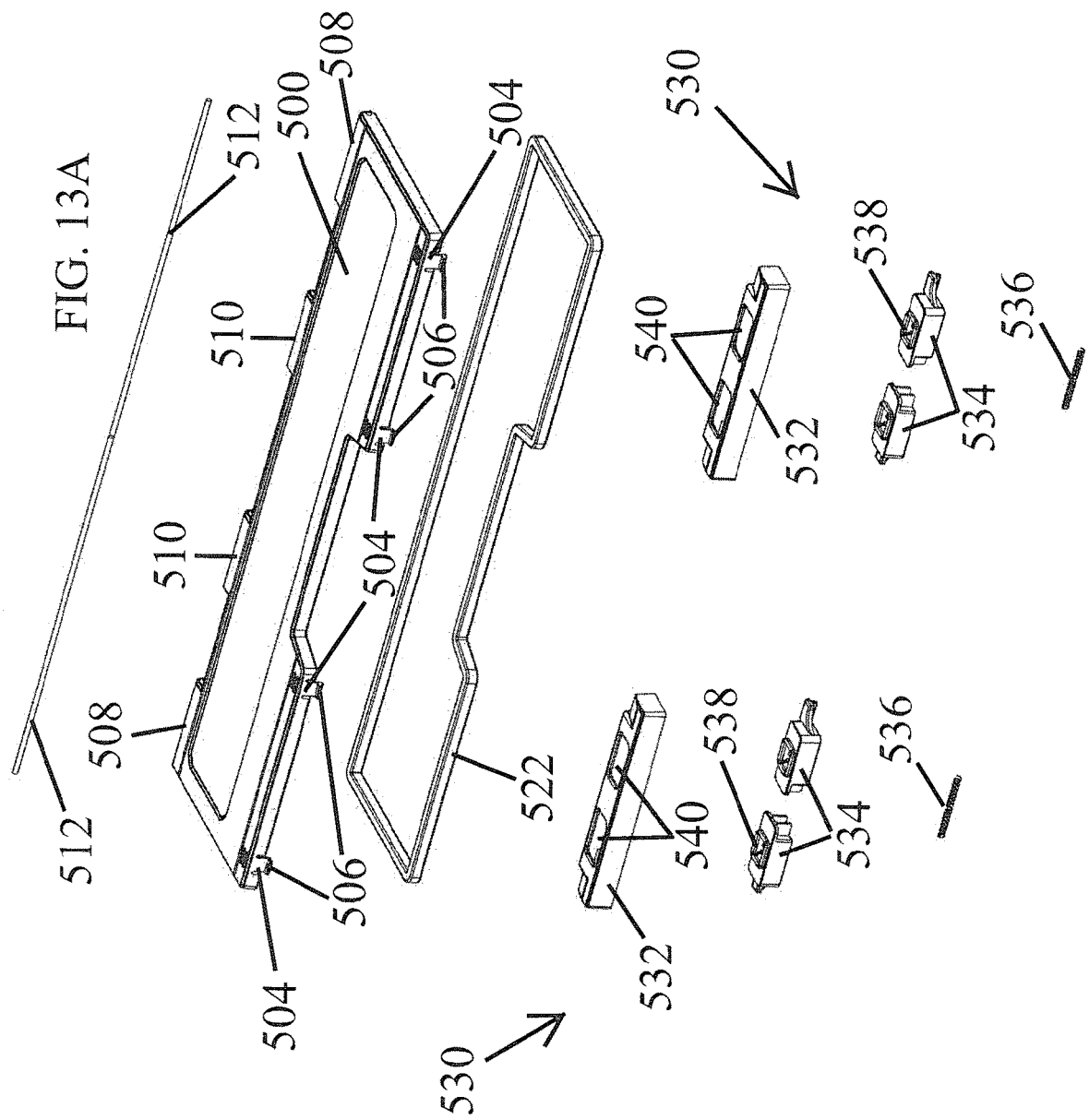
Figure 13D:
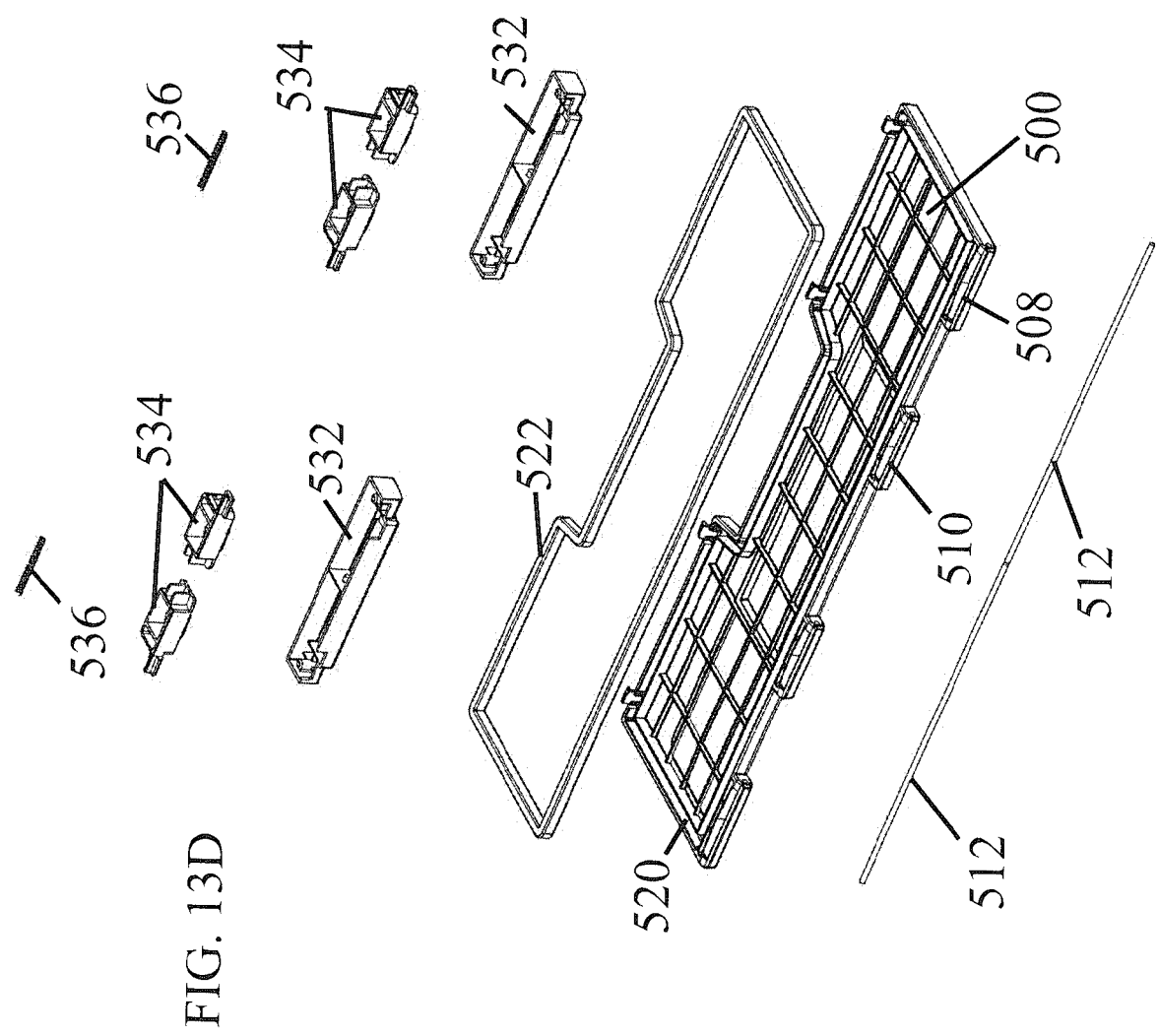
Figure 13E:
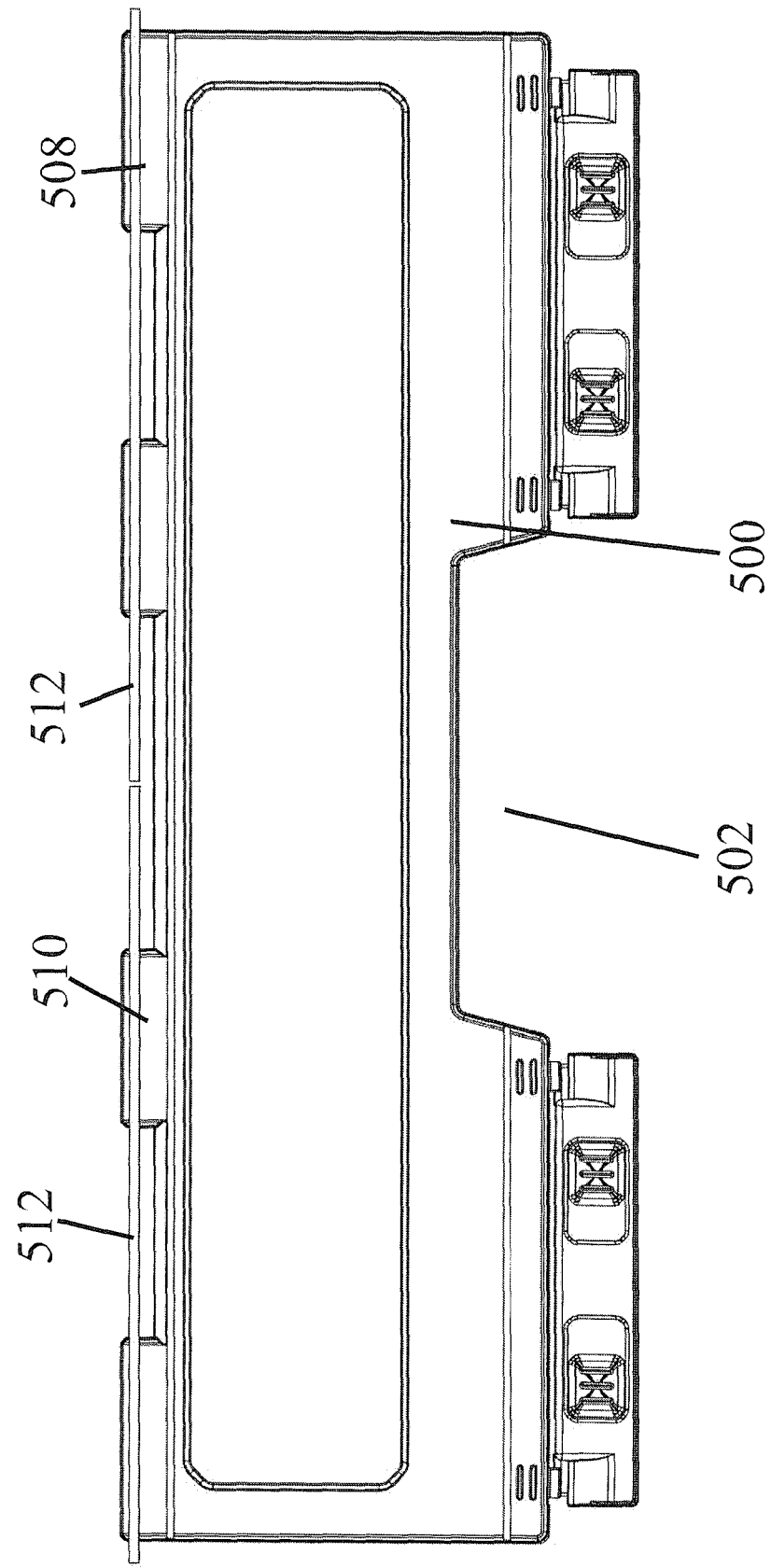
Figure 13F:
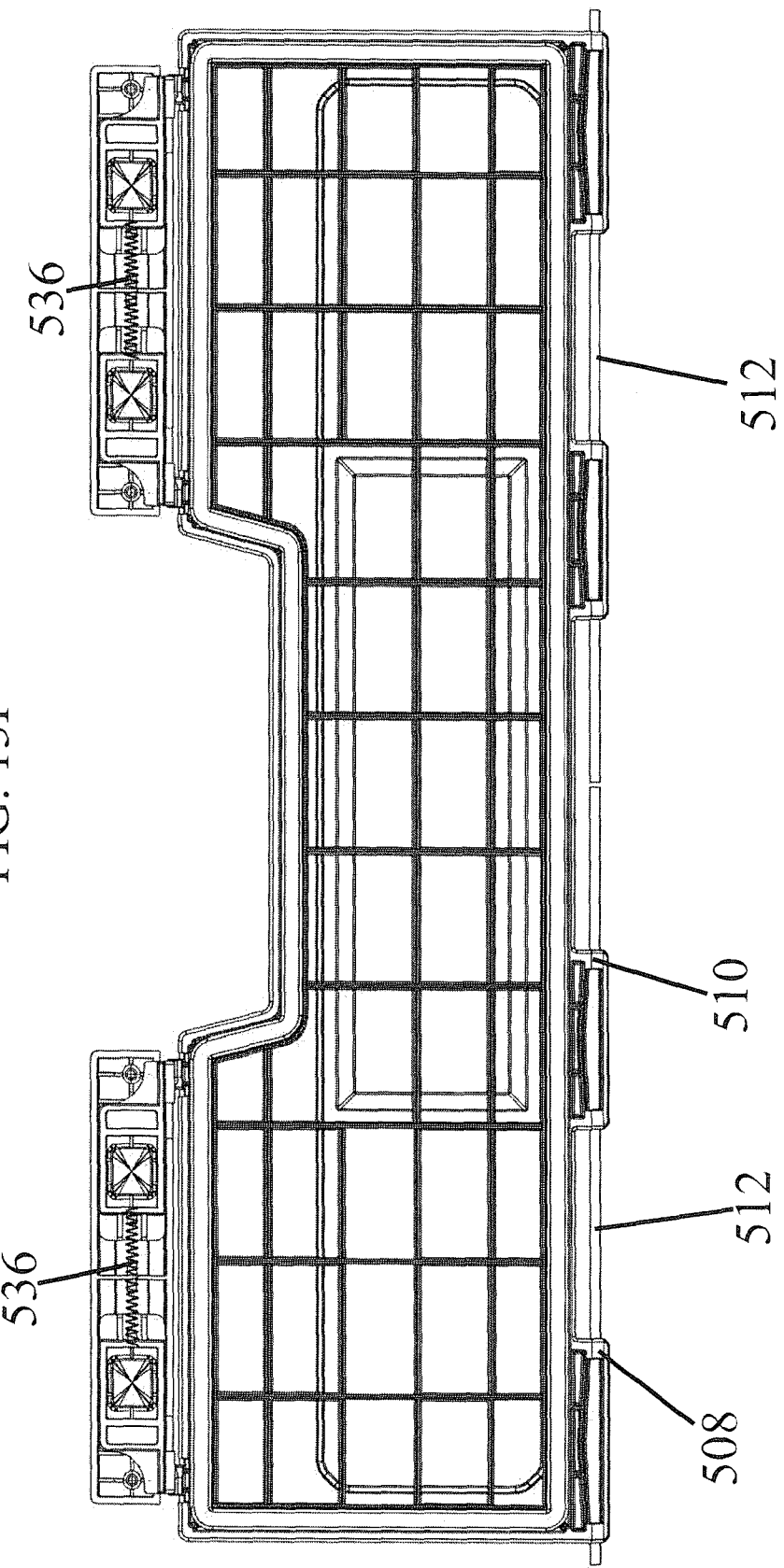
Figure 13G:
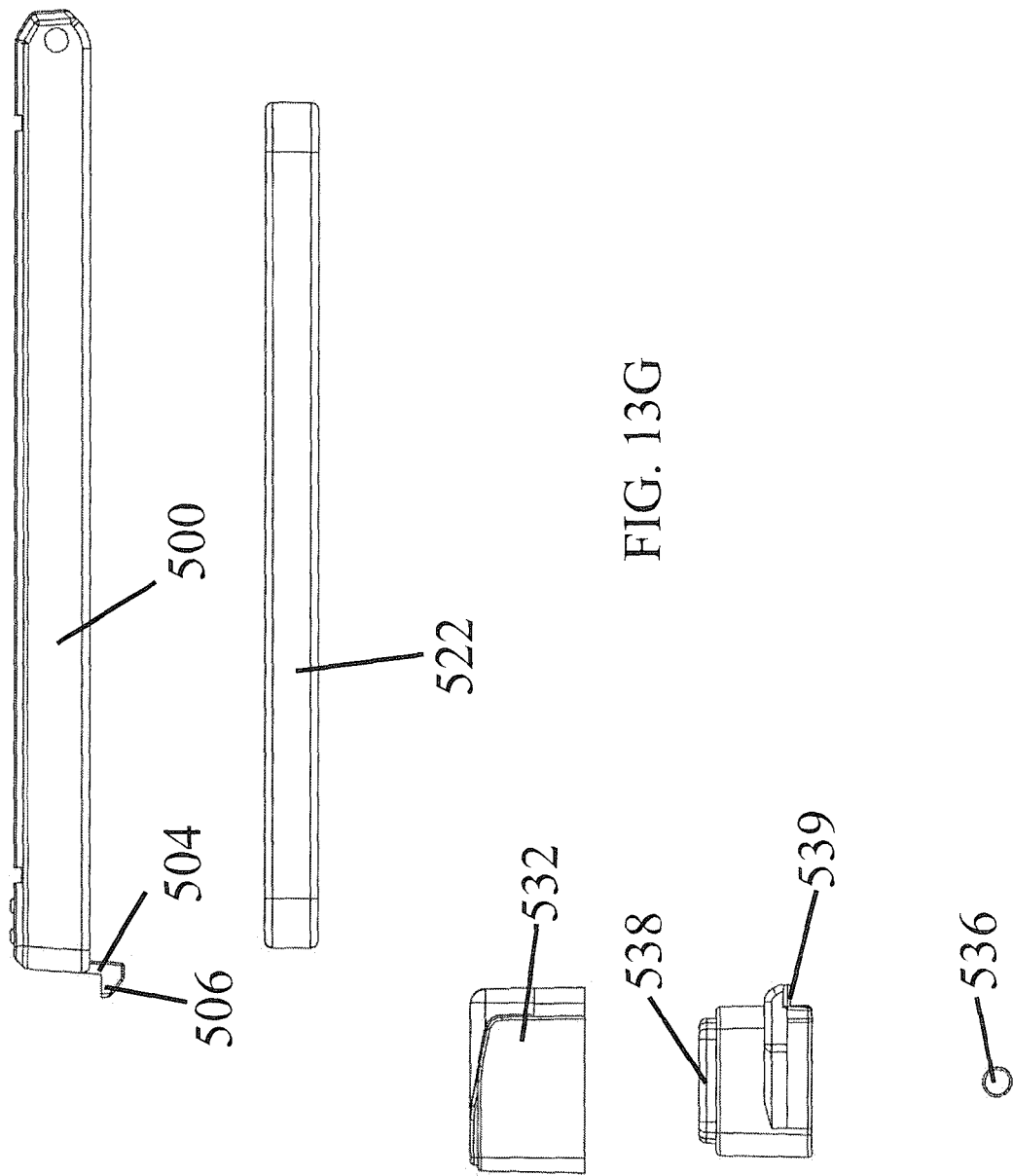
Figure 13H:
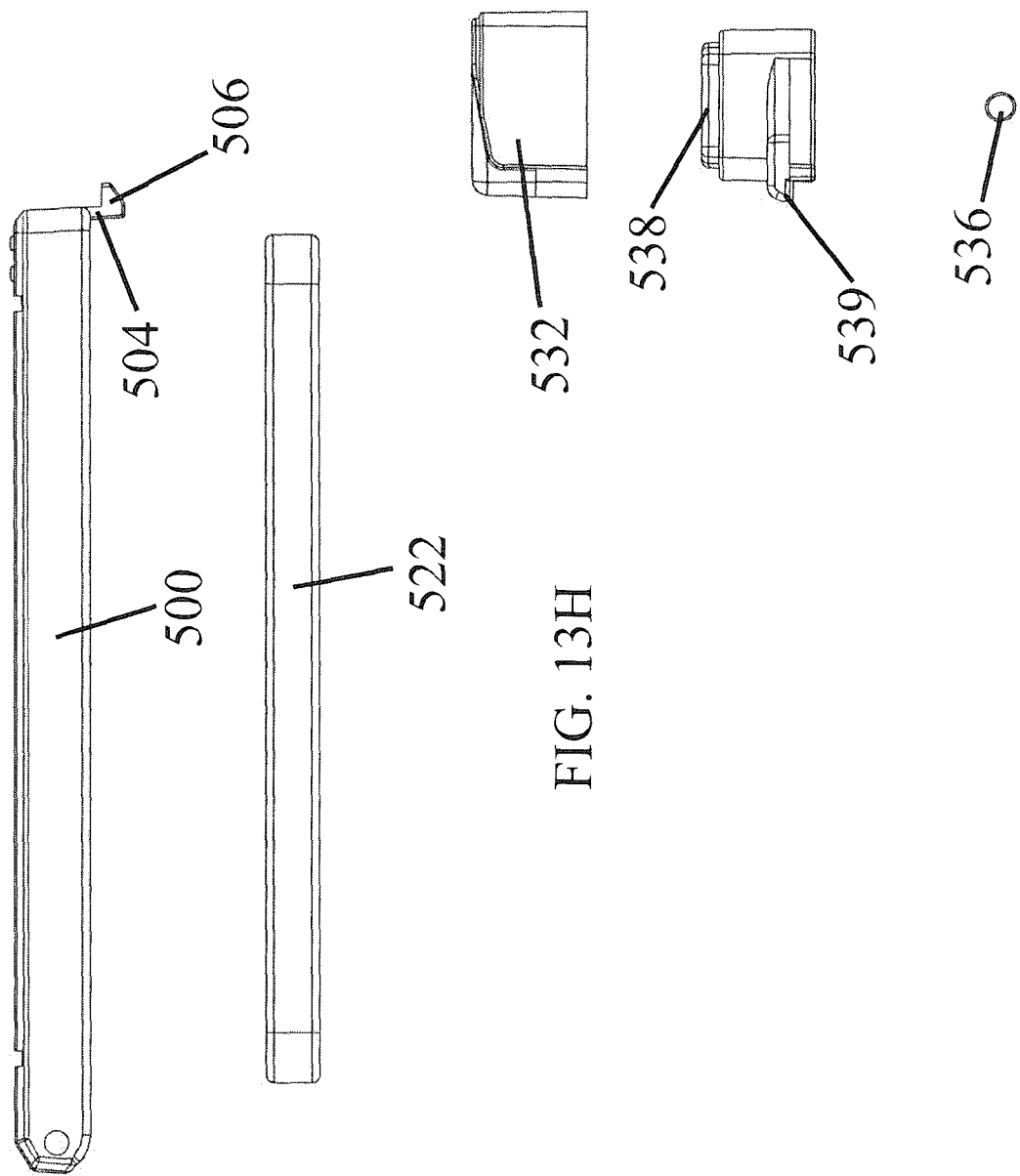
Figure 14A:
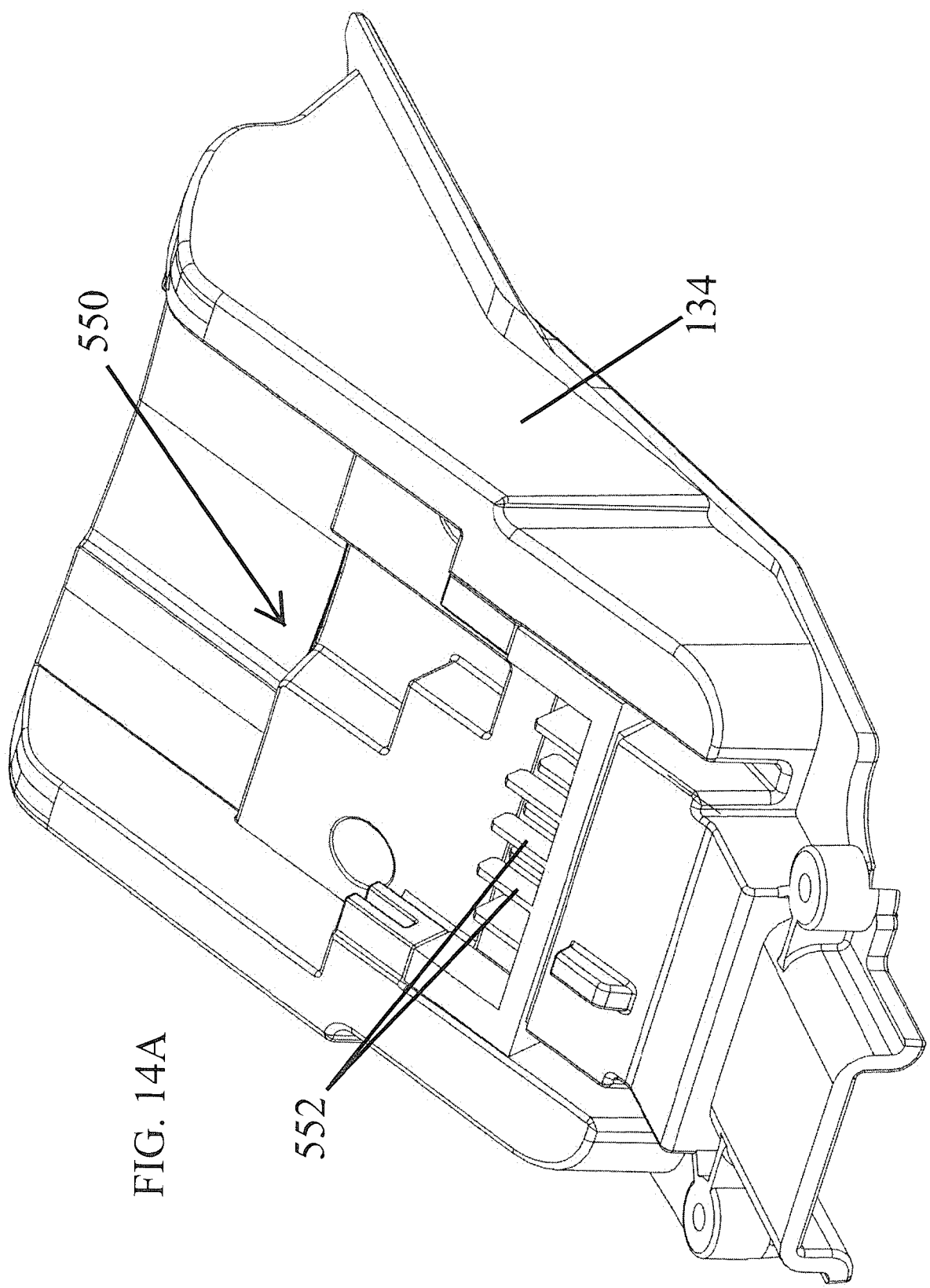
FIGS. 14A, 14B, 14C, 14D, 14E, 14F, 14G and 14H are respective simplified front/top view pictorial; back/top view pictorial, front/bottom view pictorial, back/bottom view pictorial, top planar view, bottom planar view, right side planar view and left side planar view illustrations of a battery charging receptacle, forming part of the job site communications center of FIGS. 1A-2.
Figure 14B:
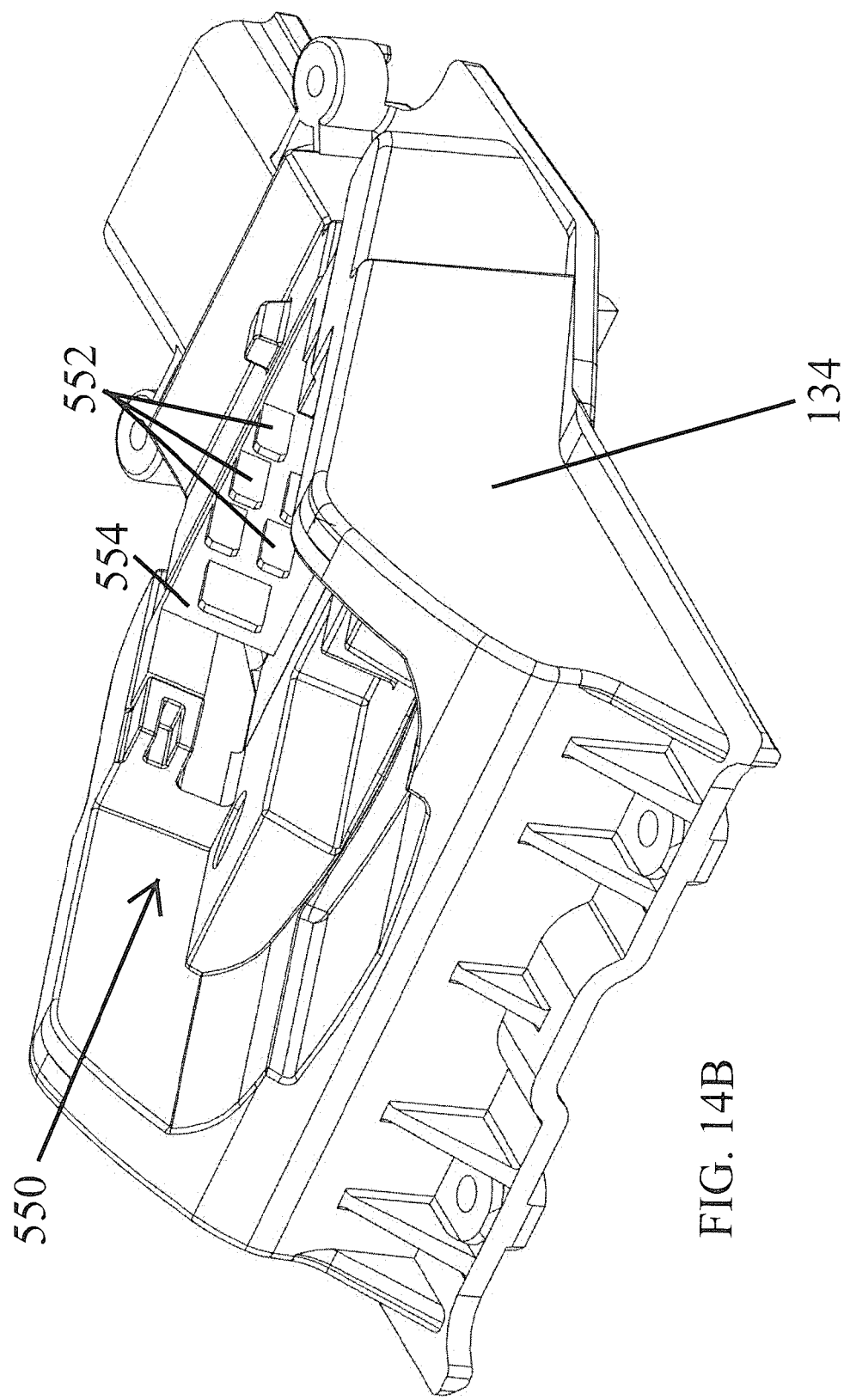
Figure 14C:
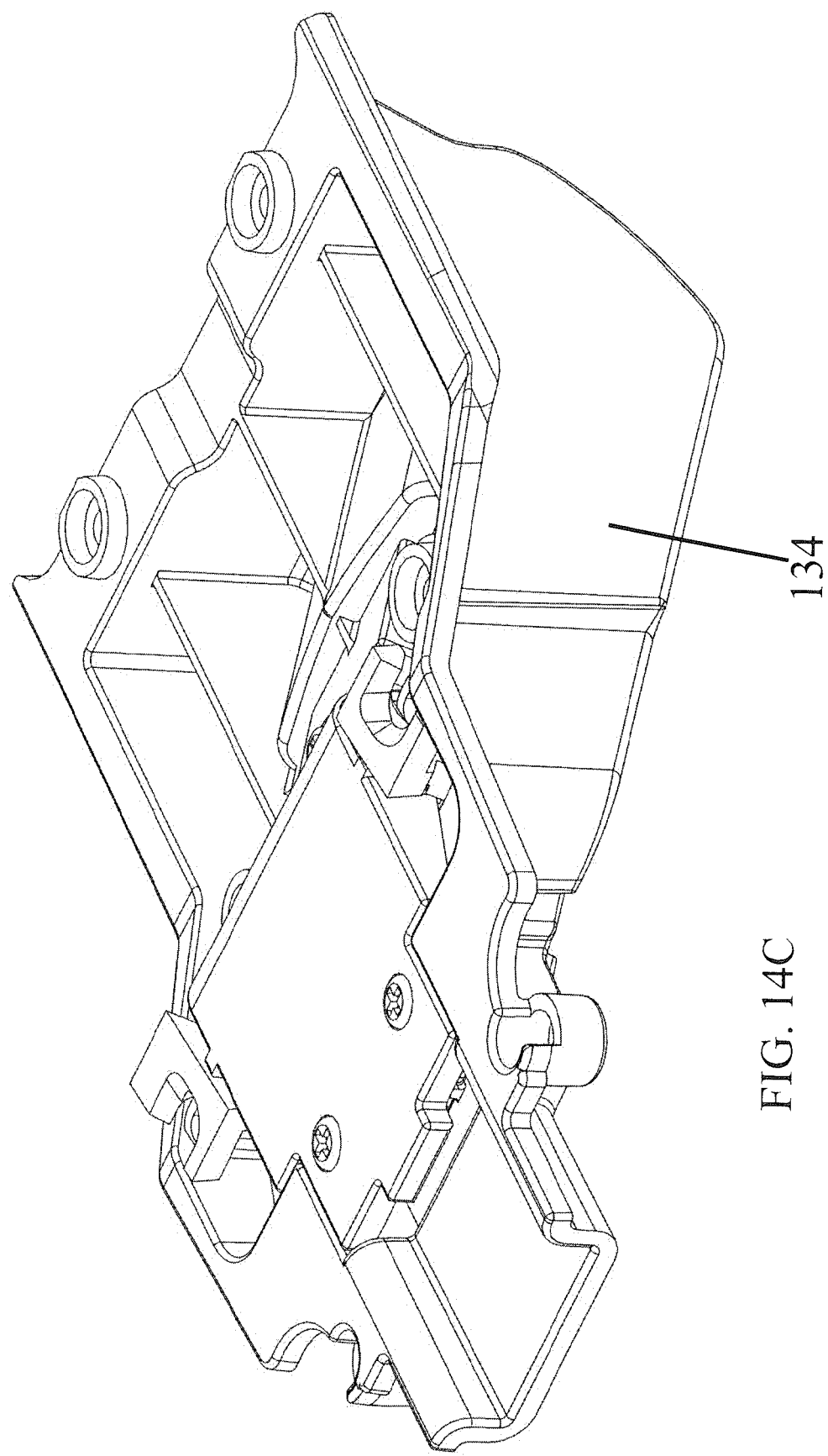
Figure 14D:
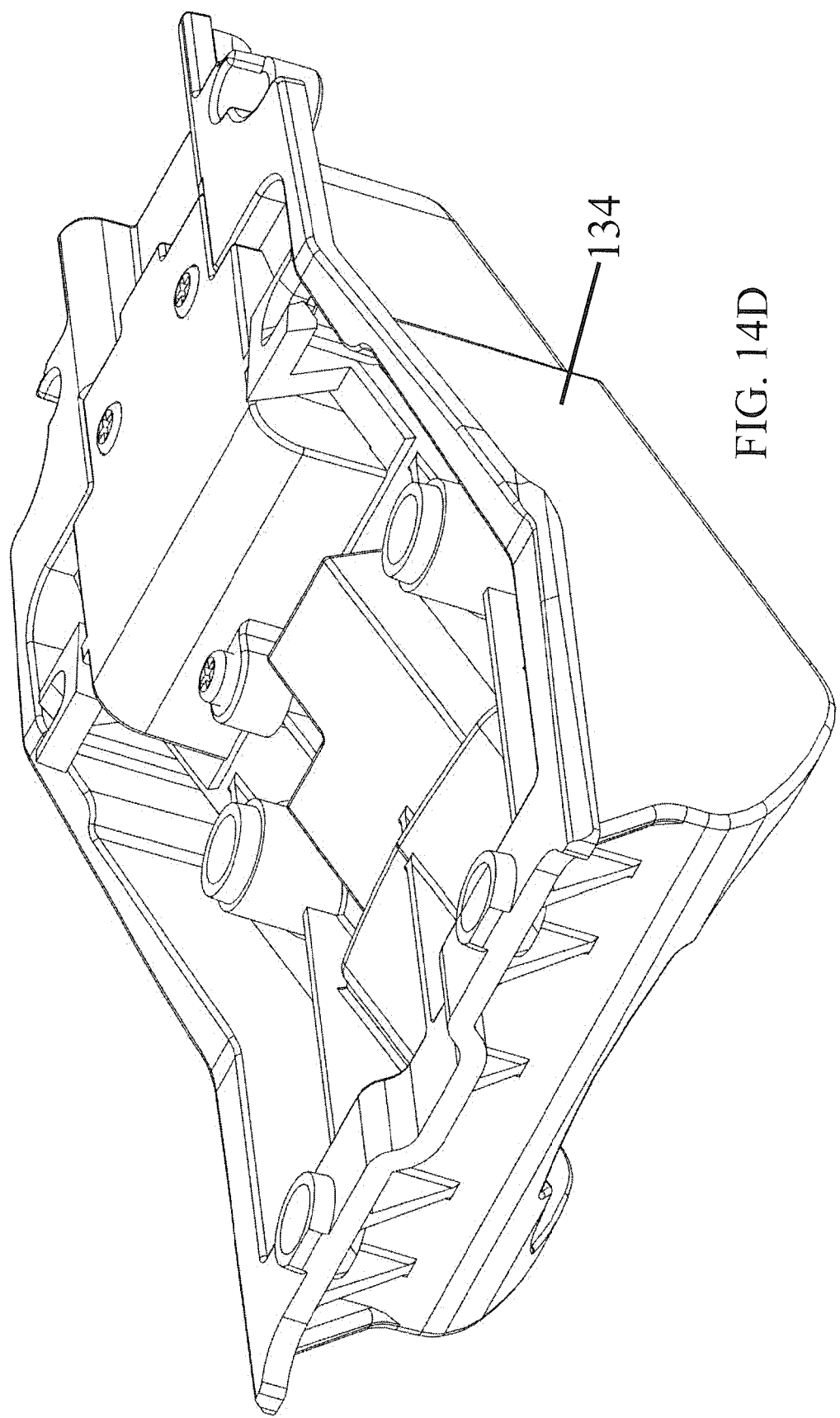
Figure 14E:
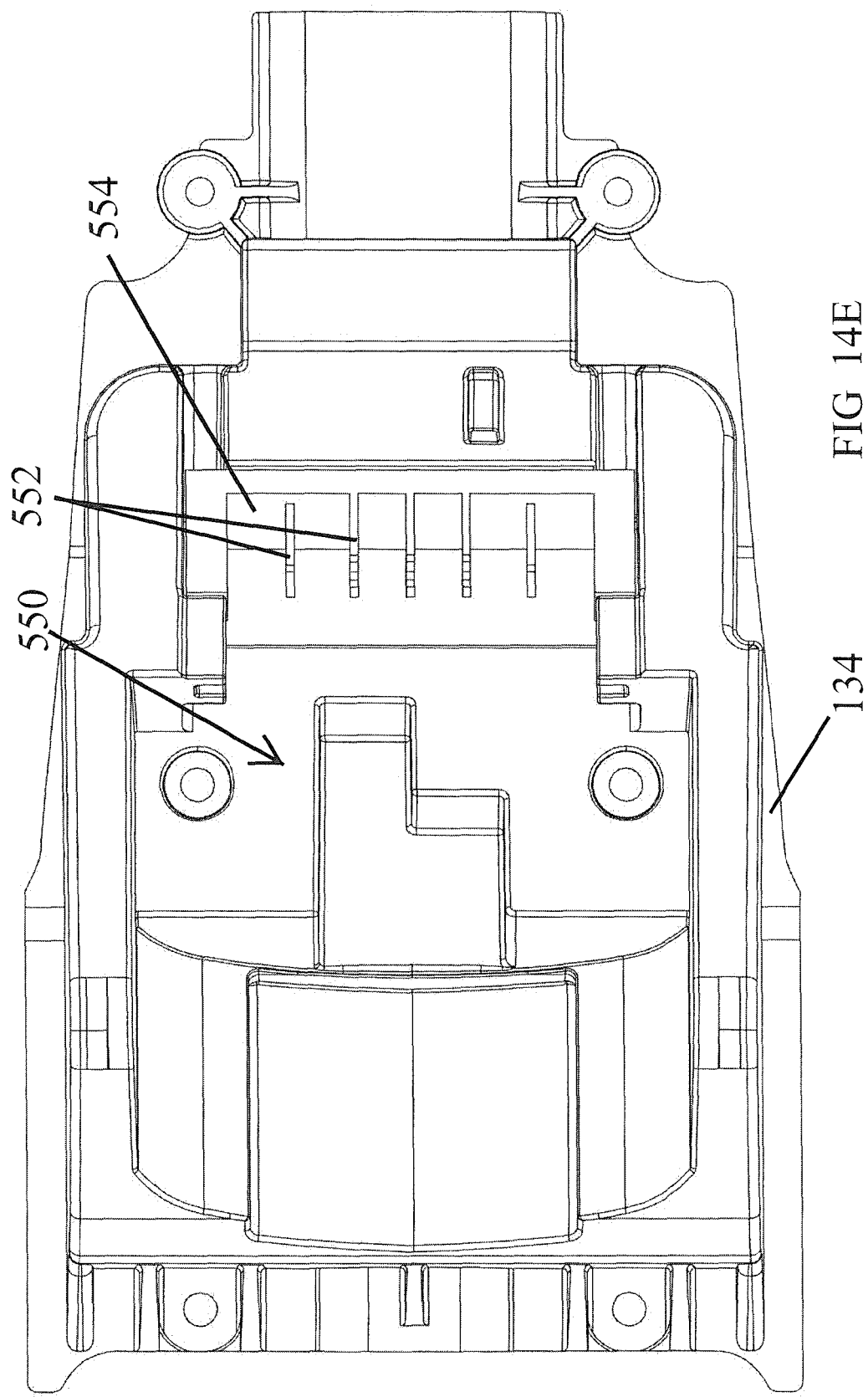
Figure 14F:
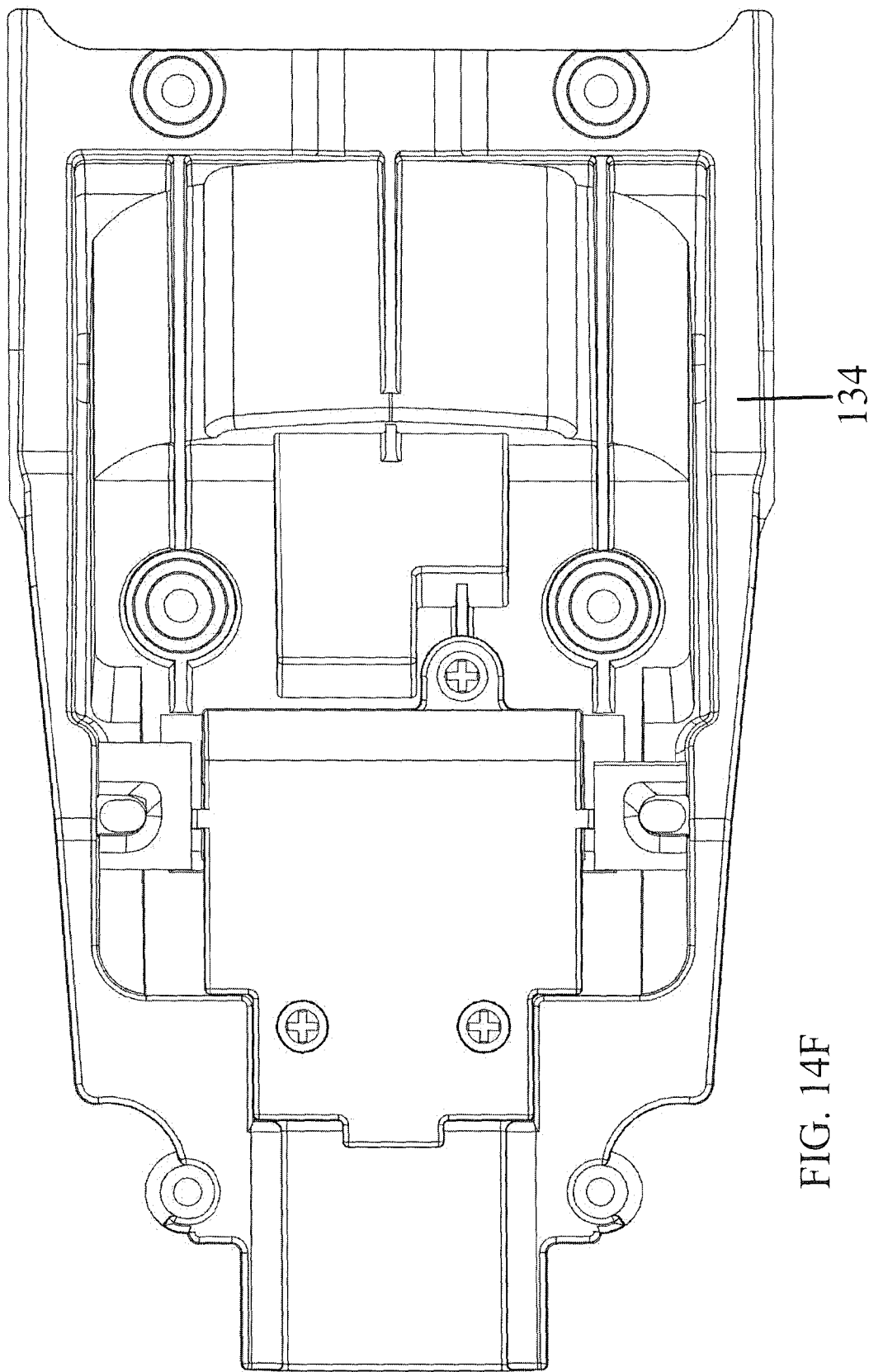
Figure 14G:
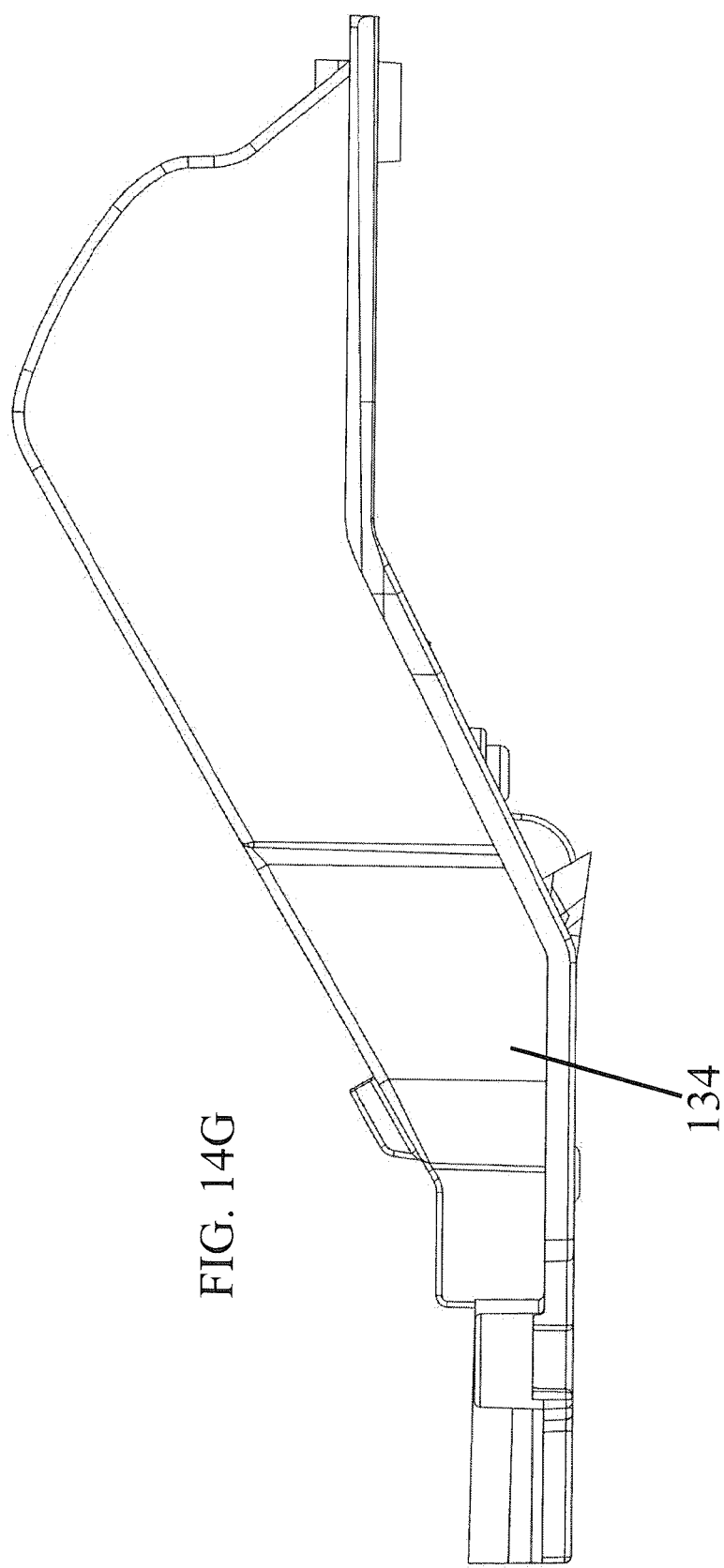
Figure 14H:
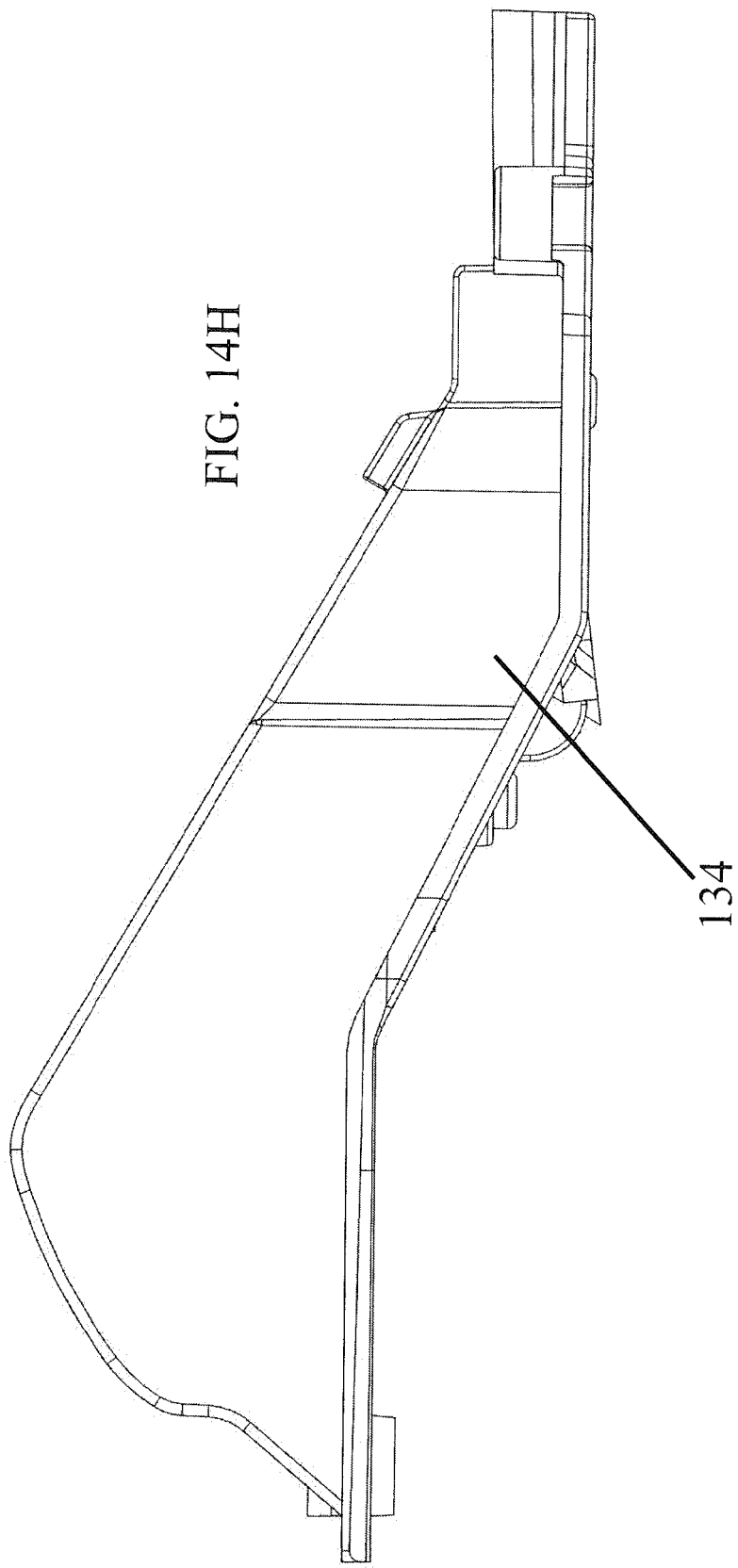

As seen particularly in FIG. 13G, each of latch elements 534 includes a finger-engageable recessed top surface 538 and a rearwardly and downwardly-facing latch engagement shoulder 539 arranged to be lockingly engaged by a forward-facing tooth 506 of a latch engaging finger 504 of cover portion 500.

The latch assembly housings 532 are each generally rectangular and define a pair of axially spaced access windows 540 for finger engagement with latch elements 534. As seen partially well in FIG. 12A, the latch elements 534 are normally in mutually spaced arrangement, under the urging of springs 536. In this arrangement, when cover portion 500 is pivoted into its fully closed position, as seen in FIGS. 12A-12H and 19A-19D, forward-facing teeth 506 of latch engaging fingers 504 of cover portion 500 are caused to lockingly engage downwardly-facing latch engagement shoulders 539 of latch elements 534, thereby locking the cover portion 500 in a sealed closed orientation with respect to enclosures 230 (FIGS. 5A-5H). This engagement can be seen particularly well in FIGS. 12G and 12H.

Unlocking of the cover portion 500 from its sealed closed orientation is achieved, as seen in FIGS. 20A-20D, by generally simultaneous finger engagement with both latch elements 534 of each latch assembly 530, each latch assembly 530 being engaged by a separate hand of a user, and by axial displacement of the latch elements 534 against the urgings of springs 536 towards each other, thus sliding downwardly-facing latch engagement shoulders 539 out of locking engagement with corresponding forward facing teeth 506 of latch engaging fingers 504 of cover portion 500 and allowing cover portion 500 to pivot upward about axle 512.

Reference is now made to FIGS. 14A, 14B, 14C, 14D, 14E, 14F, 14G and 14H, which are respective simplified front/top view pictorial; back/top view pictorial, front/bottom view pictorial, back/bottom view pictorial, top planar view, bottom planar view, right side planar view and left side planar view illustrations of battery charging assembly 134, forming part of the job site communications center of FIGS. 1A-2 and being located in recess 220 in main assembly housing element 150 (FIGS. 5A-5H).

As seen in FIGS. 14A-14F, the battery charging assembly 134 is formed define a battery receiving socket 550 configured to receive a rechargeable battery pack (not shown) and having a plurality of electrical connection pins 552 at a base 554 of socket 550.

Reference is now made to FIGS. 15A, 15B, 15C, 15D, 15E, 15F, 15G and 15H, which are respective simplified front/top view pictorial; back/top view pictorial, front/bottom view pictorial, back/bottom view pictorial, top planar view, bottom planar view, right side planar view and left side planar view illustrations of latchable, pivotable battery charging receptacle cover 188 (FIG. 4), forming part of the job site communications center of FIGS. 1A-2.

Figure 15A:
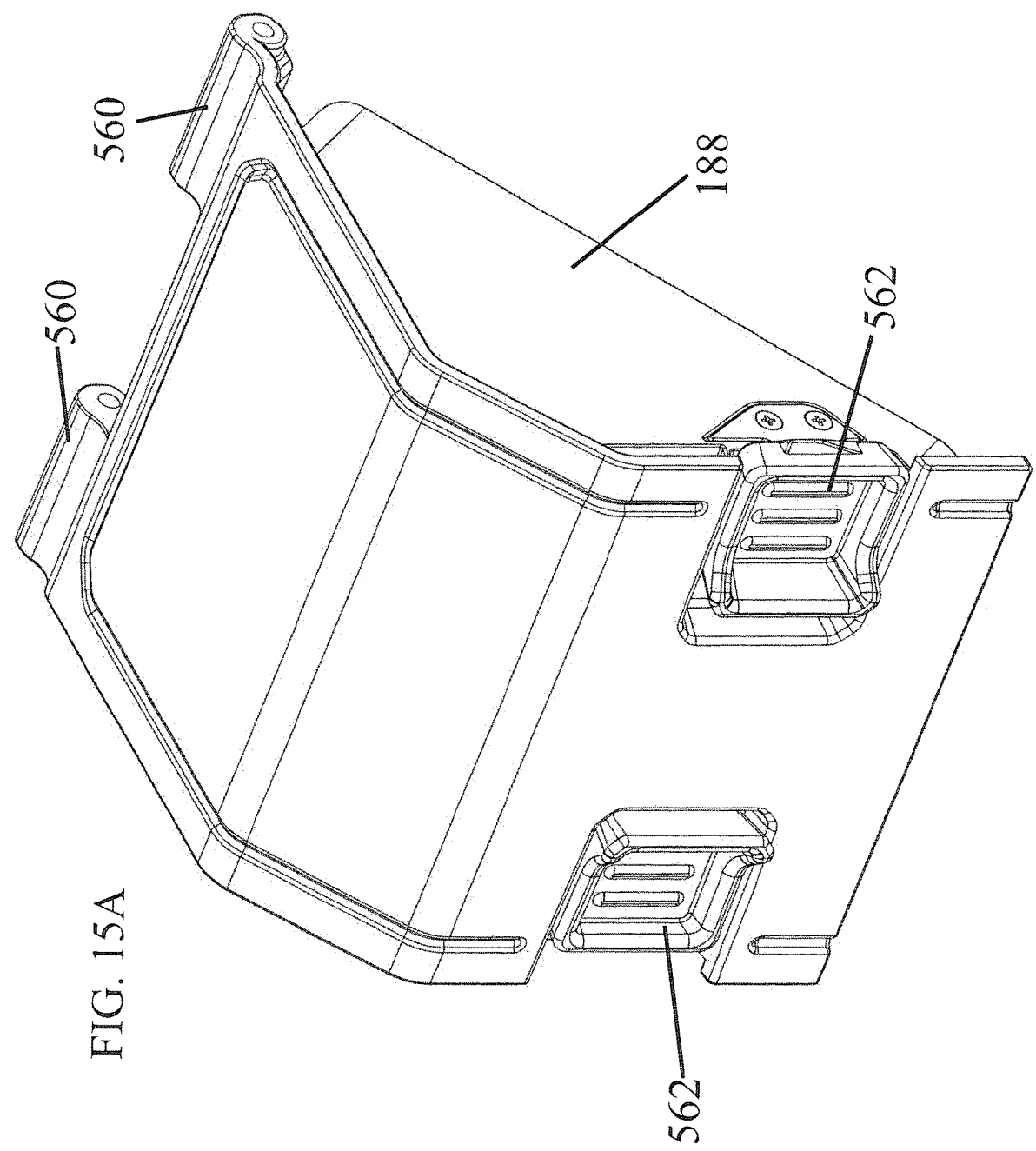
Figure 15C:
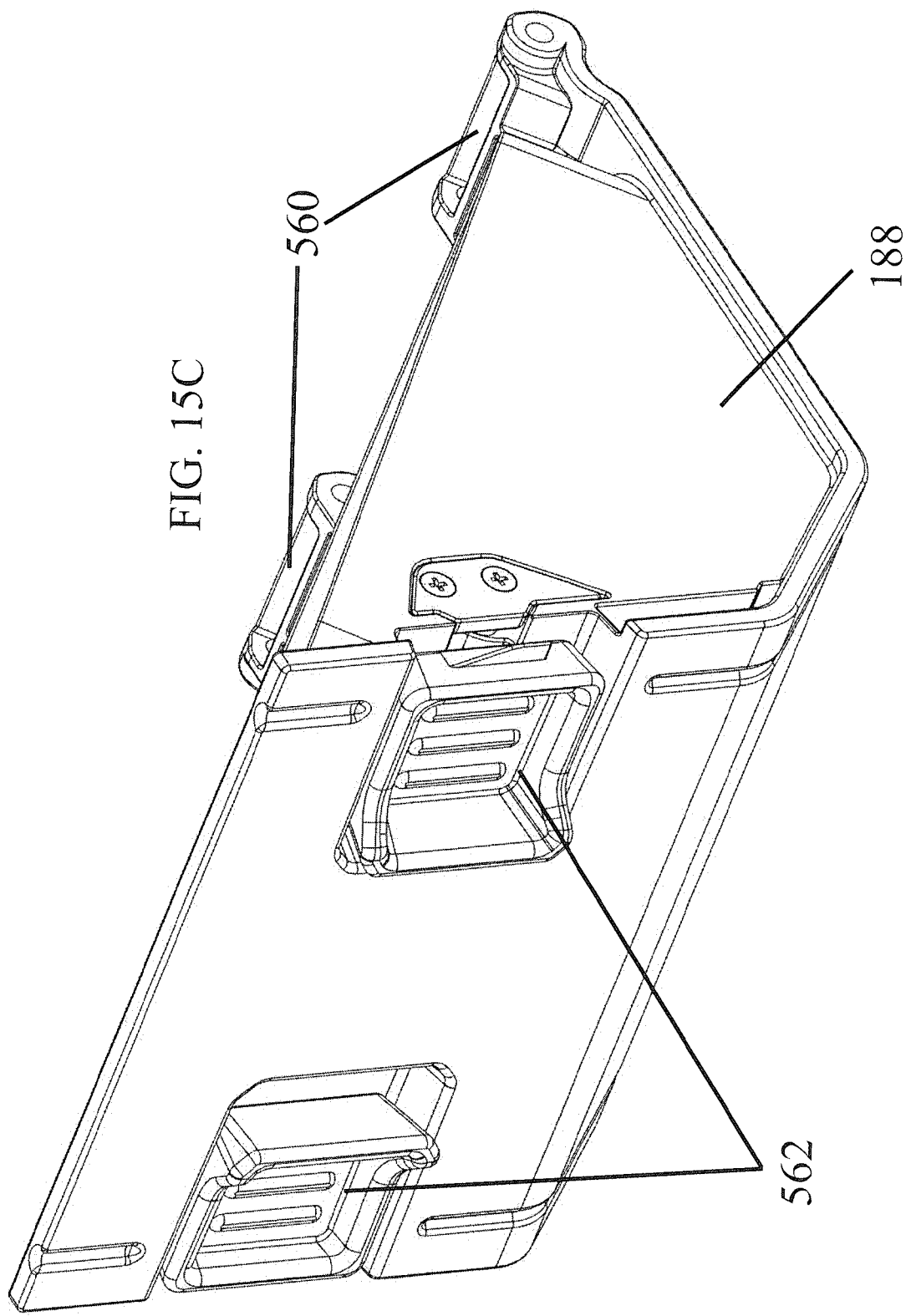
Figure 15D:
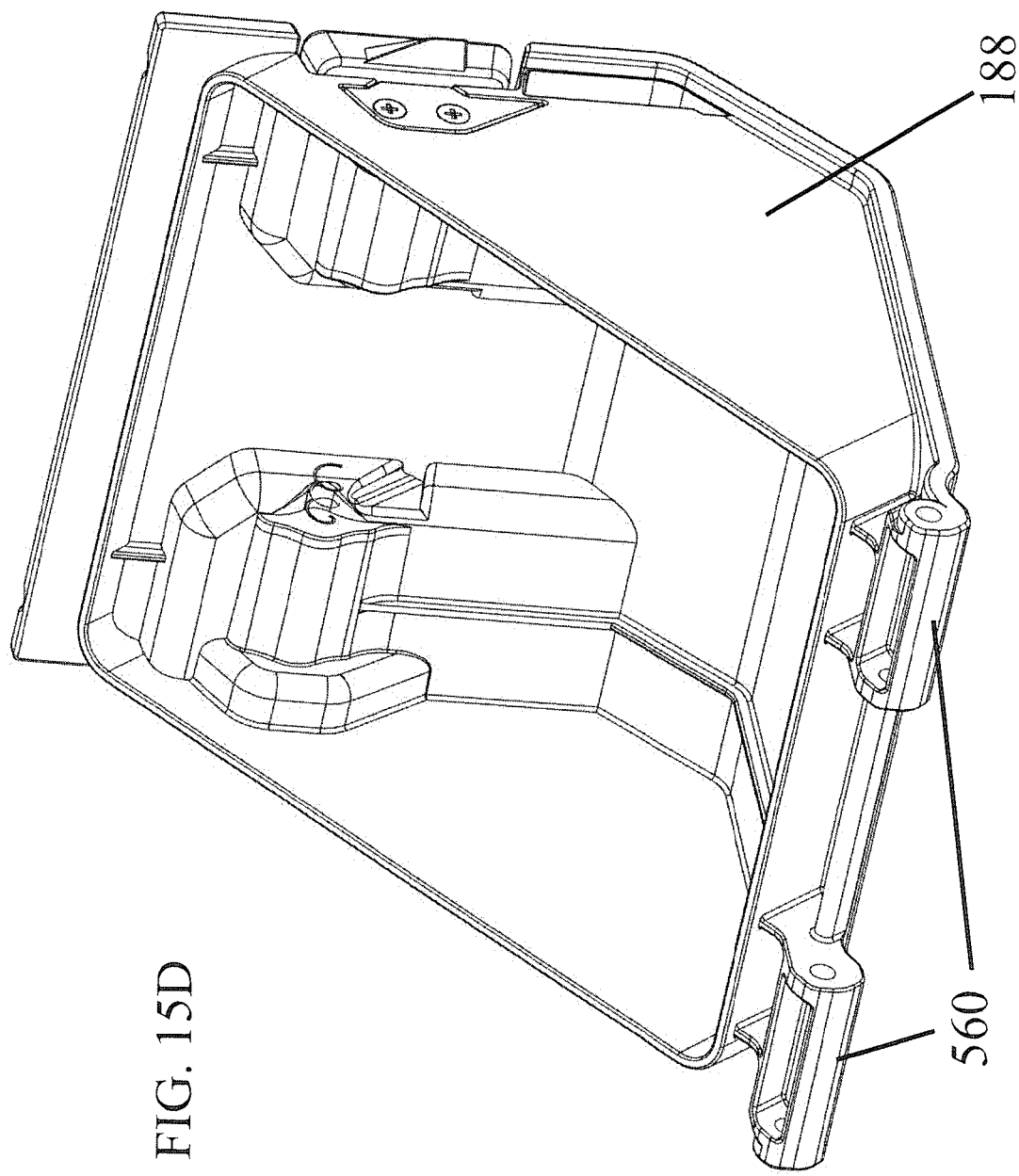
Figure 15F:
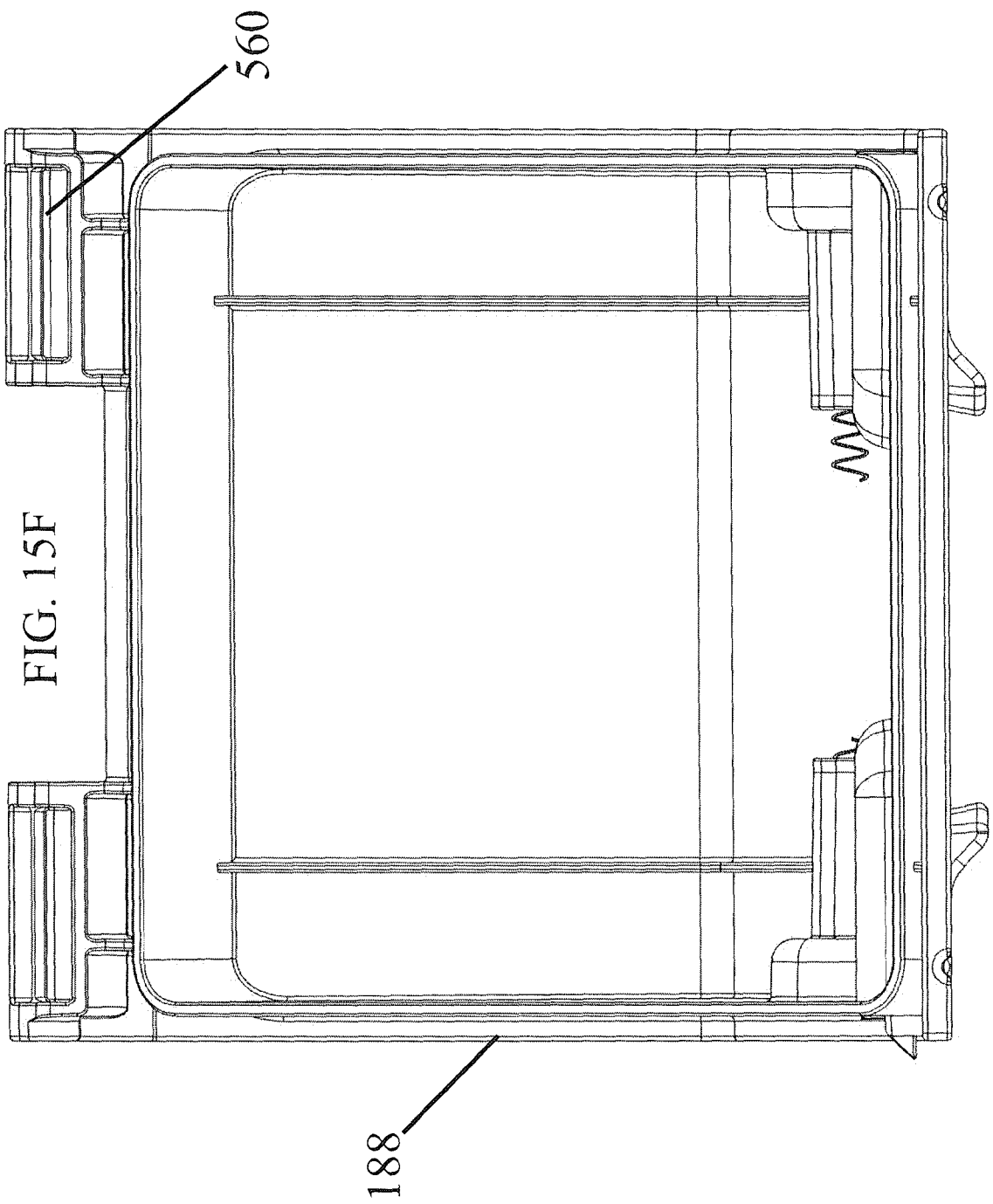
Figure 15G:
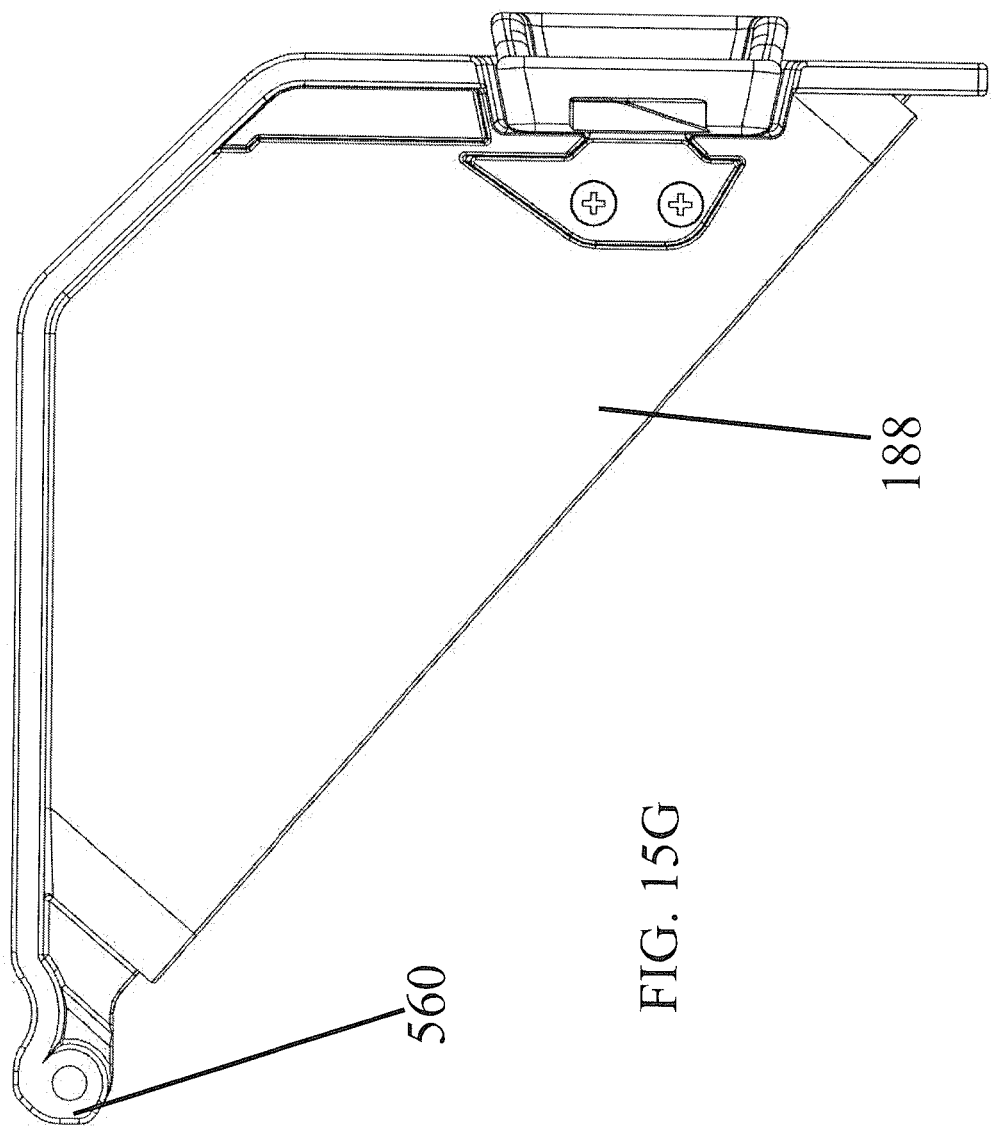
Figure 15H:
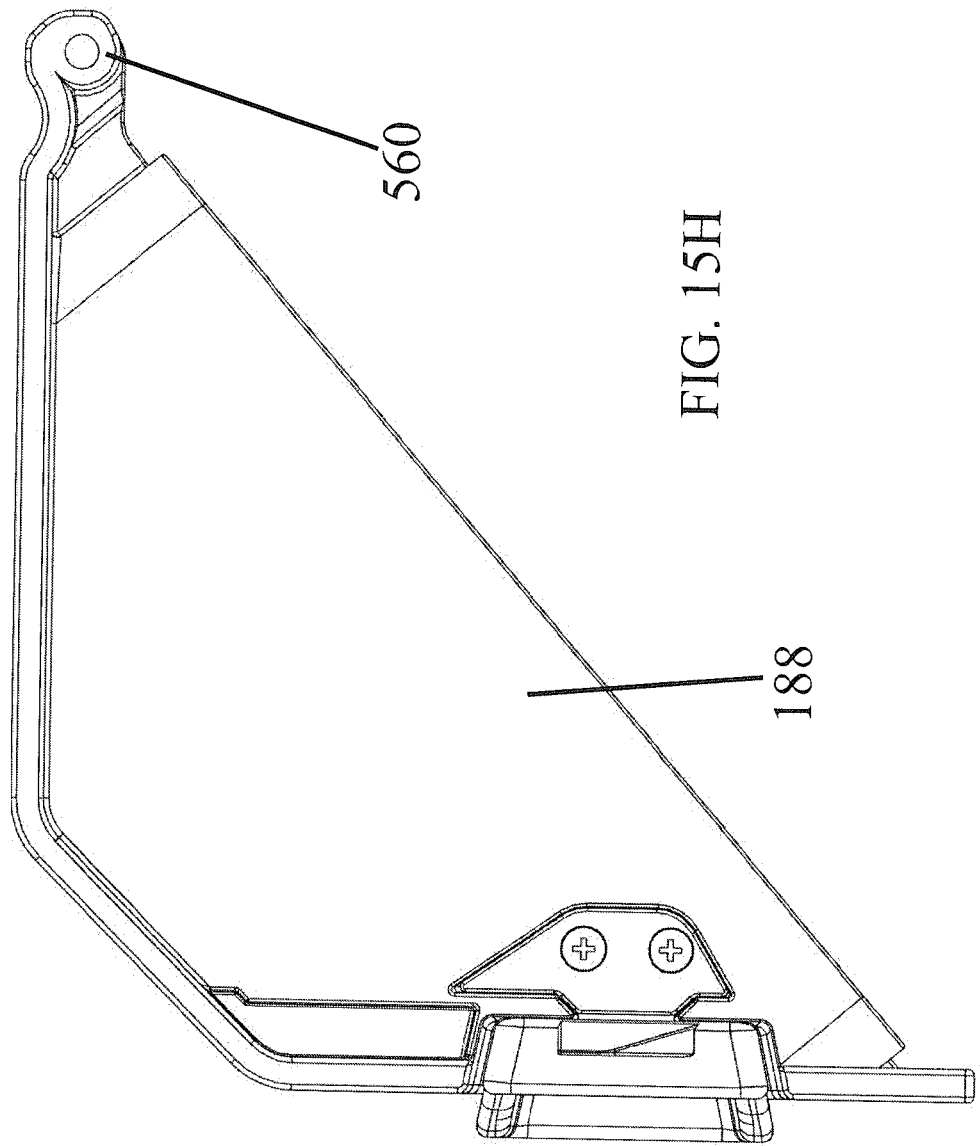

As seen in FIGS. 15A-15H, at a rearward-facing edge of cover 188, in the sense of FIG. 15A, there are preferably provided a pair of mutually spaced hinge elements 560, and receiving pivot axles 512, which also extend through corresponding mutually axially spaced hinge elements 234 formed on main assembly housing element 150 (FIGS. 5A-5H). It is thus appreciated that both the cover 188 and the cover assembly 170 pivot about the same axis, preferably about coaxial axles 512.

Cover 188 also preferably includes a pair of slidable, spring loaded side latch assemblies 562, which selectably engage latch recesses 224 formed on frame 222.

Figure 16A:
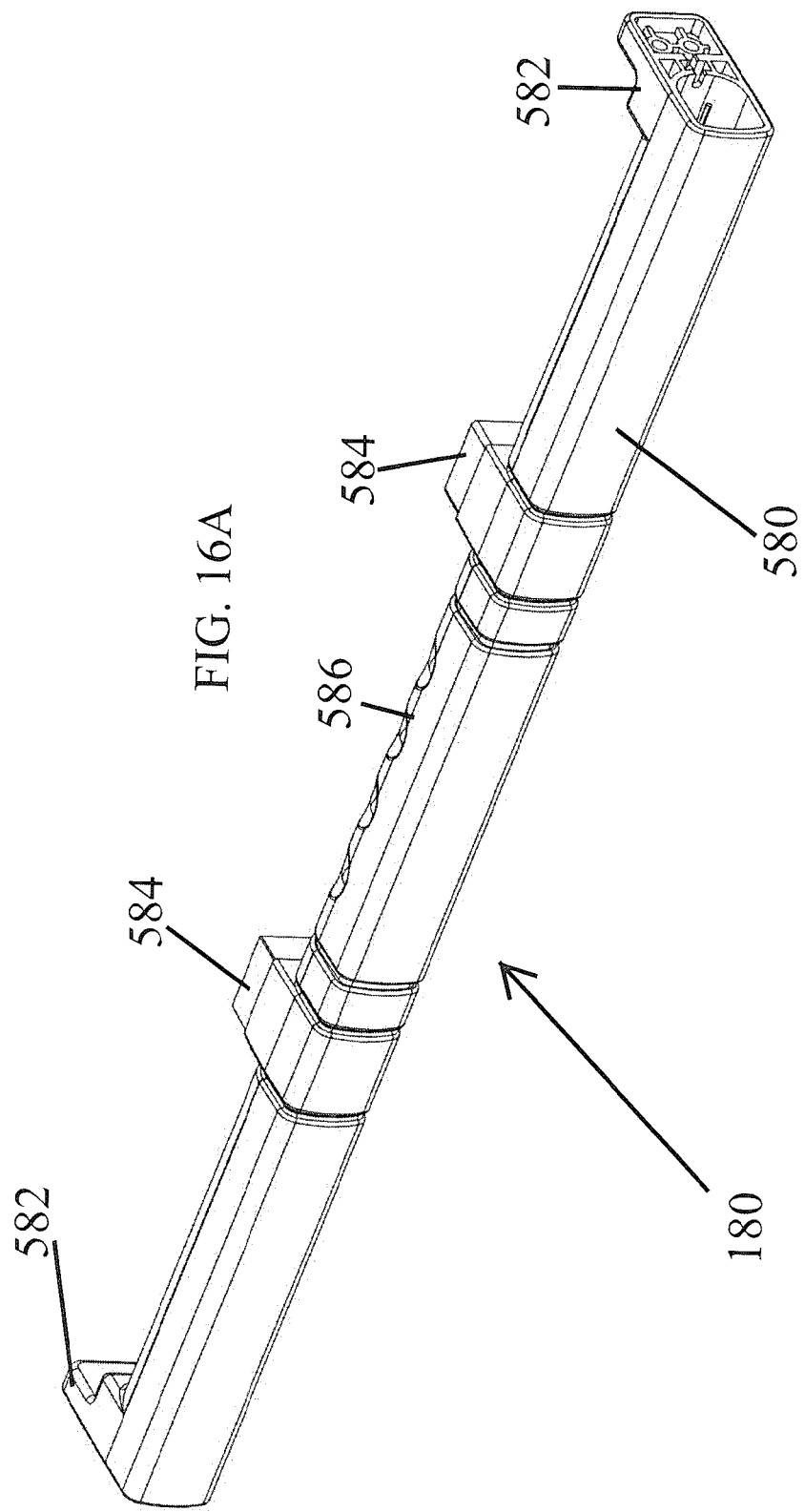
FIGS. 16A, 16B, 16C, 16D, 16E, 16F, 16G, 16H and 16I are respective simplified front/top view pictorial; back/top view pictorial, front/bottom view pictorial, back/bottom view pictorial, top planar view, bottom planar view, right side planar view, left side planar view and sectional illustrations of a handle and antenna assembly, forming part of the job site communications center of FIGS. 1A-2, FIG. 16I being taken along lines I-I in FIG. 16H.
Figure 16B:
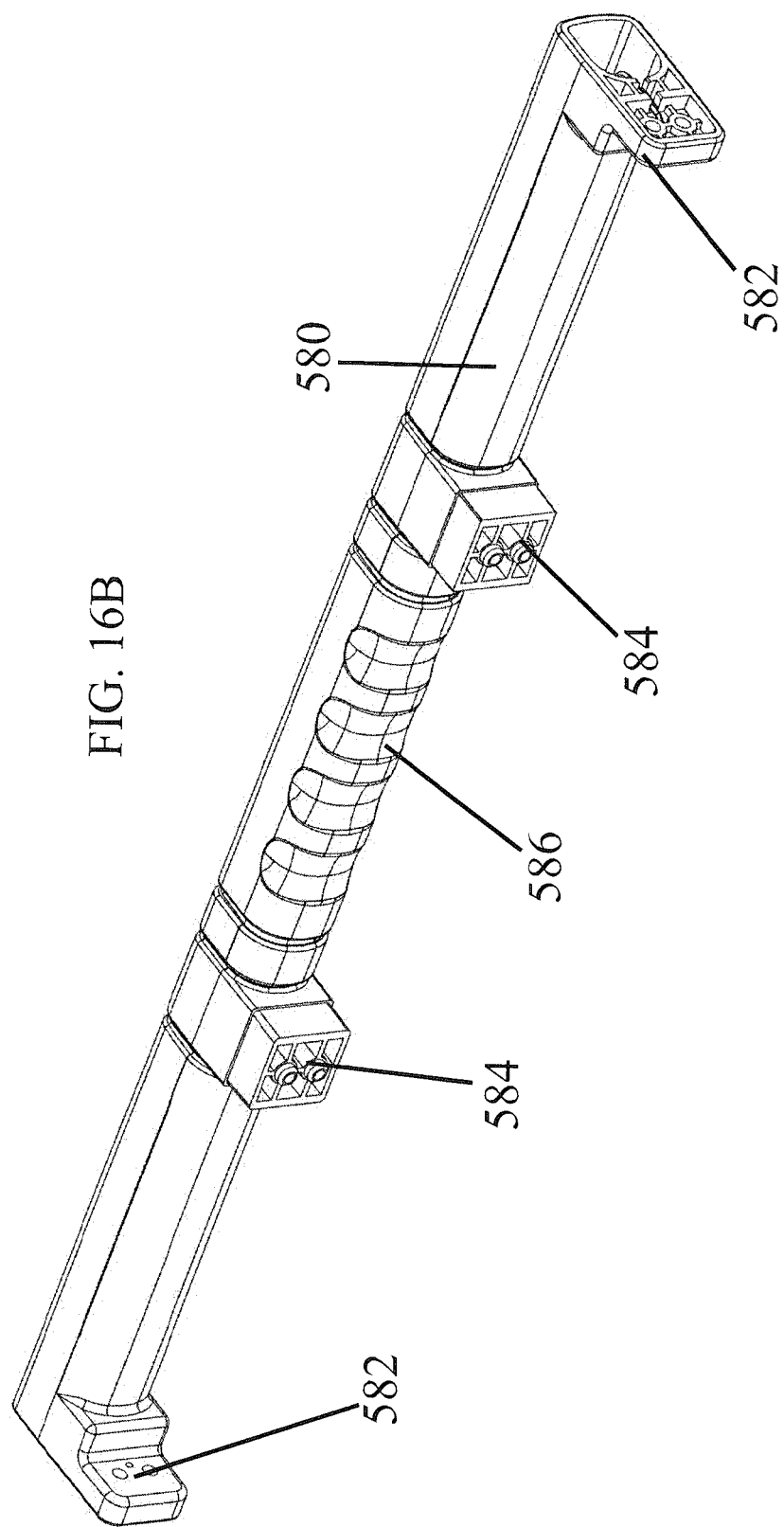
Figure 16C:
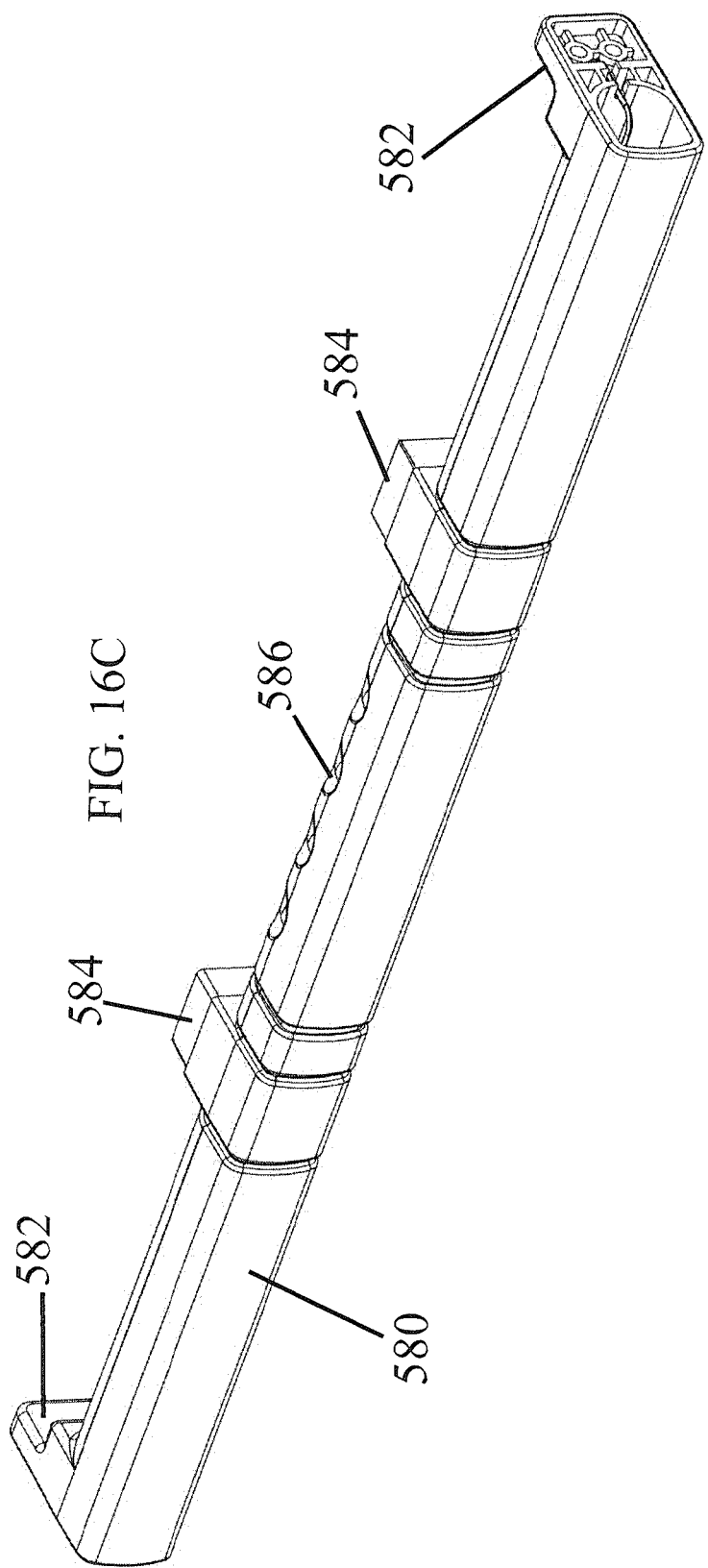
Figure 16D:
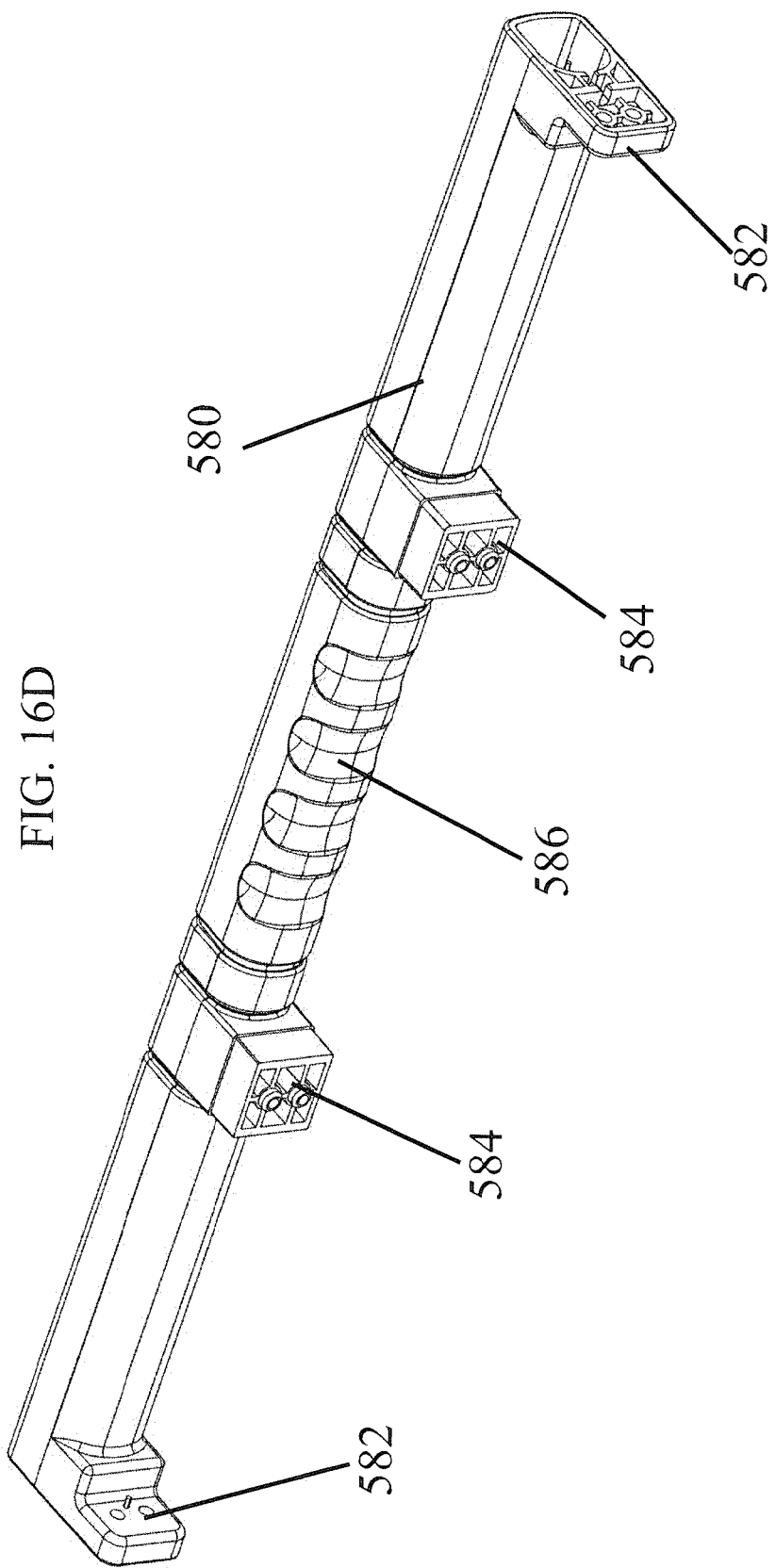
Figure 16E:
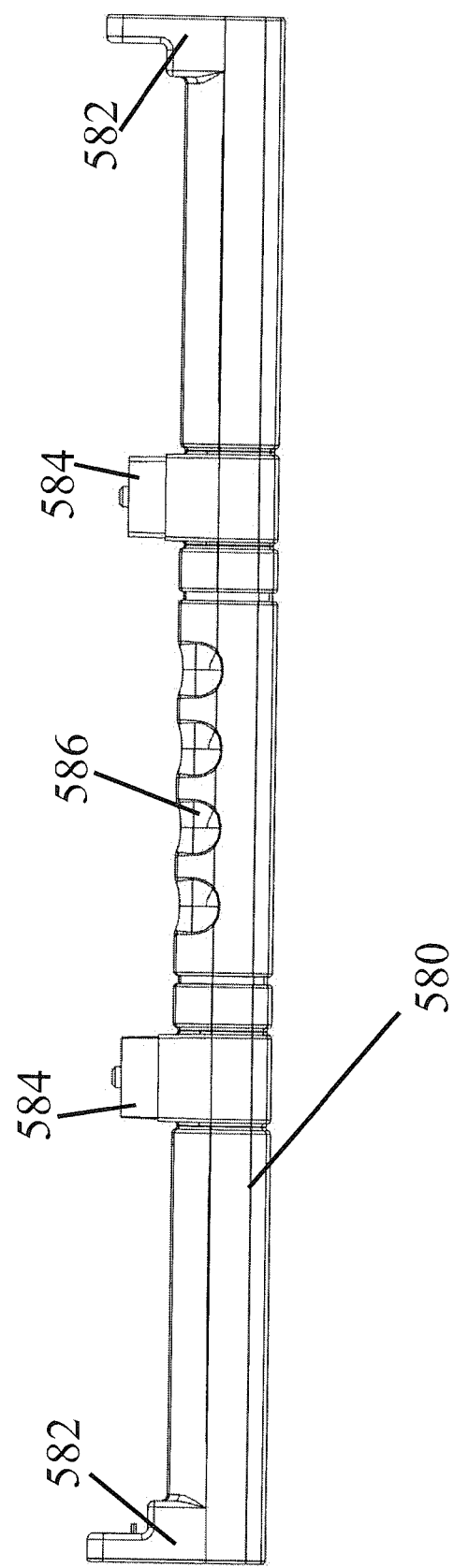
Figure 16F:
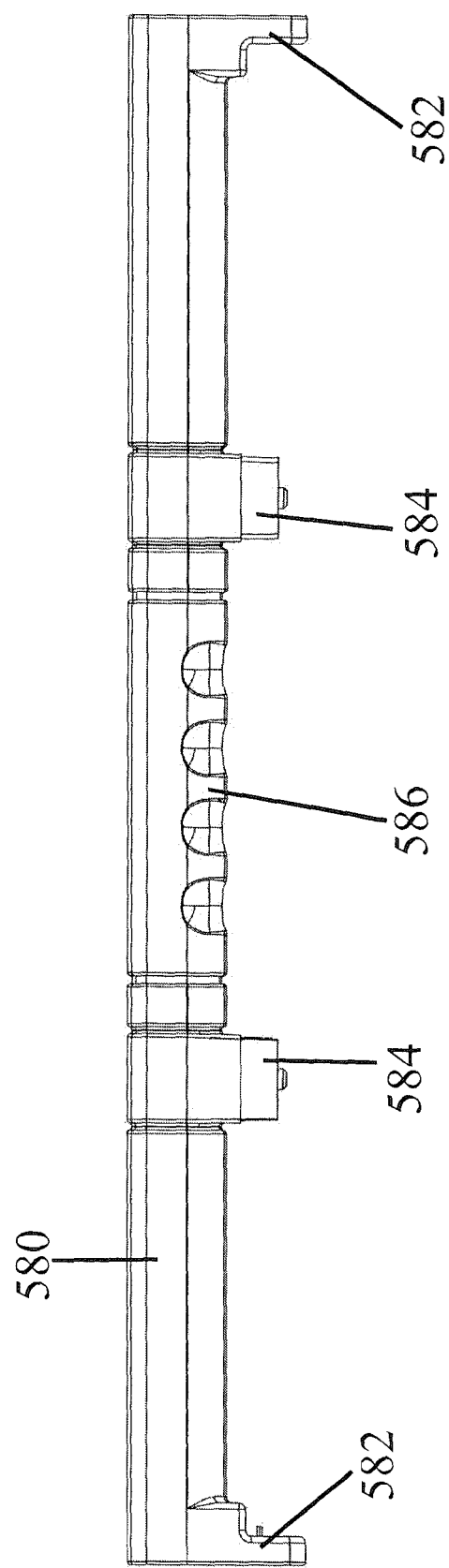
Figure 16G:
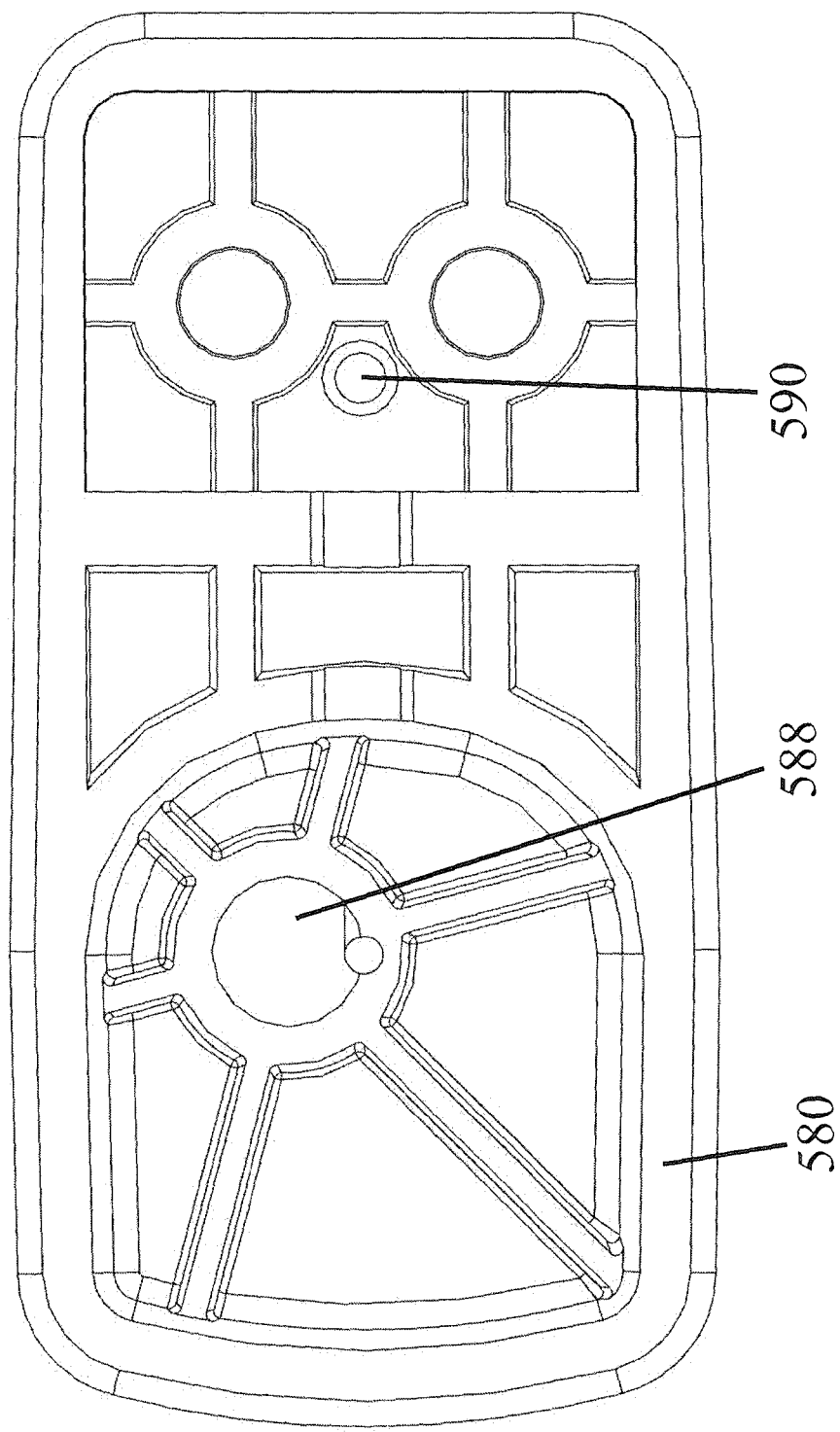
Figure 16H:
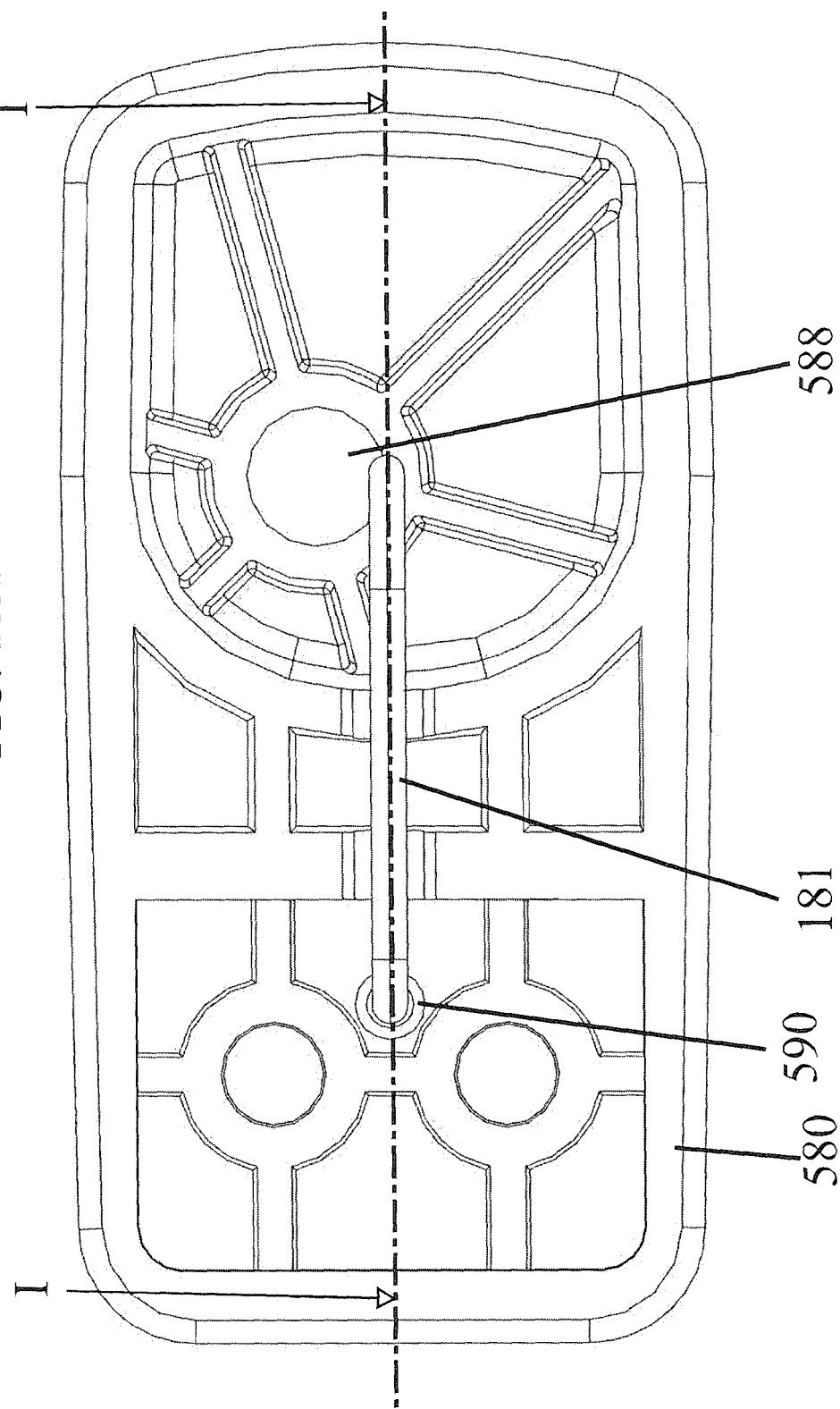
Figure 16I:
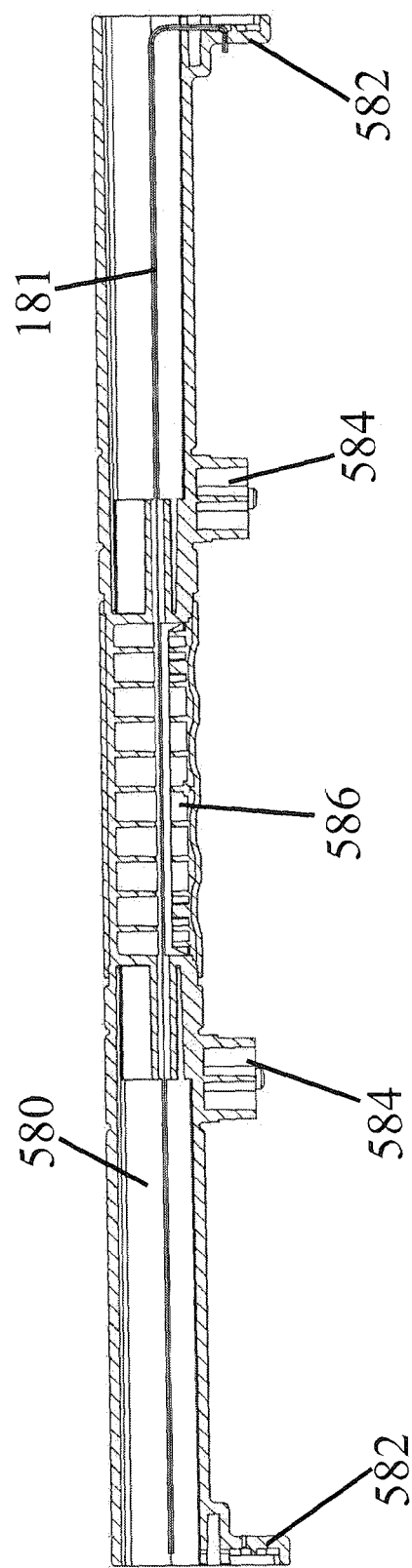
Figure 17A:
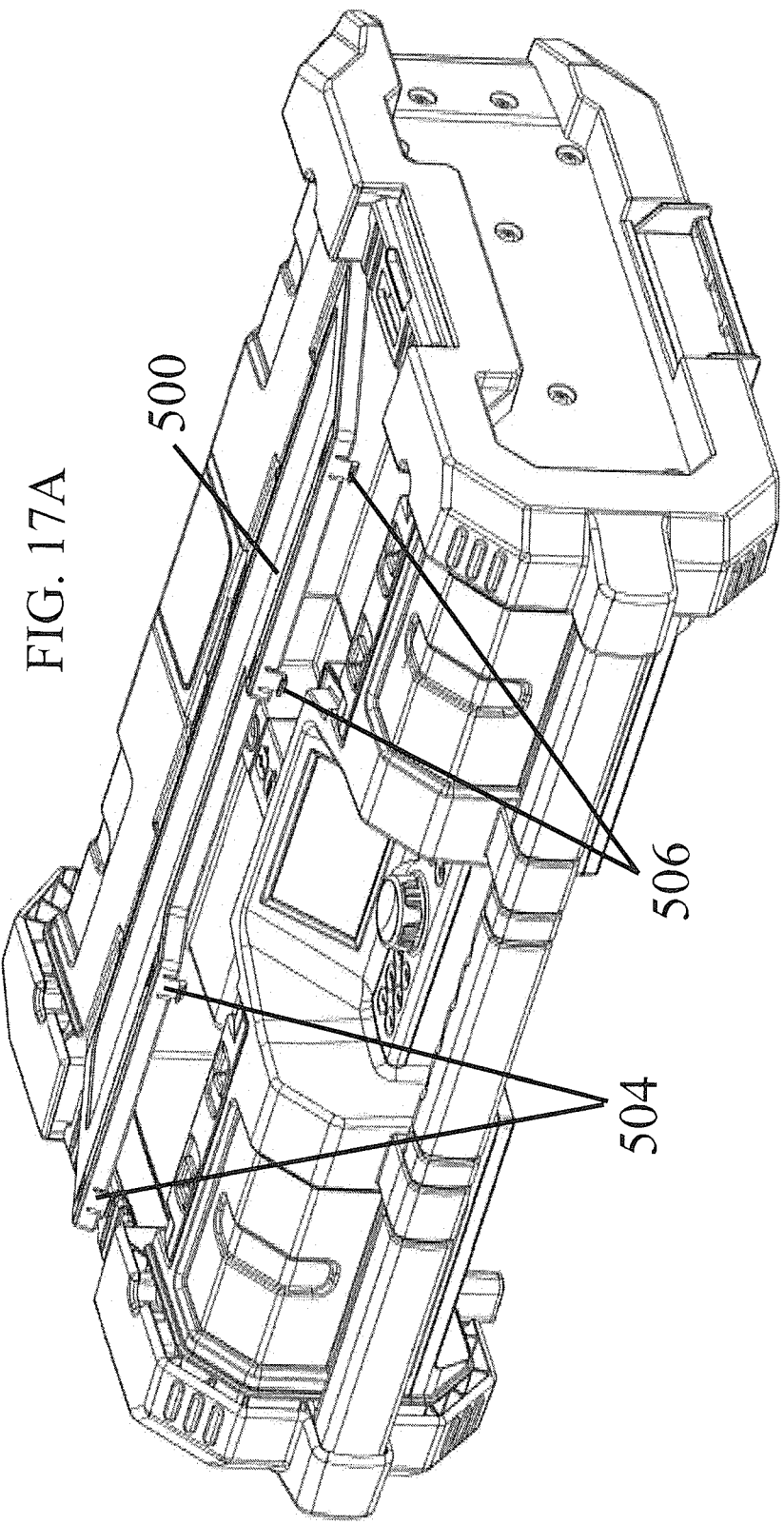
FIGS. 17A, 17B, 17C and 17D are respective simplified front/top view pictorial; side-facing sectional, rearward-facing sectional and top planar view illustrations of the latchable pivotable top cover assembly of FIGS. 12A-12H in a cover-raised operative orientation, FIGS. 17B and 17C being taken along lines B-B and C-C in FIG. 17D.
Figure 17B:
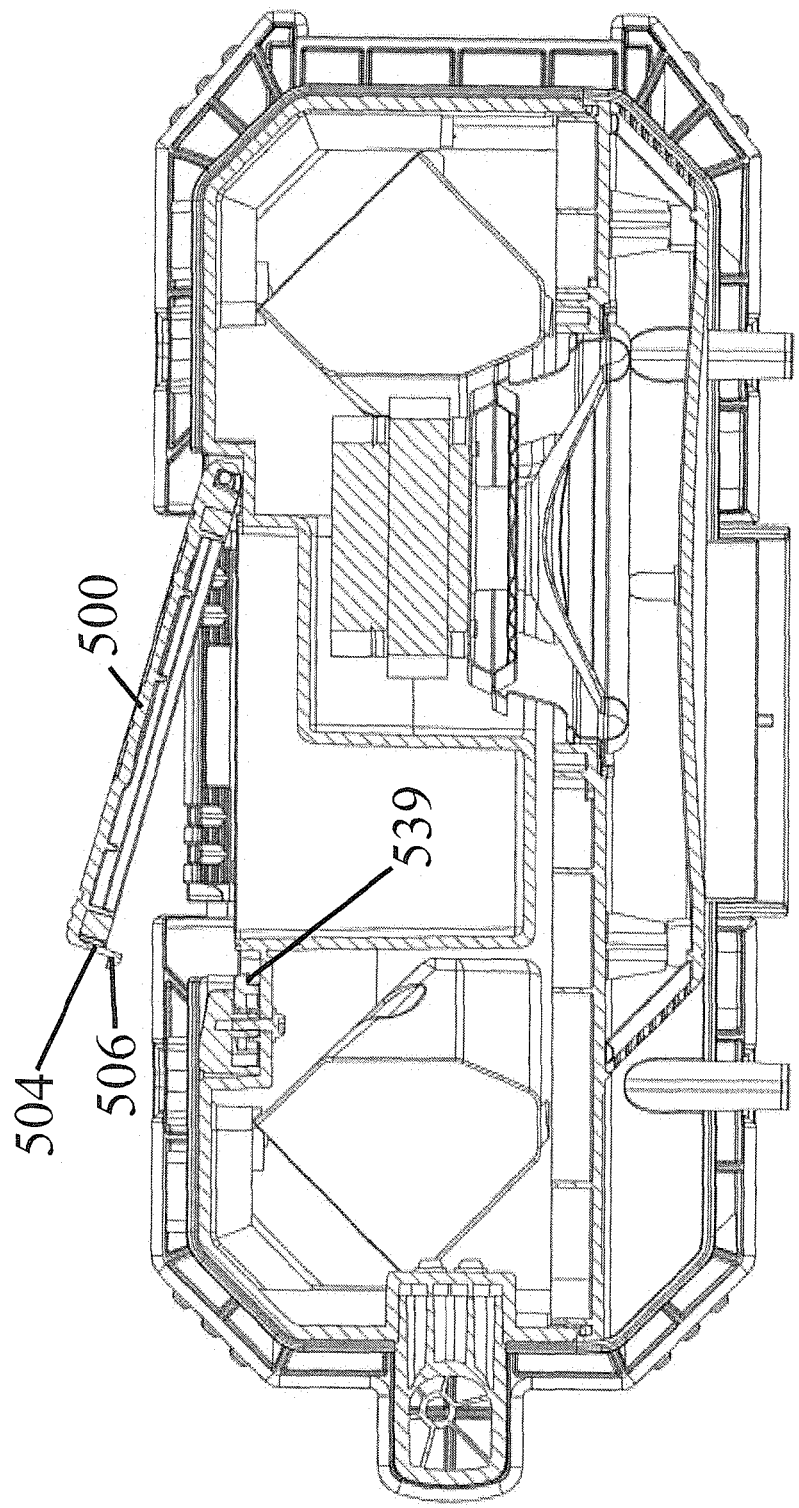
Figure 17C:
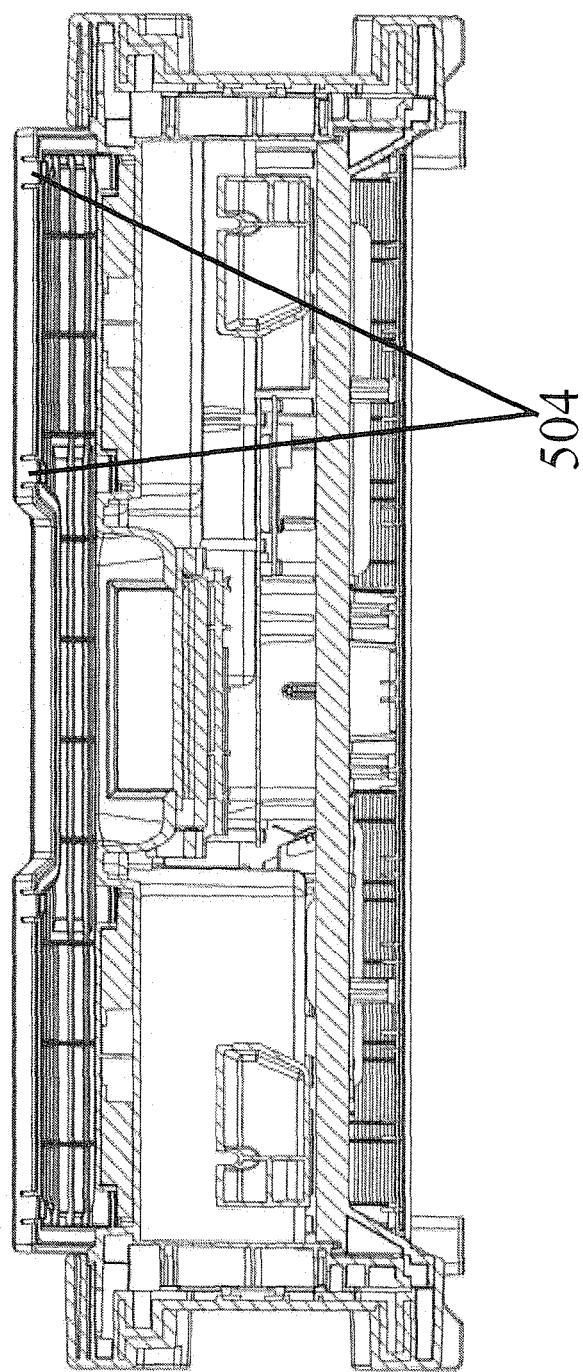
Figure 17D:
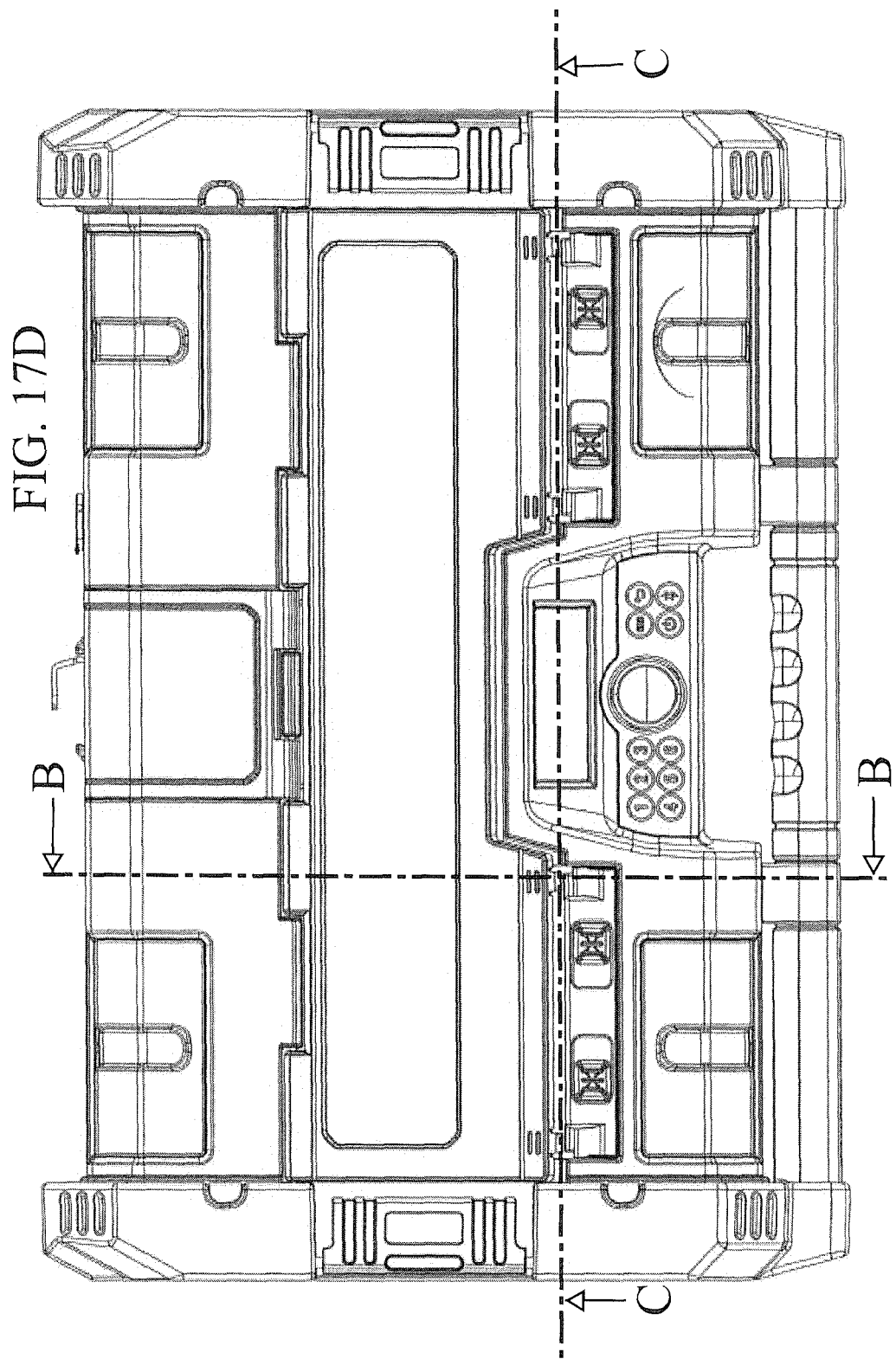
Figure 18A:
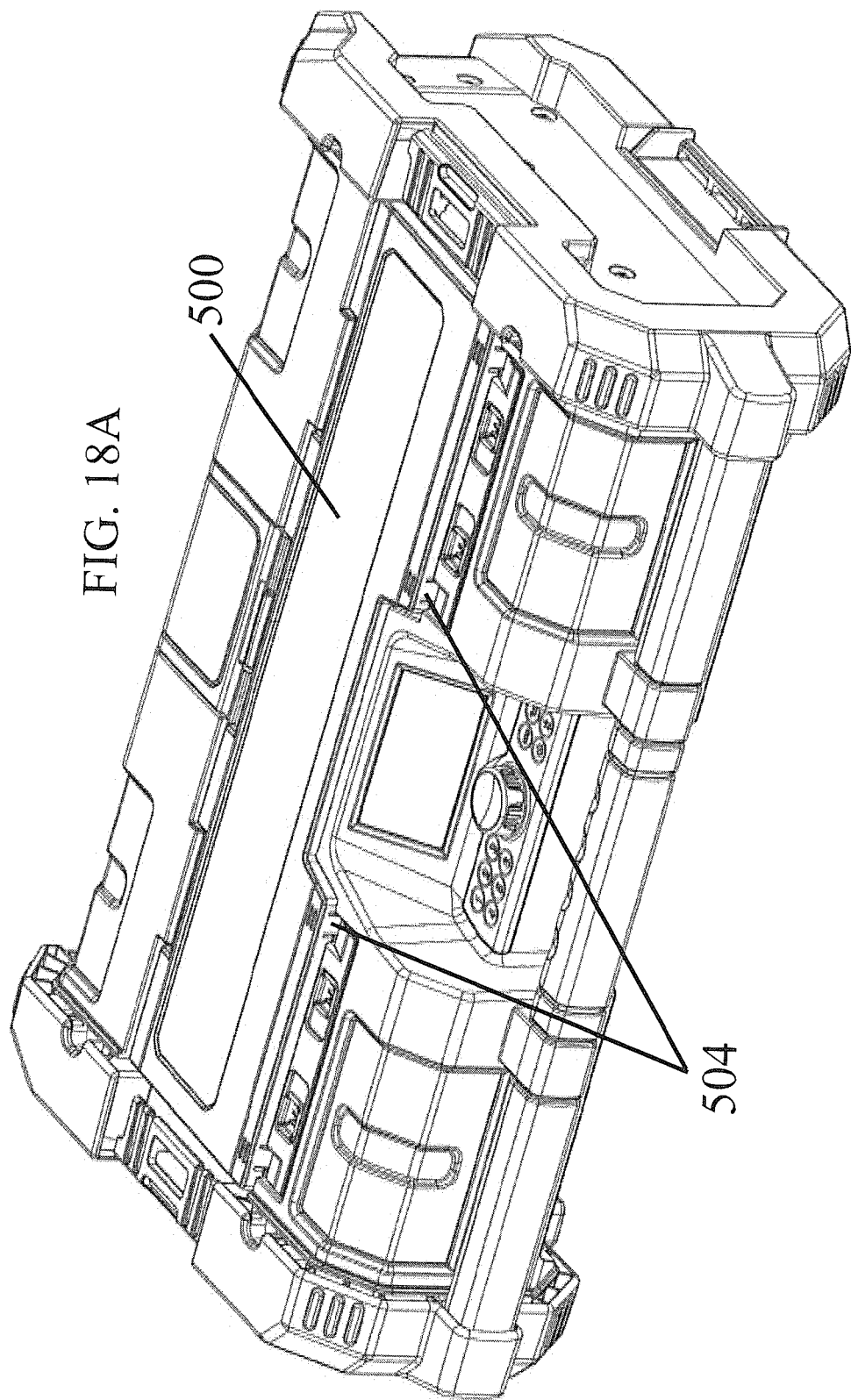
Figure 18C:
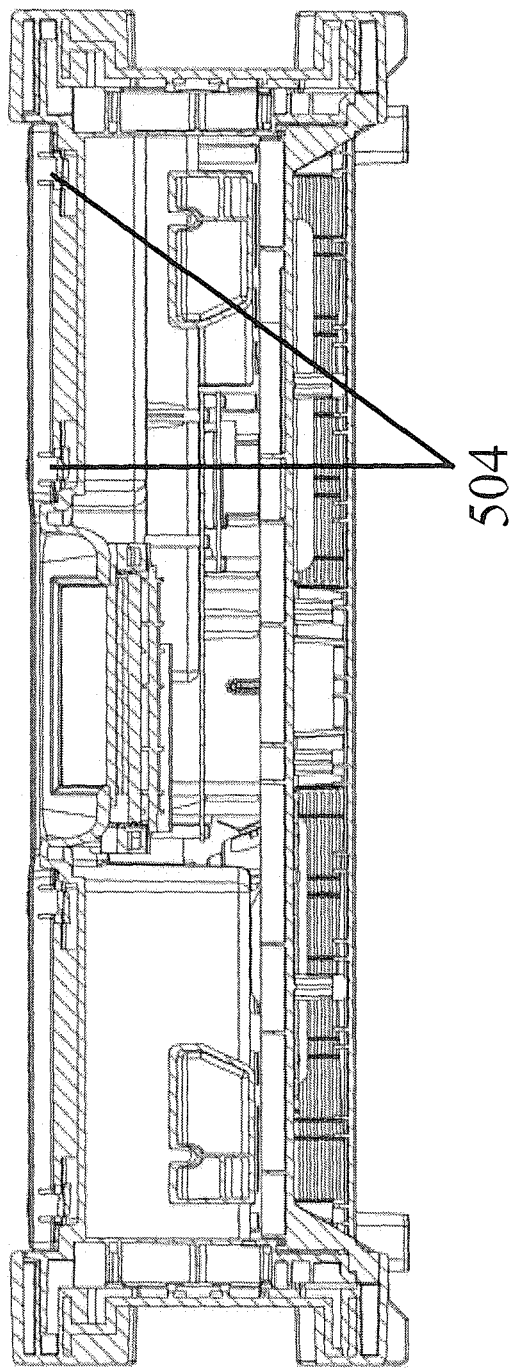
Figure 19A:
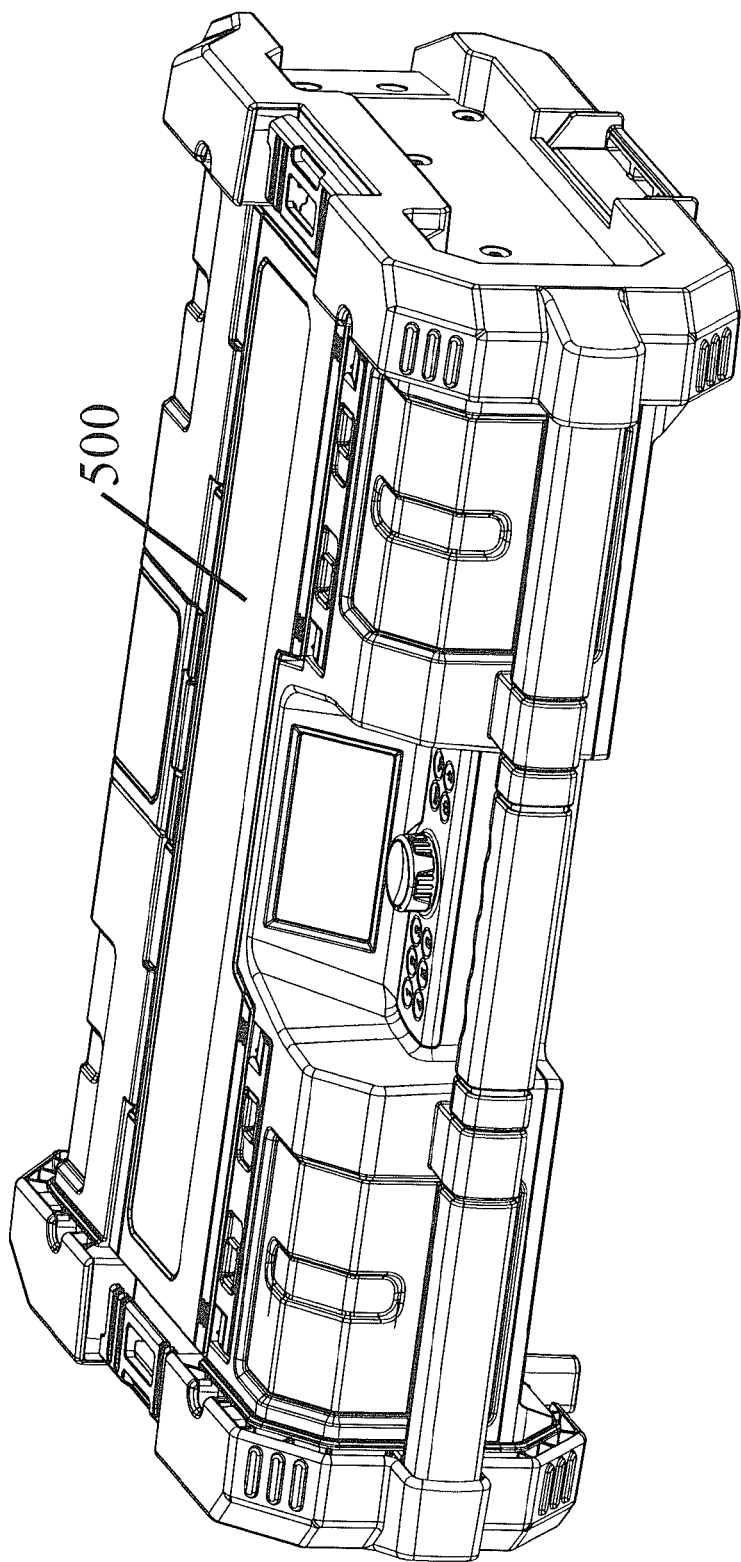
FIGS. 19A, 19B, 19C and 19D are respective simplified front/top view pictorial; side-facing sectional, rearward-facing sectional and top planar view illustrations of the latchable pivotable top cover assembly of FIGS. 12A-12H in a cover-lowered, latched operative orientation, FIGS. 19B and 19C being taken along lines B-B and C-C in FIG. 19D.
Figure 19B:
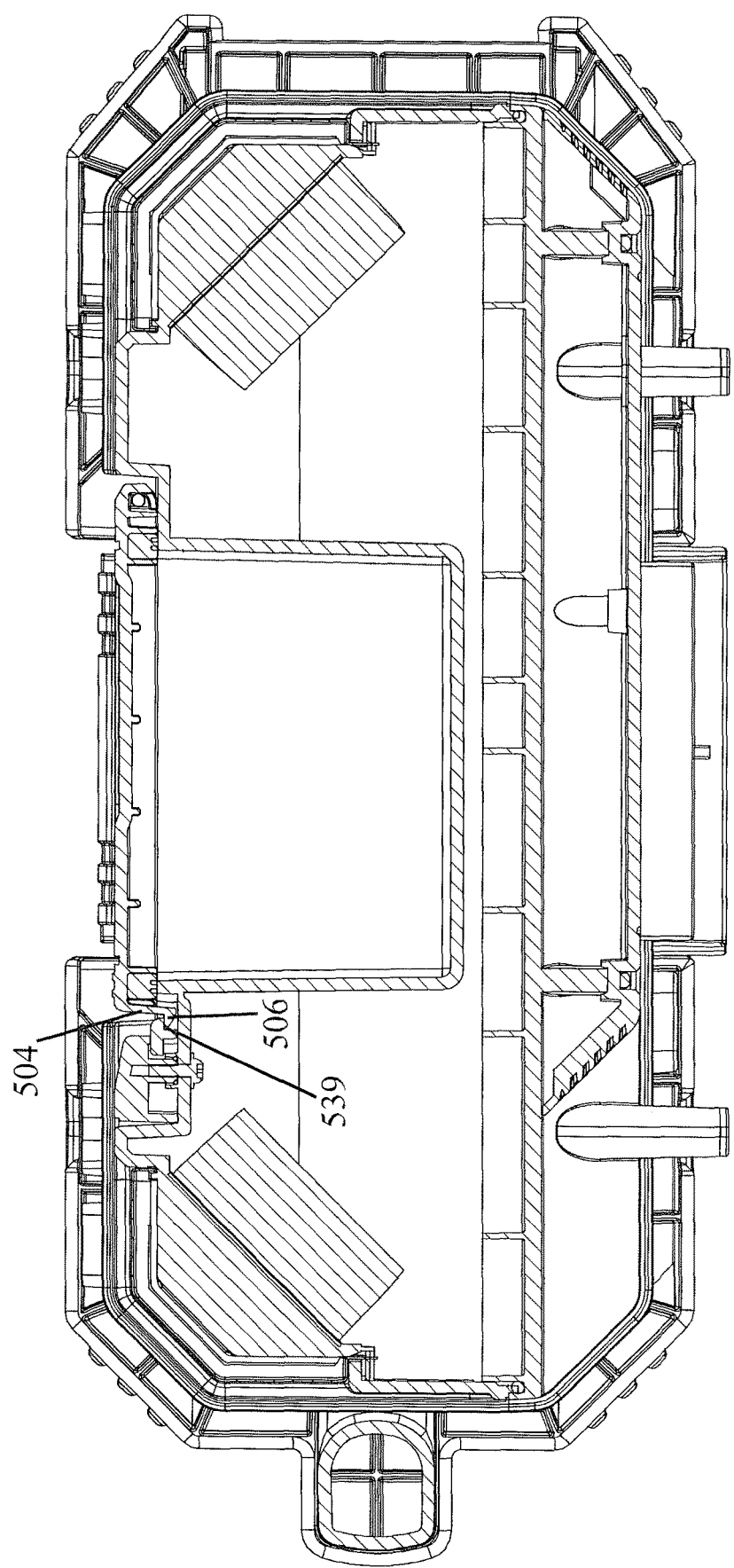
Figure 19C:
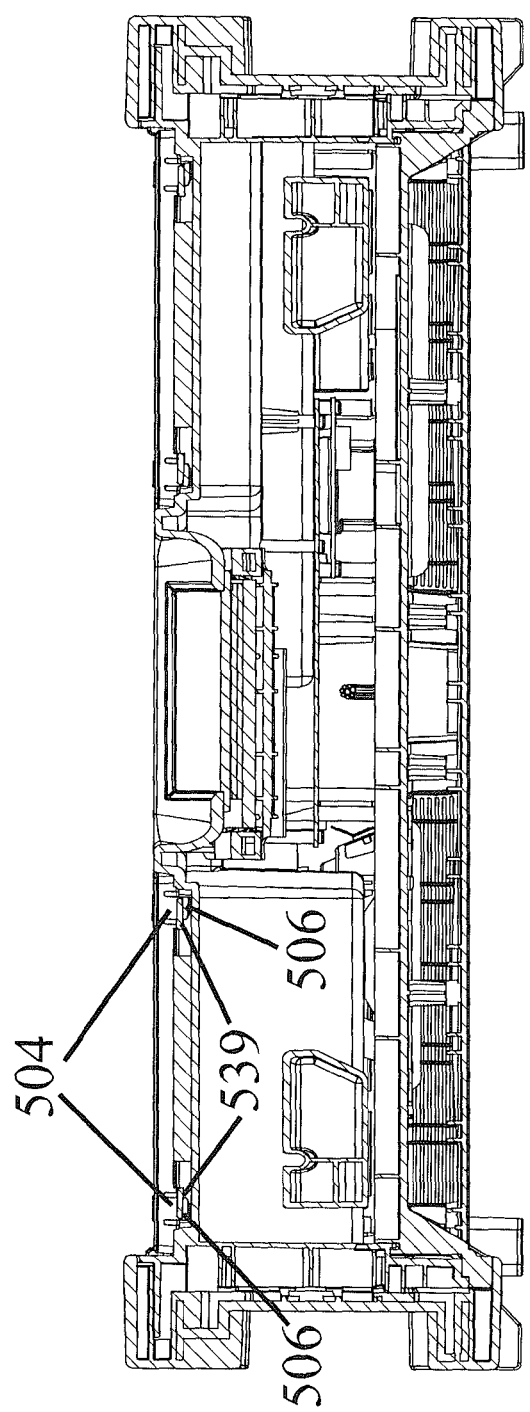
Figure 19D:
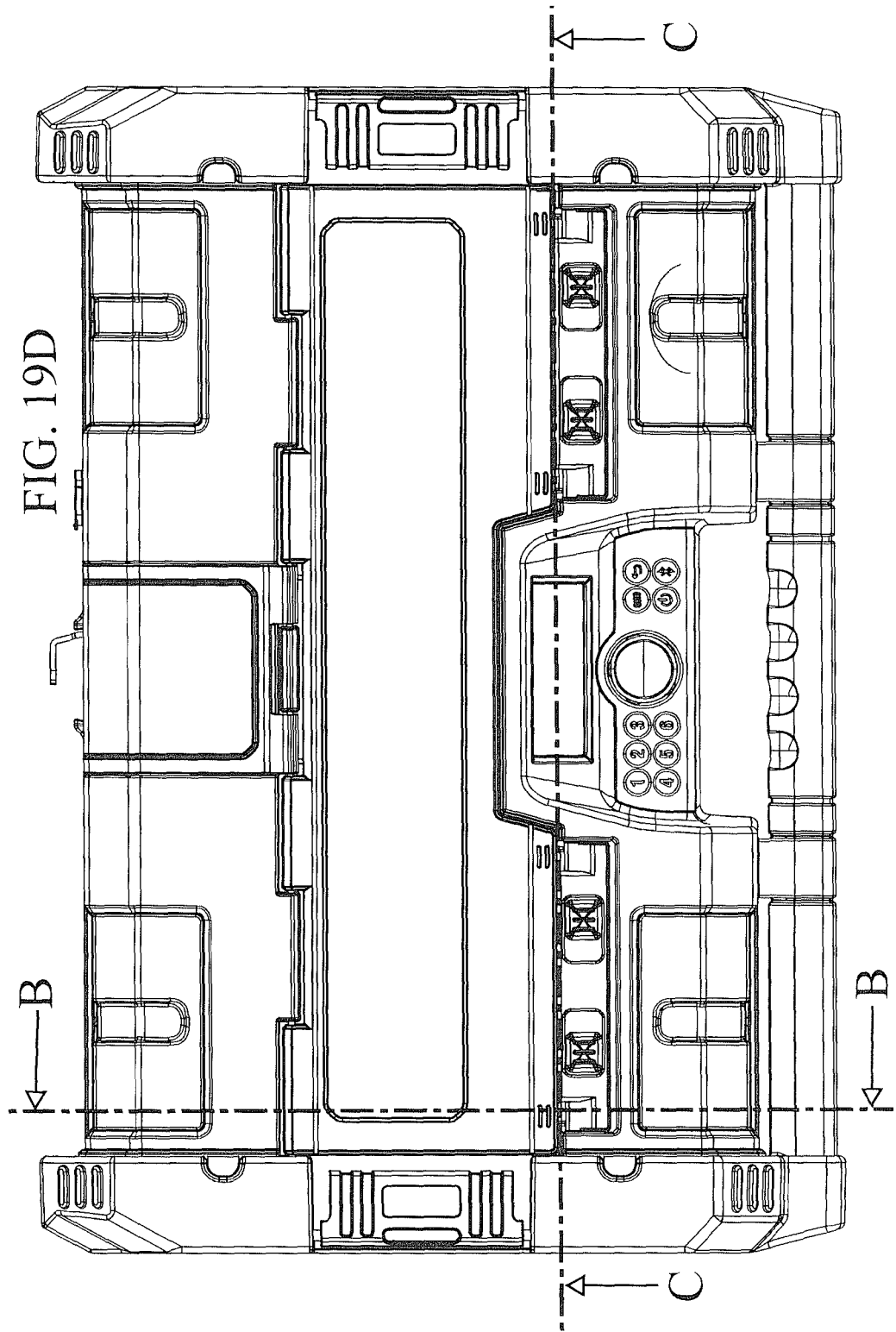
Figure 20A:
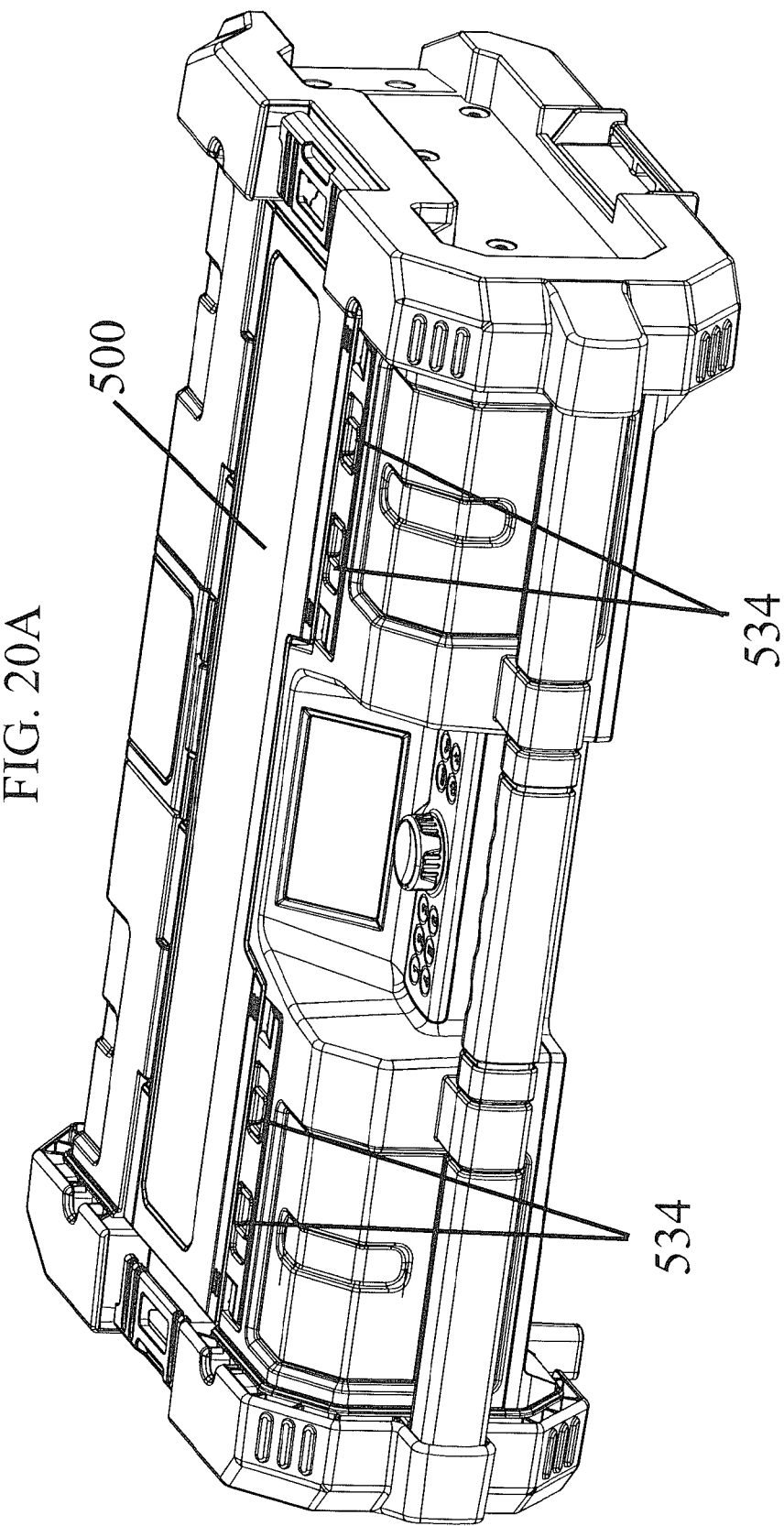
Figure 20B:
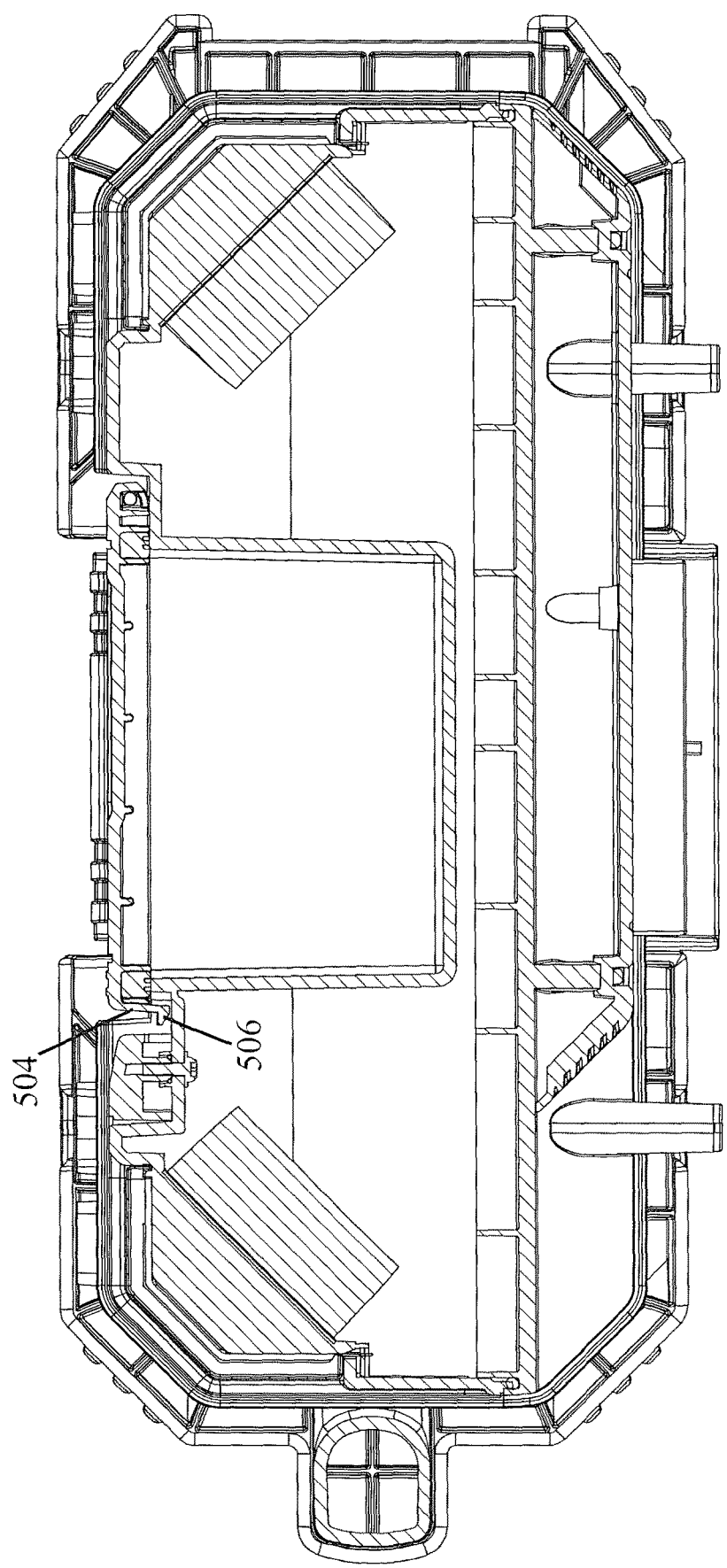
Figure 20C:
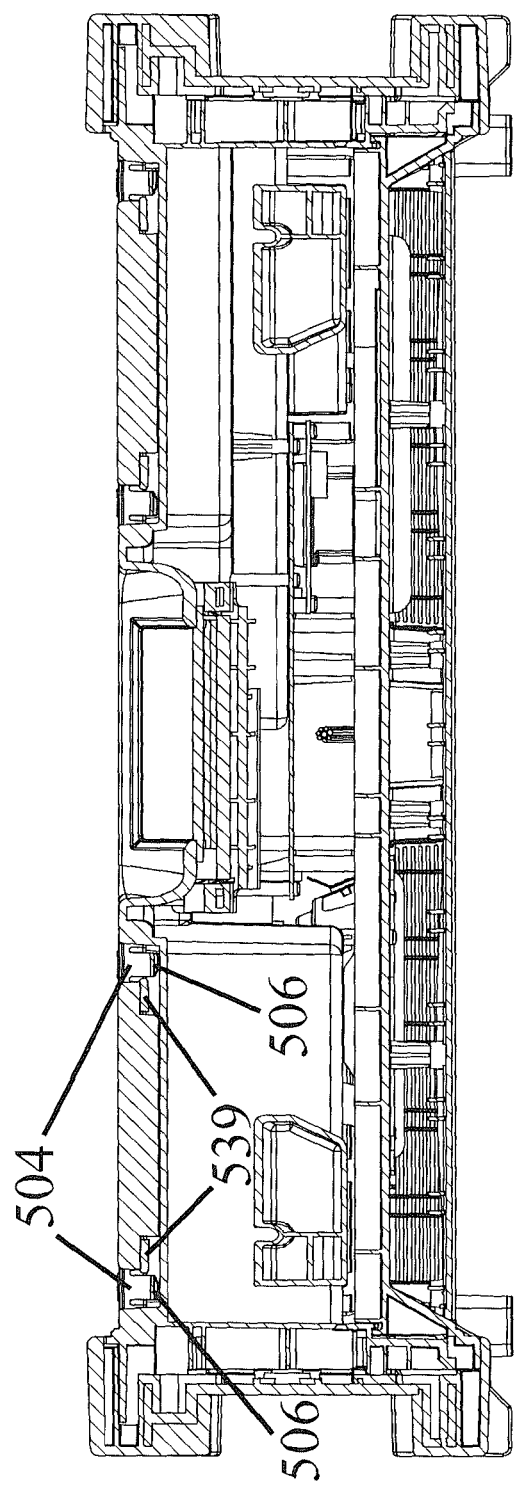

Reference is now made to FIGS. 16A, 16B, 16C, 16D, 16E, 16F, 16G, 16H and 16I, which are respective simplified front/top view pictorial; back/top view pictorial, front/bottom view pictorial, back/bottom view pictorial, top planar view, bottom planar view, right side planar view, left side planar view and sectional illustrations of handle and antenna assembly 180, forming part of the job site communications center of FIGS. 1A-2, FIG. 16I being taken along lines I-I in FIG. 16H.

As seem in FIG. 16A, the handle and antenna assembly 180 includes a generally hollow handle element 580 defining a pair of end attachment protrusions 582, each of which fits into a corresponding socket formed on a forward-facing surface of main assembly housing element 150, and a pair of intermediate attachment protrusions 584, each of which fits into a corresponding socket formed on a forward-facing surface of main assembly housing element 150. A hand grip portion 586 is preferably molded over a central portion of generally hollow handle element 580.

Antenna 181 (FIG. 4) preferably extends through a hollow portion 588 of handle element 580 and also extends through an antenna connection passageway 590 into antenna connection socket 252 of the main assembly housing element 150.

It is appreciated that the job site communications center may include additional handles. Additionally, generally hollow handle element 580 may form a hollow front bumper bar, which further protects the front of the job site communications center, including speakers, grills and any nearby elements of the user interface from frontal impacts, while minimizing weight of the jobsite communications center and material required. Alternatively, an additional solid front bumper bar may be provided.

It is appreciated that all connections for antenna 181 are contained within main assembly 100, and the user cannot access or adjust antenna 181. As seen in FIG. 4, antenna 186 may also be provided at a side of main assembly 100, positioned inside a channel in main assembly 100 between ribs of a reinforced side section thereof, such that antenna 186 is covered by the side panel when it is attached to the main assembly 100. These arrangements provide increased protection for antennas 181 and 186 and the connections thereof to the sound system, which improves the durability of the sound system.

It is appreciated that job site communications center may include various radio receivers, for example, FM, AM, DAB and other versions of digital radio broadcast. Additionally, the sound system of job site communications center may include Bluetooth® capabilities and may have one or more auxiliary inputs, in order to allow media from other devices to be played through the sound system. The sound system may have one or more user accessible compartments within the main shell, which can be sealed in order to protect devices contained in the compartments. The device interface ports can be provided within the compartments, and USB chargers to recharge mobile telephones or other devices may also be provided within the compartments. Thereby, the whole assembly of the sound system, mobile telephone or other device, and linking cables, can be protected from water or dust ingress and from impacts, and the whole assembly can also easily be moved to another work location with a minimum of disturbance of the assembly.

The job site communications center may be operated by a battery, or may be plugged into a power supply using a transformer supplied with the job site communications center. When plugged in, the job site communications center may be arranged to recharge the battery. Advantageously, the sound system of job site communications center may be powered by batteries intended for use with power tools, which will typically be available on a jobsite, and which can provide suitable power for the application and are convenient to use when the job site communications center is not close to a source of mains power.

Reference is now made to FIGS. 21A, 21B and 21C, which are simplified pictorial illustrations illustrating stages in stackable and lockable mounting of a tool box onto the job site center of FIGS. 1A-20D in accordance with one embodiment of the present invention.

FIG. 21A shows initial partial sliding engagement of the job site communications center of FIGS. 1A-20D with the right one of a pair of known mounting brackets 600 of a known TOUGH SYSTEM™ tool box carrier 602, commercially available under the DEWALT® brand from the Stanley Black & Decker. The enlargement shows a known socket 604 forming part of each of brackets 600 which surrounds a screw head 606, also forming part of each of brackets 600. The enlargement also shows resilient downwardly extending curved engagement lip 388 (FIG. 9D) at a lower surface 390 of an upper portion 392 of partially peripheral bumper protrusion 382 adjacent open rearward facing end 386. At this stage engagement lip 388 does not engage socket 604.

FIG. 21B shows further partial sliding engagement of the job site communications center of FIGS. 1A-20D with the right one of a pair of known mounting brackets 600 of the known TOUGH SYSTEM™ tool box carrier. The enlargement shows resilient downwardly extending curved engagement lip 388 (FIG. 9D) approaching socket 604 of bracket 600 which surrounds screw head 606. At this stage engagement lip 388 does not yet engage socket 604.

FIG. 21C shows full retained engagement of the job site communications center of FIGS. 1A-20D with the right one of a pair of known mounting brackets 600 of the known TOUGH SYSTEM™ tool box carrier. Enlargement A shows resilient downwardly extending curved engagement lip 388 (FIG. 9D) engaging socket 604 of bracket 600 and partially surrounding screw head 606. This engagement retains but does not lock the job site communications center of FIGS. 1A-20D onto the TOUGH SYSTEM™ tool box carrier 602. Enlargement B shows a rotatable locking element 610 of the TOUGH SYSTEM™ tool box carrier 602 out of locking engagement with back mounting bracket 136 (FIGS. 1A-2) of the job site communications center 100.

Figure 21D:
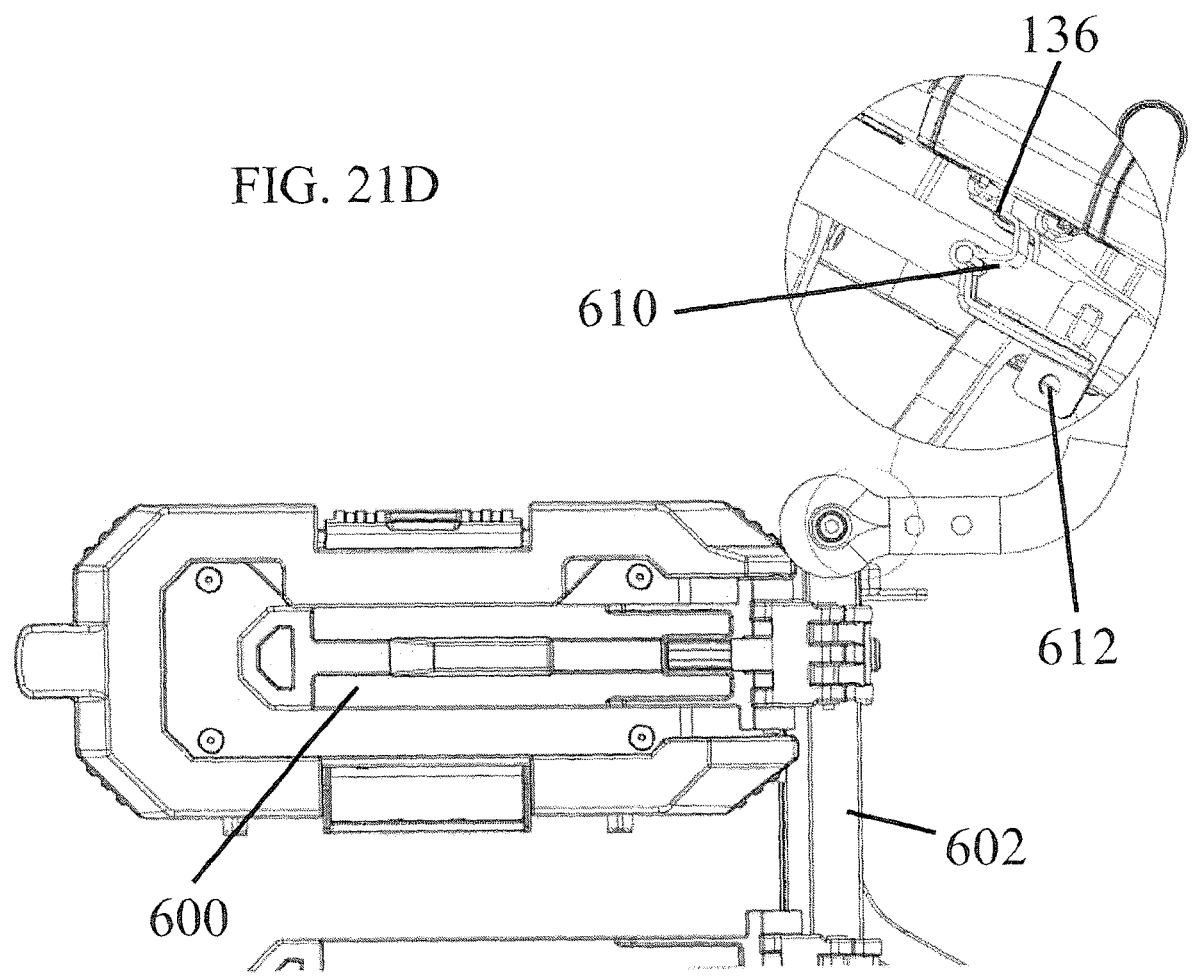

FIG. 21D shows full locked engagement of the job site communications center of FIGS. 1A-20D with the right one of a pair of known mounting brackets 600 of the known TOUGH SYSTEM™ tool box carrier 602. As seen in Enlargement A of FIG. 21C, resilient downwardly extending curved engagement lip 388 (FIG. 9D) engages socket 604 of bracket 600 and partially surrounding screw head 606. This engagement retains but does not lock the job site communications center of FIGS. 1A-20D onto the TOUGH SYSTEM™ tool box carrier 602. The enlargement shown in FIG. 21D shows rotatable locking element 610 of the TOUGH SYSTEM™ tool box carrier 602 in locking engagement with back mounting bracket 136 (FIGS. 1A-2) of the job site communications center 100. A padlock (not shown) may be inserted into an aperture 612 of rotatable locking element 610 for preventing unauthorized unlocking and removal of the job site communications center from the tool box carrier 602.

Figure 22A:
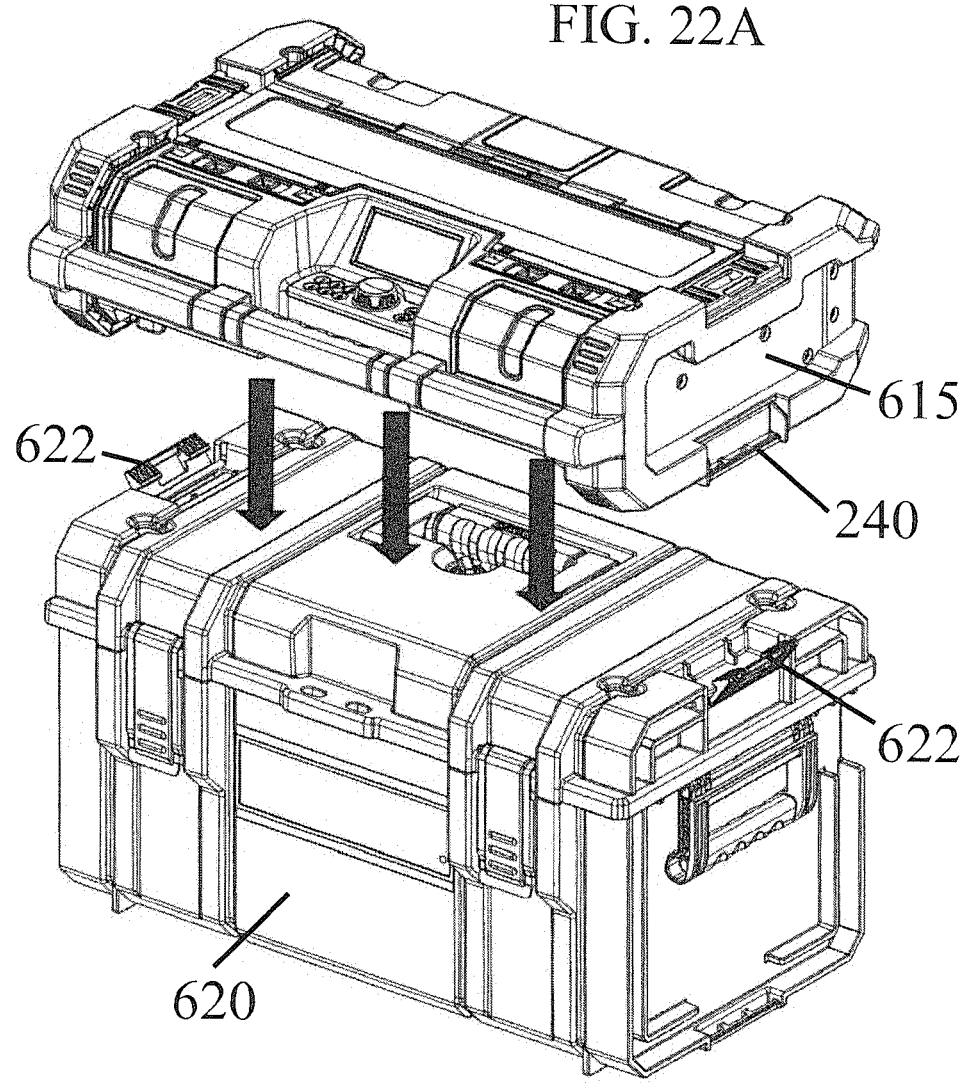

Reference is now made to FIGS. 22A and 22B, which are simplified pictorial illustrations illustrating stages in stackable and lockable mounting of the job site communications center of FIGS. 1A-20D onto a tool box in accordance with one embodiment of the present invention.

FIG. 22A shows a job site communications center as shown in FIGS. 1-20D, herein designated by reference number 615, located above a conventional tool box 620, forming part of the TOUGH SYSTEM™, wherein latches 622 of the conventional tool box are in an open operative orientation.

FIG. 22B shows the job site communications center 615 stacked and latched onto and above conventional tool box 620, forming part of the TOUGH SYSTEM®, wherein latches 622 of the conventional tool box are in latching engagement with latch engagement portion 240 (FIGS. 5A-5H) of the job site communications center 615.

Figure 23A:
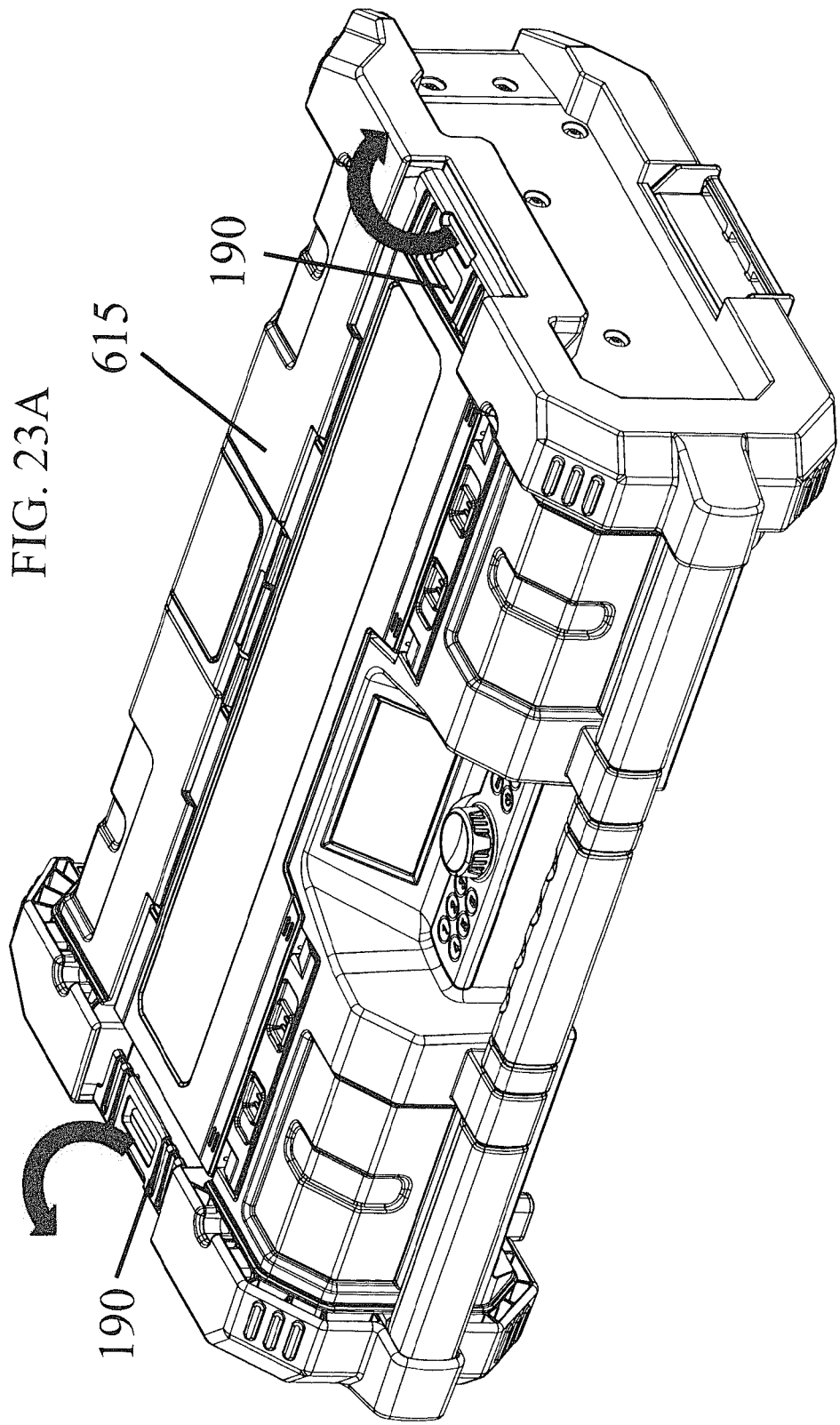
Figure 23C:
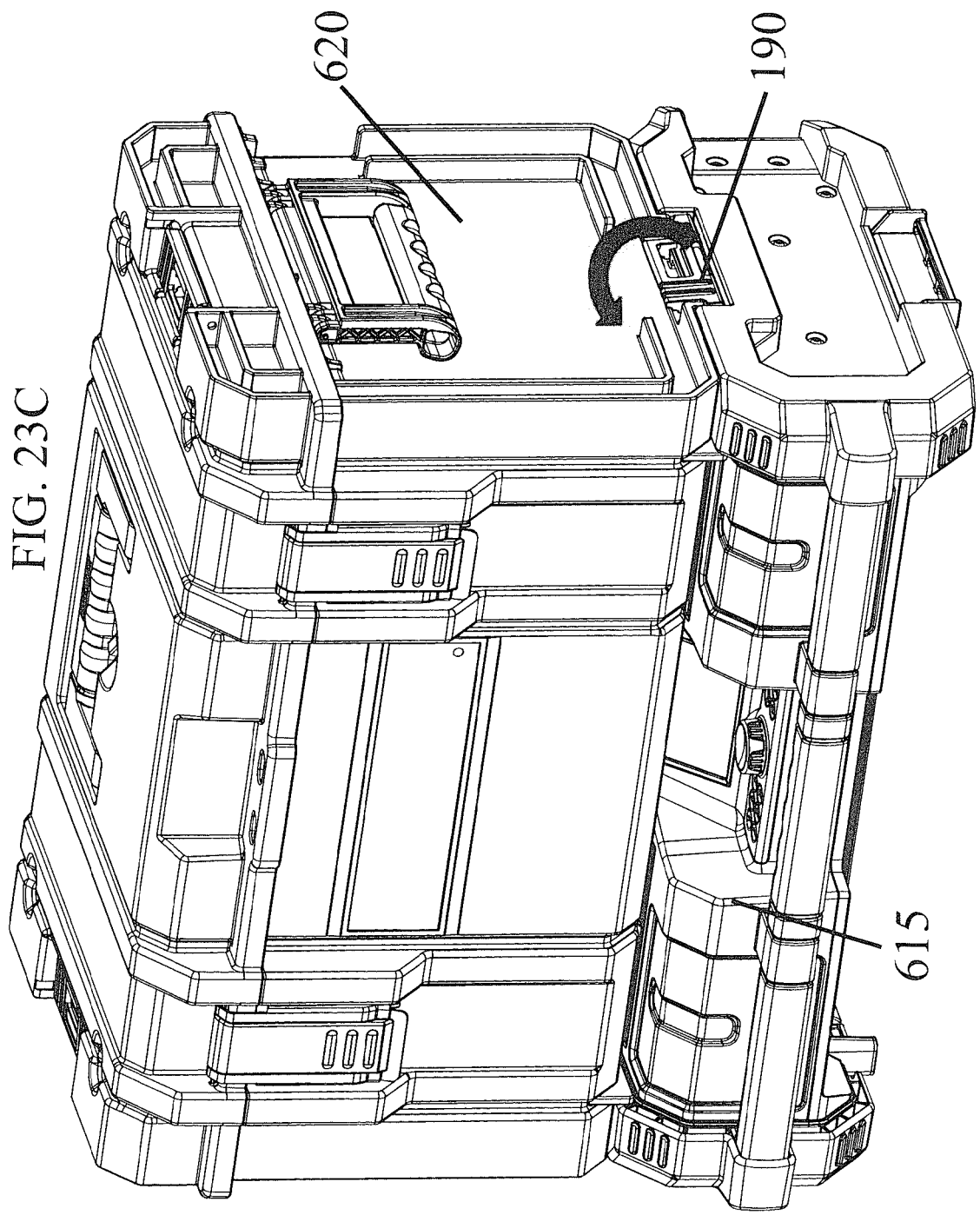

Reference is now made to FIGS. 23A, 23B and 23C, which are simplified pictorial illustrations illustrating stages in stackable and lockable mounting of a tool box onto the job site communications center of FIGS. 1A-20D in accordance with one embodiment of the present invention.

FIG. 23A shows the job site communications center 615, wherein latch assemblies 190 (FIGS. 1A-5H) of the job site communications center 615 are in an open operative orientation.

FIG. 23B shows a conventional tool box 620, forming part of the TOUGH SYSTEM™, about to be stacked onto the job site communications center 615, wherein latch assemblies 190 (FIGS. 1A-5H) of the job site communications center 615 are in an open operative orientation.

FIG. 23C shows the conventional tool box 620 stacked and latched onto and above job site communications center 615 wherein latch assemblies 190 of the job site communications center 615 are in latching engagement with corresponding latch engagement portion 624 (FIG. 23B) of the conventional tool box 620.

Figure 24A:
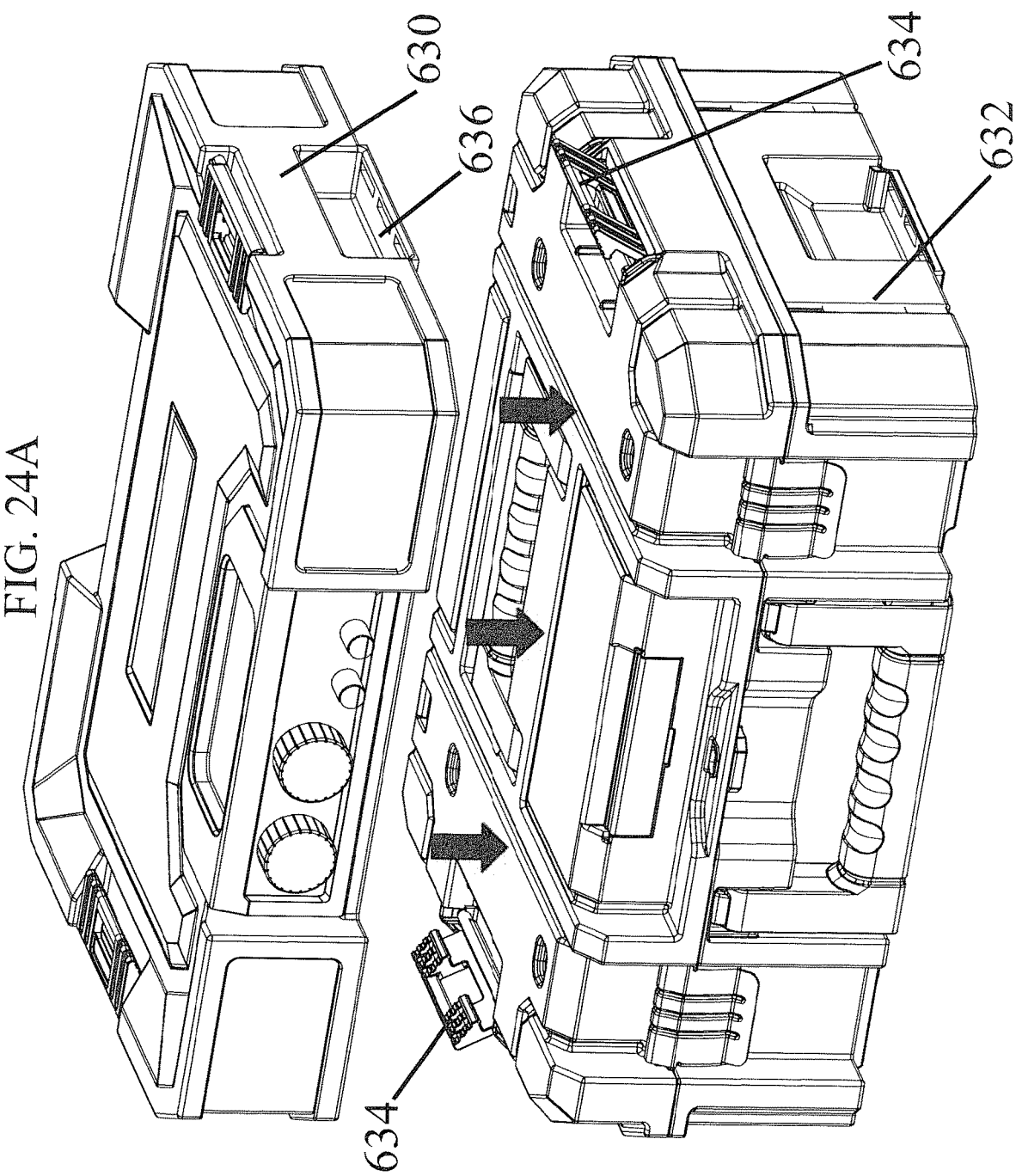
FIGS. 24A and 24B are simplified pictorial illustrations illustrating stages in stackable and lockable mounting of a job site communications center onto a tool box in accordance with another embodiment of the present invention.
Figure 24B:
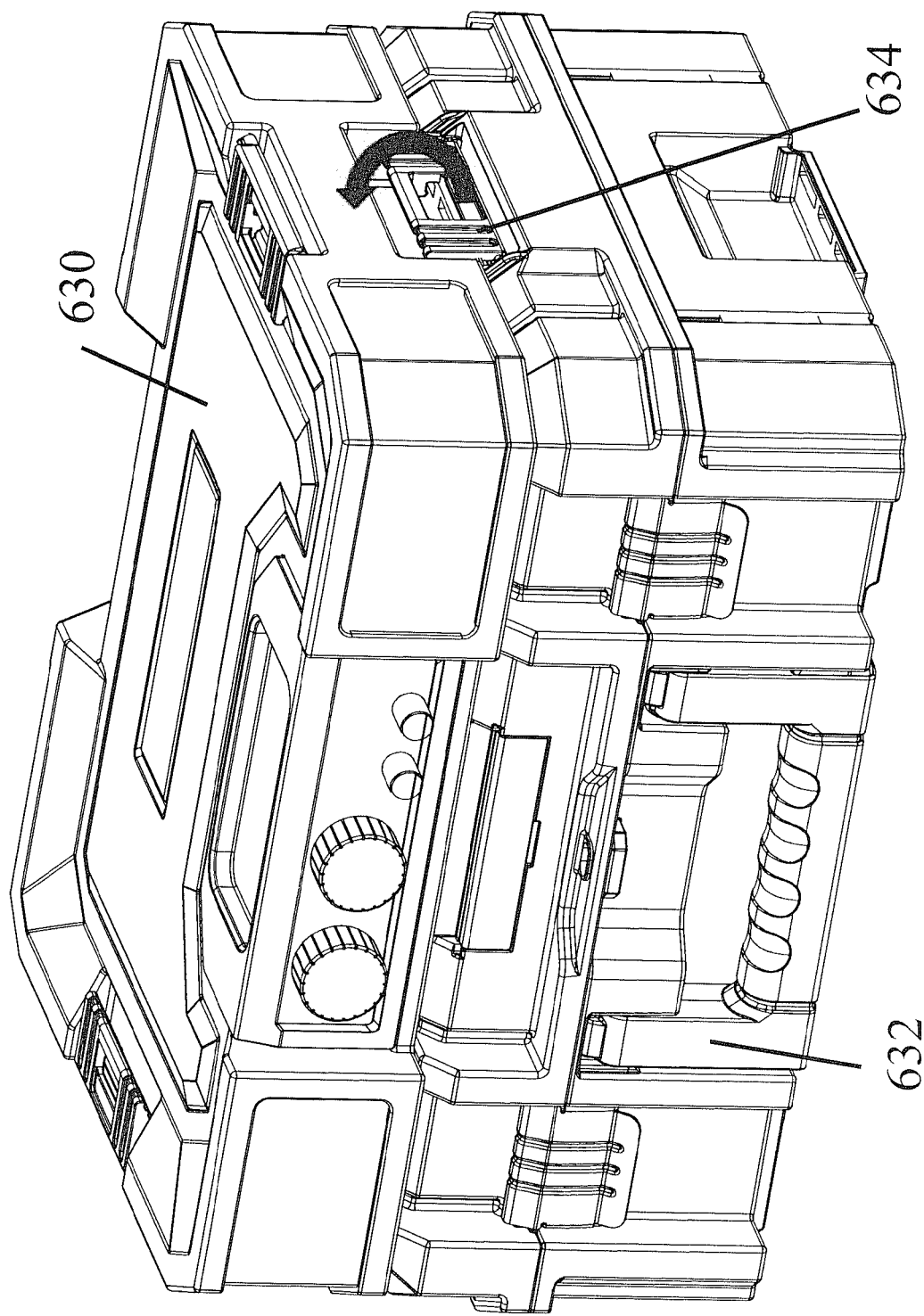

Reference is now made to FIGS. 24A and 24B, which are simplified pictorial illustrations illustrating stages in stackable and lockable mounting of another job site communications center onto a tool box in accordance with another embodiment of the present invention.

FIG. 24A shows a job site communications center 630, having at least some of the functionality of the job site communication center of FIGS. 1A-20D, located above a conventional tool box 632, forming part of the TSTAK® SYSTEM, wherein latches 634 of the conventional tool box 632 are in an open operative orientation.

FIG. 24B shows the job site communications center 630 stacked and latched onto and above conventional tool box 632, wherein latches 634 of the conventional tool box 632 are in latching engagement with latch engagement portions 636 (FIG. 24A) of the job site communications center 630, which may be similar to latch engagement portions 240 (FIGS. 5A-5H) of the job site communications center shown in FIGS. 1A-20D.

Figure 25B:
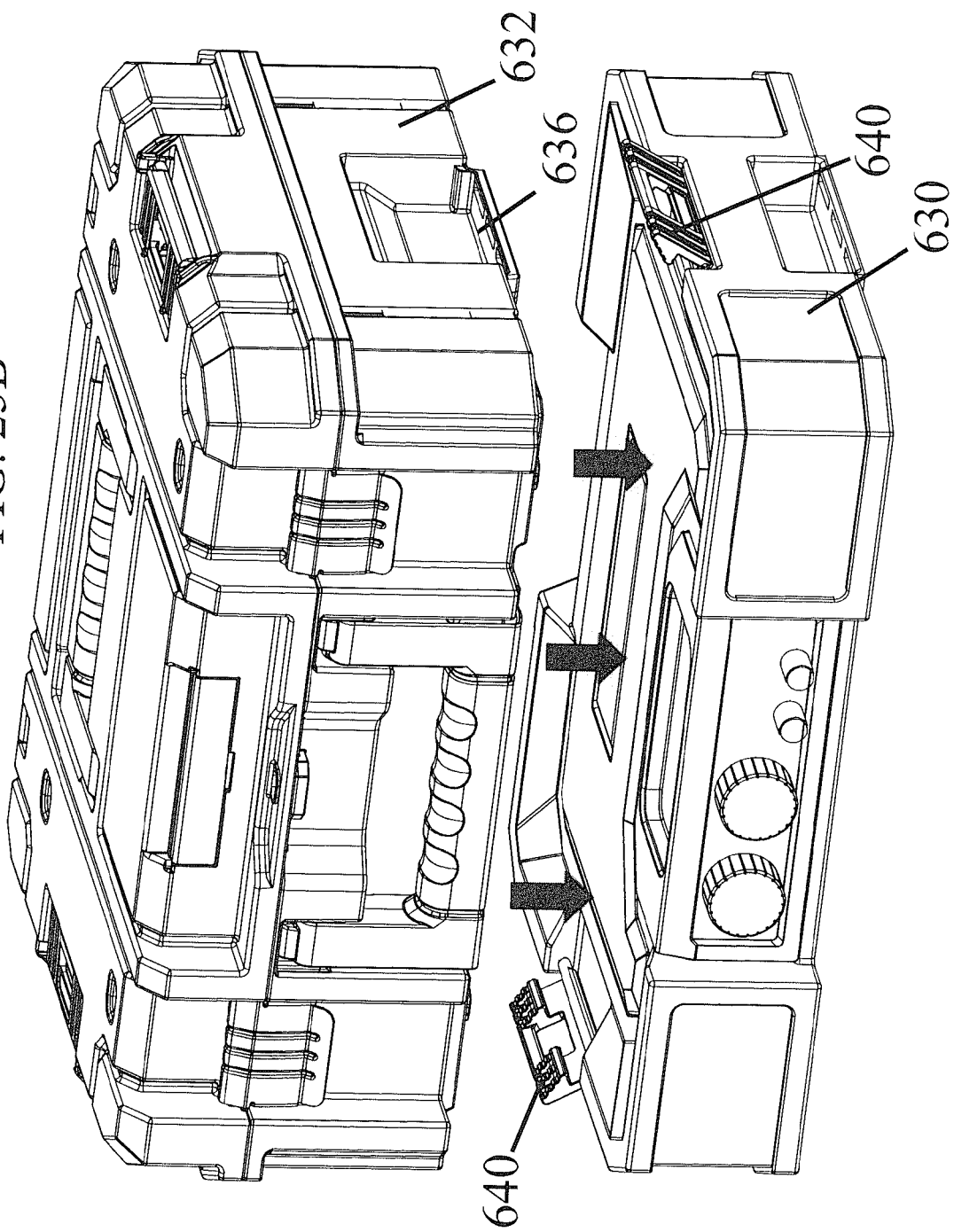
Figure 25C:
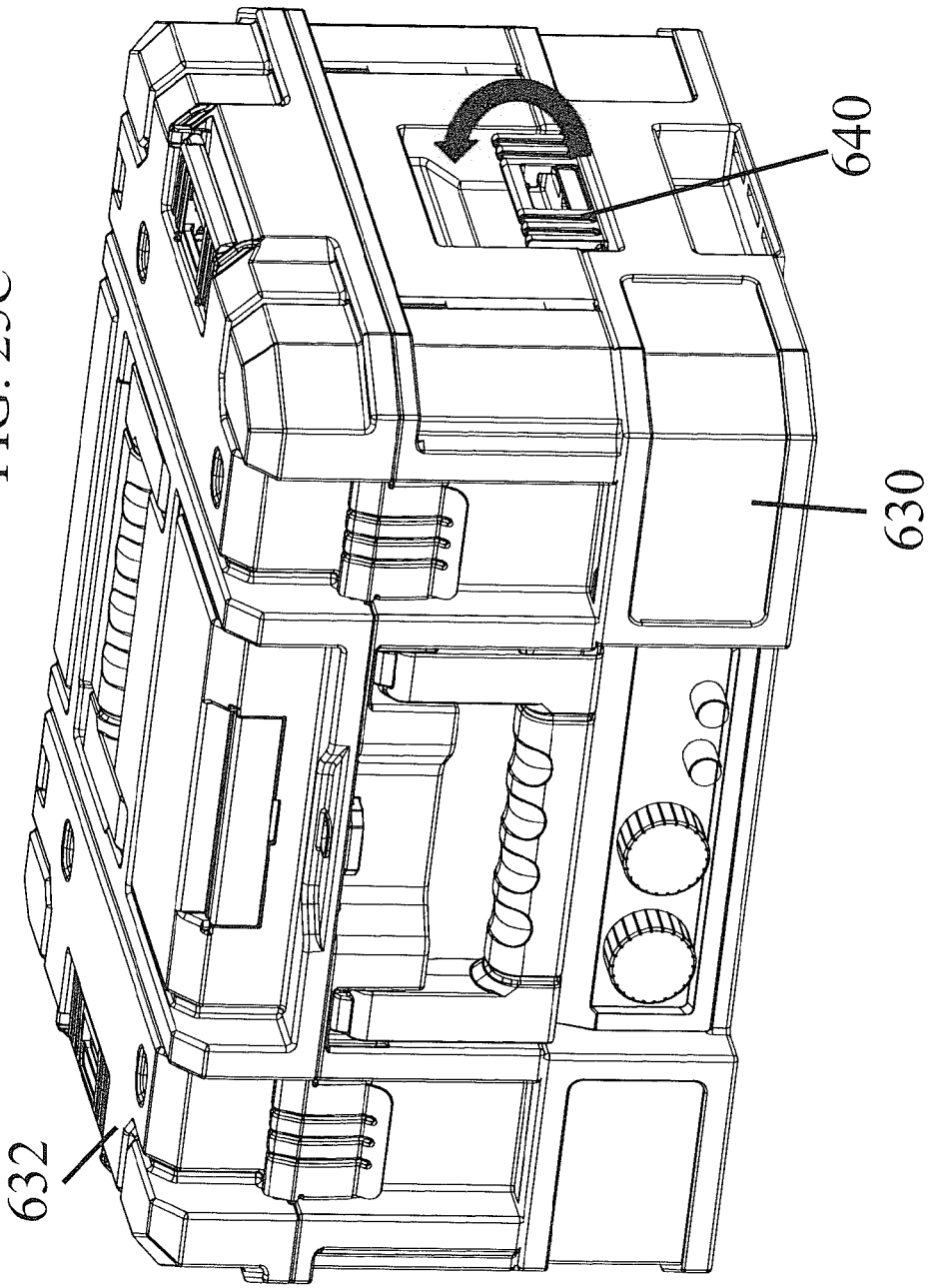

Reference is now made to FIGS. 25A, 25B and 25C, which are simplified pictorial illustrations illustrating stages in stackable and lockable mounting of a known tool box 632 onto the job site communications center 630 in accordance with one embodiment of the present invention.

FIG. 25A shows the job site communications center 630, wherein latch assemblies 640, which may be similar to latch assemblies 190 (FIGS. 1A-5H) of the job site communications center 100, are in an open operative orientation.

FIG. 25B shows a conventional tool box 632 about to be stacked onto the job site communications center 630, wherein latch assemblies 640 of the job site communications center 630 are in an open operative orientation.

FIG. 25C shows the conventional tool box 632 stacked and latched onto and above job site communications center 630 wherein latch assemblies 640 of the job site communications center 630 are in latching engagement with corresponding latch engagement portion 636 of the conventional tool box 632.

It is appreciated that the jobsite communications center of FIGS. 1A-16I may be used in a standalone mode, such as, for example on a floor or other flat support surface. Alternatively, it can be placed on a stationary rack or a movable rack, such as seen in FIGS. 21A-21D. The side panels of FIGS. 8A-11H include rack attachment structures in the form of a slot that is horizontal when the jobsite communications center is in normal use, shaped to be slidably engageable with horizontal bracket arms of a storage rack system or dolly of the appropriate width. The outer face of respective right and left side bracket engaging elements 122 and 124 is flat and respective right and left side bumpers 126 and 128 extend linearly horizontally and have a gap at the rear such that the jobsite communications center may be slid and rested onto a bracket arm at that point. Parts of the resilient bumpers 126 and 128 may be in contact with the bracket arms, in order to increase the friction holding the sound system onto the bracket arms when the dolly is moved. In particular, there may be one or more dimples in one part which engage with corresponding raised portions of the other part, wherein preferably the dimples are provided on the resilient bumpers 126 and 128 and the raised portions are provided on the bracket arms. As shown in FIG. 2, back mounting bracket 136 may be provided at the rear of the jobsite communications center, which may be used to lock the radio onto the rack or dolly to hold it securely, as seen in FIG. 21D.

Alternatively, the jobsite communications center FIGS. 1A-16I may be placed in a stack with other items, such as, for example, as seen in FIGS. 22A-23C, DEWALT® Tough System™ storage boxes, or anything else of a suitable size and shape. Latch assemblies 190 (FIG. 4) may, for example, be used to latch onto a case or second job site communications center placed on top of the first job communications center, and latch engagement portion 240 (FIGS. 5A-5H) may accept latches from a case or second job site communications center placed below. It is appreciated that the number and location of latch assemblies 190 and latch engagement portion 240 may vary.

It is appreciated that for any jobsite sound system, the highest risk of being dropped is when it is being carried across a jobsite from a van or car to get to the worksite, or when it is being carried between two worksites. A worker typically has to take a number of tools or items to each worksite, and may carry these in one or more toolboxes. A worker will typically carry as many items together as possible, in order to minimize the number of trips between positions before starting work. This can result in a jobsite sound system being carried while being balanced on top of another item, which increases the risk of being dropped. Thus, the integration of a jobsite sound system into a storage system, as seen in FIGS. 21A-25C, where it is latched onto a toolbox so both are carried together, or where it is latched into a movable storage rack, reduces the overall risk of damage to the jobsite sound system and makes it easier for the user to move items between locations on the jobsite.

Figure 26A:
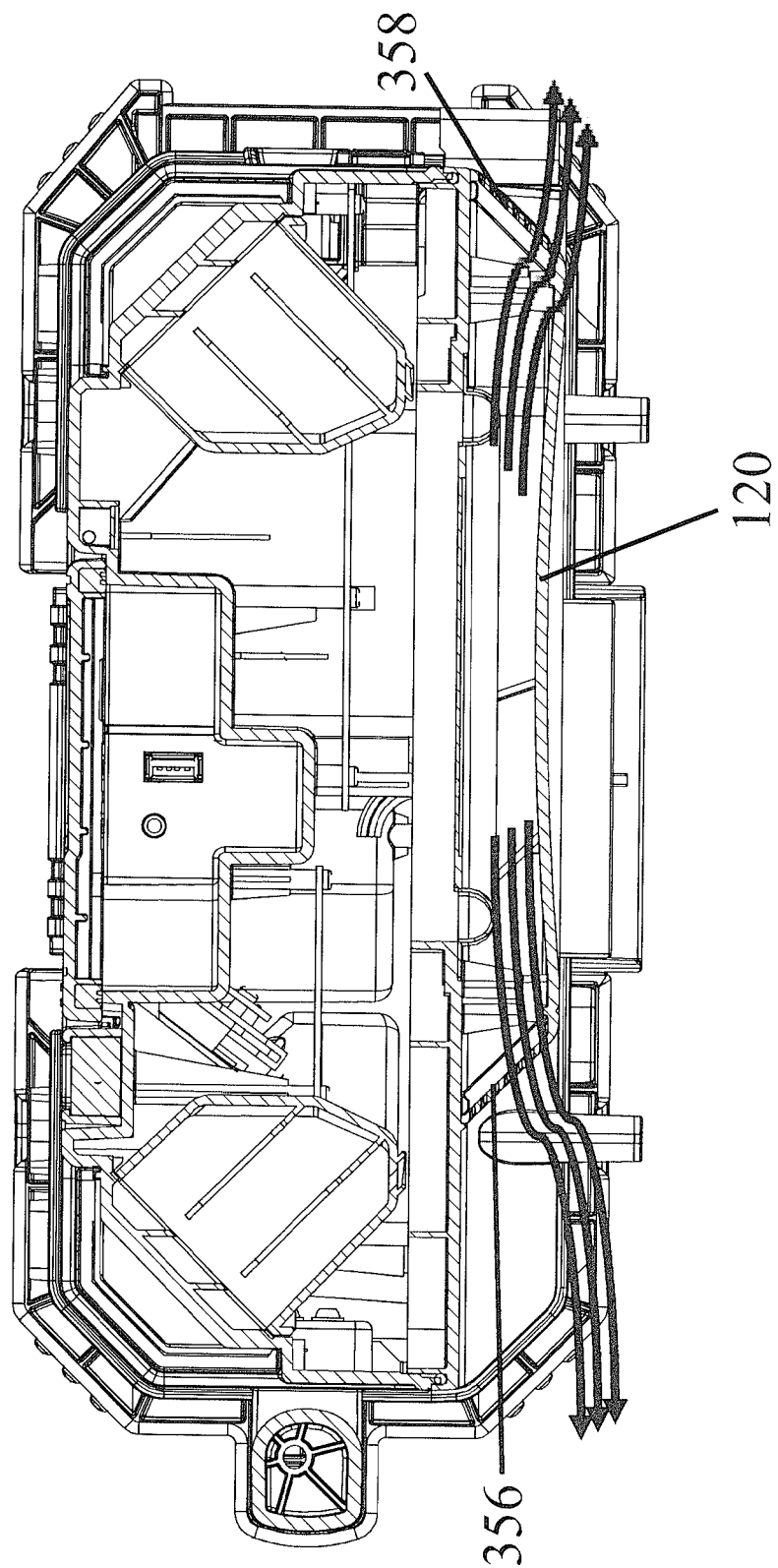
FIGS. 26A and 26B are simplified sectional illustrations of the flow of sound from two sub-woofers and out through grills in the job site communications center in accordance with one embodiment of the present invention, taken along lines XXVIA-XXVIA and XXVIB-XXVIB in FIG. 1E, respectively.
Figure 26B:
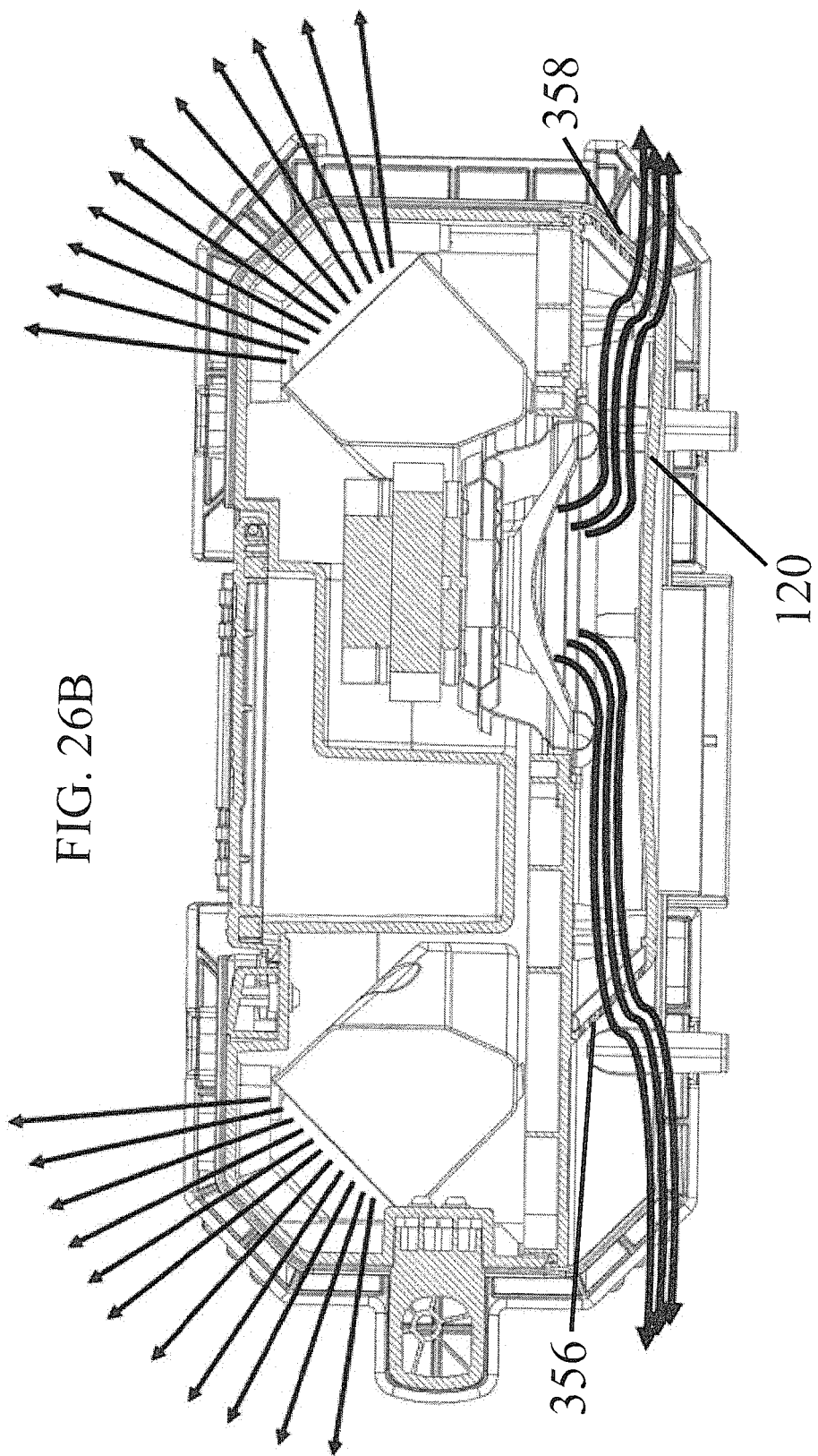

Reference is now made to FIGS. 26A and 26B, which are simplified sectional illustrations of the flow of sound from sub-woofers 132 and 130, respectively, and out through grills in the job site communications center in accordance with one embodiment of the present invention, taken along lines XXVIA-XXVIA and XXVIB-XXVIB in FIG. 1E, respectively.

As indicated by the arrows in FIGS. 26A and 26B, sound from respective sub-woofers 132 and 130 (FIG. 2) passes over bottom element 120 and more specifically over generally planar top facing surface 350, having formed therein a pair of slightly convex (in the sense of FIG. 2) round domes 354 and 352, arranged to generally underlie sub-woofers 132 and 130, respectively, and out through upwardly-inclined, forward facing grill 356 and a bifurcated upwardly-inclined rearward facing grill 358. FIG. 26B also shows the sound from tweeters 182.

Figure 27:
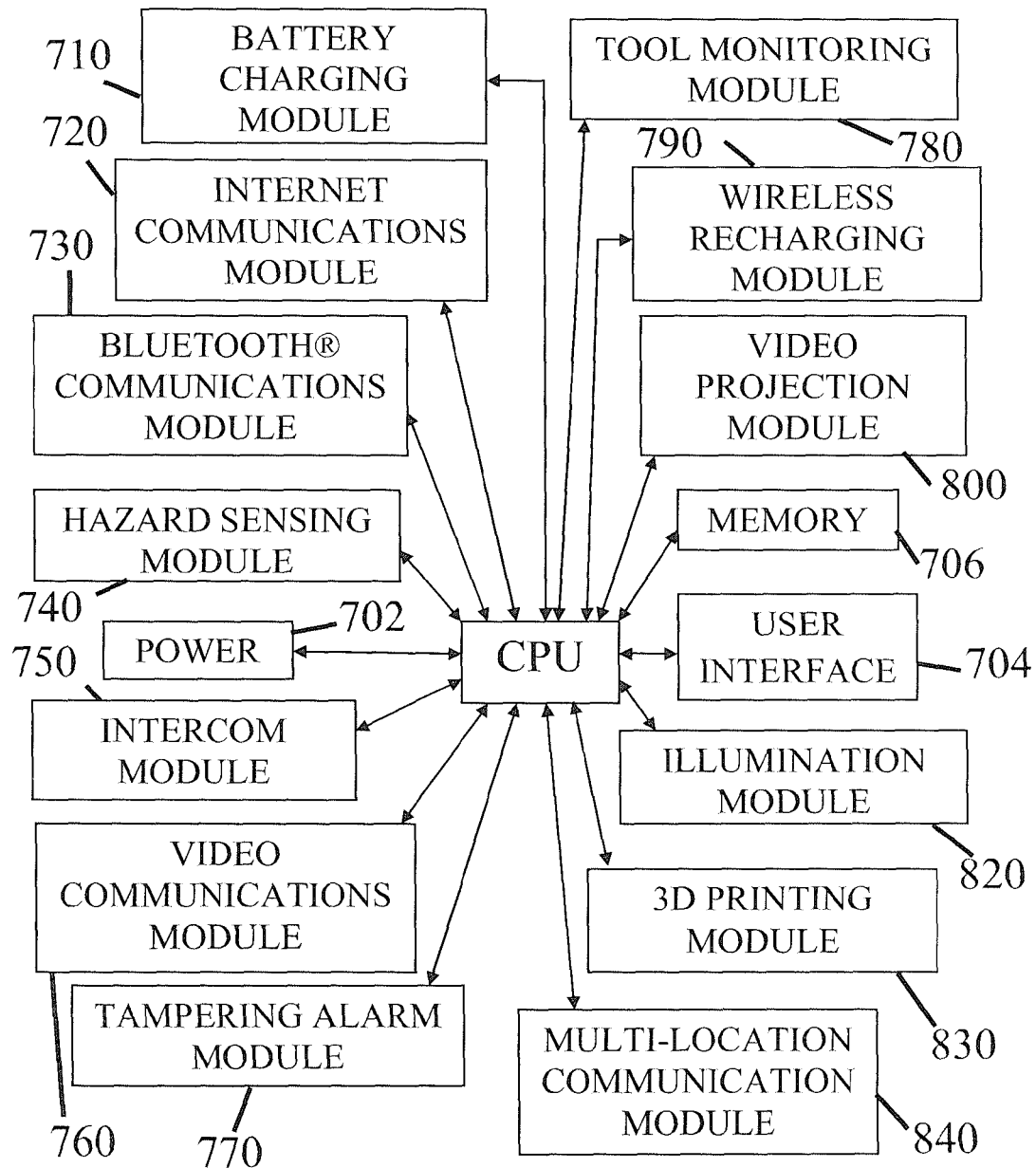
FIG. 27 is a simplified block diagram illustrating various selectable features of the job site communications center of any of FIGS. 1A-39.

Reference is now made to FIG. 27, which is a simplified block diagram illustrating various selectable features of the job site communications center of any of FIGS. 1A-26B. As seen in FIG. 27, the job site communications center of any of FIGS. 1A-26B, preferably includes a central processor 700, which forms part of the user interface and electronics subassembly 160 (FIGS. 1A-2). Central processor 700 is preferably powered by a power supply 702 which may receive mains power or have an external or internal battery (not shown). A user interface 704, such as a radio control panel, and preferably including a multi-functional user interface control may be wirelessly coupled to the central processor 700 or hard wired thereto.

The central processor 700, preferably associated with a memory 706, preferably controls and powers the operation of one and preferably more than one and most preferably all of the following modules, some of which are described hereinbelow with reference to FIGS. 28-39:

A battery charging module 710, employing battery charging assembly 134 (FIG. 2);

An internet communications module 720, such as a WIFI hot-spot;

A Bluetooth® communications module 730;

A hazard sensing module 740, which may sense hazards, such as noxious gases, excessive temperature and earthquakes;

An intercom module 750 which may employ smartphones or alternatively dedicated intercom units;

A one-way or two-way video communications module 760, which may employ the internet communications module 720 and/or the Bluetooth communications module;

A tampering alarm module 770;

A tool monitoring module 780, which may monitor tool wear, overheating, battery status and duty cycle;

A wireless recharging module 790 for wirelessly recharging tool batteries;

A video projection module 800 for projecting received video images onto a job site surface;

An illumination module 820 for providing ambient and directed illumination at a job site;

A 3D printing module 830 and

A communication module 840 between multiple disparately located job site communication centers.

Figure 28:
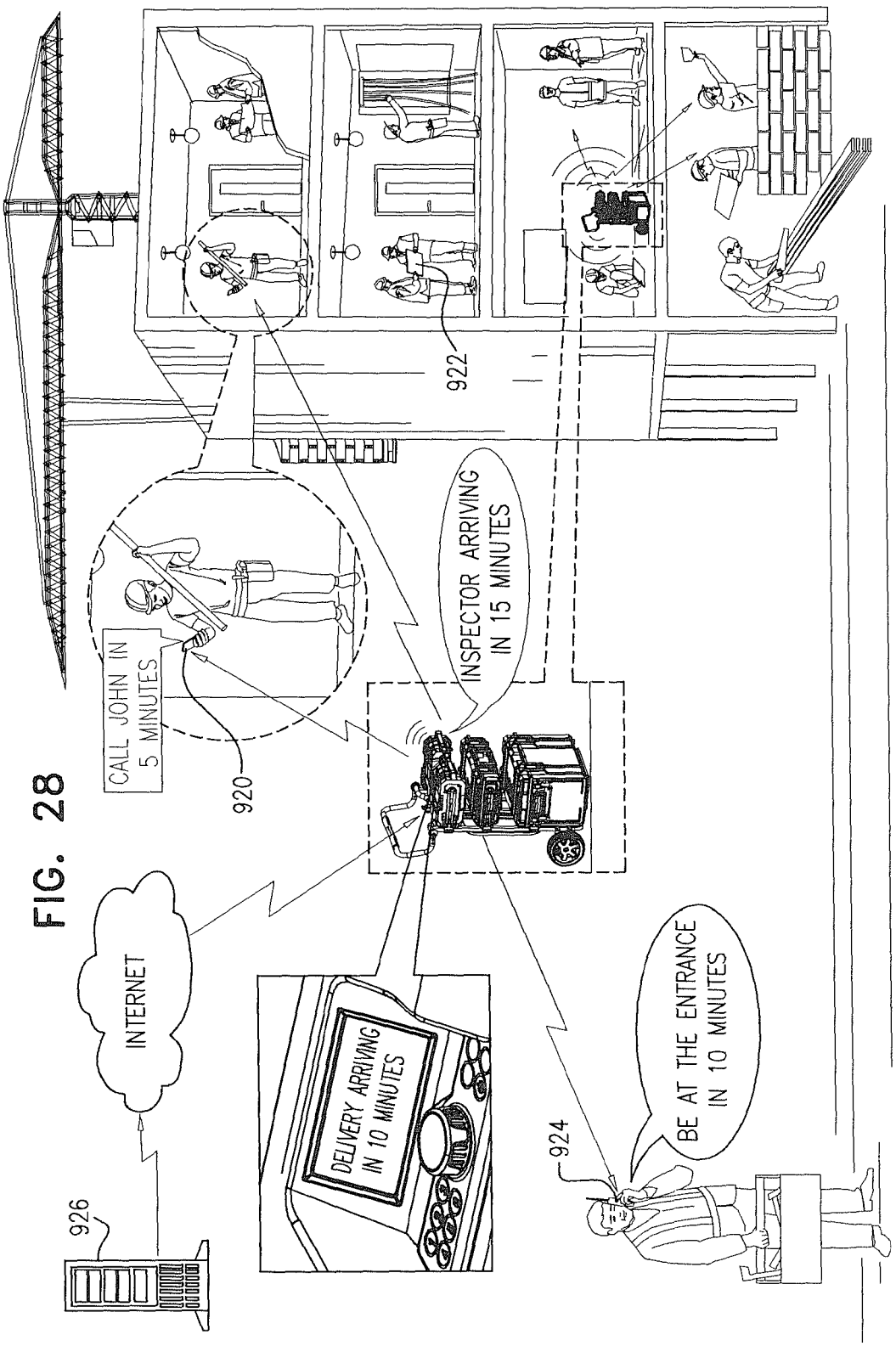
FIG. 28 is a simplified pictorial illustration of the operation of the communication center of any of FIGS. 1A-26B in a calendar reminder mode of operation.

Reference is now made to FIG. 28, which is a simplified pictorial illustration of the operation of the communication center of any of FIGS. 1A-27 in a calendar reminder mode of operation. As seen in FIG. 28, the internet communications module 720 (FIG. 27) of the job site communications center 100 of any of FIGS. 1A-27 preferably includes a reminder module. Reminders may be sent to various persons in communication with the communication center in various ways, such as via smartphones 920, tablets 922 or intercom units 924. The reminders may be stored at the job site in memory 706, forming part of the job site communications center and associated with processor 700 or alternatively in a memory forming part of a remote server 926, accessible via the Internet or any other communications medium.

Figure 29:
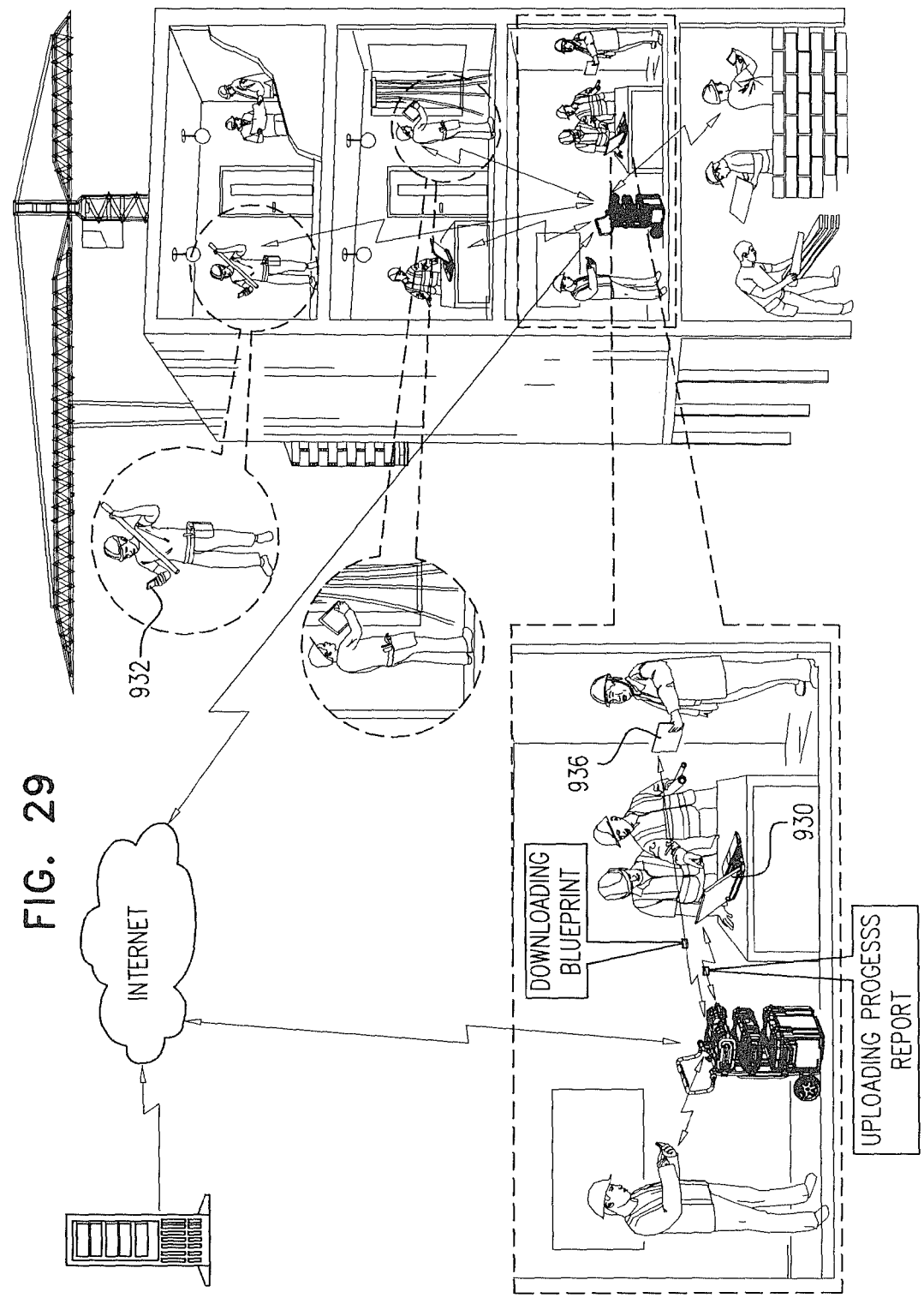
FIG. 29 is a simplified pictorial illustration of the operation of the communication center of any of FIGS. 1A-26B in a WIFI hotspot mode of operation.

Reference is now made to FIG. 29, which is a simplified pictorial illustration of the operation of the communication center of any of FIGS. 1A-26B in a WIFI hotspot mode of operation. As seen in FIG. 29, the internet communications module 720 (FIG. 27) of the job site communications center 100 of any of FIG. 1A preferably provides broadband internet communications via the internet for computers 930, smartphones 932, tablets 936 and any other devices having an Internet of Things (TOT) module at the job site.

Figure 30:
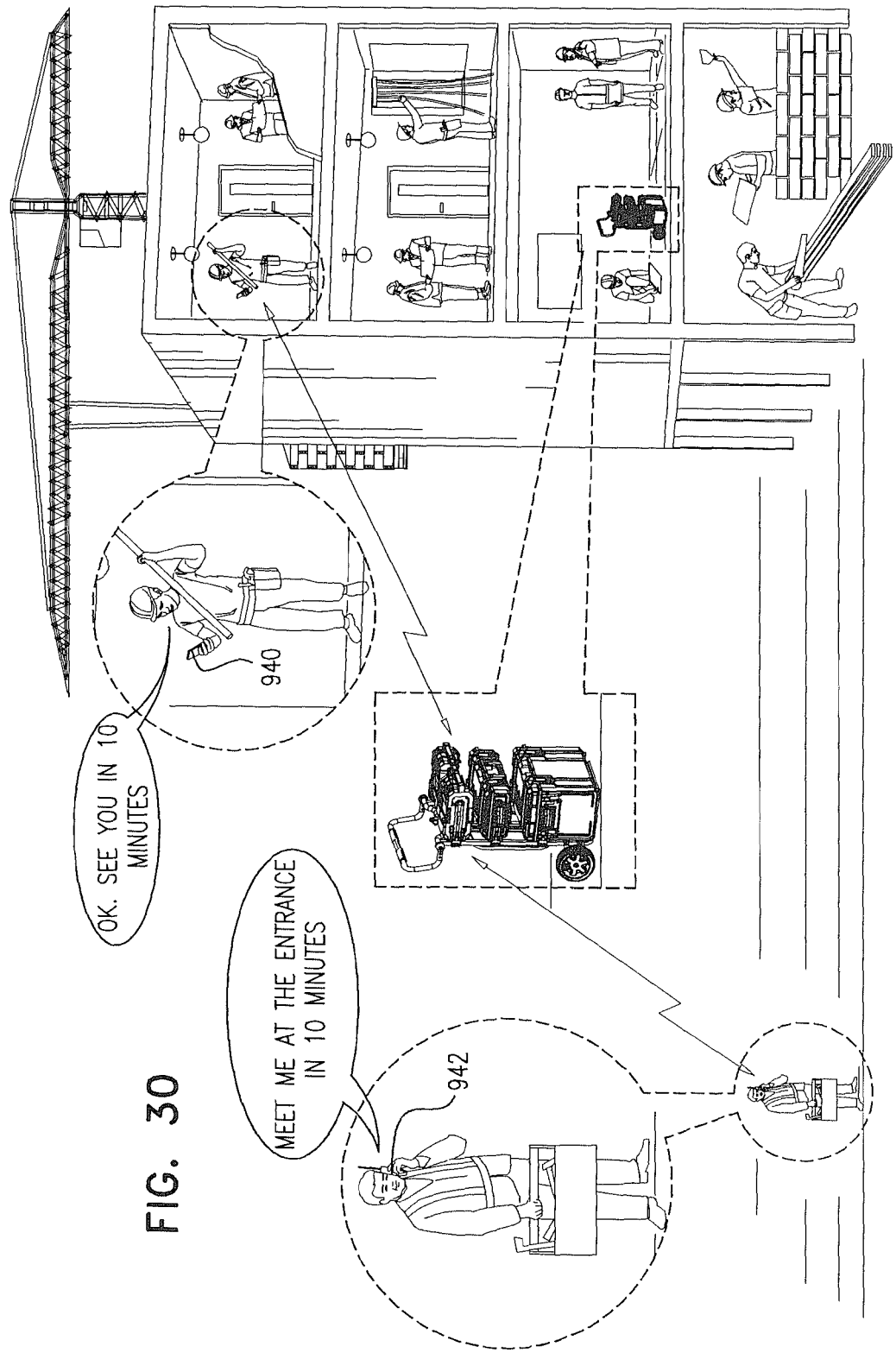
FIG. 30 is a simplified pictorial illustration of the operation of the communication center of any of FIGS. 1A-26B in an intercom mode of operation.

Reference is now made to FIG. 30, which is a simplified pictorial illustration of the operation of the job site communication center of any of FIGS. 1A-27 in an intercom mode of operation employing intercom module 730 (FIG. 27). As seen in FIG. 30, intercom module 730 enables point to point and multipoint communications between people at the job site via smartphones 940 and/or intercom specific communicators 942.

Figure 31:
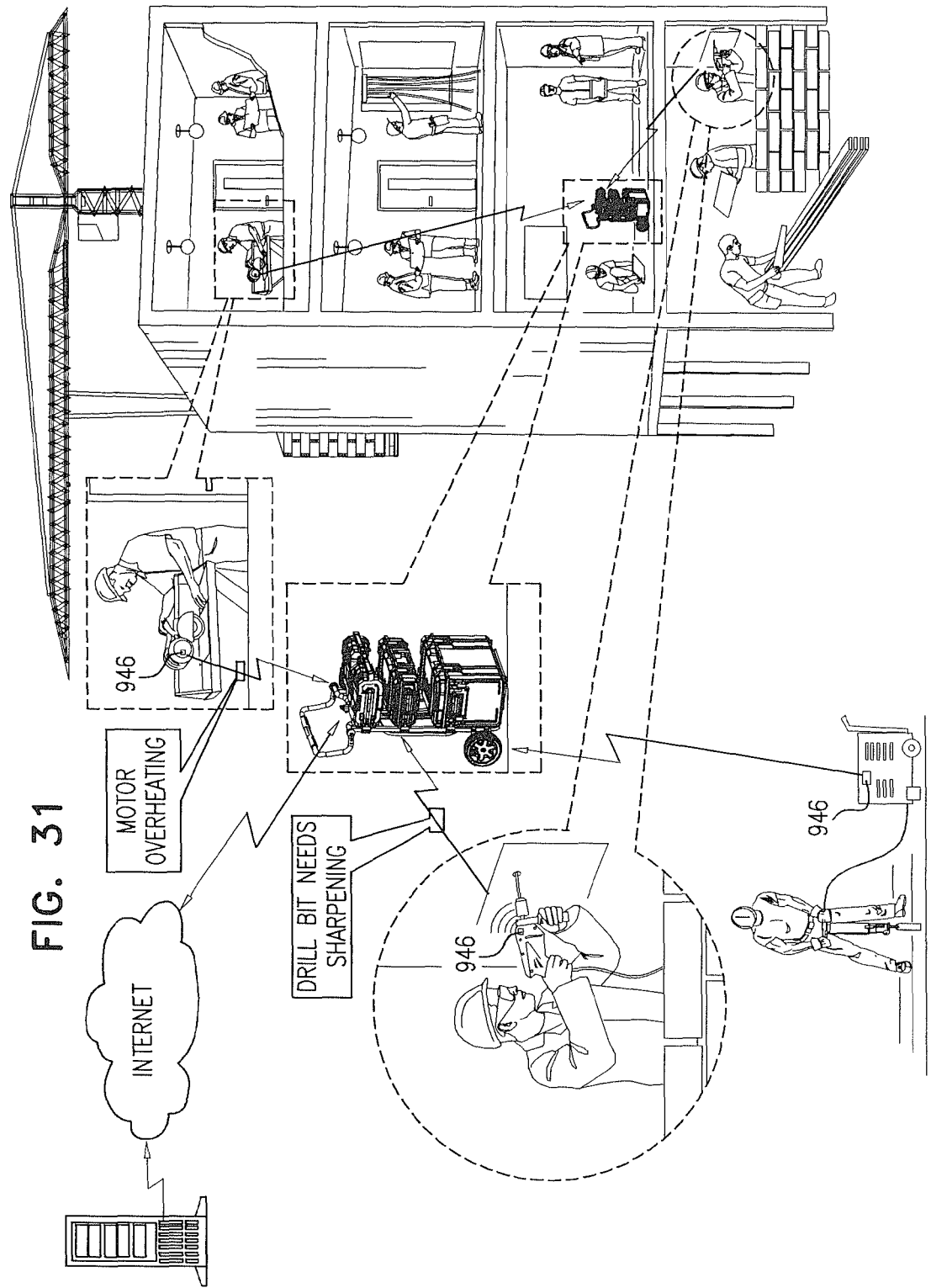
FIG. 31 is a simplified pictorial illustration of the operation of the communication center of any of FIGS. 1A-26B in a tool monitoring mode of operation.

Reference is now made to FIG. 31, which is a simplified pictorial illustration of the operation of the job site communications center of any of FIGS. 1A-27 in a tool monitoring mode of operation employing tool monitoring module 780. Tool monitoring module 780 may be employed with various tools, such as drills and saws and any other devices having an Internet of Things (TOT) module 946, at the job site. Tool monitoring module 780 may monitor various tool parameters, such as duty cycle, hours of operation, tool wear, cutting implement wear and removal of tools from the propinquity of the job site communications center and may employ TOT modules 946 embedded in or attached to various tools.

Figure 32:
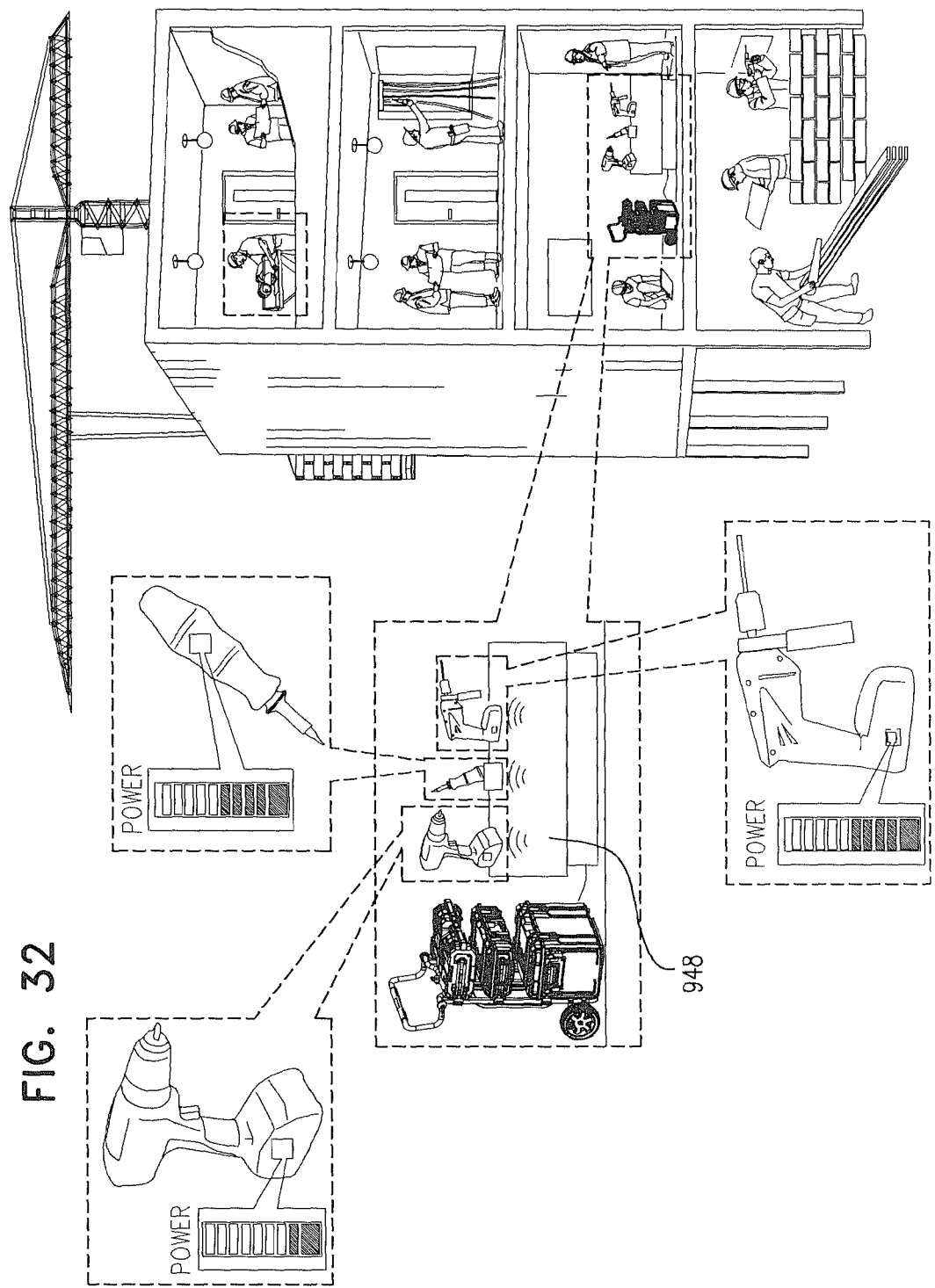
FIG. 32 is a simplified pictorial illustration of the operation of the communication center of any of FIGS. 1A-26B in a wireless recharging mode of operation.

Reference is now made to FIG. 32, which is a simplified pictorial illustration of the operation of the communication center of any of FIGS. 1A-27 in a wireless recharging mode of operation, employing wireless recharging module 790 (FIG. 27). The wireless recharging may be based on induction or on any other available technology and may employ a known inductive charger 948.

Figure 33:
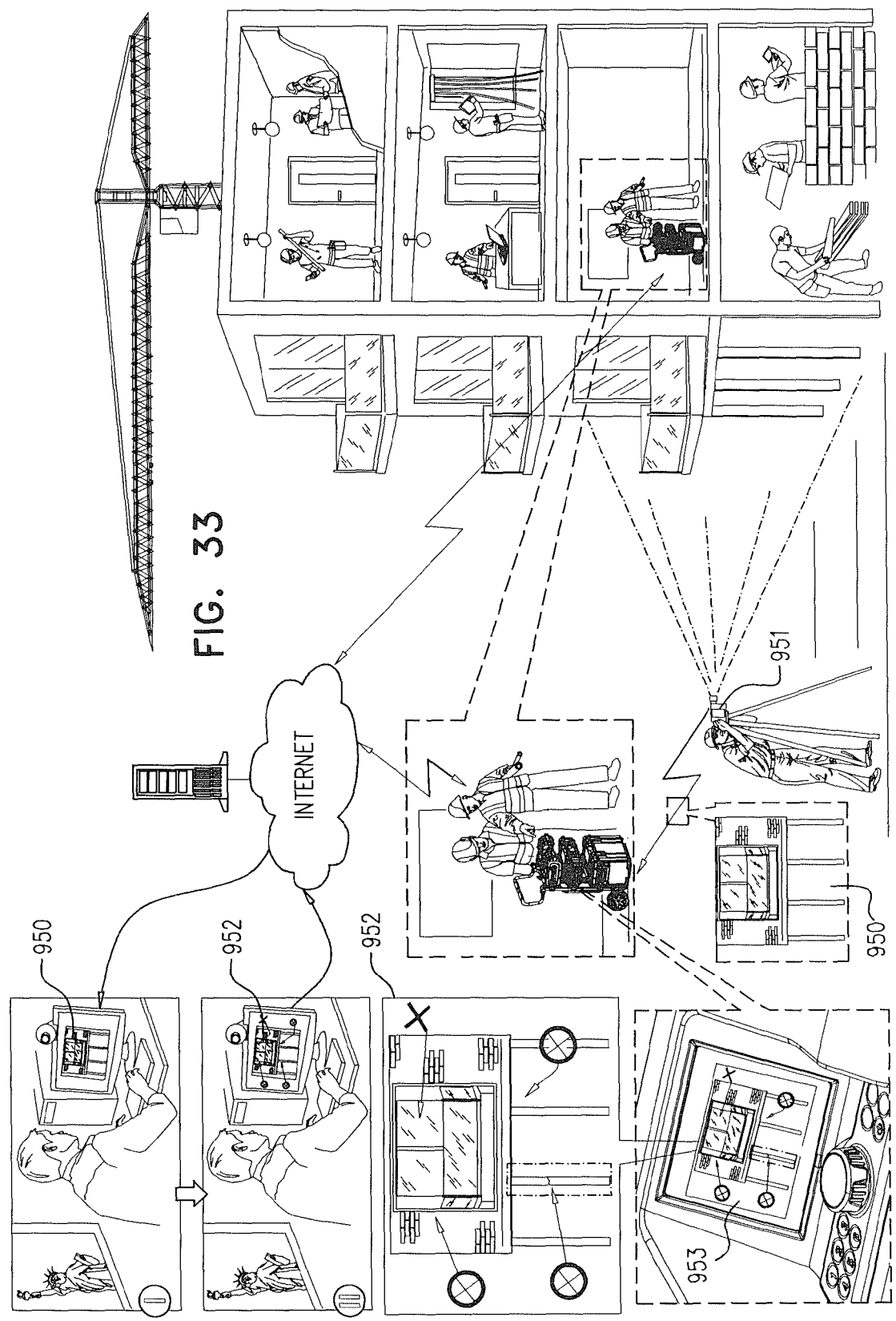
FIG. 33 is a simplified pictorial illustration of the operation of the communication center of any of FIGS. 1A-26B in a two-way video communication mode of operation.

Reference is now made to FIG. 33, which is a simplified pictorial illustration of the operation of the communication center of any of FIGS. 1A-27 in a one way or two-way video communication mode of operation, employing one-way or two-way video communications module 760 (FIG. 27). This module may employ internet communications module 720 and/or Bluetooth communications module 730 and enables still or moving images 950 from the job site to be communicated via a job site camera 951, or a camera module forming part of jobsite communications center, to remotely-located users and also enables still or moving images 952 from a remote location to be viewed at a job site, such as on display 953. In the illustrated embodiment shown in FIG. 33, images 950 of a structure under construction taken with job site camera 951 are transmitted to a remote location, where a user is able to annotate them and provided annotated images 952 to workers at the job site for viewing on display 953.

Figure 34:
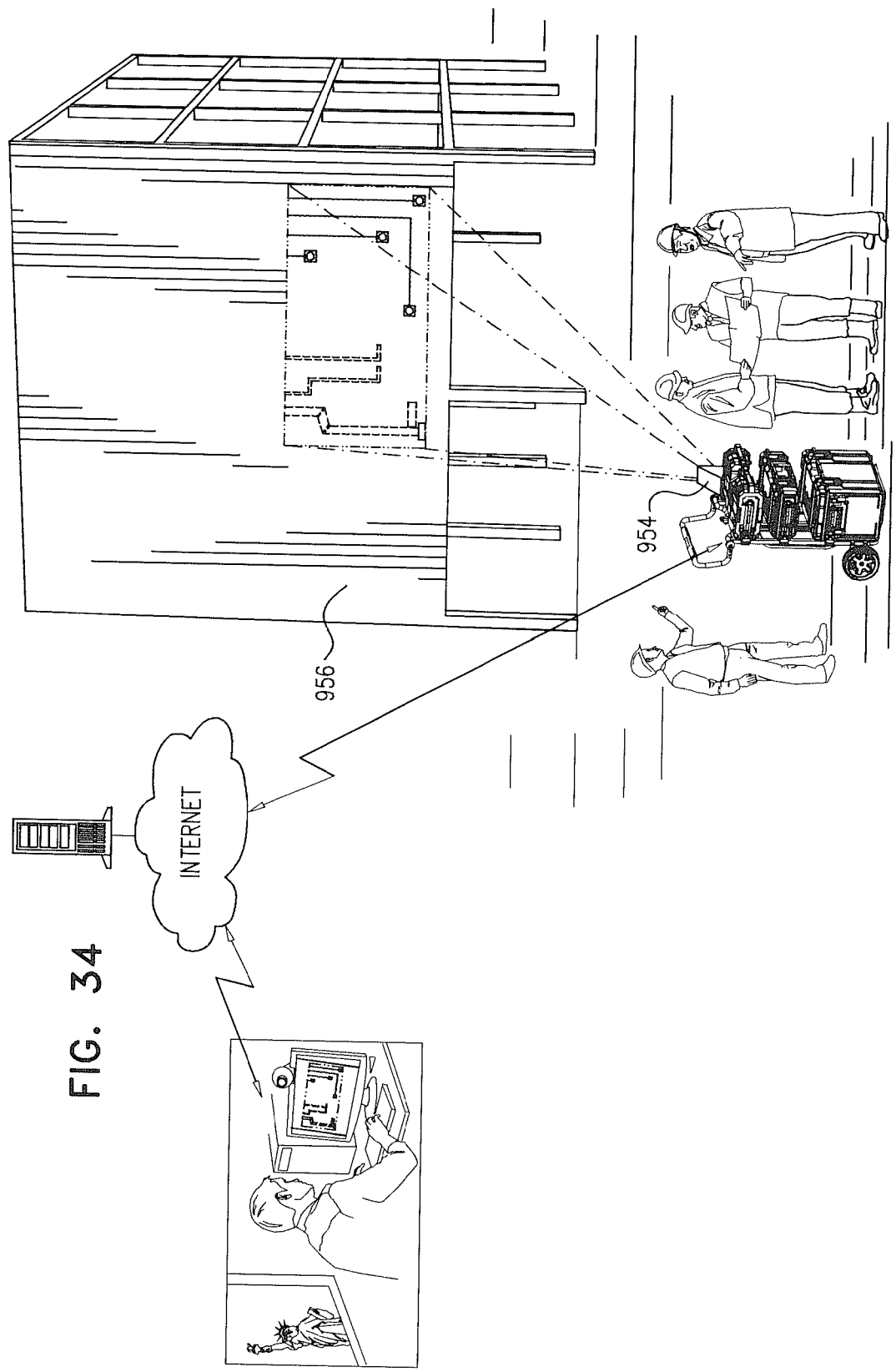
FIG. 34 is a simplified pictorial illustration of the operation of the communication center of any of FIGS. 1A-26B in a video projection mode of operation.

Reference is now made to FIG. 34, which is a simplified pictorial illustration of the operation of the communication center of any of FIGS. 1A-27 in a video projection mode of operation, preferably employing video projection module 800 (FIG. 27). As seen figuratively in FIG. 34, this enables architectural drawings to be overlaid by projection, using a conventional computer controlled projector 954 onto existing structures 956 at the job site. The projected content may be stored in memory 706 (FIG. 27) of the job site communication center or received via the internet from a remote location.

Figure 35:
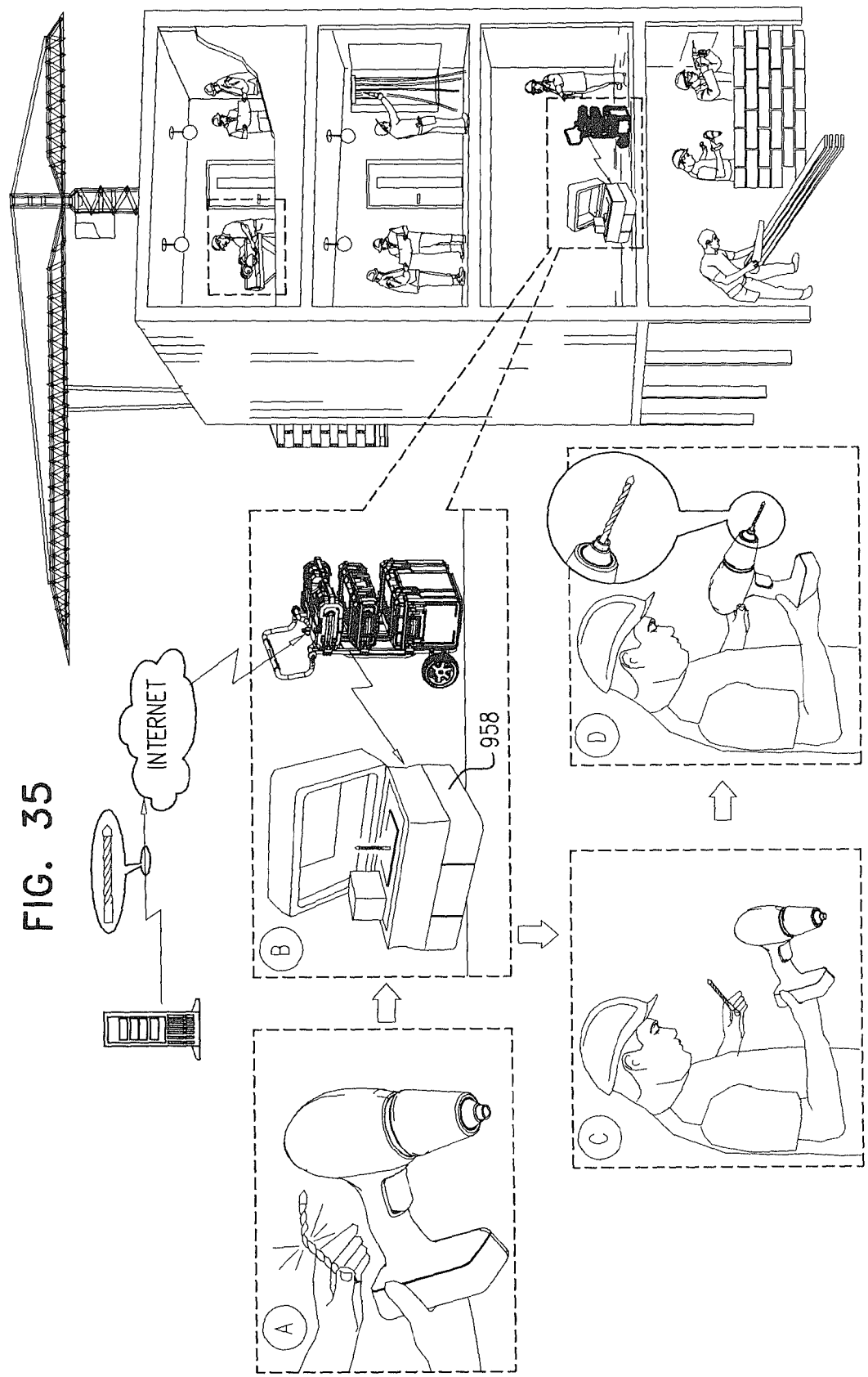
FIG. 35 is a simplified pictorial illustration of the operation of the communication center of any of FIGS. 1A-26B in a 3D printing mode of operation.

Reference is now made to FIG. 35, which is a simplified pictorial illustration of the operation of the communication center of any of FIGS. 1A-27 in a 3D printing mode of operation, employing 3D printing module 830 (FIG. 27). This module enables models and tools, such as drill bits, to be fabricated at the job site by a 3D-printer 958 from computerized instructions received from a remotely located server.

Figure 36:
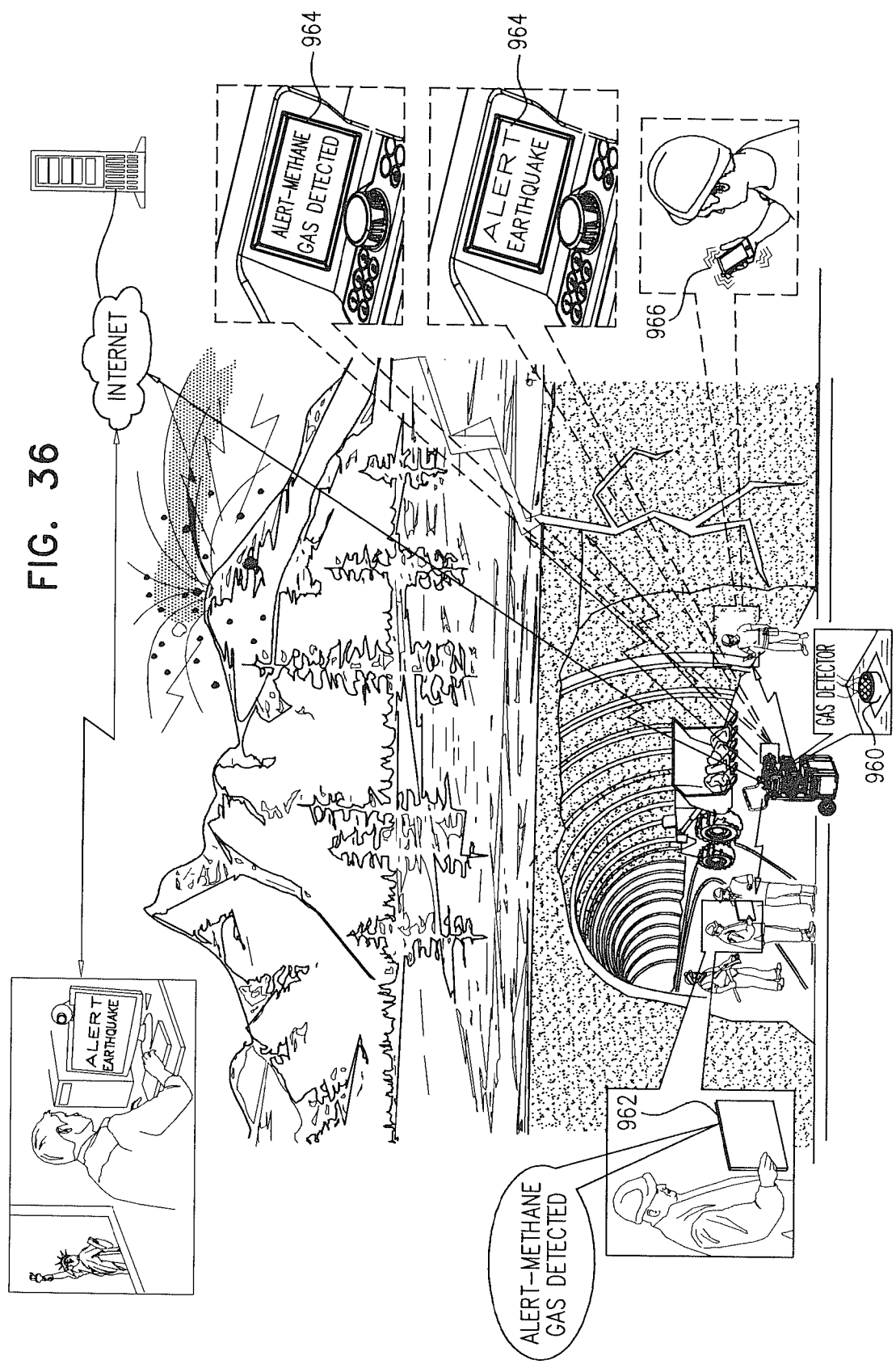
FIG. 36 is a simplified pictorial illustration of the operation of the communication center of any of FIGS. 1A-26B in a hazard sensing mode of operation.

Reference is now made to FIG. 36, which is a simplified pictorial illustration of the operation of the communication center of any of FIGS. 1A-27 in a hazard sensing mode of operation, preferably employing hazard sensing module 740 (FIG. 27). Hazard sensing module 740, which is suitable for various types of job sites, such as in a mine, can include gas sensors 960, such as methane sensors, carbon monoxide sensors, bio-sensors, which sense the presence of dangerous bio-organisms, vibrations, which could indicate earthquakes or other dangerous events, excessive noise or dangerous levels of illumination. The outputs of gas sensors 960 may be provided to processor 700 (FIG. 27) and may trigger any suitable alarm, such as an audio alarm 962, a visually sensible alarm 964, a tactile alarm 966 or a combination thereof. Processor 700 (FIG. 27) may also provide remote alerts, via the internet to remote sites, such as a project management site.

Figure 37:
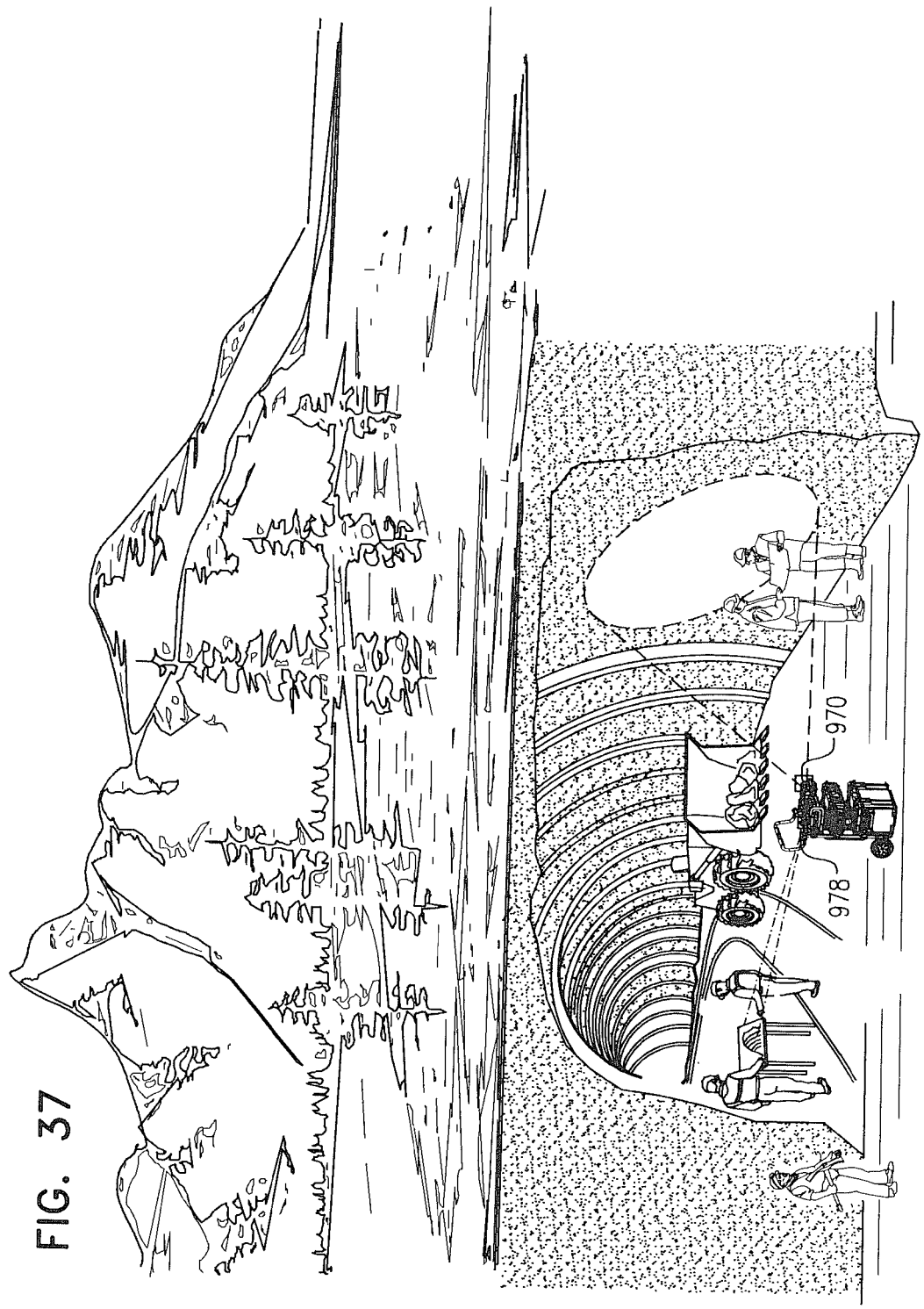
FIG. 37 is a simplified pictorial illustration of the operation of the communication center of any of FIGS. 1A-26B in an illumination mode of operation.

Reference is now made to FIG. 37, which is a simplified pictorial illustration of the operation of the communication center of any of FIGS. 1A-27 in an illumination mode of operation, preferably employing illumination module 820 (FIG. 27). Illumination module 820, which is suitable for various types of job sites, such as in a mine, can include various types of illuminators, such as large space illuminating lamps 970 and directable lamps 978, including, for example LED illuminators and laser illuminators.

Figure 38:
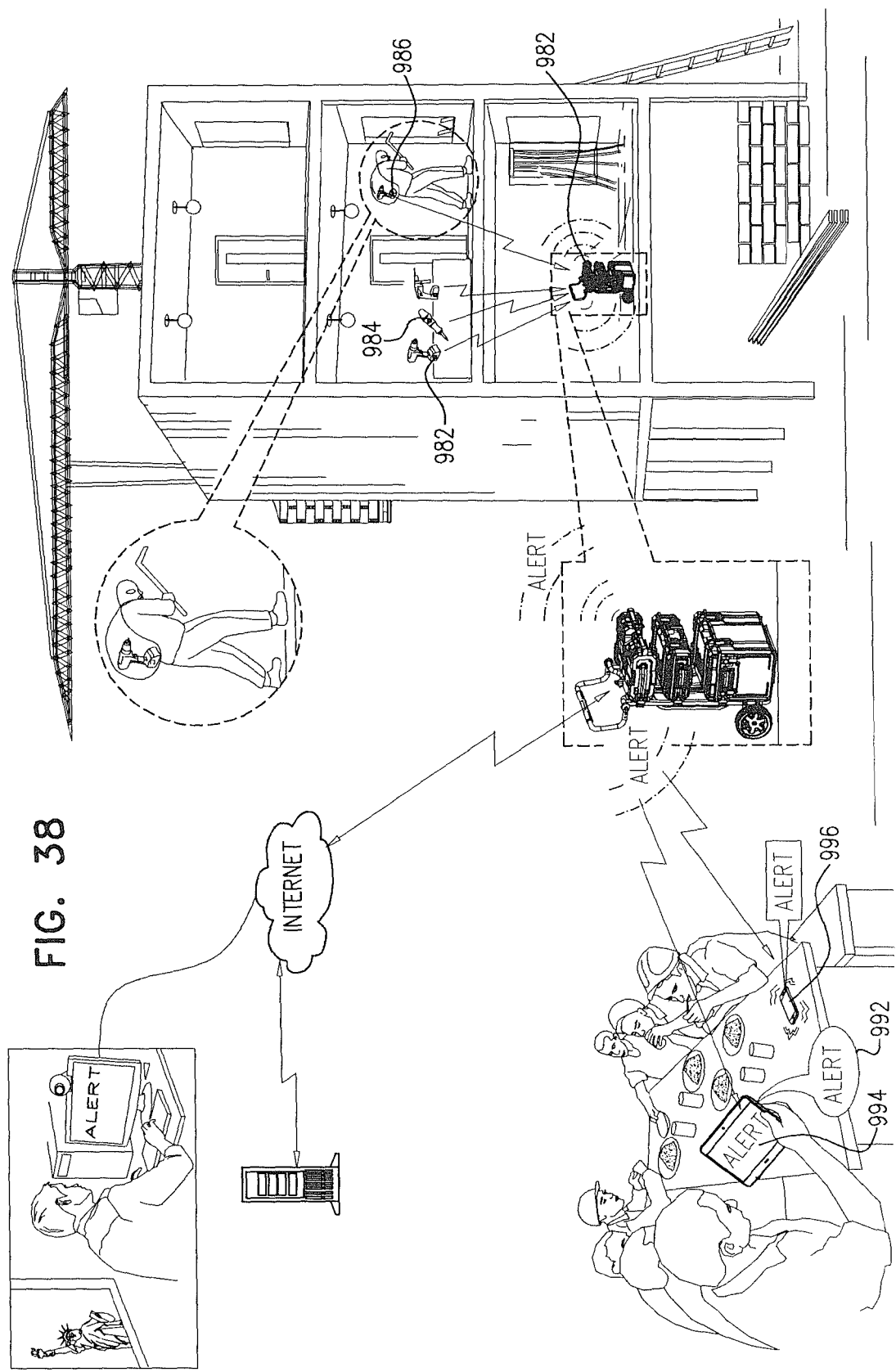
FIG. 38 is a simplified pictorial illustration of the operation of the communication center of any of FIGS. 1A-26B in an alarm mode of operation.

Reference is now made to FIG. 38, which is a simplified pictorial illustration of the operation of the communication center of any of FIGS. 1A-27 in a tampering alarm mode of operation, preferably employing tampering alarm module 770 (FIG. 27). Tampering alarm module 770 may employ various types of sensors, such as vibration sensors 980, case-open switch sensors 982, propinquity sensors 984 and movement sensors 986, which sensors may output to processor 700 (FIG. 27). Processor 700 preferably provides a sensor output thresholding function to avoid false alarms and proves an output to such as an audio alarm 992 a visually sensible alarm 994, a tactile alarm 996 or a combination thereof. Processor 700 (FIG. 27) may also provide remote alerts, via the internet to remote sites, such as a project management site, indicating intrusion into a protected space in which the communication center is located or tampering with the communication center, toolboxes or tools.

Figure 39:
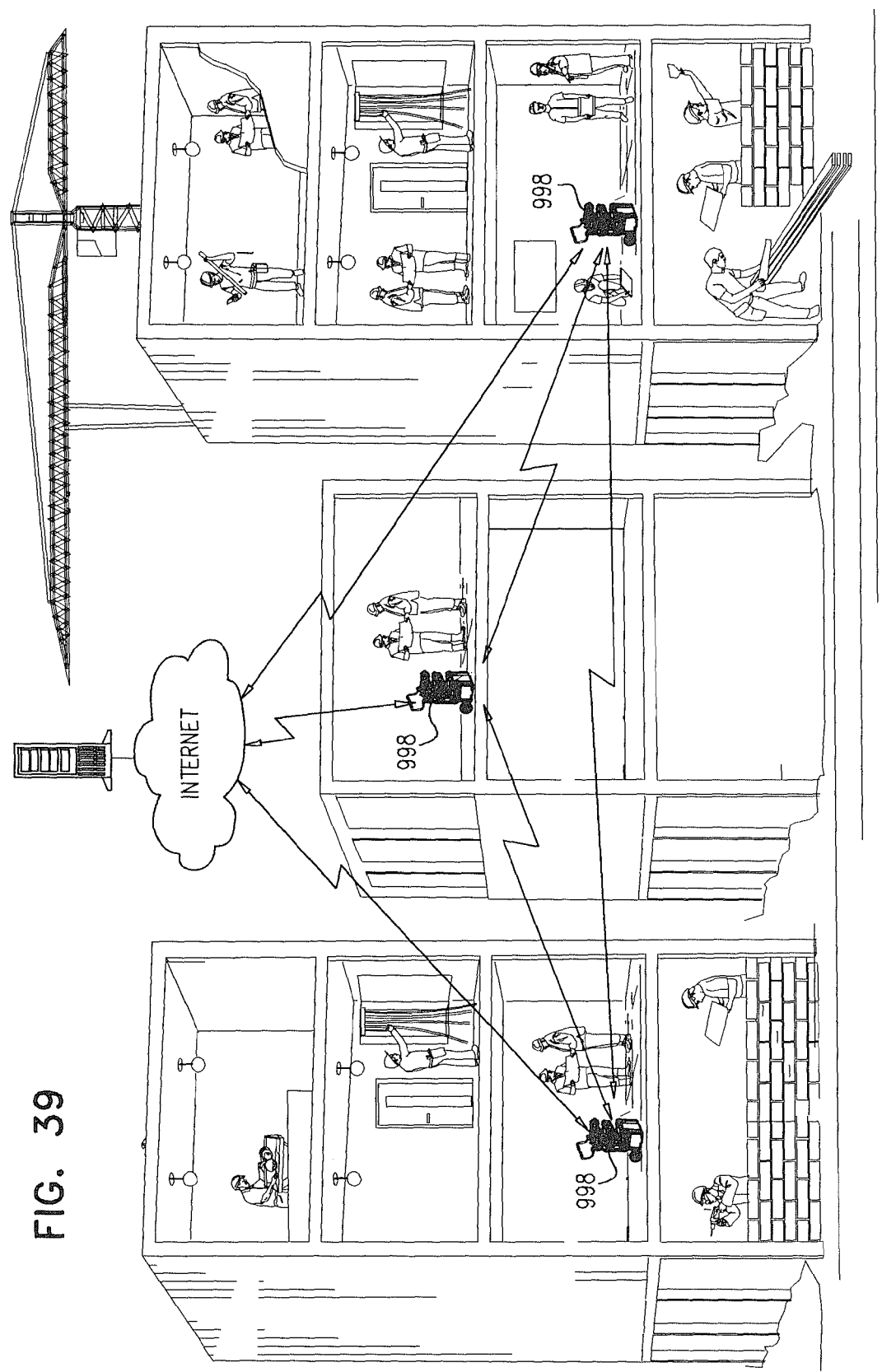
FIG. 39 is a simplified pictorial illustration of the operation of the communication center of any of FIGS. 1A-26B in a mode of communication between communication centers.

Reference is now made to FIG. 39, which is a simplified pictorial illustration of the operation of the communication center of any of FIGS. 1A-27 in a mode of communication between communication centers, preferably employing communication module 840 (FIG. 27) which enables communication between multiple disparately located job site communication centers. In this way, a network of job site communication centers 998 at disparate locations in a large job site can be effectively created and employed for coordinating activities and sharing information.

It will be appreciated by persons skilled in the art that the present invention is not limited by what has been particularly claimed and includes both combinations and subcombinations of features described and shown hereinabove as well as modifications thereof which are not in the prior art.

The invention claimed is:

1. A toolbox system comprising:
   at least one toolbox having a footprint; and
   a jobsite communications center having a footprint at least similar to the footprint of said at least one toolbox, said at least one toolbox and said jobsite communication center having mutual attachment elements enabling said jobsite communications center and said at least one toolbox to be removably attached to each other and transported together,
   said jobsite communications center comprising a cover assembly, said cover assembly including:
      a pair of latch assemblies, each of said latch assemblies including:
         two slidable latch elements; and
         a spring urging said latch elements towards a locked orientation; and
      a water-resistant seal, said water-resistant seal acting as a spring to urge said cover assembly into an open orientation when it is unlatched.

2. A toolbox system comprising:
   a toolbox cart;
   at least one toolbox having a footprint; and
   a jobsite communications center having a footprint at least similar to the footprint of said at least one toolbox, said toolbox cart, said at least one toolbox and said jobsite communication center having mutual attachment elements enabling said jobsite communications center and said at least one toolbox to be removably attached to said cart and transported together,
said jobsite communications center comprising a cover assembly, said cover assembly including:
a pair of latch assemblies, each of said latch assemblies including:
two slidable latch elements; and
a spring urging said latch elements towards a locked orientation; and
a water-resistant seal, said water-resistant seal acting as a spring to urge said cover assembly into an open orientation when it is unlatched.

3. A toolbox system according to claim 1 and wherein:
said jobsite communications center comprises a housing, the housing including:
a main shell comprising:
a top shell; and
a bottom shell; and
at least one side panel, the at least one side panel partially overlapping an area of the main shell;
each of the at least one side panels comprises:
a plate; and
at least one bumper, said plate being relatively rigid and said bumper being relatively resilient; and
said plate is connected to the main shell in the area of overlap and the bumper protrudes beyond one or more planar surfaces of the housing.

4. A toolbox system according to claim 3, wherein at least one of the bumpers is overmolded onto the corresponding plate.

5. A toolbox system according to claim 3, wherein:
the housing comprises a handle attached to the main shell; and
the handle comprises a hollow adapted to contain at least one antenna.

6. A toolbox system according to claim 3, wherein the housing comprises an enclosure for at least one antenna, the enclosure being located in-between one of the one or more plates and the main shell in the area of overlap.

7. A toolbox system according to claim 3, wherein:
the housing accommodates a sound system comprising:
at least one sound input receiver;
at least two speakers; and
a power source for powering the at least two speakers; and
the housing comprises at least one speaker cover, said at least one speaker cover covering each of said at least two speakers located within said housing.

8. A toolbox system according to claim 3, wherein the housing is integratable into a storage system by means of adaptation to be stackable or adaptation to be supported on a storage rack.

9. A toolbox system according to claim 8, wherein the housing comprises one or more latches, one or more latch receiving structures, and one or more rack attachment structures.

10. A toolbox system according to claim 8, further comprising a rear attachment point for securing to a rack.

11. A toolbox system according to claim 3 and also comprising:
sound system electronics located within said housing; and
WIFI electronics coupled to said sound system electronics and located within said housing.

12. A toolbox system according to claim 11 and also comprising Internet Of Things (IOT) electronics for communication with IOT components of tools via said WIFI electronics.

13. A toolbox system according to claim 11 and wherein said WIFI electronics enables communication with a monitoring site remote from said sound system.

14. A toolbox system according to claim 3 and wherein:
said housing comprises a sound system including at least six speakers housed therein;
at least one of the at least six speakers is an active subwoofer; and
at least one of the at least six speakers is a passive subwoofer.

15. A toolbox system according to claim 2 and wherein:
said jobsite communications center comprises a housing, the housing including:
a main shell comprising:
a top shell; and
a bottom shell; and
at least one side panel, the at least one side panel partially overlapping an area of the main shell;
each of the at least one side panels comprises:
a plate; and
at least one bumper, said plate being relatively rigid and said bumper being relatively resilient; and
said plate is connected to the main shell in the area of overlap and the bumper protrudes beyond one or more planar surfaces of the housing.

16. A toolbox system according to claim 15, wherein at least one of the bumpers is overmolded onto the corresponding plate.

17. A toolbox system according to claim 15, wherein:
the housing comprises a handle attached to the main shell; and
the handle comprises a hollow adapted to contain at least one antenna.

18. A toolbox system according to claim 15, wherein the housing comprises an enclosure for at least one antenna, the enclosure being located in-between one of the one or more plates and the main shell in the area of overlap.

19. A toolbox system according to claim 15, wherein:
the housing accommodates a sound system comprising:
at least one sound input receiver;
at least two speakers; and
a power source for powering the at least two speakers; and
the housing comprises at least one speaker cover, said at least one speaker cover covering each of said at least two speakers located within said housing.

20. A toolbox system according to claim 15, wherein the housing is integratable into a storage system by means of adaptation to be stackable or adaptation to be supported on a storage rack.

21. A toolbox system according to claim 14, wherein:
said housing comprises:
a top face,
a bottom face opposite to the top face, and
at least one side face;
said housing has a central axis passing through the centre point of the top face and the centre point of the bottom face;
both the active subwoofer and the passive subwoofer face the bottom face of the housing;
the central axis of the active subwoofer and the passive subwoofer are parallel to the central axis of the housing;
a speaker cover is attached to the outside of the housing, the speaker cover comprising a first convex region facing the housing, the first convex region having a central axis collinear with the central axis of the active subwoofer, and a second convex region facing the housing, the second convex region having a central axis collinear with the central axis of the passive subwoofer, the speaker cover further comprising at least one grill region.

22. A toolbox system according to claim 21, wherein:
at least four of the at least six speakers comprise tweeter units,
each of the tweeter units are located adjacent to the top face of the housing; and
a central axis of each tweeter unit is at a diverging angle to the central axis of the housing.

23. A jobsite communications center according to claim 1 and wherein said communications module comprises:
a radio receiver;
a WI-FI hotspot module;
a wireless router;
a BLUETOOTH® module;
a video communication module, said video communication module providing audio-video communication both to and from a jobsite to a remote location;
a projector operative to project an image onto a region of said jobsite;
a camera for imaging a region of said jobsite;
a wireless communication module for transmitting an image from said camera to said remote location;
an image overlay module for overlaying an image taken at said jobsite with another image;
an image comparison module for indicating differences between said image taken at said jobsite and said another image;
a holographic lens module;
a lighting module, said lighting module including at least one of ambient light and directable lighting;
a visually sensible display;
a smartphone interface;
a remotely controllable 360 degree camera;
a printer;
an augmented-reality module;
an intercom module for enabling intercom communications among multiple smartphones via said communications module;
a 3D printer to enable on-site fabrication of elements based on data received via said communications module;
a 3D scanner;
a tool tracking module;
a tool use monitoring module;
a tool wear monitoring module;
a tool battery charge state tracking module;
an environmental hazard sensing module, said environmental hazard sensing module including sensors for at least one of fire, smoke, dangerous chemicals, biohazards, weather hazards and earthquakes;
at least one sensor interface;
a calendar module including an active reminder module;
a message transmission module;
a wireless remote communicator enabling it to communicate with a wireless remote communicator in another jobsite communication center located remotely therefrom; and
a communicator for enabling it to communicate with and via the cloud.

24. A jobsite communications center according to claim 1 and also comprising:
at least one of an oxygen source, a compressor, a welder and a dust extractor;
at least one of a refrigerated compartment and a microwave oven;
at least one of an intrusion alarm module and a tampering alarm module, said at least one of an intrusion alarm module and a tampering alarm module having at least one of a wireless remote reporting module and a management module and
a wireless battery charging module.

* * * * *